(12) United States Patent
Creech

(10) Patent No.: US 11,355,916 B2
(45) Date of Patent: Jun. 7, 2022

(54) ONE-TRANSISTOR DEVICES FOR PROTECTING CIRCUITS AND AUTOCATALYTIC VOLTAGE CONVERSION THEREFOR

(71) Applicant: Symptote Technologies LLC, Charleston, SC (US)

(72) Inventor: Mark D. Creech, Charleston, SC (US)

(73) Assignee: Symptote Technologies LLC, Charleston, SC (US)

(*) Notice: Subject to any disclaimer, the term of this patent is extended or adjusted under 35 U.S.C. 154(b) by 0 days.

(21) Appl. No.: 16/943,512

(22) Filed: Jul. 30, 2020

(65) Prior Publication Data

US 2020/0366082 A1 Nov. 19, 2020

Related U.S. Application Data

(63) Continuation of application No. 15/755,744, filed as application No. PCT/US2016/052734 on Sep. 21, 2016, now Pat. No. 10,770,883.
(Continued)

(51) Int. Cl.
*H02H 3/08* (2006.01)
*H03K 17/082* (2006.01)
(Continued)

(52) U.S. Cl.
CPC ......... *H02H 3/085* (2013.01); *H01L 27/0266* (2013.01); *H01L 27/0288* (2013.01);
(Continued)

(58) Field of Classification Search
CPC .... H02H 3/08; H01L 27/0266; H01L 27/0288
See application file for complete search history.

(56) References Cited

U.S. PATENT DOCUMENTS

| 3,603,811 A | 9/1971 | Day et al. |
| 4,376,986 A | 3/1983 | Elmasry et al. |

(Continued)

FOREIGN PATENT DOCUMENTS

| CN | 101197534 A | 11/2008 |
| CN | 101594048 A | 12/2009 |

(Continued)

OTHER PUBLICATIONS

SM74611 Smart Bypass Diode, Texas Instruments, May 2016 (17 pages).
(Continued)

*Primary Examiner* — Scott Bauer
(74) *Attorney, Agent, or Firm* — Thrive IP®; Jeremy M. Stipkala; William La Salle, III

(57) ABSTRACT

Devices having one primary transistor, or a plurality of primary transistors in parallel, protect electrical circuits from overcurrent conditions. Optionally, the devices have only two terminals and require no auxiliary power to operate. In those devices, the voltage drop across the device provides the electrical energy to power the device. A third or fourth terminal can appear in further devices, allowing additional overcurrent and overvoltage monitoring opportunities. Autocatalytic voltage conversion allows certain devices to rapidly limit or block nascent overcurrents.

18 Claims, 83 Drawing Sheets

Related U.S. Application Data

(60) Provisional application No. 62/351,625, filed on Jun. 17, 2016, provisional application No. 62/317,092, filed on Apr. 1, 2016, provisional application No. 62/281,453, filed on Jan. 21, 2016, provisional application No. 62/221,428, filed on Sep. 21, 2015.

(51) Int. Cl.
  *H02H 3/087*   (2006.01)
  *H03K 17/042*  (2006.01)
  *H03K 17/0412* (2006.01)
  *H01L 27/02*   (2006.01)
  *H02H 9/02*    (2006.01)
  *H02M 1/32*    (2007.01)
  *H03K 17/687*  (2006.01)

(52) U.S. Cl.
  CPC .............. *H02H 3/08* (2013.01); *H02H 3/087* (2013.01); *H02H 9/025* (2013.01); *H02M 1/32* (2013.01); *H03K 17/04123* (2013.01); *H03K 17/04206* (2013.01); *H03K 17/0822* (2013.01); *H03K 2017/6875* (2013.01); *H03K 2217/0027* (2013.01); *H03K 2217/0081* (2013.01)

(56) References Cited

U.S. PATENT DOCUMENTS

| | | | |
|---|---|---|---|
| 4,744,369 A | 5/1988 | Kroll | |
| 5,157,289 A | 10/1992 | Vasile | |
| 5,191,279 A | 3/1993 | Zommer | |
| 5,283,707 A | 2/1994 | Conners et al. | |
| 5,291,123 A | 3/1994 | Brown | |
| 5,319,515 A | 6/1994 | Pryor et al. | |
| 5,396,117 A | 3/1995 | Housen et al. | |
| 5,465,188 A | 11/1995 | Pryor et al. | |
| 5,581,433 A | 12/1996 | Jordan | |
| 5,742,463 A | 4/1998 | Harris | |
| 5,805,393 A | 9/1998 | Thomas | |
| 5,914,619 A | 6/1999 | Tihanyi | |
| 5,986,902 A | 11/1999 | Brkovic et al. | |
| 6,002,566 A | 12/1999 | Arikawa et al. | |
| 6,049,447 A | 4/2000 | Roesch et al. | |
| 6,061,219 A | 5/2000 | Giffard | |
| 6,118,641 A | 9/2000 | Atkins et al. | |
| 6,181,541 B1 | 1/2001 | Souri et al. | |
| 6,317,343 B1 | 11/2001 | Okamura et al. | |
| 6,331,763 B1 | 12/2001 | Thomas et al. | |
| 6,404,608 B1 | 6/2002 | Pryor et al. | |
| 7,015,680 B2 | 3/2006 | Moraveji et al. | |
| 7,324,315 B2 | 1/2008 | Harris | |
| 7,492,566 B2 | 2/2009 | Harris | |
| 7,576,962 B2 | 8/2009 | Harris | |
| 7,903,382 B2 | 3/2011 | Premerlani et al. | |
| 8,004,806 B2 | 8/2011 | Li | |
| 8,139,329 B2 | 3/2012 | Martin | |
| 8,169,763 B2 | 5/2012 | Morrish | |
| 8,223,467 B2 | 7/2012 | Morrish | |
| 8,289,664 B2 | 10/2012 | Haines et al. | |
| 8,289,667 B2 | 10/2012 | Morrish | |
| 8,537,517 B1 | 9/2013 | Banak et al. | |
| 8,570,713 B2 | 10/2013 | Kumfer et al. | |
| 8,605,398 B2 | 12/2013 | Bode et al. | |
| 8,643,055 B2 | 2/2014 | Ankoudinov et al. | |
| 8,729,739 B2 | 5/2014 | Lubomirsky et al. | |
| 9,490,798 B1 | 11/2016 | Charpentier et al. | |
| 9,755,630 B2 | 9/2017 | Urciuoli | |
| 10,205,313 B2 | 2/2019 | Creech | |
| 10,770,883 B2 | 9/2020 | Creech | |
| 2002/0125507 A1 | 9/2002 | Washburn et al. | |
| 2006/0238936 A1 | 10/2006 | Blanchard et al. | |
| 2007/0146020 A1 | 6/2007 | Williams | |
| 2008/0116864 A1 | 5/2008 | Goto et al. | |
| 2008/0290927 A1 | 11/2008 | Mazzola et al. | |
| 2009/0174362 A1 | 7/2009 | Richardson et al. | |
| 2009/0251197 A1* | 10/2009 | Friedrichs | H03K 17/567 327/436 |
| 2009/0279225 A1 | 11/2009 | Morrish | |
| 2010/0039083 A1* | 2/2010 | Moriarty, Jr. | H02M 5/293 323/282 |
| 2010/0328831 A1 | 12/2010 | Zhang et al. | |
| 2011/0181252 A1 | 7/2011 | Salato et al. | |
| 2011/0242865 A1 | 10/2011 | Robbins | |
| 2012/0039007 A1 | 2/2012 | Turchi et al. | |
| 2012/0161860 A1 | 6/2012 | Snowdon | |
| 2012/0235210 A1 | 9/2012 | Takemae et al. | |
| 2014/0042452 A1 | 2/2014 | Pendharkar et al. | |
| 2014/0070340 A1 | 3/2014 | Hall et al. | |
| 2014/0070786 A1* | 3/2014 | Guerra | G05F 1/618 323/285 |
| 2014/0175454 A1 | 6/2014 | Roberts et al. | |
| 2015/0138680 A1 | 5/2015 | Souma | |
| 2015/0207314 A1 | 7/2015 | Tournier et al. | |
| 2015/0207401 A1 | 7/2015 | Zhang et al. | |
| 2015/0280417 A1 | 10/2015 | Shen | |
| 2015/0372474 A1 | 12/2015 | Davidson et al. | |
| 2017/0025844 A1 | 1/2017 | Creech | |
| 2018/0248353 A1 | 8/2018 | Creech | |

FOREIGN PATENT DOCUMENTS

| | | |
|---|---|---|
| CN | 203415972 U | 1/2014 |
| CN | 104335437 A | 2/2015 |
| EP | 00197965 B1 | 9/1985 |
| EP | 0708515 A1 | 4/1996 |
| EP | 0593588 B1 | 3/1997 |
| KR | 1019937003726 A | 11/1993 |
| KR | 1020120072355 A | 7/2012 |
| WO | 8602180 | 4/1986 |
| WO | 1992012561 | 7/1992 |
| WO | 93/01639 A1 | 1/1993 |
| WO | 02/051668 A1 | 7/2002 |
| WO | 2015/124884 A1 | 8/2015 |
| WO | 2017/05333 A1 | 3/2017 |

OTHER PUBLICATIONS

European Patent Office Communication pursuant to Article 94(3) EPC (dated Nov. 20, 2020) (62 pages).
Bourns, 'TCS-DL Series—TCS Dual Transient Current Suppressors,' www.bourns.com (2011) (7 pages).
Bourns, 'TBU-DT Series—TBU High-Speed Protectors,' www.bourns.com (2011) (5 pages).
Jones, E.F., Presentation 'Understanding Arc Flash,' Schneider Electric (34 pages).
Brenda Kovacevic, Micrel, 'Solid State Circuit Breakers' Application Note 5 (1997) (7 pages).
Dominique Bergogne et al., Normally-on SiC JFETs in Power Converters: Gate Driver and Safe Operations (6 pages).
Dominique Tournier et al., 'Sic Current Limiting FETs (CLFs) for DC applications,' Materials Science Forum (2014) (5 pages).
ETA Engineering technology, White Paper 'Reliable disconnection of photovoltaic,' (May 2012) (6 pages).
Toru Tanzawa, 'Innovation of Switched-Capacitor Voltage Multiplier,' IEEE Solid-State Circuits Magazine (2016) (9 pages).
www.ResearchGate.net, Conference paper 'Active protections for normally-on Sic JFETs,' (Oct. 2011) (11 pages).
Chen, Cheng et al., 'Robustness of Sic MOSFETs in short-circuit mode,' https://hal.archives-ouvertes.fr (Sep. 15, 2015) (9 pages).
Steve Mannas, 'Overcurrent-Protection ICs Have Their Current Limits,' Power Electronics Technology (Oct. 2008) (3 pages).
OMRON Electronic Components, White Paper 'RF MEMS Switching: What you need to know,' (13 pages).
Semiconductor Components Industries, LLC, 'NIS5132 Series, +12 Volt Electronic Fuse,' https://onsemi.com (Jul. 2014) (11 pages).
Kempkes, M. et al., 'Solid-State Circuit Breakers for Medium Voltage DC Power,' Diversified Technologies, Inc. (4 pages).
Micrel, Inc., 'MIC5021: High-Speed High-Side MOSFET Driver,' https://www.micrel.com (Jul. 2005) (10 pages).

(56) References Cited

OTHER PUBLICATIONS

Micrel, Inc., 'MIC5011: Minimum Parts High- or Low-Side MOSFET Driver,' https://www.micrel.com (Jul. 2005) (12 pages).
Dr. Huikai Xie, 'Advanced MEMS, Lecture 17,' University of Florida (2005) (11 pages).
Jin Qiu et al., 'A High-Current Electrothermal Bistable MEMS Relay,' ABB Corporate Research Ltd. (4 pages).
Jo-Ey Wong et al., 'An Electrostatically-Actuated MEMS Switch for Power Applications,' Massachusetts Institute of Technology (2000) (6 pages).
Radant MEMS, 'RF MEMS Switches and Products,' www.radantmems.com (2013) (92 pages).
SURGEGATE—MC025 Analog Station Set & Central Office Line Protector, www.itwlinx.com (1 page).
Maxim; '60mA, SOT23 Inverting Charge Pump with Shutdown,' Maxim Integrated Products (Dec. 2008) (14 pages).
Linear Technology, 'Auto-Reset Electronic Circuit Breaker,' (16 pages).
Francois D. Martzloff et al., 'Selecting varistor clamping voltage: Lower is not better!,' National Institute of Standards and Technology (7 pages).
Texas Instruments, 'LM5064 Negative Voltage System Power Management and Protection IC with PMBus,' (Feb. 2013) (62 pages).
Abdus Sattar, 'Depletion-Mode Power MOSFETs and Applications,' IXYS Corporation (10 pages).
Janusz A. Starzyk et al., 'A DC-DC Charge Pump Design Based on Voltage Doublers,' IEEE Transactions on Circuits and Systems, Fundamental Theory and Applications, vol. 48, No. 3 (Mar. 2001) (10 pages).
Zhang et al., 'Over-Current Protection Scheme for Sic Power MOSFET DC Circuit Breaker,' Center for Research in Energy Systems Transformation (2015) (6 pages).
Device Engineering Incorporated, 'Surge Blocking Module,' (2011) (12 pages).
CALY Technologies, '1200V, 600 mOHM, SIC Current Limiting Device with Standard Short-Circuit Capabilities,' (2017) (4 pages).
Atmel, 'AVR4100: Selecting and testing 32kHz crystal oscillators for Atmel AVR microcontrollers,' (Mar. 2015) (24 pages).
ETA, 'Electronic Relay with Timer Function,' www.e-t-a.de (4 pages).
ETA, 'Thermal Automotive Circuit Breaker,' www.e-t-a.de (2015/16) (2 pages).
ETA Engineering Technology, 'Current—Customer Magazine of E-T-A Elektrotechnische Apparate GmbH,' Issue Jan. 2012 (16 pages).
Ming-Dou Ker et al., 'Impact of MOSFET Gate-Oxide Reliability on CMOS Operational Amplifier in a 130-nm Low-Voltage Process,' IEEE Transactions on Device and Materials Reliability, vol. 8, No. 2 (Jun. 2008) (14 pages).
Tim Howell, PEG Conference, 'Comparing Circuit Protection Technologies for 48 V DC in High Surge Environments,' (36 pages).
Andy Fewster et al., Power Design 'Latched Overcurrent Fault Detector Has Fast Response Time,' Power Electronic Technology, www.powerelectronics.com (Oct. 2005) (2 pages).
Anup Bhalla et al., 'Robustness of SiC JFETs and Cascodes,' Bodo's Power Systems, www.bodospower.com (May 2015) (3 pages).
Sze Chin, 'Boosting the Current Limit of Current Limiting Diodes,' Central Semiconductor Corp. (3 pages).
IXYS Corporation, 'Power Semiconductor Solutions for Automotive Applications,' www.ixys.com (Apr. 2015) (46 pages).
Xiang W. et al., 'Research on fast solid state DC breaker based on a natural current zero-crossing point,' State Grid Electric Power Research Institute, J. Mod. Power Syst. Clean Energy (2014) (9 pages).
US Army, 'Ultra-Fast Bi-Directional Solid State Circuit Breaker,' (2 pages).
Peter Maiutti, 'Crystal Oscillator of the C500 and C166 Microcontroller Families,' Infineon technologies (46 pages).

J-P Laur et al., 'A New Circuit-Breaker Integrated Device for Protection Applications,' IEEE (1999) (4 pages).
Johannes Andersson et al., 'Circuit breakers, Melting fuses and Electronic fuses,' Chalmers Universtiy of Technology (2010) (78 pages).
ON Semiconductor 'Advantages of eFuses Versus PTC Resettable Fuses,' Semiconductor Components Industries, LLC (Oct. 2016) (5 pages).
Younis Allasasmeh, Thesis 'Analysis, Design, and Implementation of Integrated Charge Pumps with High Performance,' (Aug. 2011) (123 pages).
EFM32, 'Oscillator Design Considerations,' (21 pages).
Radial Leaded PTC: OZRM Series, (4 pages).
Pilvelait, B. et al., 'A High Power Solid State Circuit Breaker for Military Hybrid Electric Vehicle Applications,' 2012 NDIA Ground Vehicle Systems Engineering and Technology Symposium (Aug. 2012) (10 pages).
Modi, P., Thesis 'A Charge Pump Architecture with High Power Efficiency and Low Output Ripple Noise in 0.5um CMOS Process Technology,' Rochester Institute of Technology (2012) (94 pages).
Alwash, M. et al., 'Short-Circuit Protection of Power Converters with SiC Current Limiters,' IEEE (2016) (6 pages).
Yu Wen et al., 'A Dual-Mode Driver IC with Monolithic Negative Drive-Voltage Capability and Digital Current-Mode Controller for Depletion-Mode GaN HEMT,' IEEE (2015) (10 pages).
Veliadis, V. et al., 'Suitability of N-ON recessed implanted gate vertical-channel SiC JFETs for optically triggered 1200 V solid-state-circuit-breakers,' IEEE (2015) (4 pages).
Miao, Z. et al., 'A Self-Powered Bidirectional DC Solid State Circuit Breaker Using Two Normally-on SiC JFETs,' IEEE (2015) (6 pages).
Tiwari, A.K. et al., 'SiC Current Limiting Devices for Surge Protection,' IEEE (2015) (4 pages).
Radsmanesh, H. et al., 'A Novel Solid State Fault Current Limiting Circuit Breaker for Medium Voltage Network Applications,' IEEE (2015) (8 pages).
Giannoutsos, S.V. et al., 'A Gate Drive Circuit for Normally-on SiC JFETs with Self-Protection Functions against Overcurrent and Shoot-Through Fault Conditions,' IEEE (2015) (9 pages).
Bingjian, Y. et al., 'A Hybrid Circuit Breaker for DC-Application,' IEEE (2015) (6 pages).
Ouaida, R. et al., 'State of Art Current and Future Technologies in Current Limiting Devices,' IEEE (2015) (6 pages).
Shen, Z.J. et al., 'Wide-Bandgap Solid-State Circuit Breakers for DC Power Systems: Device and Circuit Considerations,' IEEE Transactions on Electron Devices, vol. 62, No. 2 (Feb. 2015) (7 pages).
Miao, Z. et al., 'A Self-Powered Ultra-Fast DC Solid State Circuit Breaker Using a Normally-on SiC JFET,' IEEE (2015) (7 pages).
Zhang, Y. et al., 'Over-Current Protection Scheme for SiC Power MOSFET DC Circuit Breaker,' IEEE (2014) (5 pages).
Konrad, W. et al., 'A Simple SiC JFET based AC vaiable current limiter,' Electric Drives and Machines Institute, Graz University of Technology (7 pages).
Kedia, S. et al., 'Simulation, Design, Fabrication, and testing of a MEMS Resettable Circuit Breaker,' IEEE Journal of Microelectromechanical Systems, vol. 24, No. 1 (Feb. 2015) (9 pages).
Peftitsis, D. et al., 'Self-Powered Gate Driver for Normally-ON SiC JFETs: Design Considerations and Systems Limitations,' IEEE Transactions on Power Electronics, vol. 29, No. 10 (Oct. 2014) (7 pages).
Kampitsis, G. et al., 'Performance Consideration of an AC Coupled Gate Drive Circuit With Forward Bias for Normally-ON SiC JFETs,' IEEE (2013) (6 pages).
Juvekar, S. et al., 'A fast acting DC solid state fault isolation device (FID) with Si and SiC devices for MVDC distribution system,' IEEE (2012) (6 pages).
Chen, P. et al., 'A 80-m V Input, Fast Startup Dual-Mode Boost Converter with Charge-Pumped Pulse Generator for Energy Harvesting,' IEEE Asian Solid-State Circuits Conference (Nov. 2011) (4 pages).

(56) References Cited

OTHER PUBLICATIONS

Alexandrov, P. et al., 'Solid-State Disconnects Based on SiC Power JFETs,' IEEE (2011) (5 pages).
Dubois, F. et al., 'Ultrafast Safety System to Turn-off Normally on Sic JFETs,' SAFRAN Group and CPES (10 pages).
Urciuoli, D.P. et al., 'Demonstration of a 600-V, 60-A, Bidirectional Silicon Carbide Solid-state Circuit Breaker,' US Government Work (5 pages).
Guedon, F. et al., 'Gate driver for SiC JFETs with portection against normally-on behaviour induces fault,' Electronic Letter, vol. 47, No. 6 (Mar. 2011) (2 pages).
Bergogne, D. et al., 'Normally-on SiC JFETs in Power Converters: Gate Driver and Safe Operation,' CIPS (Mar. 2010) (6 pages).
Kim, J.H. et al., 'Protection Circuit of Normally-on SiC JFET Using an Inrush Current,' (4 pages).
Luo, F. et al., 'A Novel Solid State Fault Current Limiter for DC Power Distribution,' IEEE (2008) (6 pages).
Domes, D. et al., 'A New, Universal and Fast Switching Gate-Drive-Concept for SiC-JFETs based on Current Source Principle' (6 pages).
Kelley, R.L. et al., 'Inherently Safe DC/DC Converter using a Normally-on SiC JFET,' IEEE (2005) (5 pages).
Heldwein, M. et al., 'A Novel SiC J-FET Gate Drive Circuit for Sparse Matrix Converter Applications,' IEEE (2004) (6 pages).
Yeatman, E.M. et al., 'Thermally tripped MEMS Circuit Breakers,' Micosaic Systems and Imperial College London (1 page).
Vinko, D. et al., 'Modification of the Cockcroft-Walton charge pump by using switched capacitors technique for improved performance under capacitive loads,' WSEAS Transactions on Circuits and Systems, Issue 1, vol. 8 (Jan. 2009) (10 pages).
Gregory, G.D., 'Applying Low-Voltage Circuit Breakers in Direct Current Systems,' IEEE (1994) (10 pages).
Geear, M.C. et al., 'Microengineered Electrically Resettable Circuit Breaker,' Journal of Microelectromechanical Systems, vol. 13, No. 6 (Dec. 2004) (8 pages).
Emphatec, 'Fused Overvoltage Protector,' www.emphatec.com (4 pages).
Linear Technology, 'Low Quiescent Current Surge Stopper,' www.linear.com (22 pages).
Schmitt, H., Presentation 'Fault Current Limiters Report on the Activitires of CIGRE WG A3.10,' Siemens AG, (Sep. 2003) (31 pages).
Magnecraft Solution Guide, 'Advantages of the 861 Solid State Relay,' (7 pages).
Tournier, D. et al., 'SiC Current Limiting FETs (CLFs) for DC Appplications,' Materials Science Forum, vols. 778-780 (2014) (5 pages).
Omron, 'RF MEMS Switch 2SMES-01,' (9 pages).
Bouarroudj-Berkani, M. et al., 'Ageing of SiC JFET transistors under repetitive current limitation conditions,' ELSEVIER, Microelectronics Reliability (2010) (6 pages).
Urciuoli, D.P., 'Evaluation of SiC VJFET Devices,' Army Research Lab. (May 2008) (20 pages).
Peftitsis, D. et al., 'Self-Powered Gate Driver for Normally ON Silicon Carbide Junction Field-Effect Transistors Without External Power Supply,' IEEE Transactions on Power Electronics, vol. 28, No. 3, pp. 1488-1501 (Mar. 2013).
GaN-on-Si power transistors from French lab Leti, Electronics Weekly, http://www.electronicsweekly.com/news/design/power/gan-on-si-power-transistors-french-lab-leti (Jul. 2015).
Urciuoli, D.P. et al., 'Evaluation of SiC VJFET Devices for Scalable Solid-State Circuit Breakers,' U.S. Army Research Lab. (20 pages).
Urciuoli, D.P. et al., 'Trade Study and Design of a TRL-4, 100 degress C, 28- to 600-V Bidirectional DC-DC Converter Power Stage,' Army Research Lab., Jan. 2011 (33 pages).

Linear Technology, Auto-Reset Electronic Circuit Breaker 1992 (16 pages).
International Search Report for PCT/US2016/052734 dated Jan. 5, 2017 (4 pages).
Written Opinion for PCT/US2016/052734 dated Jan. 5, 2017 (8 pages).
Notice of Allowance (in Korean Language) for Korean Application No. 10-2018-7010578, dated Nov. 29, 2018 (5 pages).
Extended European Search Report for European Patent Application No. EP 16 84 9449 dated Aug. 9, 2019 (15 pages).
Patent Certificate for Japanese Patent No. JP 6651186 issued Jan. 24, 2020 (1 page).
Letter forwarding Patent Certificate for Japanese Patent No. JP 6651186 dated Feb. 18, 2020 (2 pages).
Invention Patent Certificate for Chinese Patent No. ZL 201680067719.4 dated Jan. 17, 2020 (4 pages).
Partial Supplementary Search Report for European 16849449.0 dated Apr. 5, 2019 (15 pages).
Machine translation of Chinese Application CN 101594048 A dated Mar. 19, 2009 (13 pages).
Translation of Office Action dated Mar. 8, 2019 for Chinese Application No. 201680067719.4 (12 pages).
Machine translation of Chinese Application CN 203415972U dated Jan. 29, 2014 (8 pages).
Notice of Allowance dated Nov. 29, 2018 for Korean Patent App. No. 10-2018-7010578 from Korean Intellectual Property Office (5 pages).
Letter regarding Notice of Allowance for Korean Patent App. No. 10-2018-7010578 dated Nov. 30, 2018 (Redacted) (2 pages).
Office Action dated Aug. 7, 2018 for Korean Patent App. No. 10-2018-7010578 from Korean Intellectual Property Office (5 pages).
Translation of Korean Office Action dated Aug. 7, 2018 for Korean Patent App. No. 10-2018-7010578 (Redacted) (4 pages).
Texas Instruments, 'Unregulated 60-mA Charge Pump Voltage Inverter,' (Jun. 2008) (29 pages).
Power Developer (Nov. 2015) (16 pages).
PEG Conference, 'Voice Protection for ONTs Using ECL and Crowbar Devices,' (30 pages).
Conte, F.D. et al., 'Safety in the battery design: the short circuit,' World Electric Vehicle Journal, vol. 3 (2009) (8 pages).
Wilk, G.D. et al., 'High-k gate dielectrics: Current status and materials properties considerations,' Journal of Applied Physics, vol. 89, No. 10 (May 2001) (33 pages).
Euro Quartz, 'XO91 Oscillators,' www.euroquartz.co.uk (2 pages).
Texas Instruments, 'Regulated 200-mA High Efficiency Charge Pump DC/DC Converters,' (Aug. 2000) (30 pages).
Texas Instruments, 'CMOS Voltage Converter,' (Jun. 2006) (23 pages).
Texas Instruments, 'TPS25942x/44x 2.7V-18V, 5A eFuse Power MUX with Multiple Protection Modes,' (Mar. 2015) (54 pages).
Radant MEMS, 'Application Note for Test & Handling of SPST RF-MEMS Switches,' www.radantmems.com (4 pages).
Texas Instruments, 'TPS6030 Single Cell to 3-V or 3.3-V, 20-mA Dual Output, High Efficiency Charge Pump,' (Oct. 2015) (25 pages).
International Preliminary Report on Patentability for PCT/US2016/052734, dated Mar. 27, 2018 (9 pages).
Office Action dated Jul. 14, 2021 for Chinese Application 201911355453.5 (6 pages).
Translation of Office Action dated Jul. 14, 2021 for Chinese Application 201911355453.5 (6 pages).
Google translation of Chinese Patent No. 104335437 (18 pages).
Google translation of Chinese Patent No. 203415972 (8 pages).

* cited by examiner

© 2015 Mark D. Creech
(17 U.S.C. 401)

© 2015 Mark D. Creech
(17 U.S.C. 401)

Fig. 9 © 2015 Mark D. Creech
(17 U.S.C. 401)

Fig. 10 © 2015 Mark D. Creech
(17 U.S.C. 401)

© 2015 Mark D. Creech
(17 U.S.C. 401)

© 2015 Mark D. Creech
(17 U.S.C. 401)

Fig. 14   © 2015 Mark D. Creech
(17 U.S.C. 401)

© 2015 Mark D. Creech
(17 U.S.C. 401)

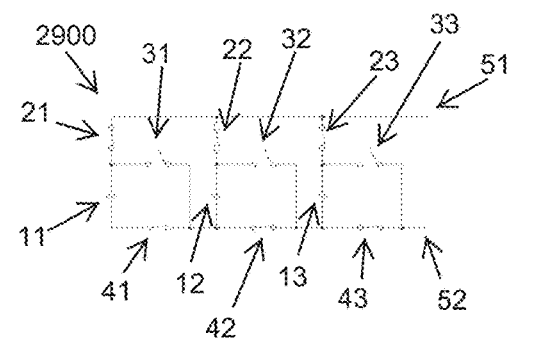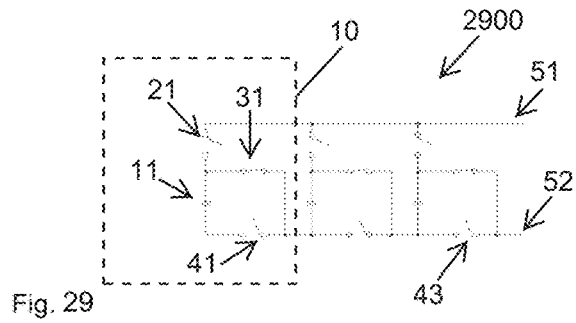
Fig. 29
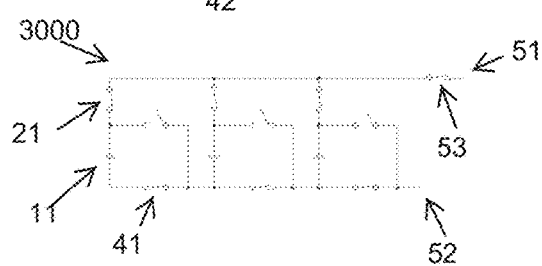
Fig. 30
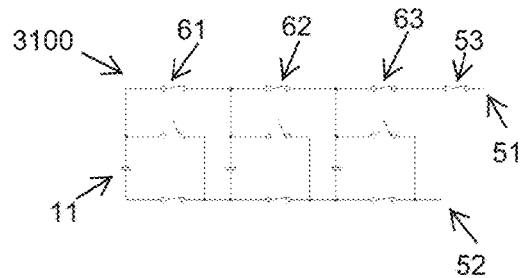
Fig. 31
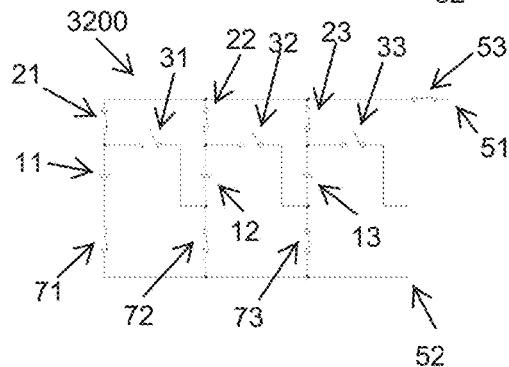
Fig. 32
PARALLEL
(Charging)
SERIES
(Discharging)
© 2015 Mark D. Creech
(17 U.S.C. 401)

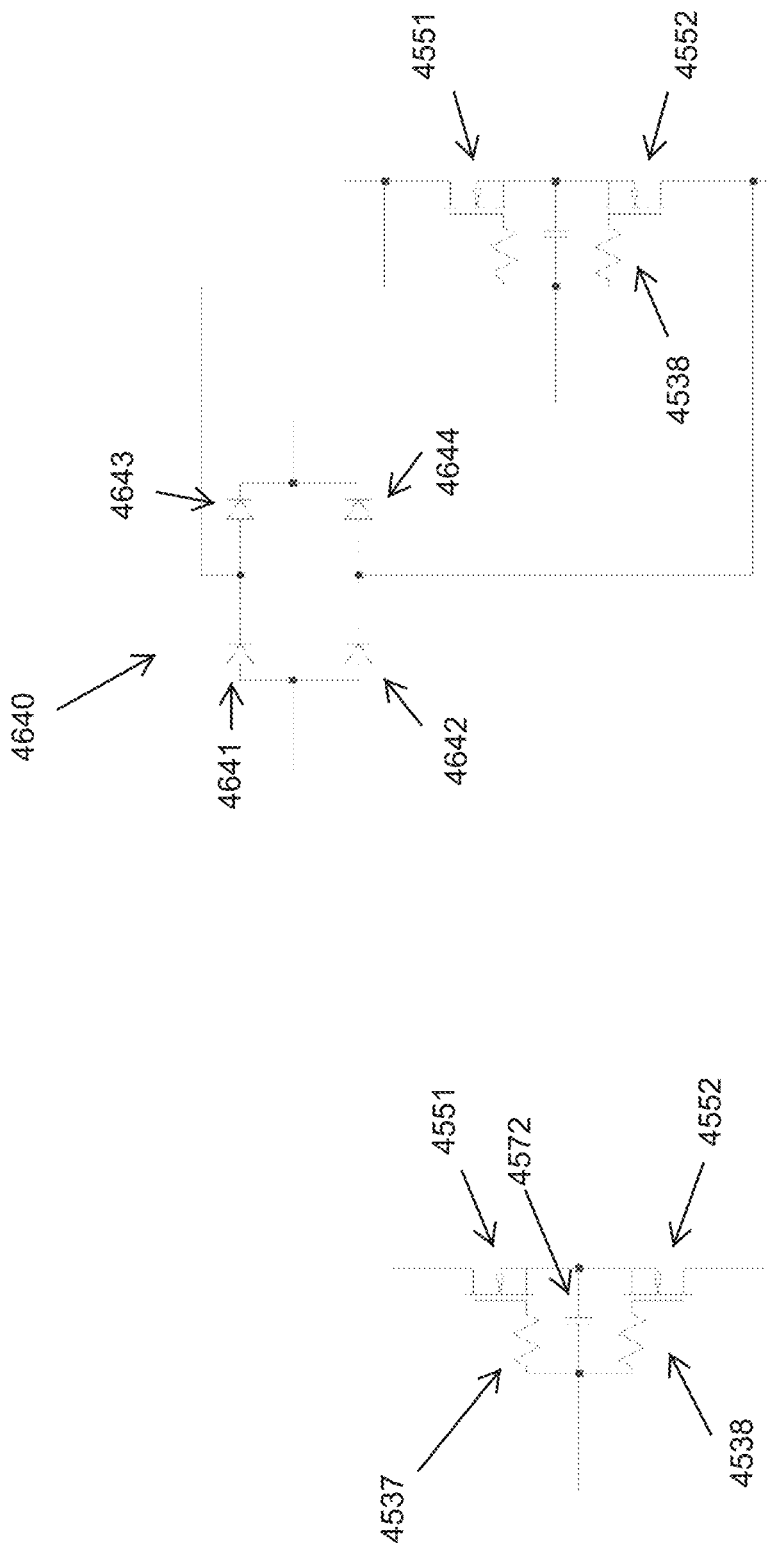

© 2016 Mark D. Creech (17 U.S.C. 401)

© 2016 Mark D. Creech (17 U.S.C. 401)

© 2016 Mark D. Creech
(17 U.S.C. 401)

ONE-TRANSISTOR DEVICES FOR PROTECTING CIRCUITS AND AUTOCATALYTIC VOLTAGE CONVERSION THEREFOR

CROSS-REFERENCE TO RELATED APPLICATIONS

The present application claims benefit of priority under 35 U.S.C. § 120 to U.S. Non-Provisional patent application Ser. No. 15/755,744, allowed, having a § 371 date of Feb. 27, 2018, entitled, "ONE-TRANSISTOR DEVICES FOR PROTECTING CIRCUITS AND AUTOCATALYTIC VOLTAGE CONVERSION THEREFOR," which represents the U.S. National Phase under 35 U.S.C. § 371 of International Patent Application No. PCT/US2016/052734, internationally filed on Sep. 21, 2016, entitled, "ONE-TRANSISTOR DEVICES FOR PROTECTING CIRCUITS AND AUTOCATALYTIC VOLTAGE CONVERSION THEREFOR," which in turn claims benefit of priority under PCT Article 8 and 35 U.S.C. § 119(e) of (a) U.S. Provisional Patent Application No. 62/221,428 filed Sep. 21, 2015, entitled, "ONE-TRANSISTOR DEVICES FOR PROTECTING CIRCUITS AND AUTOCATALYTIC VOLTAGE CONVERSION THEREFOR;"
(b) U.S. Provisional Patent Application No. 62/281,453 filed Jan. 21, 2016, entitled, "ONE-TRANSISTOR DEVICES FOR PROTECTING CIRCUITS AND AUTOCATALYTIC VOLTAGE CONVERSION THEREFOR;"
(c) U.S. Provisional Patent Application No. 62/317,092 filed Apr. 1, 2016, entitled, "ONE-TRANSISTOR DEVICES FOR PROTECTING CIRCUITS AND AUTOCATALYTIC VOLTAGE CONVERSION THEREFOR;" and
(d) U.S. Provisional Patent Application No. 62/351,625 filed Jun. 17, 2016, entitled, "ONE-TRANSISTOR DEVICES FOR PROTECTING CIRCUITS AND AUTOCATALYTIC VOLTAGE CONVERSION THEREFOR."

Each of the foregoing non-provisional patent application, international patent application, and provisional patent applications (a)-(d) are incorporated herein by reference in their entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

FIELD OF THE INVENTION

This invention relates to devices and methods for protecting electrical circuits.

BACKGROUND OF THE INVENTION

So far, attempts to employ a single transistor to block dangerous currents have met with considerable difficulties. When two transistors are placed in series in the primary current path of a circuit to be protected, the voltage drop across one transistor can be used at the gate of the other transistor. However, efforts to use the voltage drop across a single transistor to drive its own gate to provide an efficient and effective device for protecting a circuit during routine, long-term operation have not been successful. When an overcurrent condition arises, that condition must be detected and dealt with quickly. If the single transistor device reacts too slowly, the circuit protected by that device will suffer damage. Moreover, if the single transistor takes too long to enter blocking depletion mode, the single transistor itself will be damaged by the overcurrent passing through that transistor. Similarly, entering a current-limiting mode too slowly could damage the protected circuit and the transistor.

Optionally, an auxiliary power source can be used to control the gate of a single transistor placed in the primary current path of a circuit to be protected from overcurrent conditions. That auxiliary power can be derived from a source other than the circuit to be protected, such as an independent mains supply or a long-life lithium ion battery. However, should the auxiliary power source itself experience an overcurrent condition, or simply disappear as in the case of a discharged battery, the single transistor may be damaged or fail to operate, thereby damaging the circuit to be protected, or leaving that circuit unprotected altogether. Furthermore, the auxiliary power requirement wastes energy, and may cause additional thermal energy dissipation requirements for the protected circuit.

A normally-on transistor may exhibit current-limiting properties in some circumstances, for example, when its gate is shorted to its source, and the voltage drop from its drain to its source exceeds the transistor's characteristic threshold voltage. However, the voltage required to achieve current-limiting behavior is usually unacceptably high for many applications. Moreover, the transistor must exhibit an on resistance of at least several ohms, requiring a significant power loss during normal current conditions. Variability in the threshold voltages of transistors, power loss, heat generated by such a transistor, and other obstacles make it impractical to simply employ a single transistor by itself as a current-limiting device in many circumstances.

Circuit protection devices are needed that do not require an auxiliary power source, more efficiently guard low-power and high-power circuit applications, serve any circuit with strict or sensitive energy requirements, and adequately protect electrical circuits.

SUMMARY OF THE INVENTION

Applicant has unexpectedly discovered devices and methods for efficiently and quickly protecting an electrical circuit when an overcurrent condition arises in routine operation of that circuit, using a primary transistor or a plurality of primary transistors in parallel with each other. Also unexpectedly, those transistors in many cases are depletion-mode, normally-on transistors. And, those transistors operate in some embodiments using only the voltage drop across the protective device, and without any auxiliary power. Additional embodiments allow for the selective limiting, blocking, or both, of dangerous overcurrents. In still further embodiments, autocatalytic voltage conversion unexpectedly provides a rapid transition from conduction to limiting or blocking dangerous currents.

Some embodiments of the present invention are configured to protect a circuit from an overcurrent condition by providing a transistor that operates to pass current during normal current conditions, and then enter blocking depletion mode when an overcurrent condition arises. As used herein, "blocking depletion" indicates that the transistor has moved into depletion beyond its threshold voltage ($V_{TH}$), and is substantially non-conductive between its source and its drain. Other embodiments are configured to protect a circuit from an overcurrent condition by providing a transistor that operates to pass current during normal current conditions, and then enter a current-limiting mode when an overcurrent condition arises. As used herein, "current-limiting mode" indicates a transistor having a gate bias such that the transistor is neither fully conductive nor substantially non-conductive between its source and drain. In some cases, the current passing between the drain and source is substantially constant for a given range of voltage drops between the drain and source, when the transistor is in current-limiting mode. Still other embodiments are configured to protect a circuit from overcurrent conditions by providing a transistor that operates to pass current during normal current conditions, enters a current-limiting mode when a slight overcurrent condition arises, and then enter blocking depletion mode if the overcurrent condition becomes severe. "Slight" and "severe" overcurrent conditions are relative, and depend on intended power loads, delicacy of the protected circuit, and other factors. In some cases, a slight overcurrent condition exists when the current that flows through or would flow through a device of the present invention is no more than a certain threshold of current. A severe overcurrent condition exists when the current that flows through or would flow through a device of the present invention is greater than that certain threshold of current. Current that "would flow through a device" means the current expected if the device were not in current limiting mode or blocking depletion mode. That threshold is any suitable threshold, such as for example, 10%, 50%, 100%, 200%, 500%, or 1000% of a maximum expected current load fora protected circuit. In other cases, that threshold represents 0.1 A, 0.5 A, 1 A, 5 A, 10 A, 50 A, 100 A, 1000 A, 10,000 A, or 100,000 A more than a maximum expected current load for a protected circuit.

Accordingly, certain embodiments provide devices for protecting a circuit having a primary current path from a overcurrent condition, each device comprising:

a first terminal and a second terminal configured to route the primary current path through the device;
a first transistor comprising a first gate, a first drain, and a first source;
wherein the first transistor is a depletion mode, normally-on transistor;
wherein the first transistor is arranged in series in the primary current path between the first terminal and the second terminal;
a driver circuitry;
the driver circuitry comprising a voltage converter circuitry adapted to receive an input voltage derived solely from a voltage between the first terminal and the second terminal, and convert the input voltage to a releasably-stored voltage,
wherein the driver circuitry is configured to apply the releasably-stored voltage or a derivative voltage thereof as a gate voltage at the first gate relative to the first source;
wherein, when a first positive voltage and a normal current condition exist from the first terminal to the second terminal,
the first transistor is configured to pass current between the first terminal and the second terminal; and
wherein, when a second positive voltage and an overcurrent condition exist from the first terminal to the second terminal,
the driver circuitry is configured to drive the first transistor into blocking depletion mode by applying the releasably-stored voltage or the derivative voltage thereof as the gate voltage; and
wherein the device is configured to pass current during normal current conditions, and to substantially block current during overcurrent conditions.

Additional embodiments relate to devices for protecting a circuit having a primary current path from a overcurrent condition, comprising:

a first terminal and a second terminal configured to route the primary current path through the device;
a first transistor comprising a first gate, a first drain, and a first source;
wherein the first transistor is a depletion mode, normally-on transistor;
wherein the first transistor is arranged in series in the primary current path between the first terminal and the second terminal;
a driver circuitry;
the driver circuitry comprising a voltage converter circuitry adapted to receive an input voltage derived solely from a voltage between the first terminal and the second terminal, and convert the input voltage to a releasably-stored voltage,
wherein the driver circuitry is configured to apply the releasably-stored voltage or a derivative voltage thereof as a gate voltage at the first gate relative to the first source;
wherein, when a first positive voltage and a normal current condition exist from the first terminal to the second terminal,
the first transistor is configured to pass current between the first terminal and the second terminal; and
wherein, when a second positive voltage and a slight overcurrent condition exist from the first terminal to the second terminal,
the driver circuitry is configured to drive the first transistor into current-limiting mode by applying the releasably-stored voltage or the derivative voltage thereof as the gate voltage; and
wherein, when a third positive voltage and a severe overcurrent condition exist from the first terminal to the second terminal,
the driver circuitry is configured to drive the first transistor into blocking depletion mode by applying the releasably-stored voltage or the derivative voltage thereof as the gate voltage; and
wherein the device is configured to pass current during normal current conditions, to limit current during slight overcurrent conditions, and to substantially block current during severe overcurrent conditions.

Still other embodiments relate to devices similar to the foregoing devices, which devices further comprise a third terminal adapted to be placed in bifurcated electrical communication with the second terminal. The driver circuitry comprises a voltage converter circuitry adapted to receive an input voltage derived from a voltage between the second terminal and the third terminal and convert the input voltage to a releasably-stored voltage.

Additional embodiments relate to devices similar to the foregoing devices, further comprise a third terminal and a fourth terminal adapted to be placed in bifurcated electrical communication with the primary current path. The driver circuitry comprises a voltage converter circuitry adapted to receive an input voltage derived from a voltage between the third terminal and the fourth terminal, and convert the input voltage into a releasably-stored voltage.

Other embodiments provide methods for protecting a circuit against an overcurrent condition, each method comprising:
providing a device having
　a first terminal and a second terminal, and
　a first transistor comprising a first gate, a first drain, and a first source;
　wherein the first transistor is a depletion mode, normally-on transistor;
　wherein the first transistor is arranged in series in a primary current path between the first terminal and the second terminal;
　wherein the device is configured to receive no auxiliary power;
placing the first terminal and the second terminal in series electrical communication in the circuit so that all current flowing in the circuit flows through or is blocked by the device;
when a non-zero voltage exists between the first terminal and the second terminal, converting the non-zero voltage to obtain a releasably-stored voltage;
　floating the releasably-stored voltage to obtain a floated voltage;
when an overcurrent condition exists between the first terminal and the second terminal,
　applying the floated voltage to the first gate to drive the first transistor into blocking depletion mode,
　thereby blocking substantially all current between the first terminal and the second terminal;
thereby protecting the circuit from the overcurrent condition.

Further embodiments relate to methods for protecting a circuit against an overcurrent condition, each method comprising:
providing a device having
　a first terminal and a second terminal, and
　a first transistor comprising a first gate, a first drain, and a first source;
　wherein the first transistor is a depletion mode, normally-on transistor;
　wherein the first transistor is arranged in series in a primary current path between the first terminal and the second terminal;
　wherein the device is configured to receive no auxiliary power;
placing the first terminal and the second terminal in series electrical communication in the circuit so that all current flowing in the circuit flows through or is blocked by the device;
when a non-zero voltage and an overcurrent condition exist between the first terminal and the second terminal,
　converting the non-zero voltage to obtain a releasably-stored voltage;
　floating the releasably-stored voltage to obtain a floated voltage;
　applying the floated voltage to the first gate to drive the first transistor into blocking depletion mode,
　thereby blocking substantially all current between the first terminal and the second terminal;
thereby protecting the circuit from the overcurrent condition.

Other embodiments relate to methods for protecting a circuit against an overcurrent condition, each method comprising:
providing a device having
　a first terminal and a second terminal, and
　a first transistor comprising a first gate, a first drain, and a first source;
　wherein the first transistor is a depletion mode, normally-on transistor;
　wherein the first transistor is arranged in series in a primary current path between the first terminal and the second terminal;
　wherein the device is configured to receive no auxiliary power;
placing the first terminal and the second terminal in series electrical communication in the circuit so that all current flowing in the circuit flows through or is limited by the device;
when a non-zero voltage exists between the first terminal and the second terminal,
　converting the non-zero voltage to obtain a releasably-stored voltage;
　floating the releasably-stored voltage to obtain a floated voltage;
when an overcurrent condition exists between the first terminal and the second terminal,
　applying the floated voltage to the first gate to drive the first transistor into current limiting mode,
　thereby limiting the current between the first terminal and the second terminal;
thereby protecting the circuit from the overcurrent condition.

Certain embodiments relate to methods for protecting a circuit against an overcurrent condition, each method comprising:
providing a device having
　a first terminal and a second terminal, and
　a first transistor comprising a first gate, a first drain, and a first source;
　wherein the first transistor is a depletion mode, normally-on transistor;
　wherein the first transistor is arranged in series in a primary current path between the first terminal and the second terminal;
　wherein the device is configured to receive no auxiliary power;
placing the first terminal and the second terminal in series electrical communication in the circuit so that all current flowing in the circuit flows through or is blocked by the device;
when a non-zero voltage and an overcurrent condition exists between the first terminal and the second terminal,
　converting the non-zero voltage to obtain a releasably-stored voltage;
　floating the releasably-stored voltage to obtain a floated voltage;
　applying the floated voltage to the first gate to drive the first transistor into current limiting mode,
　thereby limiting the current between the first terminal and the second terminal;
thereby protecting the circuit from the overcurrent condition.

Still other embodiments relate to methods for protecting a circuit against an overcurrent condition, each method comprising:
providing a device having
　a first terminal and a second terminal,
　and a first transistor comprising a first gate, a first drain, and a first source;
　wherein the first transistor is a depletion mode, normally-on transistor;

wherein the first transistor is arranged in series in a primary current path between the first terminal and the second terminal;
wherein the device is configured to receive no auxiliary power;
placing the first terminal and the second terminal in series electrical communication in the circuit so that all current flowing in the circuit flows through or is blocked by the device;
when a non-zero voltage and an overcurrent condition exist between the first terminal and the second terminal,
autocatalytically converting the non-zero voltage to obtain a releasably-stored voltage;
floating the releasably-stored voltage to obtain a floated voltage;
applying the floated voltage to the first gate to drive the first transistor into blocking depletion mode,
thereby blocking substantially all current between the first terminal and the second terminal;
thereby protecting the circuit from the overcurrent condition.

Still other embodiments of the present invention relate to methods similar to the foregoing methods in which the device comprises a first terminal and a second terminal in the primary current path, and a third terminal placed in bifurcated electrical communication with the second terminal. A voltage between the second terminal and the third terminal is converted to obtain a releasably-stored voltage, or autocatalytically converted to obtain a releasably-stored voltage, as the case may be, ultimately to allow, limit, or block current through the device in accordance with the foregoing methods. Once the current is limited or blocked, resetting to allowing full or limited (from blocking) current may be determined from other points in the circuit, such as between the first terminal and one or both of the second and third terminals, in some cases.

Still additional embodiments of the present invention relate to methods similar to the foregoing methods in which the device comprises a first terminal and a second terminal in the primary current path, and a third terminal and a fourth terminal placed in bifurcated electrical communication with the primary current path. A voltage between the third terminal and the fourth terminal is converted to obtain a releasably-stored voltage, or autocatalytically converted to obtain a releasably-stored voltage, as the case may be, ultimately to allow, limit, or block current through the device in accordance with the foregoing methods. Once the current is limited or blocked, resetting to allowing full or limited (from blocking) current may be determined from other points in the circuit, such as between the first terminal and one or more of the second, third, and fourth terminals, in some cases.

Yet additional embodiments provide voltage converter circuitry comprising:
a first input lead and a second input lead configured to receive an input voltage;
at least one output lead configured to deliver a converted voltage;
wherein the voltage converter circuitry is configured to convert the input voltage to the converted voltage autocatalytically.

Certain embodiments of the present invention relate to methods of autocatalytically converting an input voltage into a converted voltage, each method comprising:
charging a plurality of capacitors flexibly configured in parallel electrical communication with the input voltage;
switching the plurality of capacitors so the plurality of capacitors is flexibly configured in series electrical communication to provide the converted voltage;
wherein the converted voltage or a portion thereof drives at least some of the switching, thereby autocatalytically converting the input voltage to the converted voltage.

Certain other embodiments of the present invention involve devices that provide an oscillator to facilitate the operation of one or more components. Oscillations can occur at one or at more than one frequency. As described herein, those oscillations can be controlled and applied usefully to protect circuits from sustained overcurrent conditions, for example, by modulating extended use voltage converters and/or extended use voltage floaters, described below.

Further embodiments relate to methods of manufacturing the devices of the various embodiments of the present invention.

While the disclosure provides certain specific embodiments, the invention is not limited to those embodiments. A person of ordinary skill will appreciate from the description herein that modifications can be made to the described embodiments and therefore that the specification is broader in scope than the described embodiments. All examples are therefore non-limiting.

BRIEF DESCRIPTION OF THE DRAWINGS

FIG. 29 provides wiring diagrams depicting one embodiment of a parallel-to-series switched capacitor network 2900 charging in parallel (left side) and discharging in series (right side).

FIG. 30 provides wiring diagrams depicting one embodiment of a parallel-to-series switched capacitor network 3000 charging in parallel (left side) and discharging in series (right side).

FIG. 31 provides wiring diagrams depicting one embodiment of a parallel-to-series switched capacitor network 3100 charging in parallel (left side) and discharging in series (right side).

FIG. 32 provides wiring diagrams depicting one embodiment of a parallel-to-series switched capacitor network 3200 charging in parallel (left side) and discharging in series (right side).

FIG. 49 provides a wiring diagram for two transistors 4551, 4552 that can be configured to block overcurrent in an alternating current environment.

FIG. 50 provides a wiring diagram for two transistors 4551, 4552 and rectifier bridge 4640 that can be configured to block overcurrent in an alternating current environment.

DETAILED DESCRIPTION

Figure 1:
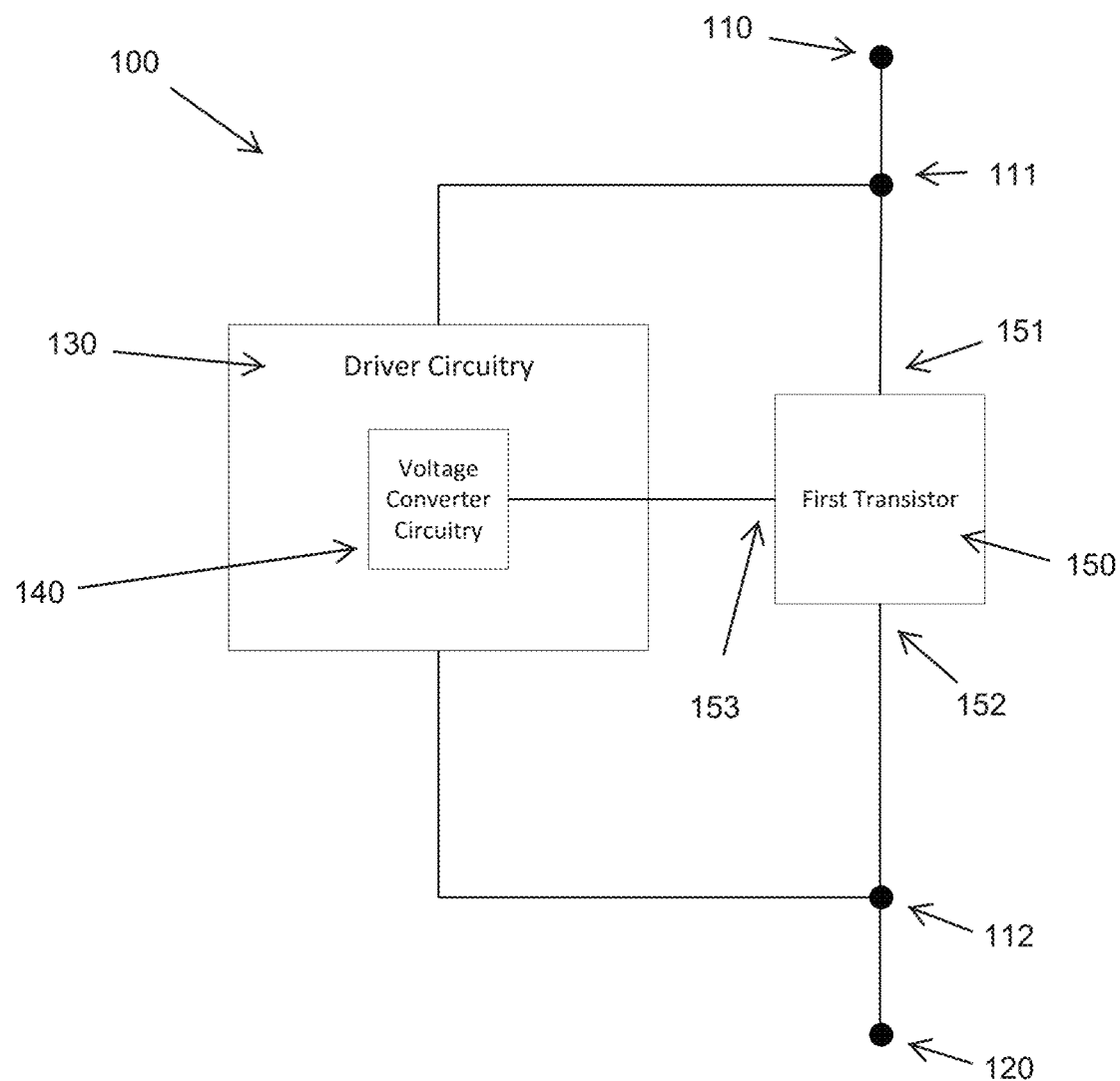
FIG. 1 conceptually depicts one embodiment of the invention comprising device 100 having driver circuitry 130 controlling first transistor 150.

As required, detailed embodiments of the present invention are disclosed herein; however, it is to be understood that the disclosed embodiments are merely exemplary of the invention that may be embodied in various forms. The figures are not necessarily to scale, and some features may be exaggerated to show details of particular components. Therefore, specific structural and functional details disclosed herein are not to be interpreted as limiting, but merely as a basis for the claims and as a representative basis for teaching one skilled in the art to variously employ the present invention.

Unless defined otherwise, all technical and scientific terms used herein have the same meaning as is commonly understood by one of ordinary skill in the art to which this disclosure belongs. In the event that there is a plurality of definitions for a term herein, those in this section prevail unless stated otherwise.

Where ever the phrase "for example," "such as," "including" and the like are used herein, the phrase "and without limitation" is understood to follow unless explicitly stated otherwise. Similarly "an example," "exemplary" and the like are understood to be non-limiting.

The term "substantially" allows for deviations from the descriptor that don't negatively impact the intended purpose. Descriptive terms are understood to be modified by the term "substantially" even if the word "substantially" is not explicitly recited.

The term "about" when used in connection with a numerical value refers to the actual given value, and to the approximation to such given value that would reasonably be inferred by one of ordinary skill in the art, including approximations due to the experimental and or measurement conditions for such given value.

The terms "comprising" and "including" and "having" and "involving" (and similarly "comprises", "includes," "has," and "involves") and the like are used interchangeably and have the same meaning. Specifically, each of the terms is defined consistent with the common United States patent law definition of "comprising" and is therefore interpreted to be an open term meaning "at least the following," and is also interpreted not to exclude additional features, limitations, aspects, etc. Thus, for example, "a device having components a, b, and c" means that the device includes at least components a, b and c. Similarly, the phrase: "a method involving steps a, b, and c" means that the method includes at least steps a, b, and c.

Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to."

Any discussion of the prior art throughout the specification should in no way be considered as an admission that such prior art is widely known or forms part of common general knowledge in the field.

It is an object of the present invention to overcome or ameliorate at least one of the disadvantages of the prior art, or to provide a useful alternative.

As stated above, certain embodiments provide a device for protecting a circuit having a primary current path from a overcurrent condition, comprising:
a first terminal and a second terminal configured to route the primary current path through the device;
a first transistor comprising a first gate, a first drain, and a first source;
wherein the first transistor is a depletion mode, normally-on transistor;
wherein the first transistor is arranged in series in the primary current path between the first terminal and the second terminal;
a driver circuitry;
the driver circuitry comprising a voltage converter circuitry adapted to receive an input voltage derived solely from a voltage between the first terminal and the second terminal, and convert the input voltage to a releasably-stored voltage, wherein the driver circuitry is configured to apply the releasably-stored voltage or a derivative voltage thereof as a gate voltage at the first gate relative to the first source;

wherein, when a first positive voltage and a normal current condition exist from the first terminal to the second terminal, the first transistor is configured to pass current between the first terminal and the second terminal; and wherein, when a second positive voltage and an overcurrent condition exist from the first terminal to the second terminal, the driver circuitry is configured to drive the first transistor into blocking depletion mode by applying the releasably-stored voltage or the derivative voltage thereof as the gate voltage; and wherein the device is configured to pass current during normal current conditions, and to substantially block current during overcurrent conditions. Further embodiments merely limit the current during an overcurrent condition; still further embodiments limit or block the current depending on the severity of the overcurrent condition.

As used herein, a "circuit," as in the circuit to be protected by various embodiments of the present invention, indicates either a complete electrical circuit or a useful portion thereof, or indeed any path that could conduct a dangerous amount of electrical energy. It is contemplated that a device of the present invention can protect an entire circuit or just a portion thereof, by blocking overcurrent from reaching the circuit or the protected portion thereof that would travel a path through the device. One or more devices of the present invention can be imposed in that path. Similarly, a sensitive composition, machine, media, or other item that needs protection can employ a device of the present invention to guard against electrical damage or collateral damage such as explosions triggered by static electricity discharge.

As used herein, the "primary current path" in the protected circuit represents a single path through which current must pass, such that if a device imposed in that path opens the circuit or blocks current through that path, substantially no current will flow in the circuit. Sometimes, a device of the present invention can protect a portion of a larger circuit; that portion is the circuit to be protected. Within the devices of the present invention, the primary current path represents a low resistance path between the first terminal and the second terminal. In many embodiments, the low resistance path has only a transistor imposed in series in that primary current path within the device. That means the current flowing between the first terminal and the second terminal also flows through the drain and the source of the first transistor. In some cases, a plurality of transistors appears in the primary current path within the device; each transistor is in parallel electrical communication with the other transistors in the plurality. That means all of the drains are in parallel with each other, all of the sources are in parallel with each other, and all of the gates are in parallel with each other. In those cases having a plurality of transistors all in parallel with each other, a very low resistance can be imposed by the device on the circuit. In some cases, as explained herein, all of the drains can be in direct parallel electrical communication with each other, and all of the sources can be in direct parallel electrical communication with each other. That means the drains are electrically connected to each other and experience the same potential, and the sources are electrically connected to each other and experience the same potential.

As used herein, "parallel" or "parallel electrical communication" indicates that identified components are configured in parallel within the device, either permanently by hardwiring or variably or "flexibly" such as allowed by the use of transistors or diodes that can switch a component's configuration. Similarly, "series" or "series electrical communication" indicate that identified components are configured in series within the device, either permanently by hardwiring or variably or "flexibly" such as allowed by the use of transistors or diodes that can switch a component's configuration. Sometimes, for example as in the case of parallel-to-series switched capacitor networks, certain components may be configured in parallel under certain conditions, and then are switched to series under other conditions.

Applicant has discovered that monitoring current, voltage, or other electrical information outside of the primary current path of a circuit to be protected can advantageously allow the protection of that circuit. Accordingly, certain embodiments of the present invention have a third terminal, or a third terminal and a fourth terminal, for such "bifurcated" monitoring. In some cases, a third terminal is adapted to be placed in bifurcated electrical communication with the second terminal. That means that, within the device of the present invention, circuitry branches off from the primary current path just before the second terminal. This circuitry introduces a means for monitoring a parameter that relates to the electrical current condition of the primary current path when the first terminal and second terminal are placed in series with a circuit to be protected. That parameter could be an impedance, such as a resistance, an inductance, or a capacitance, or a combination thereof, or a voltage, a current, or even a rate of change of any of the foregoing. In certain cases, the voltage drop, current, or other behavior across or through an impedance, usually measured as an input voltage, can be monitored for information about the electrical current condition in the primary current path between the first terminal and the second terminal. In other cases, a device of the present invention comprises a third terminal and a fourth terminal adapted to be placed in bifurcated electrical communication with the primary current path. In such cases, the third terminal and fourth terminal can be placed in electrical communication with any suitable component that provides information about the electrical current condition in the primary current path. When that information indicates the emergence of an overcurrent condition, the device can respond accordingly to limit or block the current in the primary current path. The component between the third terminal and fourth terminal can represent one or more discrete elements, such as for example resistors, capacitors, diodes, inductors, transformers, and combinations thereof; and the information provided to the third terminal and the fourth terminal can include any suitable information such as, for example, voltage drop, current, a rate of change in voltage or current, and the like, usually measured as an input voltage.

Accordingly, "bifurcated electrical communication" indicates an electrical relationship with the primary current path suitable for determining whether the primary current path should be one or more of allowed, limited, blocked, and reset.

It can be advantageous to employ autocatalytic voltage conversion in some instances of "bifurcated" monitoring. That is because the limiting or blocking of current in the primary current path may limit the power available to the bifurcated path. Autocatalytic voltage conversion would carry the conversion, once begun, to conclusion. Further, it can be advantageous to switch from "bifurcated" monitoring of electrical current conditions, during normal current conditions and the onset of an overcurrent condition, to another arrangement in additional instances: once the first transistor or plurality of primary transistors limit or block the primary current path and the bifurcated path involving the third terminal and/or fourth terminal loses power, another source of power and information about the electrical current conditions, such as the voltage drop between the first terminal and one or more of the second, third, and fourth terminals, should be available in those instances. That source of power and information can be used to maintain the device in current limiting mode or blocking depletion mode, send the device from limiting mode into blocking depletion, or to reset the device to allow limited or full current flow.

Driver circuitry can include any suitable circuitry useful for applying a voltage to the gate of a transistor as a gate voltage. Often, driver circuitry as used herein indicates the driver circuitry for the first gate of the first transistor. In some cases, the driver circuitry applies a voltage as the gate voltage at all times, and the voltage changes as the circumstances require. In other cases, the driver circuitry applies a voltage only during overcurrent conditions, and/or when driving or maintaining the transistor in current limiting mode or blocking depletion mode. Further cases allow the application of a gate voltage when driving the first transistor out of blocking depletion or current limiting mode. In still other cases, the driver circuitry comprises at least one switch, such as a switching transistor or a switching diode, which in certain instances prevents the driver circuitry from applying a gate voltage, while in other instances allows driver circuitry to apply a gate voltage.

As used herein, a "releasably-stored voltage" indicates a voltage that has been stored, temporarily or even instantaneously, that can be released or applied to do a useful task within the device. Often, one or more capacitors can be used to hold a releasably-stored voltage. In other cases, one or more inductors can be used to provide a releasably-stored voltage. For example, an inductor within the device under steady-state conditions can react to a sudden increase or decrease in current, and due to the characteristics of the inductor, provide a releasably-stored voltage that can throw a switch, for example, or begin driving the first transistor into blocking depletion mode, for another example.

A derivative voltage, such as, for example a derivative of the voltage across the first terminal and the second terminal, or a derivative of a releasably-stored voltage, indicates either a portion of the voltage or optionally an enhancement of the voltage or a portion thereof. So, in some cases, a voltage drop is employed by a voltage divider, for example, to perform more than one task. In other cases, the voltage being derived or a portion thereof, is converted, floated, or a combination thereof to provide the derivative voltage. Accordingly, a derivative voltage is not always merely a portion of the voltage being derived. Sometimes the derivative voltage can have a magnitude greater than the voltage being derived.

As used herein, "converting" a voltage indicates multiplication of that voltage by some number. A voltage converter can convert an input voltage by multiplying, reducing, inverting, or identifying, or a combination of two or more thereof, the input voltage. Multiplying indicates multiplying the voltage by a number, not necessarily an integer, greater than 1 or more negative than −1, to obtain some multiple of the voltage being converted. Reducing indicates dividing the voltage to obtain a fraction of the voltage being converted (or, mathematically speaking, multiplication of the voltage by some non-zero number between −1 and +1). Inverting indicates multiplying the voltage by a factor of −1. Identifying a voltage indicates multiplying the voltage by a factor of +1. Identifying is useful in certain instances to establish a releasably-stored voltage.

Floating, in contrast, indicates an arithmetic operation on a voltage. Voltage floating circuitry adds or subtracts a constant or variable amount to the voltage being floated. For example, if a capacitor holds a voltage, and that voltage is to be floated, that means both the positive terminal and the negative terminal of the capacitor are shifted by the same or similar amount, relative to some reference potential. Accordingly, "applying the floated voltage to the first gate to drive the first transistor into blocking depletion mode" necessarily implies that the voltage has been floated in an appropriate direction to create a voltage above the source for p-channel transistors, or a voltage below the source for n-channel transistors, for example. Then, the floated voltage is allowed to reach the gate, thereby driving the transistor into blocking depletion. In some cases, a floated voltage is a voltage floated beyond the source of the first transistor or plurality of transistors in parallel.

As used herein, a component is "configured" to perform some function if, under any circumstances, that component can perform that function. In some cases, a component will always perform a function under all circumstances for which the component is configured. In other cases, a component will perform a function for which it is configured only under certain circumstances, such as for example during an overcurrent condition.

Some devices of the present invention are configured to operate without any auxiliary power supply. That means no external source of energy, such as an independent power supply, and no independent internal source of energy, such as a battery, are provided. In other words, a device configured to operate without any auxiliary power supply derives all of its energy needs from the circuit to be protected. This means the energy needs are derived from a voltage drop and/or a current flowing between the first terminal and the second terminal, and no other leads (such as to ground) are employed, in certain instances. In other instances, where a third terminal is has been placed in bifurcated electrical communication with the second terminal, a voltage drop or other electrical behavior obtained between the second terminal and the third terminal provides the energy needs for the device. Still further instances involve devices having a third terminal and a fourth terminal placed in bifurcated electrical communication with the primary current path. In such instances, if the circuit to be protected still provides all of the energy needs of the device, then it can be said that the device is configured to operate without any auxiliary power supply. In some cases, thermal energy generated by current passing through the device can be harvested; because this thermal energy depends on the current flowing through the device as part of the circuit to be protected, that thermal energy is not "auxiliary." Similarly, other methods of controlling components can depend solely on the energy supplied by the protected circuit. For example, a light emitting diode in an optocoupler can trigger a photosensor into action; so long as the light emitting diode runs solely off of the energy supplied by the protected circuit at the first terminal and the second terminal, the device employs no auxiliary power. On the other hand, some embodiments receive all of their electrical energy solely from that supplied at the first terminal and the second terminal, and receive non-electrical auxiliary power from an independent source. Non-electrical auxiliary power can be any suitable energy, such as, for example, mechanical, thermal, light, electromagnetic, and combinations thereof. Other embodiments receive only electrical auxiliary power independent from the voltage drop across the device. In still other embodiments, auxiliary power is supplied by a battery, a thermal energy converter, a radio frequency converter, a light-to-electricity converter, an independent mains supply, or a combination thereof.

Some embodiments of the present invention provide a device wherein the device does not comprise an inductor. Other embodiments provide a device wherein the device does not comprise a transformer. Still other embodiments provide a device that does include an inductor, a transformer, or a combination thereof. Further embodiments provide a device wherein the device comprises no terminals other than the first terminal and the second terminal. Yet additional embodiments allow for one or more components to be plugged into a partial device to complete the device. For example, an end user can add components such as capacitors, resistors, and the like at various pins to customize the device to handle different expected circuit voltages and current loads. Accordingly, devices can comprise discrete components, or those components can be manufactured together in an integrated circuit. Or, a combination of integrated circuitry and discrete components can be used.

Certain embodiments provide devices configured so that, when the first positive voltage and the normal current condition exist from the first terminal to the second terminal, the first transistor is configured to operate in enhancement mode. In that way, some embodiments provide a first transistor having a very low resistance during normal current conditions.

Some instances provide driver circuitry further comprising at least one switch transistor and/or at least one switch diode configured to allow the driver circuitry to apply the gate voltage only during the overcurrent conditions. Similarly, other instances provide driver circuitry that further comprises at least one switch transistor and/or switch diode configured to allow the driver circuitry to apply the gate voltage only when driving or maintaining the first transistor in current limiting mode or blocking depletion mode. In certain cases, the at least one switch transistor comprises a pair of transistors in a push-pull configuration. Optionally, the pair of transistors comprises a pair of bipolar junction transistors in a totem pole configuration, or the pair of transistors comprises a pair of MOSFETs in a totem pole configuration. Still further instances provide driver circuitry that comprises a charge retention circuitry configured to selectively apply a retained charge as the gate voltage. Any suitable charge retention circuitry can be used. Optionally, the charge retention circuitry comprises a diode and a capacitor in series electrical communication, and the first gate is connected between the diode and the capacitor. In other cases, the charge retention circuitry comprises a charge retention transistor connected to the first gate. The charge retention transistor can be in series electrical communication with the first gate, which means that current charging the first gate flows through the drain and the source of the charge retention transistor. In some cases, the charge retention circuitry merely retains a charge, ready to apply it to the first gate as needed. In further cases, the charge retention circuitry applies a retained charge as the gate voltage, while other parts of the driver circuitry are busy with other functions such as converting voltage. Depending on circuit design, charge retention circuitry can apply a gate voltage for any suitable time, such as, for example, the length of time it takes for other portions of the device to take over managing the gate voltage.

Some embodiments of the present invention provide voltage converter circuitry that comprises a one-shot voltage converter. Any suitable one-shot voltage converter or converters can be used. As used herein, "one-shot" generally indicates a component that performs its function at an initiating phase, but then typically does not sustain that function. So, for example, a "one-shot voltage converter" delivers a converted voltage at an initiating phase, but does not repeat that function until the next initiating phase. Often, a one-shot voltage converter will operate at the beginning of an overcurrent condition, or at the beginning of the return to a safe current condition. They can be used to throw a switch transistor, for example, or to initially drive the first transistor into or out of blocking depletion mode or current limiting mode. Then, the one-shot voltage converter will not perform that function until the next event. Similarly, some embodiments provide voltage converter circuitry that comprises an extended-use voltage converter. An extended-use voltage converter provides sustained operation, such as, for example, for as long as an overcurrent condition exists, or for as long as the first transistor remains in blocking depletion mode, for another example. Any suitable technology can be used to provide the extended-use voltage converter. In some cases, the extended-use voltage converter relies on an oscillator. Optionally, the extended-use voltage converter using the oscillator further comprises an oscillator jump-start voltage converter, wherein the oscillator is configured to cause the extended-use voltage converter to provide the releasably-stored voltage only after the oscillator jump-start voltage converter provides the oscillator with an oscillator-triggering voltage. Once the triggering voltage enables the oscillator, the oscillator drives the extended-use voltage converter to continually supply a converted voltage sufficient to maintain the first transistor in blocking depletion mode or current limiting mode, as the case may be. In other cases, an oscillator is jumpstarted by the same jumpstart voltage converter that jumpstarts other portions of the device, such as, for example, driving the first transistor into blocking depletion. In some cases, voltage converter circuitry employs both a one-shot voltage converter and an extended-use voltage converter to provide for smooth operation. Still further embodiments provide a voltage converter circuitry that comprises a jump-start voltage converter. As used herein, a jump-start voltage converter indicates a voltage converter that responds very quickly to convert an input voltage. In some cases, a jump-start converter accompanies a slower voltage converter in a device. In other cases, a jump-start converter can convert a voltage to assist another converter. In certain instances, it can be very advantageous to very quickly convert a voltage to supply a releasably-stored voltage, so the device can quickly limit or block an overcurrent condition and protect the circuit. A jumpstart voltage converter can operate as a one-shot voltage converter, an extended use voltage converter, or both.

Without wishing to be bound by theory, it can be appreciated that when an overcurrent condition arises, limiting or blocking the harmful current as quickly as possible is important in certain cases. If the device uses no auxiliary power, in some cases it is the overcurrent condition itself that drives the operation of the device or components thereof. Accordingly, the time it takes to limit or block an emerging overcurrent condition may include the time it takes to charge a voltage converter (say, "$t_{chrg}$"), and the time it takes to convert the voltage (say, "$t_{conv}$"). If a jump-start voltage converter reacts quickly or has been primed during normal current conditions, it can assist the device to limit or block current while other portions of the device activate to respond to the overcurrent condition. In some cases, a jump-start voltage converter minimizes $t_{conv}$, making the time it takes to convert a voltage as short as possible.

Voltage converter circuitry can comprise any suitable components. In some cases, the voltage converter circuitry comprises a capacitor. Other embodiments of the present invention provide a device having voltage converter circuitry that comprises a switched capacitor network configured to convert the input voltage to the releasably-stored voltage. Suitable switched capacitor networks include, but are not limited to, parallel-to-series switched capacitor networks, Cockraft-Walton multipliers, Dickson charge pumps, and combinations thereof.

Any suitable number of capacitors can be employed in such a network, provided of course there are at least two capacitors. Any suitable switches can be employed in the network, such as, for example, diodes, n-channel transistors, p-channel transistors, and combinations thereof. In some cases, the switched capacitor network is configured to convert the input voltage to the releasably-stored voltage by multiplying the input voltage. In still other cases, the switched capacitor network is configured to convert the input voltage to the releasably-stored voltage autocatalytically. Still other cases provide a switched capacitor network that comprises: a plurality of capacitors that are configured to be charged by the input voltage and discharge to provide the releasably-stored voltage; and a plurality of transistors that, when in the "off" state configure the plurality of capacitors in parallel electrical communication, and when in the "on" state configure the plurality of capacitors in series electrical communication. In those cases, the switched capacitor network may be called a parallel-to-series switched capacitor network. Yet additional cases provide a parallel-to-series switched capacitor network that comprises: a plurality of capacitors that are configured to be charged by the input voltage and discharged to provide the releasably-stored voltage; and a plurality of diodes that, when forward biased, configure the plurality of capacitors in parallel electrical communication, and when reverse biased, configure the plurality of capacitors in series electrical communication.

As used herein, "autocatalytically" converting the voltage means that, as a voltage is converted by a series of components, the partially-converted voltage begins to drive its own conversion. In this way, the input voltage in the conversion process can change or even disappear, yet once begun, the autocatalytic conversion continues. Advantageously, in some cases, autocatalytic conversion of a voltage can proceed very rapidly, quickly yielding the converted voltage and driving the follow-on processes that need the converted voltage. In a few instances, autocatalytically converted voltages drive the first transistor into current limiting or blocking depletion mode, rapidly protecting the circuit from further damage. In addition, an autocatalytically-converted voltage quickly driving a transistor into blocking depletion mode can limit the damage of an overcurrent on the transistor, if the transistor were to linger in a partially-on state for long. In some embodiments, autocatalytic voltage conversion happens in a parallel-to-series switched capacitor network. As the capacitors are switched from parallel to series, the partially-converted voltage from those capacitors entering series configuration is used to drive the additional switching of the still-in-parallel capacitors. Once begun, in some cases, the autocatalytic conversion cannot be stopped. Accordingly, in certain cases, the voltage being converted is fed into the gates of the switching transistors, driving the further conversion. In still other cases, substantially all of the converted voltage is made available to the gates of the switching transistors.

It can be said, in some autocatalytic conversions of a voltage, the converted voltage is regeneratively connected or fed back to the conversion process so that the process accelerates and can proceed independently of the input voltage.

It can be useful to protect the components of an autocatalytic voltage converter. In some cases, the switches of the switched capacitor network are protected by the design of the network. The components such as capacitors, transistors and/or diodes, resistors, and other components can be chosen so as to avoid such a large converted voltage that the transistors or diodes are damaged during the conversion process. Often, since the converted voltage or a derivative voltage thereof will be used to drive the first gate, in some embodiments, the converted voltage need not be excessive to avoid damaging the first transistor or other circuit components. In addition, or alternatively, one or more diode-configured FETs can be used to regulate a converted voltage to approximately the threshold voltage of the FETs.

In some cases, it is important for the voltage converter circuitry in particular to respond quickly to changing conditions. Accordingly, certain embodiments provide voltage converter circuitry that is configured to convert the input voltage to the releasably-stored voltage within an overcurrent damage-limiting time. Any suitable time limit can be selected. The length of time depends on a number of factors, such as, for example the durability or delicate nature of the components of the circuit to be protected, the nature of the overcurrent conditions expected, and the normal operating power levels of the circuit. Suitable overcurrent damage-limiting times can be, for example, within 100 μs, within 10 μs, within 1 μs, within 100 ns, or within 20 ns.

With the techniques and circuits illustrated here, any suitable switched capacitor network can be employed alone or in combination in the various embodiments of voltage conversion circuitry herein. As used herein, input capacitors receive the input voltage or a derivative thereof, and an output capacitance receives the converted voltage or a derivative thereof. Flying capacitors transfer charge to other stages of the switched capacitor network. Thus, input capacitors that do this can be called flying capacitors herein. The parallel-configured input capacitors of a parallel-to-series switched capacitor network function as flying capacitors as they become series-configured. In general, the capacitors of the switched capacitor network are referred to herein as input capacitors, even if they could be called flying capacitors or function thereas. It will be understood by the skilled artisan, however, that other capacitors such as tank capacitors that do not function in the voltage conversion but rather supply current to the switched capacitor network, may also be employed. A tank capacitor, for example, is not an input capacitor as used herein. The output capacitance can be represented by a specific capacitor or capacitors that make available the converted voltage, the parasitic gate voltage of a transistor being driven by the converted voltage, charge storage capacitance, or a combination thereof.

When crafting a switched capacitor network and voltage converter circuitry for use with the present invention, one or more factors may be taken into account.

First, Inrush Current: To rapidly charge the input capacitors of the switched capacitor network, the network must be able to handle substantial inrush current. This is true, for example, when the ratio of the combined input capacitance to the output capacitance is greater than one. The small scale and power handling capabilities of currently-known charge pumps make high inrush currents impossible or damaging. High frequencies exacerbate those problems. Unconsidered attempts to provide protection against such inrush currents can create other problems such as voltage droop at the input. Voltage conversion efficiency also may degrade, since higher currents create higher voltage ripple. To increase inrush and speed up startup for a Dickson charge pumps, for example, one could initially short the negative plates of the input capacitor terminals to ground with a switch such as a transistor. This would rapidly charge those capacitors to the input voltage with the inrush current. Then the switch would be opened to stop the inrush current. Components of the voltage converter circuitry, for example, can be selected to handle higher than 400 mW power levels and also possess low impedance or otherwise exhibit low forward voltage drops when conducting.

Second, Capacitor Ratios: In some embodiments, the input capacitors have a larger capacitance relative to the output capacitor. When the ratio of the combined input capacitance to the output capacitance is greater than one, the number of clock cycles it takes to charge the output capacitor(s) may be reduced. However, in some circuitry the ripple voltage is proportional to that ratio, so that ratio conventionally has been kept low and less than one. Also, the output capacitance must be large enough to accommodate the load and unload transients, typically in excess of 2 µF. That suggests a larger input capacitance if the ratio is to be maintained as greater than one. In some cases, if the ratio of the combined input capacitance to the output capacitance is equal to or less than one, the other factors mentioned herein may be optimized. In certain instances, however, such optimization may not be sufficient without adjusting the ratio to obtain the performance desired. In other cases, the input capacitors can have decreasing capacitance, such as those suggested for an embodiment of FIG. 91. It so happens that the capacitances suggested for the embodiment of FIG. 91 have decreasing capacitance and meet the ratio being greater than one explained above. In some cases, the input capacitors are arranged from the input to the output to have decreasing capacitances. In further cases, the last input capacitor has a capacitance greater than the output capacitance. In still further cases, if the charge paths for the capacitor stages in the switched capacitor network are not identical, then the stage providing the highest inrush capability or fastest speed or lowest impedance path from the input to that stage has the largest capacitor. Accordingly, additional cases provide that the capacitance of each capacitor in a given stage is sized according to the stages before and after. The largest capacitor is placed where it is charged the easiest, the second-largest capacitor appears where it is charged the next easiest, and so on. Relative ease of charging can be indicated by the number of switches in the charging path, voltage drop to that stage, impedance to that stage, and the like.

Third, Output Current: The switched capacitor network must be able to output enough current to quickly charge the output capacitor where present. This may be impeded by high-output resistance, limits on the frequency of operation, the on-resistance of any internal switches within the network, and the equipment series resistance of the switched capacitors. Components of the voltage converter circuitry, for example, can be selected to handle higher than 400 mW power levels and also possess low impedance or otherwise exhibit low forward voltage drops when conducting. The magnitude of output current may be increased by, for example, adjusting the input capacitor to output capacitor ratio to a value greater than one so that most or all charge necessary to charge the output is transferred within a single clock cycle or pulse.

Figure 47:
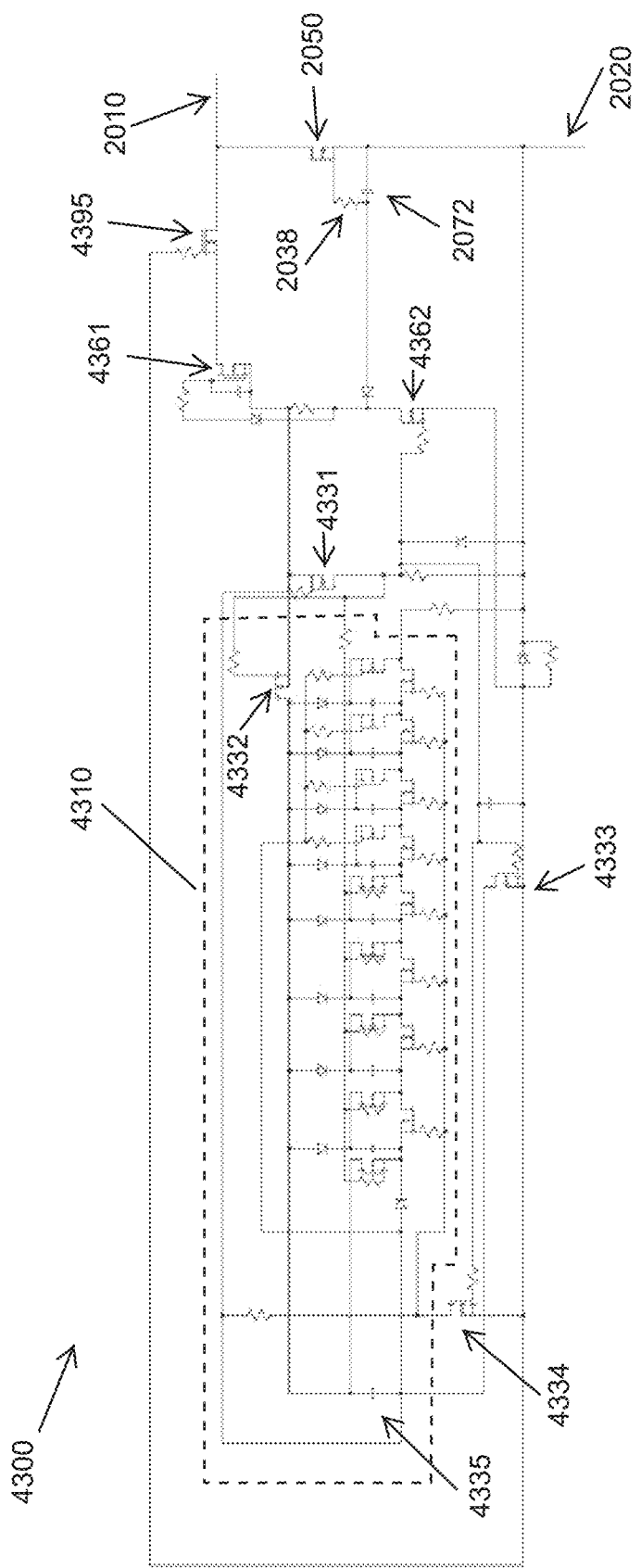
FIG. 47 provides wiring diagram of an additional embodiment, device 4300, employing a parallel-to-series switched capacitor network 4310.

Fourth, Voltage Droop: The switched capacitor network should deliver sufficient current without drooping the output voltage too low. The substantial increase in output resistance which may accompany multiple stages in a switched capacitor network may make it difficult or impossible to avoid a substantial voltage droop, however. Compensation for voltage droop would generally require the addition of more components which may cause other issues, such as, for example, start up delays. Voltage droop can be avoided in certain instances of the present invention by placing low impedance transistors in the charge and discharge paths. Where a multiplied or other higher voltage is available, those transistors can be driven into low impedance states. The transistor 4332 in FIG. 47 is configured this way.

Several efforts can be made to lower voltage droop in certain embodiments of the present invention. Primarily, components are chosen for low impedance incurring low voltage drops at the desired or expected current ranges. Low on-resistance transistors, Schottky diodes, and low-valued resistors (if any) can be mentioned. Low resistance may mean lower protection, however; a protective depletion-mode transistor can "umbrella" those components behind it if greater protection is desired. Secondarily, voltage droop can be mitigated by positively correlating capacitors' capacitance with expected currents. Higher capacitance capacitors are placed where higher currents are expected, and lower capacitance capacitors appear where lower currents are expected. This is manifested where capacitance values decrease from the input to the output. One surprising and unexpected effect of reducing capacitance along the switched capacitor network is a three-faceted advantage. The speed of voltage conversion increases with the need for fewer clock cycles for charging; the kind of voltage drops that characterize charge pumps also decrease; and, importantly for some embodiments, the current at each capacitor correlates with the capacitance of that capacitor. Accordingly, some embodiments of the present invention provide a switched capacitor network in which the capacitance is positively correlated with current. Positive correlation could indicate linear or non-linear matching of capacitance to current from stage to stage. Stages nearer to the input create, and can handle, higher currents since this is where larger capacitors (incidentally having lower equivalent series resistance) reside, and where fewer switches appear to create voltage drops. In the case of certain parallel-to-series switched capacitor networks, early stages are parallel-arranged capacitors having therefore a large capacitance for charging, and later stages are the same capacitors now arranged in series and thereby having a lower capacitance.

Fifth, High Frequency: In general, a higher frequency will cause the switched capacitor network to charge more quickly. This is significant when small input capacitors are being used to charge large capacitors downstream. However, most switched capacitor networks will have an optimum frequency above which efficiency drops. Higher frequencies can cause thermal dissipation issues especially at higher currents, decrease efficiency, or require large or expensive transistors. In some embodiments, a high-frequency oscillator can be provided in connection with the voltage converter circuitry, and a tank capacitor can be provided at the input or the output of the oscillator to supply current. In some cases, an oscillator operating at about 750 kHz or more can be employed. In other cases, an oscillator operating at least about 1 MHz, at least about 10 MHz, at least about 50 MHz, or at least about 100 MHz can be employed.

Certain embodiments relate to methods for decreasing the number of clock cycles required for a switched capacitor network to convert an input voltage to a converted voltage, comprising: arranging a plurality of input capacitors in order of decreasing capacitance from the input to the output, and charging each subsequent capacitor from the previous capacitor in the plurality of input capacitors. Other embodiments relate to methods for decreasing the frequency requirements of a switched capacitor network to convert an input voltage to an output voltage, comprising: arranging a plurality of input capacitors in order of decreasing capacitance from the input to the output, and charging each subsequent capacitor from the previous capacitor in the plurality of input capacitors. Any suitable switched capacitor network can be used. For example, either of those methods can be performed with a parallel-to-series switched capacitor network, in which the input capacitance is provided by the parallel-arranged capacitors, the flying capacitance represents the next stage formed by the series-arranged capacitors, and the flying capacitance is larger than the output capacitance.

Sixth, Pre-Output Start-Up Delay: As mentioned above, when an overcurrent condition arises, it may be important to convert an input voltage to drive the first transistor into blocking depletion mode quickly. Conventional oscillator circuitry may require some time to reach steady-state values due to the random nature of both input and output signals. Also, frequencies may exhibit voltage dependency with longer startups at lower voltages. Some instances of the present invention avoid the start-up delay issue by providing a switched capacitor network that does not rely on numerous clock cycles to achieve conversion.

Seventh, Protection of the Voltage Converter Circuitry: Voltage converter circuitry may have limited power handling capabilities and could be vulnerable to damage and other issues. Accordingly, some embodiments of the present invention provide overcurrent and overvoltage protection of the voltage converter circuitry. In one example, a current limiting resistor may limit the amount of current at the input of the switched capacitor network. However, such a resistor may cause a voltage droop at the input which may degrade performance and cause unpredictable behavior. In certain instances, for example, startup delay times may fluctuate widely, making circuitry performance difficult to predict. Accordingly, in some embodiments of the present invention, a depletion mode FET can be placed across the input to the switched capacitor network. The gate of that transistor can be placed directly across the protected circuit, or can be switched there by another switch such as a transistor. Alternatively, a transistor may be placed in series with a tank capacitor or other input capacitors to allow inrush current, but to cut off further current once the switched capacitor network is charged. Transistor 4332 in FIG. 47 serves this role.

Eighth, Input Voltage Rise Rate: Some conventional integrated circuits limit the rate at which input voltage increases. Such a limitation highlights the need for certain embodiments of the present invention. If such a limitation is required of the voltage converter circuitry, the startup time may increase by efforts to adhere to that limitation. Certain embodiments of the present invention do not have such limitation. In other embodiments, a hold up capacitor at the input, optionally with a resistor, can slow the rate of change in voltage at the input.

Ninth, Multiplication: Voltage multiplication typically takes a relatively long time. Moreover, conversion efficiency drops dramatically with the addition of further stages. For example, a cascade of three stages of a conventional charge pump may result in only a 1.4-fold increase in voltage, rather than the ideal three-fold increase.

Some embodiments of the present invention provide voltage floating circuitry. In some cases, the driver circuitry further comprising a voltage floating circuitry configured to float the releasably-stored voltage to obtain a floated voltage, wherein the driver circuitry is configured to apply the floated voltage or a derivative of the floated voltage as the gate voltage. Any suitable voltage floating circuitry can be used. In some cases, the voltage floating circuitry comprises a capacitor and at least one transistor. In further cases, the voltage floating circuitry comprises a pair of transistors arranged in a push-pull configuration. Still further cases provide voltage floating circuitry comprising a capacitor and a diode, wherein the capacitor's positive terminal is connected to the cathode of the diode, and the capacitor's negative terminal is connected to the anode of the diode. Additional cases provide voltage floating circuitry comprising a capacitor and a diode, wherein the capacitor's negative terminal is connected to the anode of the diode; further comprising a floater switch transistor configured to selectively connect the capacitor's positive terminal to the cathode of the diode, thereby selectively placing the capacitor in parallel with the diode. In still other cases, the cathode of the diode can be connected to the first source.

The voltage floating circuitry can be configured to operate under any desired conditions. In some cases, the voltage floating circuitry operates anytime a non-zero voltage appears across the first terminal and the second terminal. In other cases, the voltage floating circuitry is configured to float the releasably-stored voltage provided by the voltage converter circuitry only during overcurrent conditions. Further cases provide devices wherein the voltage floating circuitry is configured to float the releasably-stored voltage only when the driver circuitry is driving or maintaining the first transistor in current limiting mode and/or blocking depletion mode.

Certain instances of the present invention provide voltage floating circuitry that comprises a one-shot voltage floater, and the driver circuitry is configured to apply the floated voltage or the derivative of the floated voltage as the gate voltage only at the beginning of the overcurrent condition. Other instances provide voltage floating circuitry that comprises an extended-use voltage floater. Any suitable technology can be used to provide the extended-use voltage floater. In some cases, the extended-use voltage floater relies on an oscillator. Upon each oscillation, the oscillator prompts the extended-use voltage floater to float a releasably-stored voltage, such as by switching a pair of transistors in a push-pull, totem pole arrangement. Sometimes an oscillator output drives the extended use floater so that whether the floater circuity is actively producing a floated voltage depends on the state of the oscillator output. For example, in some cases an oscillator output drives a floater input, such as a BJT base or MOSFET gate, so that when the oscillator output is high, the floater circuit is configured to receive a releasably stored converted voltage, through for example a diode or any other switch, and when the oscillator output is low the floater circuit floats the converted voltage. In some cases when the oscillator output is high the floater circuit receives a capacitor as the releasably stored voltage, and the when the oscillator output is low the floater circuitry switches the capacitor to be in parallel with a diode so that the diode prevents capacitor discharge and also helps create a floated voltage.

Further embodiments provide a current monitoring circuitry for monitoring the current that passes through the device, or that would pass through the device if the first transistor were not in current limiting mode and/or blocking depletion mode. For example, some devices further comprise a current monitoring circuitry configured to monitor a current that would pass between the first terminal and the second terminal; and to configure the driver circuitry to drive the first transistor into current limiting mode and/or blocking depletion mode when the current represents overcurrent conditions. In another example, certain devices comprise a current monitoring circuitry configured to monitor a current that would pass between the first terminal and the second terminal by monitoring a voltage drop from the second terminal to a third terminal, and to configure the driver circuitry to drive the first transistor into current limiting mode and/or blocking depletion mode when that voltage drop represents overcurrent conditions between the first terminal and the second terminal. In some instances, the voltage drop appearing between the second terminal and third terminal may represent an overvoltage event in the protected circuit. It may therefore be said that the first transistor may protect the protected circuit against both overcurrents and overvoltages. As used herein, overvoltages are a kind of overcurrent condition. In a further example, other devices comprise a current monitoring circuitry configured to monitor a current that would pass between the first terminal and the second terminal by monitoring a voltage drop from a third terminal to a fourth terminal, and to configure the driver circuitry to drive the first transistor into current limiting mode and/or blocking depletion mode when that voltage drop represents overcurrent conditions between the first terminal and the second terminal. In some instances, the voltage drop appearing between the third terminal and fourth terminal may represent an overvoltage event in the protected circuit. It may be said, therefore, that the first transistor may protect the protected circuit against both overcurrents and overvoltage. As used herein, overvoltages are a kind of overcurrent condition. Current monitors can employ any suitable technology to monitor the current. For example, in some cases, the current monitoring circuitry monitors the current by measuring the voltage between the first terminal and the second terminal. Using the voltage to monitor the current is helpful when the current is blocked.

Yet additional embodiments provide devices having delay block timer circuitry configured to delay the driver circuitry from driving the first transistor into blocking depletion mode until the overcurrent condition is a sustained overcurrent condition. Other embodiments provide devices having delay limit timer circuitry configured to delay the driver circuitry from driving the first transistor into current limiting mode until the overcurrent condition is a sustained slight overcurrent condition. Any suitable components can be used to provide the delay block or delay limit timer circuitry. For example, in some cases, the delay block timer circuitry comprises a resistor and a capacitor in parallel with the first terminal and the second terminal.

Further embodiments provide a delay block integrator circuitry that measures the charge that flows through the device as an overcurrent condition arises. Once the charge reaches an unacceptable level, the delay block integrator circuitry causes the driver circuitry to drive the first transistor or parallel transistors into blocking depletion mode. Any suitable delay block integrator circuitry can be used. For example, a current representing the overcurrent can charge a capacitor. Once that capacitor reaches a preselected voltage representing the integrated charge that is due to the overcurrent condition, that capacitor can drive a transistor that allows the driver circuitry to drive the first transistor or parallel transistors into blocking depletion. The current representing the overcurrent can be provided by a constant current source, such as a transistor and a resistor in series with the capacitor, in one instance. In another instance, the current can be provided by a current mirror to charge the capacitor. Thus, blocking mode depends on the amount of energy represented by the overcurrent condition. In this way, a delay block integrator circuitry can mimic a traditional low melting-temperature wire fuse. Advantageously, however, delay block integrator circuitry improves on the traditional fuse, because the delay block integrator circuitry can be made independent of ambient temperature and/or the relative increase of current as the overcurrent condition arises. Traditional fuses, unfortunately, react more slowly if the ambient temperature is lower or if the overcurrent condition arises slowly. Delay limit integrator circuitry employing the same principles are possible in further instances of the present invention.

Still other embodiments provide circuitry to protect the gates of one or more transistors, such as the first gate of the first transistor. In some cases, gate protection circuitry is configured to reduce a gate voltage at a transistor in the device. This can be accomplished, for example, wherein the gate protection circuitry comprises a Zener diode. For another example, the gate protection circuitry may comprise a gate-protecting transistor and a gate resistor in series electrical communication between the gate of the gate-protecting transistor and the second terminal. In still other examples, a resistor provides gate protection circuitry.

Additional embodiments provide reset circuitry that allows the device to reset once the overcurrent condition has subsided. Thus, certain devices further comprise a reset circuitry such as a voltage level reset circuitry configured to configure the driver circuitry to drive the first transistor out of current limiting mode or blocking depletion mode when the overcurrent conditions no longer exist. Further devices also comprise a delay reset timer circuitry configured to delay the reset circuitry from operating until a safe current condition is a sustained safe current condition. A safe current condition, which follows an overcurrent condition, becomes a sustained safe current condition upon the passage of any suitable predetermined duration. Delay reset timer circuitry includes any suitable components, such as, for example one or more resistors and one or more capacitors.

Still other embodiments address the protection of very low power circuits, by providing a very low resistance device. For example, a first transistor or a plurality of transistors in parallel with each other can offer a very low resistance arrangement when allowing current through the device. However, due to manufacturing variability, that first transistor or the plurality of transistors might exhibit different resistances from device to device. To compensate for that, and to allow for greater device behavior predictability, certain embodiments provide a device further comprising a sense resistor arranged in series in the primary current path with the first transistor and between the first terminal and the second terminal. Further embodiments arrange the sense resistor in series between the first transistor and the second terminal. Any suitable resistance can be chosen for the sense resistor. In some cases it is 1×, 1.5×, 2×, 5×, or 10× greater than the expected resistance of the first transistor or of the plurality of transistors in parallel with each other. In other cases, it is 0.9×, 0.5×, 0.1×, 0.01×, or 0.001× lower than the expected resistance of the first transistor or of the plurality of transistors in parallel with each other. In certain cases, the input voltage can be obtained across the first transistor or plurality of transistors, the sense resistor, or a combination thereof.

Speaking of a plurality of transistors in parallel with each other, some embodiments provide a device further comprising one or more transistors, each transistor of the one or more transistors having a drain in direct parallel electrical communication with the first drain, a source in direct parallel electrical communication with the first source, and a gate in parallel electrical communication with the first gate. As used herein, "direct" parallel electrical communication, means that two points are connected and experience the same potential. So when a transistor's drain is in direct parallel electrical communication with the first drain, both drains are at the same potential, and configured in parallel. The gate being in parallel electrical communication with the first gate allows an optional resistor, for example, to be placed in series before the gate to protect the gate. If an optional component such as a resistor appears before the gate, the gate is not in "direct" parallel electrical communication with the first gate.

Still other embodiments provide a second transistor in series with the first transistor. Accordingly, certain embodiments provide a device further comprising a second transistor having a second gate, a second drain, and a second source, wherein the second transistor is arranged in series in the primary current path with the first transistor and between the first terminal and the second terminal; wherein the second transistor exhibits a lower gate capacitance than the first transistor, and the second transistor is configured so that a voltage drop across the second drain and the second source is applied to the first gate.

Further embodiments allow for a device further comprising a second transistor in series with the first transistor and optionally in electrical communication with a rectifier bridge, adapted to protect a circuit from overcurrent conditions in an alternating current environment.

Certain embodiments provide just the first transistor imposed in the primary current path.

Still other embodiments provide a temperature responsive element arranged in series in the primary current path with the first transistor and between the first terminal and the second terminal. Any suitable temperature responsive element can be used, such as, for example, positive temperature coefficient thermistors, negative temperature coefficient thermistors, and polymeric positive temperature coefficient devices. Positive temperature coefficient components can be configured to limit and block current above a predetermined temperature threshold. Negative temperature coefficient components can be configured to trigger useful circuitry in the device when the temperature, such as may be due to increased current, rises. Using a transistor in series with a positive temperature coefficient component offers several advantages, in several embodiments. The predetermined durations for limiting, blocking, and resetting can be adjusted; limiting and blocking can transition very quickly; high voltages can be blocked, and the device can serve high current circuits, for example. Also, resetting a triggered positive temperature coefficient device can be less problematic when used with the first transistor in series. In some cases, a temperature responsive element receives its thermal energy (beyond just ambient temperature) solely from the device, and does not use any auxiliary power. In other cases, a temperature responsive element receives at least some significant thermal energy (more than just ambient temperature) from an auxiliary source outside the device, such as, for example, heat generated by current flowing through the protected circuit, or from a dedicated thermal energy source.

As used herein, "blocking depletion" indicates that the transistor has moved into depletion beyond its threshold voltage ($V_{TH}$), and is substantially non-conductive between its source and its drain. To the extent that "depletion" can include a conductive state between the threshold or pinch-off voltage and the beginning of enhancement mode behavior, such conductive state is excluded from "blocking depletion." The point of the present invention is to protect circuitry from harmful overcurrent conditions, and some embodiments accomplish that by placing certain transistors into blocking depletion mode. Other embodiments place certain transistors into current limiting mode. "Current limiting mode" can be obtained by applying a gate voltage on the transistor that is less than $|V_{TH}|$, that is, less than the magnitude of the threshold voltage for that transistor. In some cases, current limiting mode is obtained by applying a gate voltage on the transistor that is less than $0.999*|V_{TH}|$, $0.5*|V_{TH}|$, or $0.1*|V_{TH}|$.

Some embodiments of the present invention comprise at least one "primary" transistor in series with two terminals of the device. That means the source and the drain of the primary transistor or transistors are in electrical communication and imposed in the primary current path of the device, and that transistor functions to allow, limit, or block current through the device. That device is then placed in series in the circuit to be protected, allowing for the complete blockage of the current in some cases. Of course, more than two transistors can be used, if desired. Additionally, further transistors can be used in a device of the present invention for purposes other than directly allowing or blocking current. Moreover, the first terminal and the second terminal can be used to impose the device comprising the primary transistor into series electrical communication with the circuit to be protected.

Other embodiments of the present invention comprise at least one "primary" transistor in series with two terminals of the device, and the device comprises a third terminal or a fourth terminal. In such devices, the first terminal and the second terminal define a primary current path of the device, and the primary transistor or transistors are configured to allow, limit, or block current through the device. Devices with three terminals or four terminals employ the additional terminals advantageously to monitor conditions, as will be illustrated herein.

It also can be said that in certain embodiments of the present invention, the primary transistor is arranged so that its "blocking end" is electronically closer to the first terminal, or the terminal of greater electrical potential in a DC-compatible device. For an n-channel transistor, the drain is the blocking end; for a p-channel transistor, the source is the blocking end. In the case of a symmetrical transistor, such as, for example a low-power p-channel JFET, either end of the transistor can be considered the blocking end. In some cases, bi-directional transistors such as certain gallium nitride ("GaN") FETs can be used, that can block current flowing from either direction. It can be said that certain bi-directional transistors do not contain an intrinsic body diode. In conventional field effect transistors, the intrinsic body diode prevents the transistor from effectively blocking current in both directions.

Further embodiments of the present invention provide the voltage at the gate of the primary transistor is controlled such that the transistor is biased toward or into enhancement mode during normal current conditions. For those embodiments that do not rely on an auxiliary power source to bias the gate, after a time the gate will have no bias if the device is "unplugged," or there is no current or potential in the circuit to be protected. In other words, the gate voltage is harvested from the potential drop from the first terminal to the second terminal.

Several embodiments provide that the voltage across the primary transistor (or, more broadly, the device) is monitored for an overcurrent condition. In certain instances, the voltage across the transistor or the device will indicate that the current passing through the device will exceed a predetermined threshold. In some cases, the overcurrent condition must be a sustained overcurrent condition, which means the current passing through the device exceeds a predetermined threshold for a predetermined duration. Any suitable predetermined threshold can be chosen. The unsafe current level selected for the predetermined threshold can depend on any suitable factors, such as, for example, the normal expected current load for the circuit to be protected; the sensitivity of the components of the circuit to increased current; and the desired level of protection sought. For example, the predetermined threshold can be 1.5 times, two times, five times, 10 times, 50 times, or 100 times the normal expected current load for the circuit to be protected. For another example, the preselected threshold can be 500 mA, 1 A, 5 A, 10 A, 50 A, 100 A, 500 A, 1000 A, 10,000 A, or 100,000 A. For another example, the predetermined threshold can be expressed in terms of voltage, such as for example, 100 mV, 200 mV, 400 mV, 500 mV, 1 V, 5 V, 10 V, 50 V, 100 V, 500 V, 1000 V, 10,000 V, or 100,000 V. Overcurrent conditions therefore may be expressed as including overvoltages and overvoltage events. Normal current conditions, in some cases, can be considered to be current and/or voltage within the predetermined threshold(s). In some cases, a non-harmful current would flow through the device, but no current is flowing, perhaps because the device is in blocking depletion mode due to a just-concluded overcurrent event. The condition in those cases can be referred to as a safe current condition. Certain embodiments wait until the safe current condition represents a sustained safe current condition before the device resets to allow current. A safe current condition exists when the voltage across the device would allow a current within a predetermined threshold to flow, and that condition has existed for a predetermined duration. In other cases, normal current conditions can be considered to be current and/or voltage within the predetermined threshold(s), and the absence of a recent overcurrent condition. Similarly, overcurrent conditions exist when the current and/or voltage exceed the predetermined thresholds. Sustained overcurrent conditions exist when the current and/or voltage exceed those thresholds for a predetermined duration. Predetermined thresholds for voltage and current, and predetermined durations, can be alike or different. For example, the threshold voltage or current for triggering the blocking of current can be the same as, greater, or lesser than the threshold voltage or current for resetting the device to allow current to flow again. Similarly, the predetermined duration for blocking current can be shorter, the same, or longer than the predetermined duration for resetting the device and allowing current to flow again.

The predetermined duration can be any suitable length of time. In some cases, the purpose of requiring a duration of an overcurrent condition is to avoid blocking current due to relatively-harmless nuisance spikes that pose no real danger to the circuit to be protected. Suitable lengths of time for the predetermined duration include, but are not limited to, 10 microseconds, 100 microseconds, one millisecond, 5 ms, 10 ms, 100 ms, one second, five seconds, 10 seconds, 30 seconds, and one minute. Once an overcurrent event, or optionally a sustained overcurrent event, is detected, the device will block current through the device, in some embodiments. This is accomplished in several instances of the present invention by applying a voltage to the gate of the primary transistor to drive that transistor into blocking depletion mode to decrease its conductivity.

Similarly, still other embodiments allow the device to "reset" after an overcurrent event, so the device will resume passing current. Any suitable method of resetting the device can be used. Powering down the circuit to be protected, manually resetting the device, automatic resetting, remote signal resetting, or a combination thereof, can be used. In some cases, the device resets after the current that would flow through the device returns to a safe level. That safe level can be any suitable current, such as below the first preselected threshold or a second preselected threshold that is higher or lower than the first preselected threshold. Moreover, the device can reset after the current that would flow through the device returns to a safe level for a second predetermined duration. Suitable lengths of time for the second predetermined duration include, but are not limited to, one millisecond, 5 ms, 10 ms, 100 ms, one second, five seconds, 10 seconds, 30 seconds, and one minute. The current that would flow through the device can be determined from the voltage drop from the first terminal to the second terminal, in some cases. In other words, the device can be reset based on the voltage drop from the first terminal to the second terminal. Or, other instances provide that the device can be reset based on the voltage drop across the one or more primary transistors. The voltage at which the device resets can be any suitable voltage, such as, for example below a preselected reset voltage. Any suitable preselected reset voltage can be chosen, such as for example, 0 V, 500 mV, 1 V, 5 V, 10 V, 50 V, 100 V, 500 V, 1000 V, 10,000 V, or 100,000 V.

Further embodiments provide gate protection circuitry. Nonlimiting examples thereof appear in FIG. 11, described below. Gate protection circuitry can be configured to limit gate voltages to predetermined ranges. Any suitable predetermined range can be used. In some cases, a suitable predetermined range does not exceed a certain voltage considered to be unsafe for the transistor(s) being protected. Certain instances provide a gate-to-source voltage that is no greater than about 1 V, about 10 V, about 50 V, about 100 V, or about 1000 V. It is to be appreciated that negative voltages also can be limited to a negative suitable predetermined range of a magnitude that is the same as or different from the predetermined range for positive voltages. The predetermined ranges for the first transistor and any other transistor enjoying gate protection can be independently selected.

Certain embodiments of the present invention provide a device that requires no auxiliary power. This can be particularly advantageous, because such a device will tend to be more reliable than a device that requires its own power supply. Accordingly, some instances provide a device that is self-driven, that is, the device derives all of its power needs from the circuit to be protected. Further instances provide a device that has only two terminals. Such a device can be inserted in series with a circuit to be protected, and no further efforts need be undertaken to provide additional power to that device.

Additional embodiments of the present invention provide devices having at least one "primary" transistor, wherein the transistor is a depletion mode, normally-on transistor. In some cases, the first transistor has a negative gate threshold characteristic. A negative gate threshold characteristic means that the pinch-off voltage for that transistor occurs below 0 V. In further cases, the first transistor has a positive gate threshold. A positive gate threshold characteristic means that the pinch-off voltage for that transistor occurs above 0 V. For example, the first transistor can be an n-channel, depletion mode, normally-on transistor. The first transistor has a first gate, a first drain, and a first source; the first drain would be in electrical communication with the first terminal. The potential at a gate is determined by the voltage difference of the gate minus the source. As can be appreciated, that difference can yield a positive or negative value.

Additional instances of the present invention comprise gate drive circuitry. Any suitable gate drive circuitry can be used, such as, for example, the switch transistors 2061, 2062 in FIG. 23. Many other gate drive circuitries are possible, such as those known in the art for biasing the gates of various transistors. For example, active output, push-pull, complimentary pair, BJT totem pole, and MOSFET totem pole configurations can be mentioned.

As used herein, Vgs=gate-to-source voltage, Vds=drain-to-source voltage, and $V_{TH}$=threshold voltage. Some embodiments of the present invention provide a transistor operating substantially in enhancement mode during normal current conditions. If the transistor is an enhancement mode transistor, this means that the gate to source voltage in enhancement mode is of the same polarity as the threshold voltage (Vth) of that transistor. If the transistor is a depletion mode transistor, this means that the gate to source voltage in enhancement mode is opposite in polarity compared to the polarity of $V_{TH}$. For example, enhancement mode for an n-channel enhancement metal oxide semiconductor field-effect transistor ("MOSFET") is achieved when Vgs is positive, so it is of the same polarity as $V_{TH}$. For an n-channel depletion MOSFET enhancement mode is achieved when Vgs is positive and that is of opposite polarity as $V_{TH}$. So for a fixed Vds, a transistor operating in enhancement mode will exhibit significantly lower impedance between its drain and source than would be exhibited in depletion mode. For a transistor to be considered fully enhanced, or fully in enhancement mode, the gate to source voltage must reach a sufficient magnitude and be of the correct polarity, call it Vfull. Certain embodiments provide that a transistor operating substantially in enhancement mode is fully in enhancement mode. In other cases, operating substantially in enhancement mode means that Vgs is at least 99%, 90%, 80%, 50%, 25%, 10%, 1%, or 0.1% of Vfull. Similarly, some embodiments of the present invention provide a transistor operating in blocking depletion mode. For an enhancement mode transistor, this means that the gate to source is of the opposite polarity as the threshold voltage of that transistor ($V_{TH}$), or that the gate to source voltage is substantially equal to zero. If the transistor is instead a depletion mode transistor, this means that the gate to source voltage is of the same polarity as $V_{TH}$. For a depletion mode transistor to substantially block all current flowing between its drain and source, the transistor gate must be driven close to or beyond $V_{TH}$.

A transistor is in series in the primary current path if current flowing between a first terminal and a second terminal of a device would flow through the transistor, namely between its drain and its source. For transistors employed in an alternating current environment, a transistor is in series in the primary current path if current flowing between a first terminal and a second terminal of a device would flow through the transistor during at least one of the positive cycle and the negative cycle. In several embodiments, the primary transistor or primary transistors in parallel with each other also are configured in parallel with other transistors and components. In those embodiments, the primary transistor or transistors are in series in the primary current path because they present a low-resistance path through the device when not in blocking depletion mode.

Among the various embodiments of the present invention, various components such as transistors, resistors, diodes, zener diodes, capacitors, and the like can be used. Any suitable components can be used, such as, for example, those components already known in the art. Among transistors, field effect transistors including JFETs, MOSFETs (e.g., depletion-mode MOSFETs and enhancement-mode MOSFETs), and their wide bandgap versions such as SiC JFETs, SiC MOSFETs, GaN JFETs, GaN MOSFETs, and so-called "zero-threshold" transistors, may be mentioned, as well as bipolar junction transistors, thyristors, insulated-gate bipolar transistors, and even MEMS switches and other electromechanical relays as substitutes for transistors, in addition to combinations of any of the foregoing. Wide bandgap transistors may be considered as those having a bandgap equal to or greater than about 2 eV, and include SiC and GaN transistors.

Some devices according to the present invention are adapted to protect direct current circuits. Other devices are adapted to protect alternating current circuits. Still other devices can be employed in direct current or alternating current circuits. Still other devices, for example a device designed for direct current protection, can be employed in an alternating current circuit by adding an appropriate rectifier so the components of the device receive the proper polarity. In still other embodiments, two devices can be employed in such a manner so that one device protects the circuit under positive polarity conditions, and the second device protects the circuit under negative polarity conditions.

Further instances relate to a device wherein the first drain is in series electrical communication with the first terminal. Other instances provide a device wherein the first drain is in series electrical communication with the second terminal. Additional instances relate to a device wherein the first transistor comprises a depletion type transistor. Some instances of the present invention provide a device wherein the first transistor has a negative gate threshold characteristic or a positive gate threshold characteristic. Still other instances relate to a device wherein the first transistor has a first majority carrier characteristic that is n-type or p-type. Certain cases involve a device wherein the first transistor is an n-channel depletion mode transistor. Other cases provide a device that is a two-terminal device. Still other cases relate to a device configured to operate without any auxiliary power supply.

Devices that embody various aspects of the present invention can be manufactured according to any suitable method. Devices can comprise discrete components, or those components can be manufactured together in an integrated circuit. Or, a combination of integrated circuitry and discrete components can be used. Some methods of manufacturing a device according to the present invention comprise assembling the components so that there is or can be electrical communication between the various components.

Further embodiments relate to methods of forming the devices of the present invention. Such a method, for example, comprises arranging the first transistor in series in the primary current path between the first terminal and the second terminal. Any suitable manufacturing techniques can be used. In some cases, it is contemplated that known manufacturing techniques used for constructing integrated circuits can be used to form a device or a portion thereof. Conventional two-dimensional integrated circuits, three-dimensional integrated circuits, and any suitable technology may be mentioned. In other cases, individual components such as transistors, resistors, capacitors, and the like can be connected together, reversibly and/or permanently, such as by soldering. In still other cases, integrated circuitry can be augmented by the placement in electrical communication of additional components, such as, for example, resistors, capacitors, and/or other components selected by a downstream manufacturer or end user to fine-tune the integrated circuitry to accommodate anticipated operational parameters of the circuit to be protected. In such cases, an upstream manufacturer of the integrated circuitry can provide instructions to the downstream manufacturer or end user guiding the selection of those additional components. Optionally, identification technologies such as RFID chips can be included in the devices of the present invention.

Devices of the present invention can be used in any suitable manner. In some cases, a method of protecting a circuit from sustained overcurrent conditions comprises placing a device as described herein in series electrical communication in the primary current path of the circuit to be protected. Other methods of using one or more devices of the present invention employ those devices to protect only part of the circuit, such as for example, a portion of a circuit in parallel electrical communication with another portion of the circuit. In that case, a device can be placed in series with that portion of the circuit to be protected. Optionally, another device can be used to protect another portion of that circuit. Still further embodiments provide more than one device of the present invention protecting a circuit.

Some embodiments of the present invention relate to methods for protecting a circuit having a primary current path from an overcurrent condition, each method comprising:
placing in the primary current path the device of any the embodiments described herein, so that all current flowing in the circuit flows through or is blocked by the device. In another example, methods for protecting a circuit against an overcurrent condition, comprise:
providing a device such as one of those described herein;
placing the first terminal and the second terminal in series electrical communication in the circuit so that all current flowing in the circuit flows through or is blocked by the device;
when a non-zero voltage exists between the first terminal and the second terminal,
  converting the non-zero voltage to obtain a releasably-stored voltage;
  floating the releasably-stored voltage to obtain a floated voltage;
  when an overcurrent condition exists between the first terminal and the second terminal,
    applying the floated voltage to the first gate to drive the first transistor into blocking depletion mode,
    thereby blocking substantially all current between the first terminal and the second terminal;
thereby protecting the circuit from the overcurrent condition.

In some cases, the conversion of the non-zero voltage occurs only when an overcurrent condition exists between the first terminal and the second terminal. Similarly, in some cases the floating of a releasably-stored voltage occurs only when the overcurrent condition exists. In at least some of those cases, the device of the present invention represents a low-resistance, low power consumption device imposed in the path of the circuit to be protected. Unlike many known devices, such a device consumes little power provided by the protected circuit under normal current conditions. However, when an overcurrent condition arises, certain embodiments of the present invention quickly respond to the overcurrent condition, and block the overcurrent from reaching the protected circuit.

Further embodiments relate to methods of protecting a circuit wherein obtaining the releasably-stored voltage comprises autocatalytically converting the non-zero voltage. In other cases, converting the non-zero voltage comprises autocatalytically converting the non-zero voltage. Accordingly, some of those embodiments relate to methods for protecting a circuit against an overcurrent condition, such a method comprising:
providing a device as described herein;
placing the first terminal and the second terminal in series electrical communication in the circuit so that all current flowing in the circuit flows through or is blocked by the device;
when a non-zero voltage and an overcurrent condition exist between the first terminal and the second terminal,
  autocatalytically converting the non-zero voltage to obtain a releasably-stored voltage;
  optionally floating the releasably-stored voltage to obtain a floated voltage;
  applying the releasably-stored voltage or the optionally floated voltage to the first gate to drive the first transistor into blocking depletion mode,
  thereby blocking substantially all current between the first terminal and the second terminal;
thereby protecting the circuit from the overcurrent condition.

A device that can be used in a method for protecting a circuit against an overcurrent condition includes, in some embodiments,
  a first terminal and a second terminal, and
  a first transistor comprising a first gate, a first drain, and a first source;
  wherein the first transistor is a depletion mode, normally-on transistor;
  wherein the first transistor is arranged in series in a primary current path between the first terminal and the second terminal;
  wherein the device is configured to receive no auxiliary power.

Certain embodiments of the present invention relate to methods for protecting a circuit, wherein obtaining the releasably-stored voltage comprises autocatalytically converting the non-zero voltage.

For example, some methods for protecting a circuit against an overcurrent condition comprise:
providing a device having
  a first terminal and a second terminal,
  and a first transistor comprising a first gate, a first drain, and a first source;
  wherein the first transistor is a depletion mode, normally-on transistor;
  wherein the first transistor is arranged in series in a primary current path between the first terminal and the second terminal;

placing the first terminal and the second terminal in series electrical communication in the circuit so that all current flowing in the circuit flows through or is blocked by the device;

when an overcurrent condition exists between the first terminal and the second terminal, autocatalytically converting a non-zero voltage to obtain a releasably-stored voltage;

applying the releasably-stored voltage to the first gate to drive the first transistor into blocking depletion mode, thereby blocking substantially all current between the first terminal and the second terminal;

thereby protecting the circuit from the overcurrent condition.

The non-zero voltage can be, or is derived from, a voltage between the first terminal and the second terminal. Or, the non-zero voltage can be derived from a voltage between a second terminal and a third terminal, in those embodiments having a third terminal. Alternatively the non-zero voltage can be derived from a voltage between a third terminal and a fourth terminal, in those embodiments having a fourth terminal. Or, the non-zero voltage can be derived from an auxiliary power supplied to the device. Any suitable auxiliary power supply can be used in those embodiments. For example, the auxiliary power can be chosen from a battery, a thermal energy converter, a radio frequency converter, a light-to-electricity converter, an independent mains supply, or a combination thereof. In other cases, the device is configured to receive no auxiliary power.

Still other embodiments relate to autocatalytically converting a non-zero voltage to obtain a releasably-stored voltage; floating the releasably-stored voltage to obtain a floated voltage; applying the floated voltage to the first gate to drive the first transistor into blocking depletion mode, thereby blocking substantially all current between the first terminal and the second terminal; thereby protecting the circuit from the overcurrent condition.

During normal current conditions, in some embodiments, the primary current path between the first terminal and the second terminal defines a low resistance path, and only the first transistor, or optionally one or more transistors in parallel with the first transistor, are arranged in series in the low resistance path.

Further methods of protecting a circuit relate to obtaining the releasably-stored voltage by employing a voltage converter circuitry comprising a parallel-to-series switched capacitor network configured to convert the non-zero voltage to the releasably-stored voltage. Optionally, obtaining the releasably-stored voltage comprises multiplying the non-zero voltage.

Alternatively, the converting comprises one or more of multiplying, reducing, inverting, and identifying. In some cases, the floating releasably-stored voltage comprises switching the releasably-stored voltage. Any suitable technology can be used to switch the releasably-stored voltage. In some cases, the switching employs a floating switch transistor, a floating switch diode, or a combination thereof. Certain embodiments provide methods wherein the switching comprises placing the releasably-stored voltage in parallel with a diode, wherein the positive end of the releasably-stored voltage is connected to the cathode of the diode, and the negative end of the releasably-stored voltage is connected to the anode of the diode. Further, the applying the releasably-stored voltage to the first gate to drive the first transistor into blocking depletion may comprise placing the releasably-stored voltage in parallel with the first gate and the first source. Similarly, the applying the floated voltage to the first gate to drive the first transistor into blocking depletion may comprise placing the floated voltage in parallel with the first gate and the first source.

Further embodiments provide that the first transistor is not in enhancement mode in an absence of the overcurrent condition. Even further embodiments provide the device does not multiply or invert voltages in an absence of the overcurrent condition.

Additional embodiments of the present invention provide methods wherein the device is reset once the overcurrent condition ceases to exist. For example, some methods relate to detecting that the overcurrent condition no longer exists by determining a safe voltage between the first terminal and the second terminal;

converting the safe voltage to obtain a safe releasably-stored voltage;

applying the safe releasably-stored voltage to the first gate to drive the first transistor out of blocking depletion mode, thereby allowing current to flow between the first terminal and the second terminal. Optionally, the applying the safe releasably-stored voltage to the first gate comprises driving the first transistor into enhancement mode.

Further additional embodiments relate to detecting that the overcurrent condition no longer exists by determining a safe voltage between the first terminal and the second terminal;

converting the safe voltage to obtain a safe releasably-stored voltage;

floating the safe releasably-stored voltage to obtain a safe floated voltage;

applying the safe floated voltage to the first gate to drive the first transistor out of blocking depletion mode, thereby allowing current to flow between the first terminal and the second terminal. Optionally, the applying the safe floated voltage to the first gate comprises driving the first transistor into enhancement mode. As with certain other embodiments, the converting the safe voltage may comprise one or more of multiplying, reducing, inverting, and identifying.

Certain embodiments of the present invention relate to methods for converting a non-zero voltage comprising:

charging two or more capacitors from the non-zero voltage, where the two or more capacitors are electrically connected by a switching arrangement configuring the two or more capacitors in parallel, thereby providing a stored voltage;

multiplying the stored voltage by switching the switching arrangement to configure the two or more capacitors in series, thereby providing the releasably-stored voltage;

wherein the releasably-stored voltage powers the multiplying by driving the switching.

Further methods relate to autocatalytic conversion of a non-zero voltage, wherein the autocatalytic converting comprises:

charging two or more capacitors from the non-zero voltage, where the two or more capacitors are electrically connected by a switching arrangement configuring the two or more capacitors in parallel, thereby providing a stored voltage;

multiplying the stored voltage by switching the switching arrangement to configure the two or more capacitors in series, thereby providing the releasably-stored voltage;

wherein the releasably-stored voltage powers the multiplying by driving the switching.

Still other methods relate to the autocatalytic converting of a non-zero voltage, wherein the autocatalytic converting comprises:

providing a plurality of capacitors flexibly configured into parallel electrical communication by a switching arrangement;

charging the plurality of capacitors in parallel with the non-zero voltage to obtain a stored voltage;

multiplying the stored voltage by switching the switching arrangement so that the plurality of capacitors becomes at least partially electrically connected in series to produce a multiplied voltage;

increasing the multiplied voltage by driving the switching with the multiplied voltage so that the plurality of capacitors becomes fully electrically connected in series, thereby autocatalytically converting the non-zero voltage to obtain the releasably-stored voltage.

Still further methods relate to the autocatalytic converting of an input voltage, wherein the autocatalytic converting comprises:

providing a plurality of capacitors flexibly configured into parallel electrical communication by a switching arrangement;

charging the plurality of capacitors in parallel with the input voltage;

partially switching the switching arrangement so that a portion of the plurality of capacitors becomes flexibly configured into series electrical communication to provide a partially-multiplied voltage;

driving at least some of the partially switching using the partially-multiplied voltage;

repeating partially switching and driving until the plurality of capacitors is entirely in series electrical communication, thereby autocatalytically converting the input voltage to obtain the releasably stored voltage.

Optionally, in some cases, a switching arrangement comprises a plurality of transistors configured to flexibly connect the plurality of capacitors in a parallel or a series configuration. In certain of those cases, the plurality of capacitors is configured to drive at least a portion of the gates of the transistors in the plurality of transistors.

Further embodiments relate to devices and methods for autocatalytically converting an input voltage. Autocatalytic conversion finds particular utility in switching a transistor into blocking depletion mode in the presence of an overcurrent condition, because if the transition into blocking depletion takes too long, the overcurrent passing through the transistor could damage the transistor. In addition, autocatalytic voltage conversion can find application in many different areas as well, such as when a voltage is required no matter the variance in the input voltage.

Certain embodiments of the present invention relate to a voltage converter circuitry, comprising:

a first input lead and a second input lead configured to receive an input voltage;

at least one output lead configured to deliver a converted voltage; and a parallel-to-series switched capacitor network configured to convert the input voltage to the converted voltage;

wherein the parallel-to-series switched capacitor network is configured to convert the input voltage to the converted voltage autocatalytically. Optionally, the parallel-to-series switched capacitor network is configured to convert the input voltage to the converted voltage by multiplying the input voltage. Any suitable manner of delivering the converted voltage can be employed. In some cases, the first output lead and the second input lead are configured to deliver the converted voltage. In other cases, the voltage converter circuitry further comprises a second output lead, wherein the first output lead and the second output lead are configured to deliver the converted voltage.

Any suitable technology can be used to switch a parallel-to-series switched capacitor network, such as transistors, diodes, and combinations thereof. Some instances provide a parallel-to-series switched capacitor network comprising:

a plurality of capacitors that are configured to be charged by the input voltage and discharge to provide the converted voltage;

a plurality of transistors that, when in the "off" state configure the plurality of capacitors in parallel electrical communication, and when in the "on" state configure the plurality of capacitors in series electrical communication.

Other instances provide a parallel-to-series switched capacitor network that comprises:

a plurality of capacitors that are configured to be charged by the input voltage and discharge to provide the converted voltage;

a plurality of diodes that, when forward biased, configure the plurality of capacitors in parallel electrical communication, and when reverse biased, configure the plurality of capacitors in series electrical communication.

Certain additional embodiments of the present invention provide voltage converter circuitry comprising:

a first input lead and a second input lead configured to receive an input voltage;

at least one output lead configured to deliver a converted voltage;

wherein the voltage converter circuitry is configured to convert the input voltage to the converted voltage autocatalytically.

Further embodiments provide methods of driving a transistor having a gate, each such method comprising:

autocatalytically converting an input voltage to obtain a releasably stored voltage;

applying the releasably stored voltage to the gate, thereby driving the transistor.

Still additional embodiments relate to methods of autocatalytically converting an input voltage into a converted voltage, comprising:

charging a plurality of capacitors flexibly configured in parallel electrical communication with the input voltage;

switching in the solid state the plurality of capacitors so the plurality of capacitors is flexibly configured in series electrical communication to provide the converted voltage;

wherein the converted voltage or a portion thereof drives at least some of the switching, thereby autocatalytically converting the input voltage to the converted voltage.

The switching in the solid-state can employ any suitable technology, such as, for example, transistors, diodes, and combinations thereof.

In some cases, the switching in the solid state is provided by a plurality of transistors flexibly configuring the plurality of capacitors. In other cases, the switching in the solid state is provided by a plurality of diodes flexibly configuring the plurality of capacitors. In still other cases, the switching in the solid state is provided by a plurality of transistors and diodes flexibly configuring the plurality of capacitors.

DETAILED DESCRIPTION OF THE DRAWINGS

Further embodiments of the present invention can be described by reference to the accompanying drawings. The same reference number across different figures is intended to reference the same or a similar item in each such figure. Not every item is labeled in every figure for ease of viewing and understanding.

FIG. 1 conceptually depicts one embodiment of the invention comprising device 100 having driver circuitry 130 controlling first transistor 150. First terminal 110 and second terminal 120 define a primary current path through connection 111, first transistor 150, and connection 112. First transistor 150 is arranged in series in the primary current path via pins 151, 152. Those pins 151, 152 are the first drain and first source, or first source and first drain, respectively, depending on whether first transistor 150 is an n-channel or a p-channel device. Driver circuitry 130 is in parallel electrical communication with first transistor 150 via connections 111, 112. Driver circuitry 130 comprises voltage converter circuitry 140, which is configured to receive an input voltage such as the voltage between first terminal 110 and second terminal 120 harvested at connections 111, 112, convert the input voltage to a converted voltage or a releasably-stored voltage, and apply it as a gate voltage at first gate 153. Voltage converter circuitry 140 can comprise any suitable voltage converter circuitry. For example, a voltage converter circuitry 140 can employ a jumpstart voltage converter, a one-shot voltage converter, an extended-use voltage converter, or a combination thereof. During overcurrent conditions, driver circuitry 130 is configured to apply a gate voltage at first gate 153 the drives first transistor 150 into blocking depletion mode. During normal current conditions, or safe current conditions following an overcurrent condition, driver circuitry 130 is configured to drive first transistor 150 out of blocking depletion mode, and optionally into enhancement mode.

The first transistor 150 can be any suitable transistor. For example, first transistor 150 can be an n-channel depletion mode transistor, or any negative gate threshold characteristic, normally-on transistor. That would make pin 151 the first drain and pin 152 the first source of first transistor 150. In an alternative example, first transistor 150 can be a p-channel, depletion mode transistor, or any positive gate threshold characteristic, normally-on transistor. Pin 151 would be the first source, and pin 152 would be the first drain of first transistor 150. Any suitable driver circuitry 130 and voltage converter circuitry 140, such as those described and exemplified herein, can be used.

Figure 2:
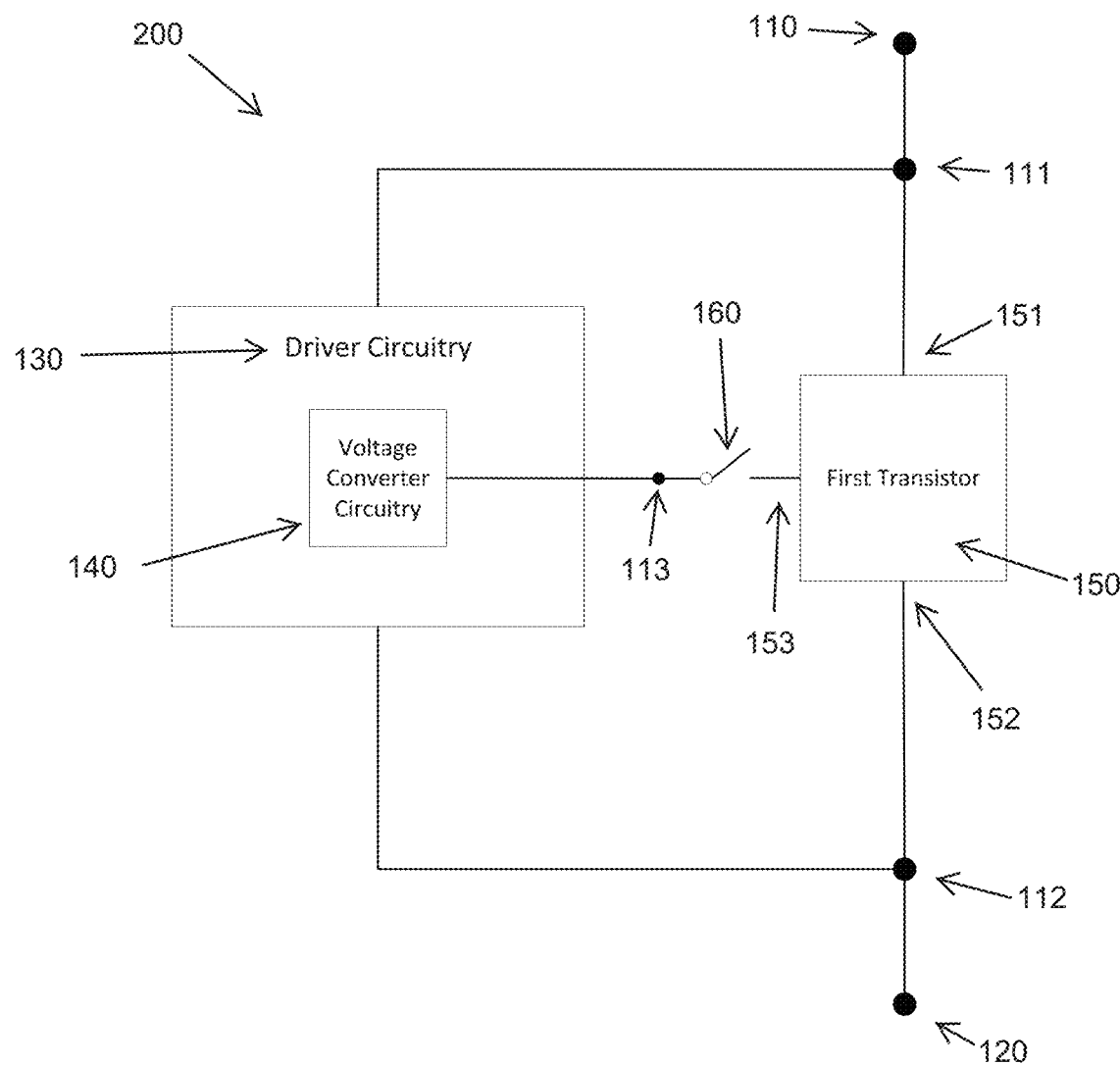
FIG. 2 conceptually depicts another embodiment, namely device 200 similar to device 100 further comprising switch 160.

FIG. 2 conceptually depicts another embodiment, namely device 200 similar to device 100 further comprising switch 160. In device 200, connection 113 imposes switch 160 between voltage converter circuitry 140 within driver circuitry 130, on the one hand, and first gate 153 of first transistor 150, on the other hand. The other components are as described for FIG. 1. Here, switch 160 is configured to allow the driver circuitry 130 to selectively apply a gate voltage at first gate 153, such as, for example, during an overcurrent condition, to drive or maintain the first transistor 150 in blocking depletion mode. Any suitable switch 160, such as those described in exemplified herein, can be used. In some cases, switch 160 comprises at least one switch transistor. In other cases, switch 160 comprises at least one diode. In still further cases, switch 160 comprises a pair of transistors in a push-pull configuration. Any suitable pair of transistors can be used. For example, certain instances provide a pair of transistors at switch 160, comprising a pair of bipolar junction transistors in a totem pole configuration. Other instances provide a pair of transistors comprising a pair of MOSFETs in a totem pole configuration.

Figure 3:
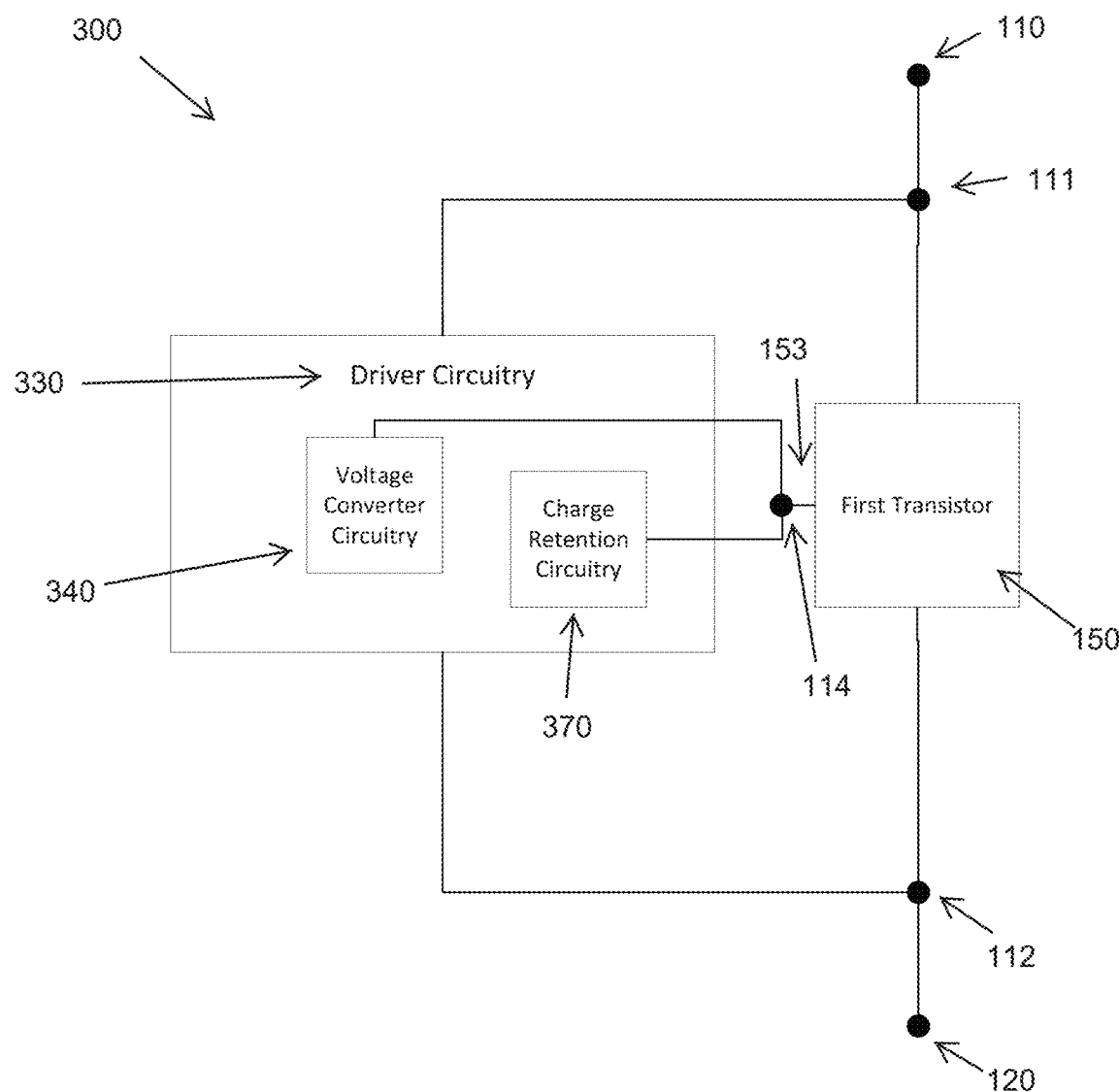
FIG. 3 conceptually depicts another embodiment of the invention comprising device 300 having voltage converter circuitry 340 and a charge retention circuitry 370 configured to apply a gate voltage at first gate 153.

FIG. 3 conceptually depicts another embodiment of the invention comprising device 300 having voltage converter circuitry 340 and a charge retention circuitry 370 configured to apply a gate voltage at first gate 153. In this embodiment, driver circuitry 330 is configured to apply a gate voltage at first gate 153 via connection 114. Voltage converter circuitry 340 can comprise any suitable voltage converter circuitry. For example, a voltage converter circuitry 340 can employ a jumpstart voltage converter, a one-shot voltage converter, an extended-use voltage converter, or a combination thereof, to receive an input voltage, and convert it into a releasably-stored voltage. Charge retention circuitry 370 can comprise any suitable charge retention circuitry. Charge retention circuitry 370 can apply a retained charge and thereby maintain a suitable gate voltage at first gate 153 while the voltage converter circuitry 340 is busy converting a voltage to also apply as a gate voltage. Working together, charge retention circuitry 370 and voltage converter circuitry 340 can maintain first transistor 150 in the desired blocking or conducting mode. During overcurrent conditions, driver circuitry 330 is configured to apply a gate voltage at first gate 153 that drives first transistor 150 into blocking depletion mode. During normal current conditions, or safe current conditions following an overcurrent condition, driver circuitry 330 is configured to drive first transistor 150 out of blocking depletion mode, and optionally into enhancement mode. Any suitable driver circuitry 330, voltage converter circuitry 340, and a charge retention circuitry 370, such as those described in exemplified herein, can be used.

Figure 4:
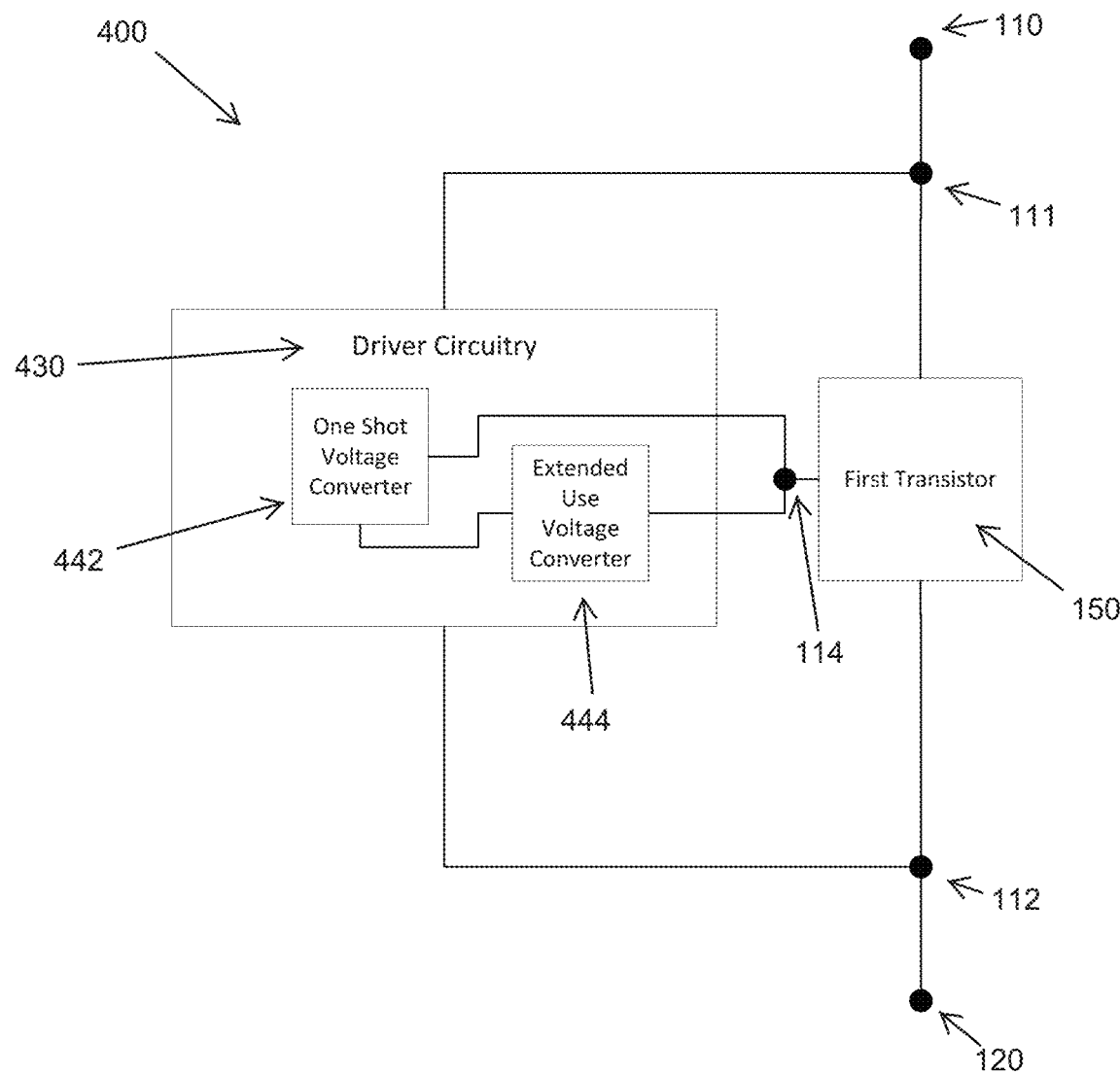
FIG. 4 conceptually depicts a further embodiment, namely, device 400 in which driver circuitry 430 comprises a one-shot voltage converter 442 and an extended use voltage converter 444.

FIG. 4 conceptually depicts a further embodiment, namely, device 400 in which driver circuitry 430 comprises a one-shot voltage converter 442 and an extended use voltage converter 444. Several alternative modes of operation of driver circuitry 430 are depicted in FIG. 4. In one case, one-shot voltage converter 442 might quickly apply a gate voltage via connection 114, driving first transistor 150 into blocking depletion mode at the beginning of an overcurrent condition. Then, extended use voltage converter 444 can maintain first transistor 150 in blocking depletion mode for as long as the overcurrent condition endures. Alternatively, or in addition, one-shot voltage converter 442 can drive extended use voltage converter 444 into action, wherein extended use voltage converter 444 applies a gate voltage via connection 114 driving and maintaining first transistor 150 in blocking depletion mode for as long as the overcurrent condition endures. Optionally, one shot voltage converter 442 and/or extended use voltage converter 444 can be configured to apply a suitable gate voltage via connection 114 to drive first transistor 150 out of blocking depletion mode, and optionally into enhancement mode. Device 400, as with devices 100, 200, and 300, can each be configured to receive no auxiliary power, deriving all of its energy needs from the electrical energy appearing at first terminal 110 and second terminal 120, via connections 111, 112. Any suitable driver circuitry 430, one-shot voltage converter 442, an extended use voltage converter 444 can be used, such as those described in exemplified herein.

Figure 5:
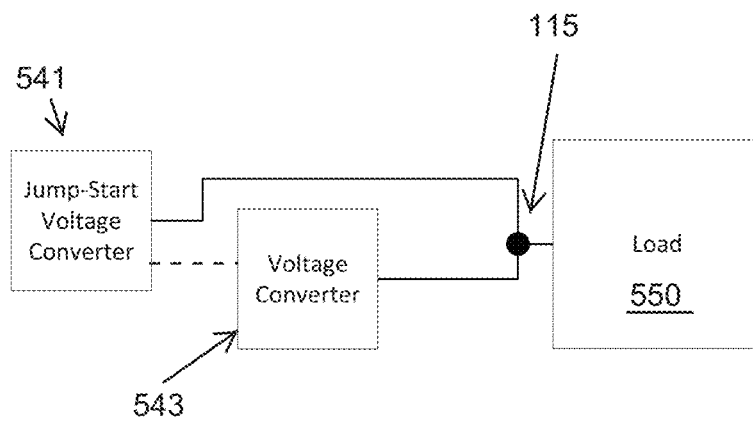
FIGS. 5, 6, and 7 conceptually depict several embodiments showing alternative configurations of a jumpstart voltage converter 541, voltage converter 543, and load 550.
Figure 6:
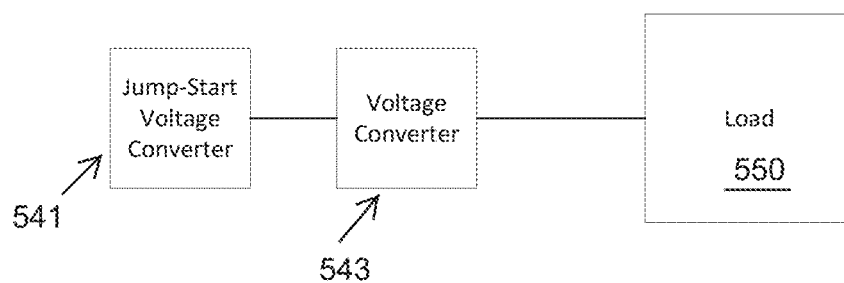
Figure 7:
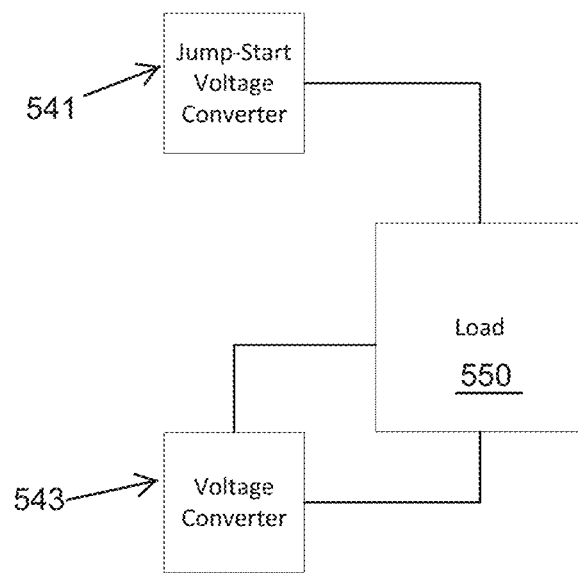

FIGS. 5, 6, and 7 conceptually depict several embodiments showing alternative configurations of a jumpstart voltage converter 541, voltage converter 543, and load 550. In FIG. 5, jumpstart voltage converter 541 is configured to quickly apply a voltage to load 550, which can be the gate of a transistor, for example. Another voltage converter 543 is configured to also apply voltage to load 550. In this way, jumpstart voltage converter 541 and voltage converter 543 work together to apply alike or different voltages to load 550. Optionally, jumpstart voltage converter 541 can also assist voltage converter 543 to initiate or perform its conversion, as indicated by the dotted line. In FIG. 6, jumpstart voltage converter 541 is configured to supply a voltage to voltage converter 543, for any suitable purpose, perhaps to quickly enable voltage converter 543 to supply a voltage to load 550. FIG. 7 illustrates jumpstart voltage converter 541 configured to apply a voltage to load 550. Voltage converter 543 is configured in a feedback loop, whereby voltage converter 543 applies a voltage to load 550, which then supplies input voltage to voltage converter 543 that voltage converter 543 converts and applies to the load 550. For example, suppose that load 550 is a transistor. Jumpstart voltage converter 541 supplies a voltage to the gate of the transistor represented by load 550, driving that transistor into blocking depletion. A blocked voltage will develop across the drain and source of that transistor that is load 550, which voltage converter 543 can then harvest, convert, and apply at the gate of the transistor that is load 550. If the converted voltage applied by voltage converter 543 maintains the transistor in blocking depletion, then voltage converter 543 may be configured to maintain the transistor that is load 550 in blocking depletion until the device is reset or the blocked voltage is removed from load 550. Any suitable jump-start voltage converter 541, voltage converter 543, and load 550 can be used, such as for example, those exemplified described herein.

Figure 8:
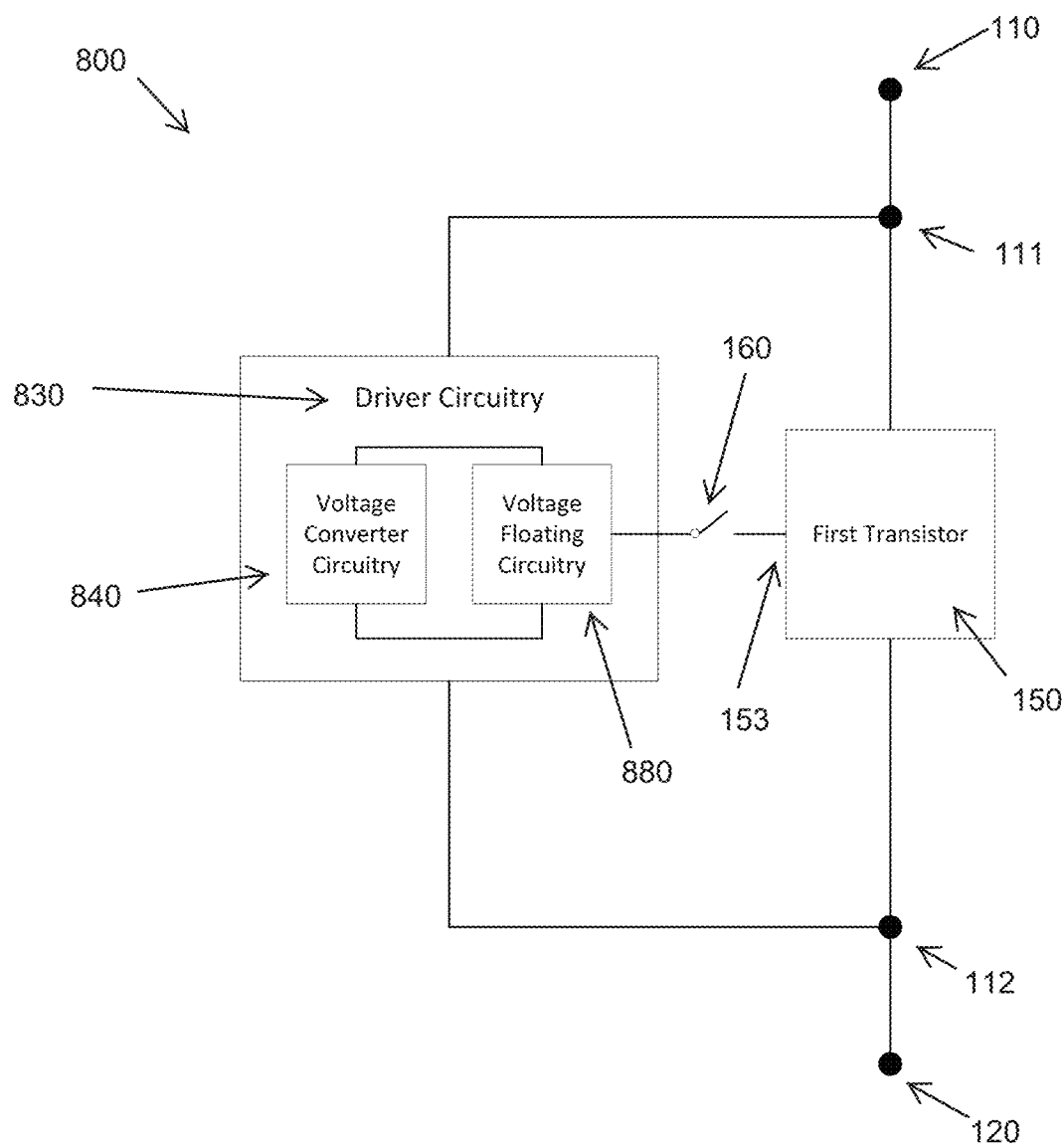
FIG. 8 conceptually depicts an additional embodiment, device 800, in which driver circuitry 830 comprises voltage floating circuitry 880.

FIG. 8 conceptually depicts an additional embodiment, device 800, in which driver circuitry 830 comprises voltage converter circuitry 840 coupled to voltage floating circuitry 880. Here, the voltage converter circuitry 840 is configured to receive an input voltage such as the voltage between first terminal 110 and second terminal 120 harvested at connections 111, 112 and convert that voltage into a releasably-stored voltage. The voltage floating circuitry 880 shifts or floats the releasably-stored voltage to provide a floated voltage that can be applied as a gate voltage at first gate 153 when switch 160 allows. For example, when an overcurrent condition arises, switch 160 can close, allowing driver circuitry 832 apply the floated voltage at first gate 153, driving first transistor 150 into blocking depletion mode. Any suitable driver circuitry 830, voltage converter circuitry 840, and voltage floating circuitry 880 can be used, such as, for example, those described in exemplified herein.

Figure 9:
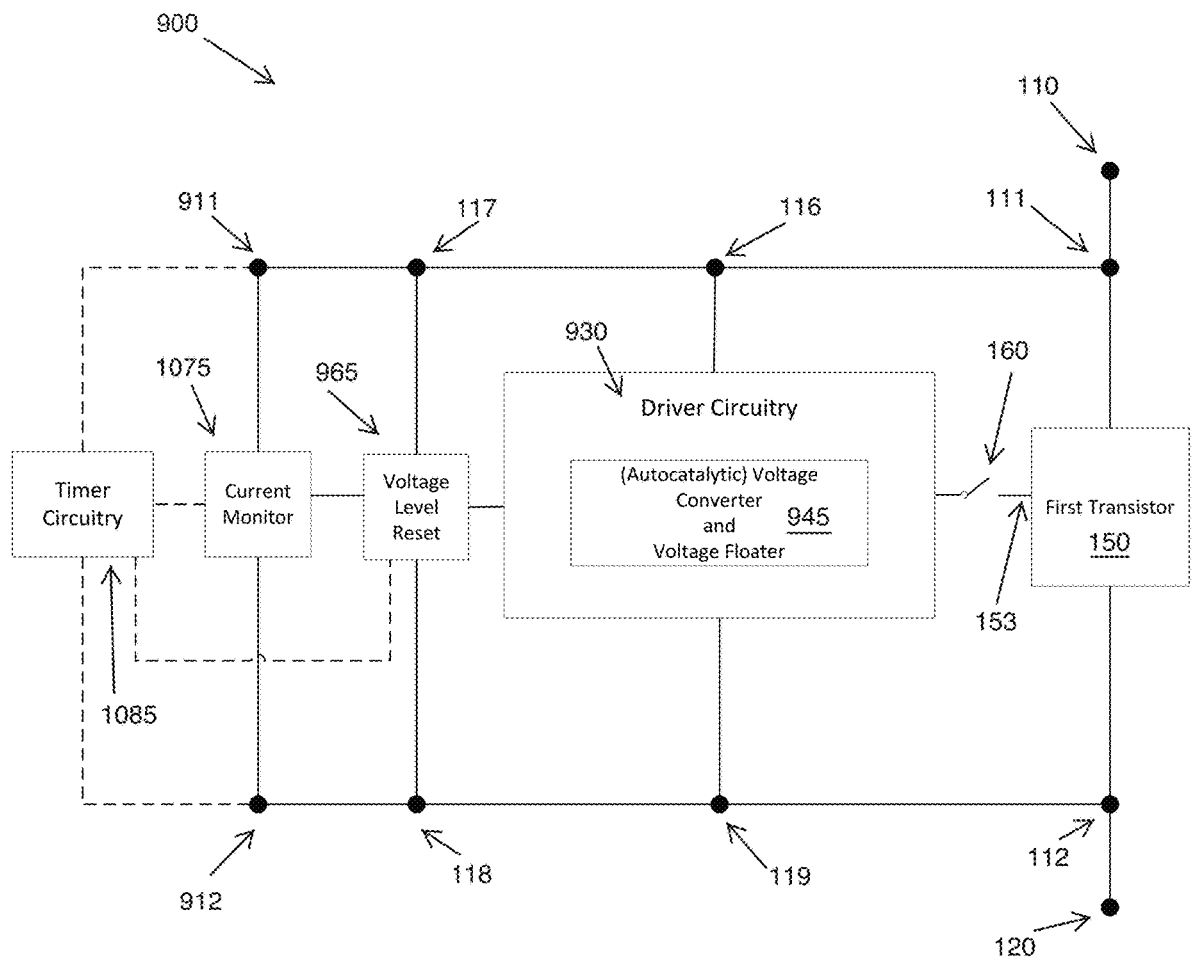
FIG. 9 conceptually depicts another embodiment, device 900, comprising a voltage level reset circuitry 965, current monitoring circuitry 1075, a combined voltage converter and voltage floater 945, and optionally timer circuitry 1085.

FIG. 9 conceptually depicts another embodiment, device 900, comprising a voltage level reset circuitry 965, current monitoring circuitry 1075, a combined voltage converter and voltage floater 945, and optionally timer circuitry 1085. Various embodiments of the present invention can employ circuitry that serves more than one function, either performing multiple functions simultaneously, performing multiple functions sequentially, or a combination thereof. In device 900, driver circuitry 930 provides an optionally autocatalytic voltage converter and voltage floater circuitry 945. As will be seen in later figures, efficient circuit design may employ components that perform both the voltage converter and voltage floating functions. Here, voltage converter and voltage floater circuitry 945 will receive an input voltage, such as, for example, the voltage between first terminal 110 and second terminal 120, or a derivative voltage thereof, harvested at connections 116, 119, for example. That input voltage will be converted, optionally autocatalytically, to provide a releasably-stored voltage, and floated to provide a floated voltage. When an overcurrent condition arises, driver circuitry 930 will apply the floated voltage at the first gate 153 when switch 160 closes, driving first transistor 150 into blocking depletion.

In addition, current monitoring circuitry 1075 monitors the current that flows through or would flow through first transistor 150 via connections 911, 912. This can be done through any suitable protocol, such as, for example, monitoring the voltage drop between connections 111, 112. Current monitoring circuitry 1075 is configured to (A) detect an arising overcurrent condition, (B) cause the voltage converter and voltage floater circuitry 945 to begin operation, and (C) close switch 160, thereby allowing driver circuitry 930 to drive first transistor 150 into blocking depletion mode. Current monitoring circuitry 1075 together with voltage level reset circuitry 965 are also configured to detect the conclusion of the overcurrent condition, and cause drive circuitry 930 to apply a gate voltage at first gate 153 that drives the first transistor 150 out of blocking depletion mode and optionally into enhancement mode. In that case, switch 160 would be closed, at least long enough to apply the desired gate voltage.

Optionally, device 900 further comprises timer circuitry 1085 affixed between connections 911, 912. Any suitable timer circuitry 1085 can be used, such as those described and exemplified herein. In some cases, timer circuitry 1085 comprises a delay block timer circuitry configured to delay the driver circuitry 930 from driving the first transistor 150 into blocking depletion mode until the overcurrent condition is a sustained overcurrent condition. In other cases, timer circuitry 1085 comprises a delay reset timer circuitry configured to delay the driver circuitry 930 from driving the first transistor 150 out of blocking depletion mode until a safe current condition is a sustained safe current condition. In still other cases, timer circuitry 1085 comprises or functions as both a delay block timer circuitry and a delay reset timer circuitry.

Optionally, voltage level reset circuitry 965 coordinates with optional timer circuitry 1085 to determine whether the safe current condition is a sustained safe current condition. Voltage level reset circuitry 965 configures driver circuitry 930 to drive the first transistor 150 out of blocking depletion mode when a safe current condition or a sustained safe current condition exists. Any suitable timer circuitry 1085, current monitoring circuitry 1075, voltage level reset circuitry 965, voltage converter and voltage floater circuitry 945, and driver circuitry 930 can be used, such as those described and exemplified herein.

Figure 10:
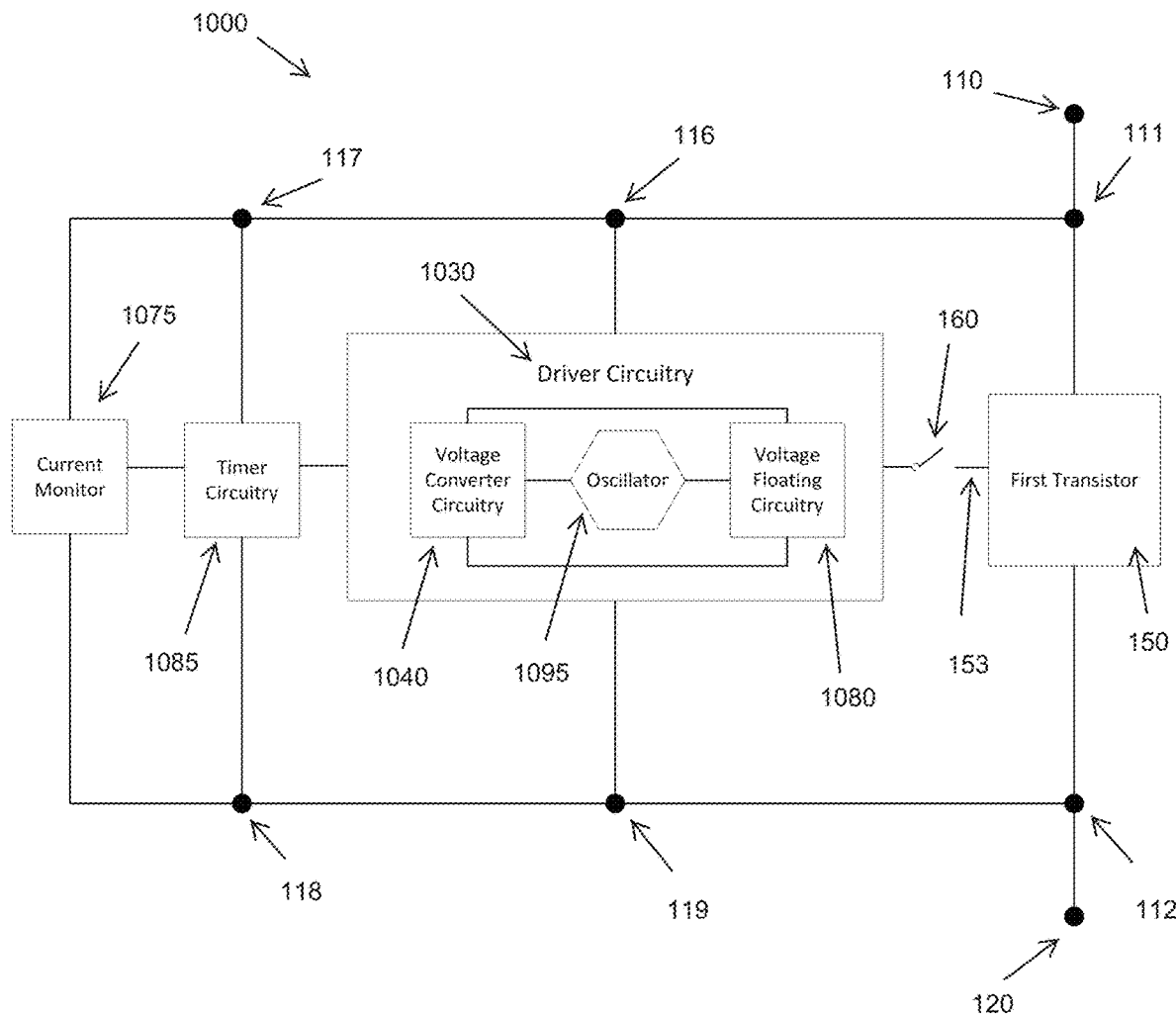
FIG. 10 conceptually depicts an additional embodiment, device 1000, comprising an oscillator 1095, timer circuitry 1085, and current monitoring circuitry 1075.

FIG. 10 conceptually depicts an additional embodiment, device 1000, comprising an oscillator 1095, timer circuitry 1085, and current monitoring circuitry 1075. Here, driver circuitry 1030 is configured to allow its voltage converter circuitry 1040 to receive an input voltage, such as, for example the voltage across first terminal 110 and second terminal 120, harvested at connections 111, 112 via connections 116, 119. The input voltage is converted into a releasably-stored voltage and shifted by voltage floating circuitry 1080 to provide a floated voltage. The converting and floating operations are modulated by oscillator 1095. In some cases, oscillator 1095 allows voltage converter circuitry 1040 to repeatedly convert an input voltage into a releasably-stored voltage. In other cases, oscillator 1095 allows voltage floating circuitry 1080 to repeatedly float a releasably-stored voltage to provide a floated voltage. In still other cases, oscillator 1095 allows both the voltage converter circuitry 1040 and voltage floating circuitry 1080 to repeatedly perform their operations. Selectively, such as when an overcurrent condition arises, switch 160 closes, allowing driver circuitry 1030 to apply the floated voltage as a gate voltage at first gate 153, driving first transistor 150 into blocking depletion mode.

In addition, current monitoring circuitry 1075 monitors the current that flows through or would flow through first transistor 150 via connections 117, 118. This can be done through any suitable protocol, such as, for example, monitoring the voltage drop between connections 111, 112. Then, when an overcurrent condition arises, current monitoring circuitry 1075 ultimately causes switch 160 to close. Optionally, when a safe current condition arises at the conclusion of an overcurrent condition, current monitoring circuitry 1075 can ultimately cause switch 160 to open. Or, current monitoring circuitry 1075 can be configured to (A) detect an arising overcurrent condition, (B) cause one or more of the voltage converter circuitry 1040, oscillator 1095, and voltage floating circuitry 1080 to begin operation, and (C) close switch 160, thereby allowing driver circuitry 1030 to drive first transistor 150 into blocking depletion mode. Any suitable current monitoring circuitry 1075, voltage converter circuitry 1040, oscillator 1095, voltage floating circuitry 1080 and driver circuitry 1030 can be used, such as those described and exemplified herein.

Figure 11:
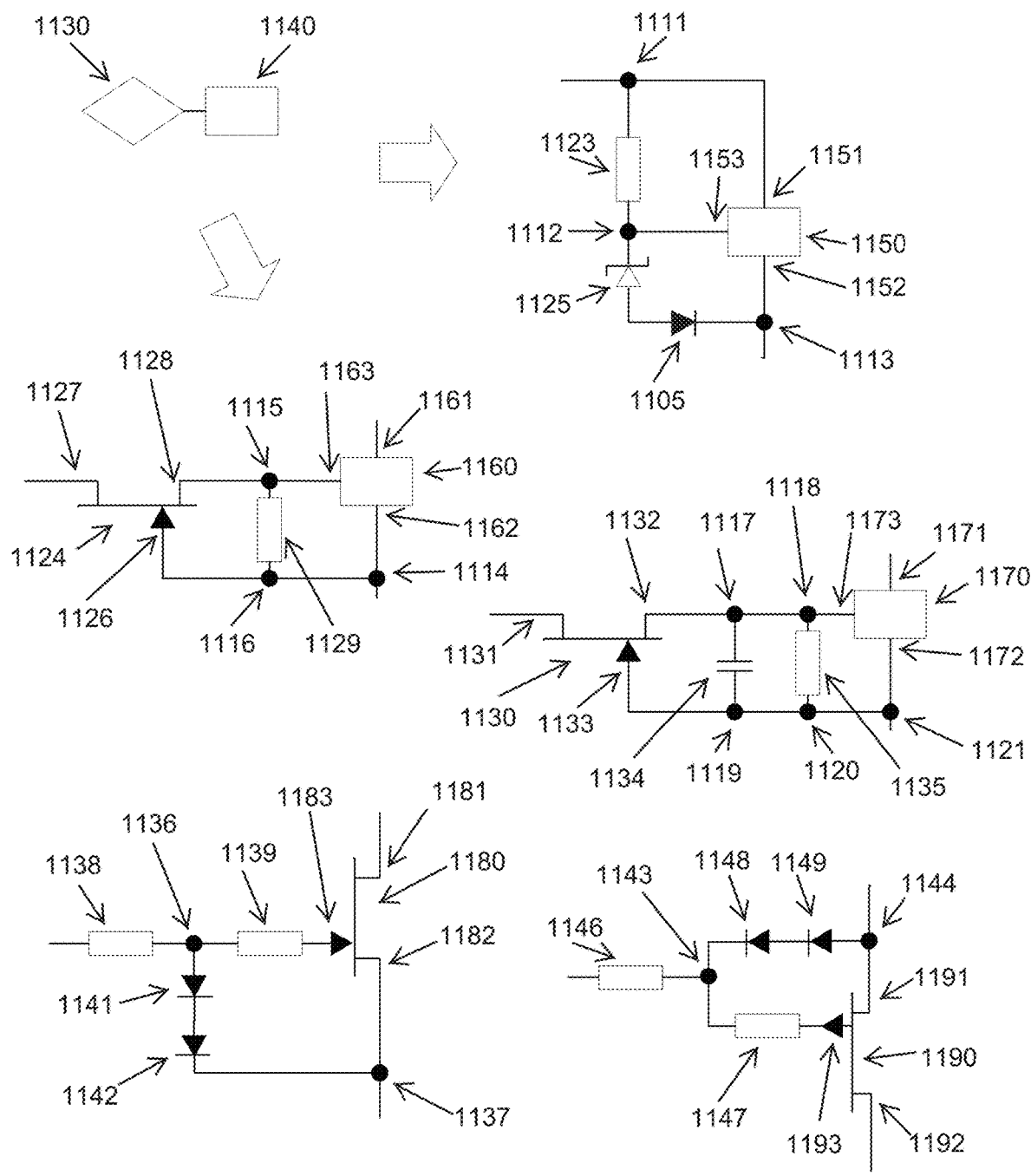
FIG. 11 illustrates several embodiments of gate protection circuitry.

FIG. 11 illustrates several embodiments of gate protection circuitry. Gate protection circuitry 1130 can be applied to any gate of any transistor 1140 in the devices of the present invention, including but not limited to the first transistor. Schematically-shown gate protection circuitry 1130 and transistor 1140 can be exemplified by the several partial circuits protecting the gates of transistors 1150, 1160, 1170, 1180, and 1190, respectively. Transistor 1150 is in electrical communication via pin 1151 with connection 1111, and via pin 1152 with connection 1113. The gate 1153 connects via connection 1112 with resistor 1123 to connection 1111, and zener diode 1125 and diode 1105 to connection 1113. Selection of zener diode 1125 with the desired zener voltage allows control over the voltage seen at gate 1153. Adjusting the magnitude of the resistance of resistor 1123 allows control over the currents through the zener diode 1125 and through the gate 1153. Diode 1105 protects against negative surges from connection 1113. Accordingly, some embodiments provide gate protection for a transistor comprising a resistor in electrical communication between a first pin and the gate, and a zener diode and a diode between the gate and a second pin.

Alternatively, transistor 1160 having a pin 1161 and pin 1162 in electrical communication with connection 1114 can employ transistor 1124 connected by source 1128 to gate 1163 via connection 1115. Drain 1127 connects to any suitable components, such as for example, driver circuitry (not shown). Here, transistor 1124 is an n-channel depletion mode transistor with its gate 1126 ultimately connecting to pin 1162 via connections 1116, 1114. Resistor 1129 appears between connections 1115, 1116, and is chosen to have a low enough impedance to allow transistor 1124 to reliably maintain a voltage less than or equal to its threshold voltage across it. Transistor 1124 protects gate 1163 against positive currents and voltages. If source 1128 is at a higher potential than gate 1126 connected to connection 1114, then the voltage difference between gate 1163 and source 1162 is limited to approximately that of the threshold voltage of the transistor 1124. Similarly, if source 1128 is at a higher potential than gate 1126 connected to connection 1114, then the current through transistor 1124 and through gate 1163 is limited to that specified on transistor 1124's characteristic curves. Other embodiments relate to gate protection circuitry for a transistor to be protected comprising a gate-protecting n-channel depletion mode transistor having its source and gate in parallel electrical communication with a resistor, in turn the resistor being in parallel electrical communication with the gate and a pin of the transistor to be protected.

Another alternative partial circuit protects gate 1173 of transistor 1170. Pin 1171 in some cases ultimately connects to first terminal (not shown) and pin 1172 ultimately connects to second terminal (not shown) via connection 1121. This partial circuit employs transistor 1130 connected by source 1132 to gate 1173 via connections 1117, 1118. Drain 1131 connects to any suitable components, such as, for example, driver circuitry (not shown). Here, transistor 1130 is an n-channel depletion mode transistor with its gate 1133, which may ultimately connect to second terminal (not shown) via connections 1119, 1120, 1121. Capacitor 1134, between connections 1117 and 1119, and resistor 1135, between connections 1118 and 1120 further protect gate 1173, since capacitor 1134 acts as a bypass capacitor and allows initial current surges to flow through it instead of gate 1173. Still other embodiments relate to gate protection circuitry for a transistor to be protected comprising a gate-protecting n-channel depletion mode transistor having its source and gate in parallel electrical communication with a resistor, and in parallel electrical communication with a capacitor, in turn the resistor and the capacitor being in parallel electrical communication with the gate and a pin of the transistor to be protected.

In a further alternative, transistor 1180, being an n-channel depletion mode, normally-on transistor, has drain 1181 connecting ultimately to first terminal (not shown) and source 1182 connecting to any suitable components, such as, for example, ultimately to second terminal (not shown) via connection 1137. Gate 1183 is protected by resistors 1138, 1139 which are joined at connection 1136. Resistor 1138 limits current through gate 1183 and diodes 1141, 1142 between connection 1136 and 1137. Resistor 1139 has its voltage limited by diodes 1141, 1142, thereby limiting current to gate 1183. Thus, still other embodiments relate to gate protection circuitry for a transistor to be protected comprising two resistors in electrical communication with the gate of the transistor to be protected, wherein the resistors are divided by a connection point having one, two, or three diodes in electrical communication with the source of the transistor to be protected. The partial circuit involving transistor 1190 provides another example of this.

P-channel, depletion mode, normally-on transistor 1190 has a source 1191 ultimately connecting to any suitable components, such as, for example, first terminal (not shown) via connection 1144. Drain 1192 ultimately connects with any suitable components, such as, for example, second terminal (not shown). Gate 1193 is in electrical communication with resistors 1146, 1147, which are divided at connection 1143. From connection 1143, two diodes 1148, 1149 connect to connection 1144. Note the diodes 1148, 1149, are each oriented to limit voltage, and thereby with resistors 1146, 1147, limit the current, to gate 1193.

Figure 12:
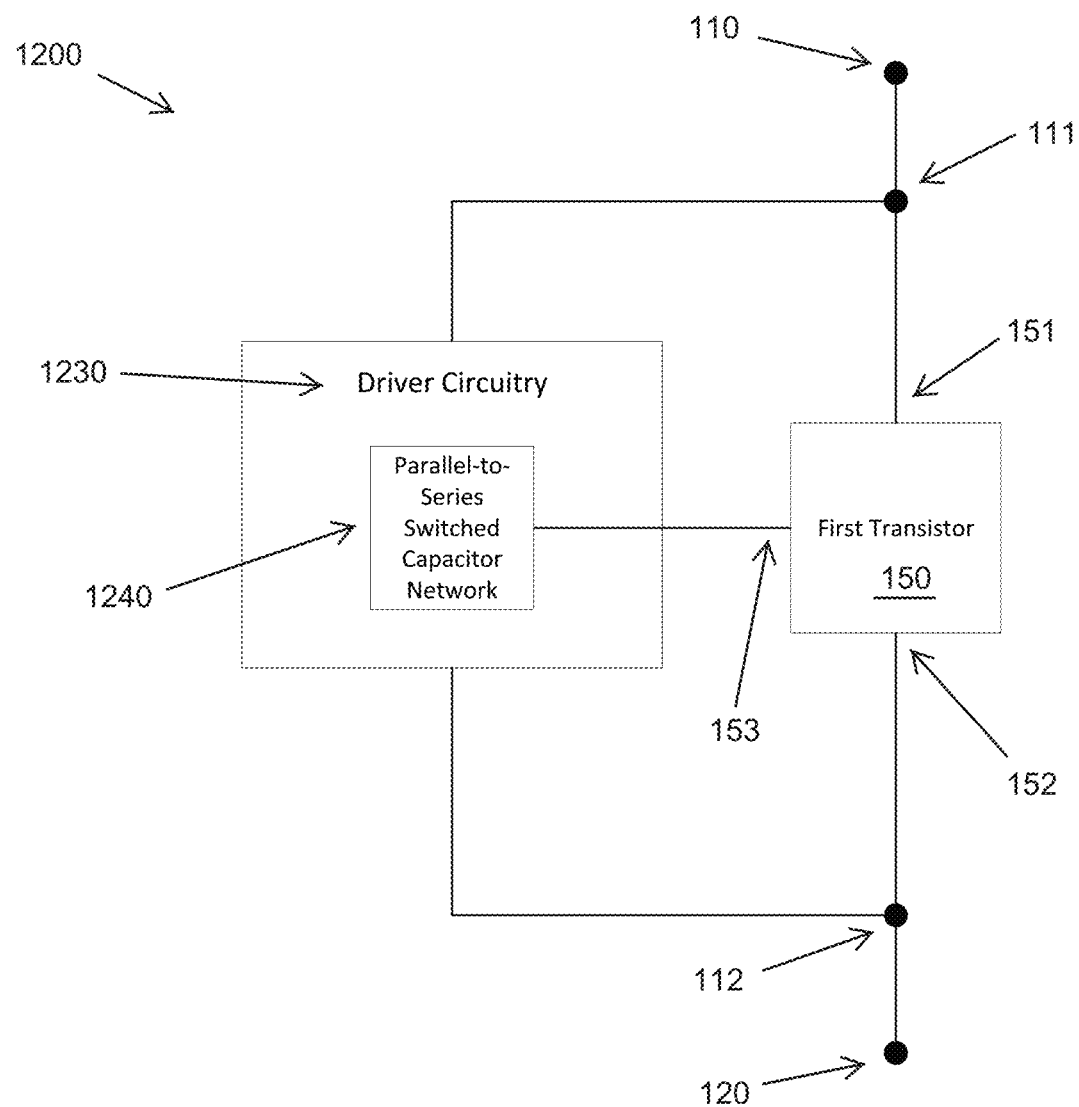
FIG. 12 conceptually depicts an embodiment, device 1200, wherein driver circuitry 1230 comprises a parallel-to-series switched capacitor network 1240 for converting voltage.

FIG. 12 conceptually depicts an embodiment, device 1200, wherein driver circuitry 1230 comprises a parallel-to-series switched capacitor network 1240 for converting voltage. Here, driver circuitry 1230 comprises parallel-to-series switched capacitor network 1240 configured to receive an input voltage, such as the voltage across device 1200 at first terminal 110 and second terminal 120 harvested at connections 111, 112. The input voltage charges the capacitors of the network 1240 in parallel, and then switches the charge capacitors into a series configuration that provides a converted voltage at first gate 153 to control first transistor 150. In some cases, that converted voltage can drive first transistor 150 into blocking depletion mode, so that no current flows through first transistor 150 between pin 151 and pin 152. In other cases, the converted voltage can drive first transistor 150 out of blocking depletion mode and optionally into enhancement mode. Any suitable driver circuitry 1230 and parallel-to-series switched capacitor network 1240, such as those described and exemplified herein, can be used.

Figure 13:
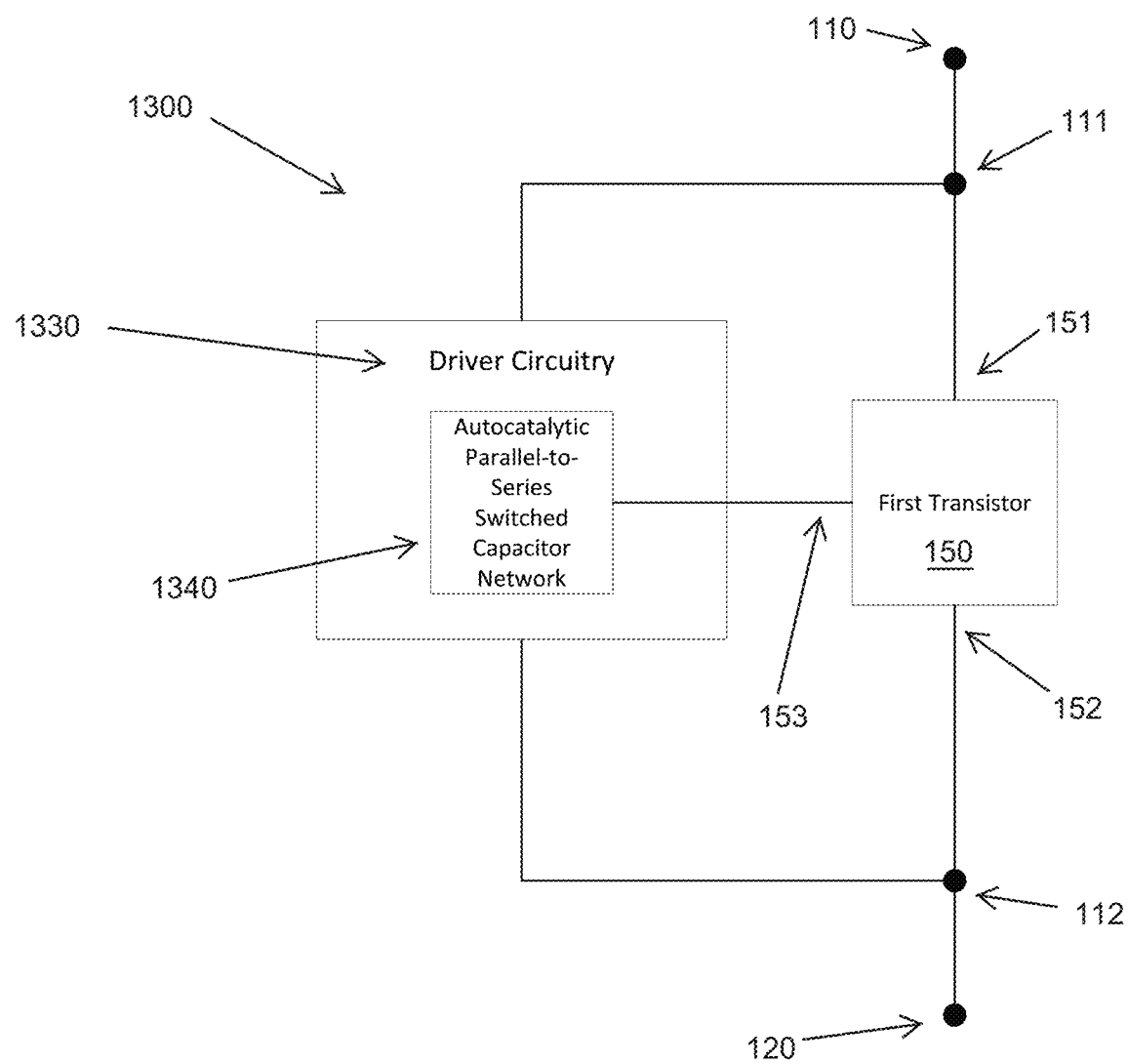
FIG. 13 conceptually depicts an embodiment, device 1300, wherein driver circuitry 1330 comprises an autocatalytic parallel-to-series switched capacitor network 1340 for autocatalytically converting voltage.

FIG. 13 conceptually depicts an embodiment, device 1300, wherein driver circuitry 1330 comprises an autocatalytic parallel-to-series switched capacitor network 1340 for autocatalytically converting voltage. Similar to device 1200, device 1300 comprises driver circuitry 1330 that comprises an autocatalytic parallel-to-series switched capacitor network 1340 configured to receive an input voltage, such as the voltage across device 1300 at first terminal 110 and second terminal 120 harvested at connections 111, 112. The input voltage charges the capacitors of the network 1340 in parallel, and then switches the charge capacitors into a series configuration that autocatalytically converts the input voltage and provides a converted voltage at first gate 153 to control first transistor 150. In some cases, that converted voltage can drive first transistor 150 into blocking depletion mode, so that no current flows through first transistor 150 between pin 151 and pin 152. In other cases, the converted voltage can drive first transistor 150 out of blocking depletion mode and optionally into enhancement mode. Any suitable driver circuitry 1330 and autocatalytic parallel-to-series switched capacitor network 1340, such as those described and exemplified herein, can be used.

Figure 14:
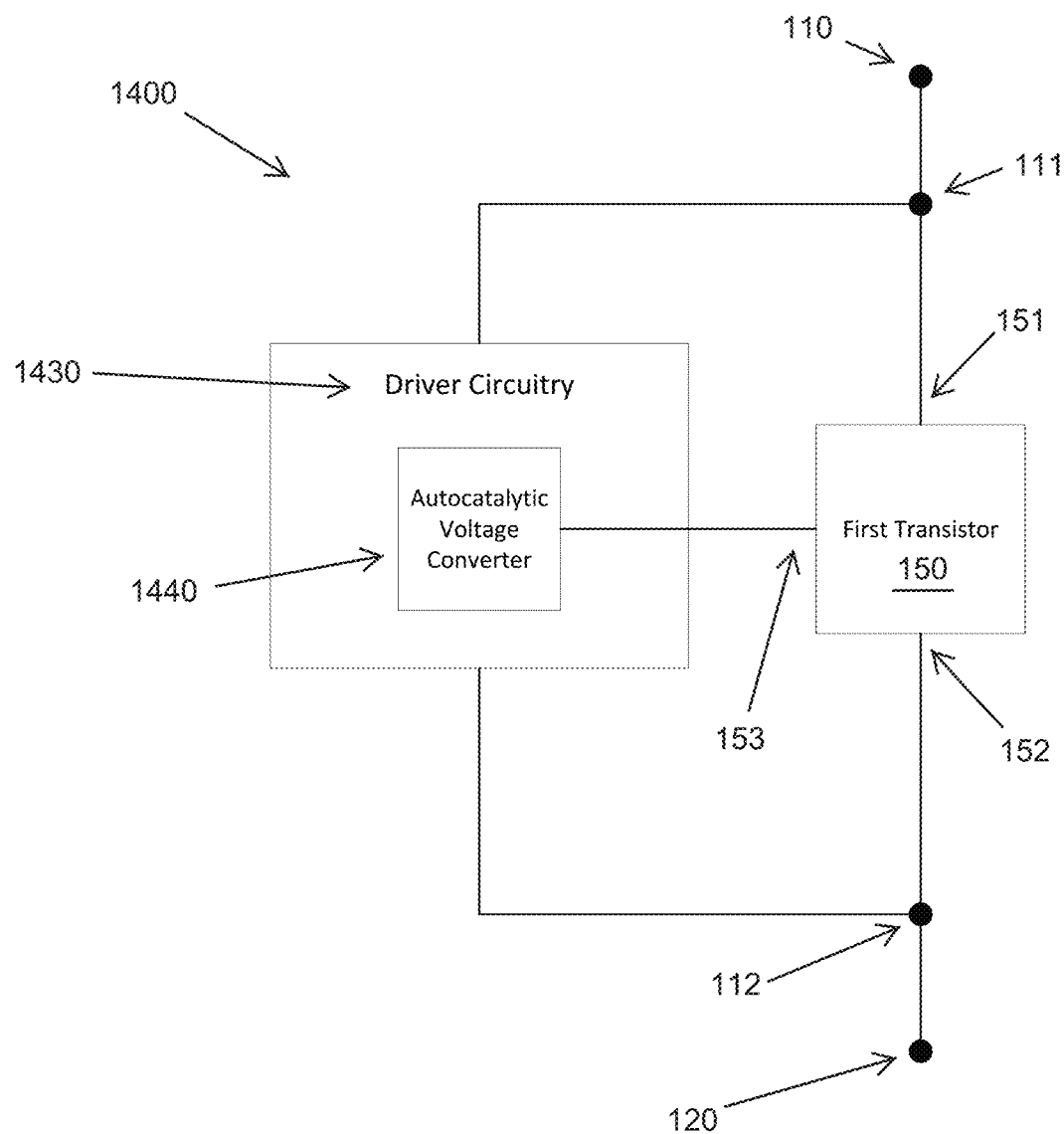
FIG. 14 conceptually depicts an embodiment, device 1400, wherein driver circuitry 1430 comprises an autocatalytic voltage converter 1440 for autocatalytically converting voltage.

FIG. 14 conceptually depicts an embodiment, device 1400, wherein driver circuitry 1430 comprises an autocatalytic voltage converter 1440 for autocatalytically converting voltage. Autocatalytic voltage converter 1440 is configured to receive an input voltage, such as the voltage across device 1400 at first terminal 110 and second terminal 120 harvested at connections 111, 112. Once the autocatalytic voltage converter 1440 has autocatalytically converted the input voltage, driver circuitry 1430 is configured to apply the converted voltage as a gate voltage at first gate 153, thereby controlling first transistor 150. In some cases, that converted voltage can drive first transistor 150 into blocking depletion mode, so that no current flows through first transistor 150 between pin 151 and pin 152. In other cases, the converted voltage can drive first transistor 150 out of blocking depletion mode and optionally into enhancement mode. Any suitable driver circuitry 1430 and autocatalytic voltage converter 1440, such as those described and exemplified herein, can be used. In some instances, the autocatalytic voltage converter 1440 can comprise a parallel-to-series switched capacitor network. In other cases, the autocatalytic voltage converter 1440 can employ any voltage converter that autocatalytically converts voltage, as that conversion is described herein. Optionally, one or more inductors and/or one or more transformers can be used in that conversion.

Figure 15:
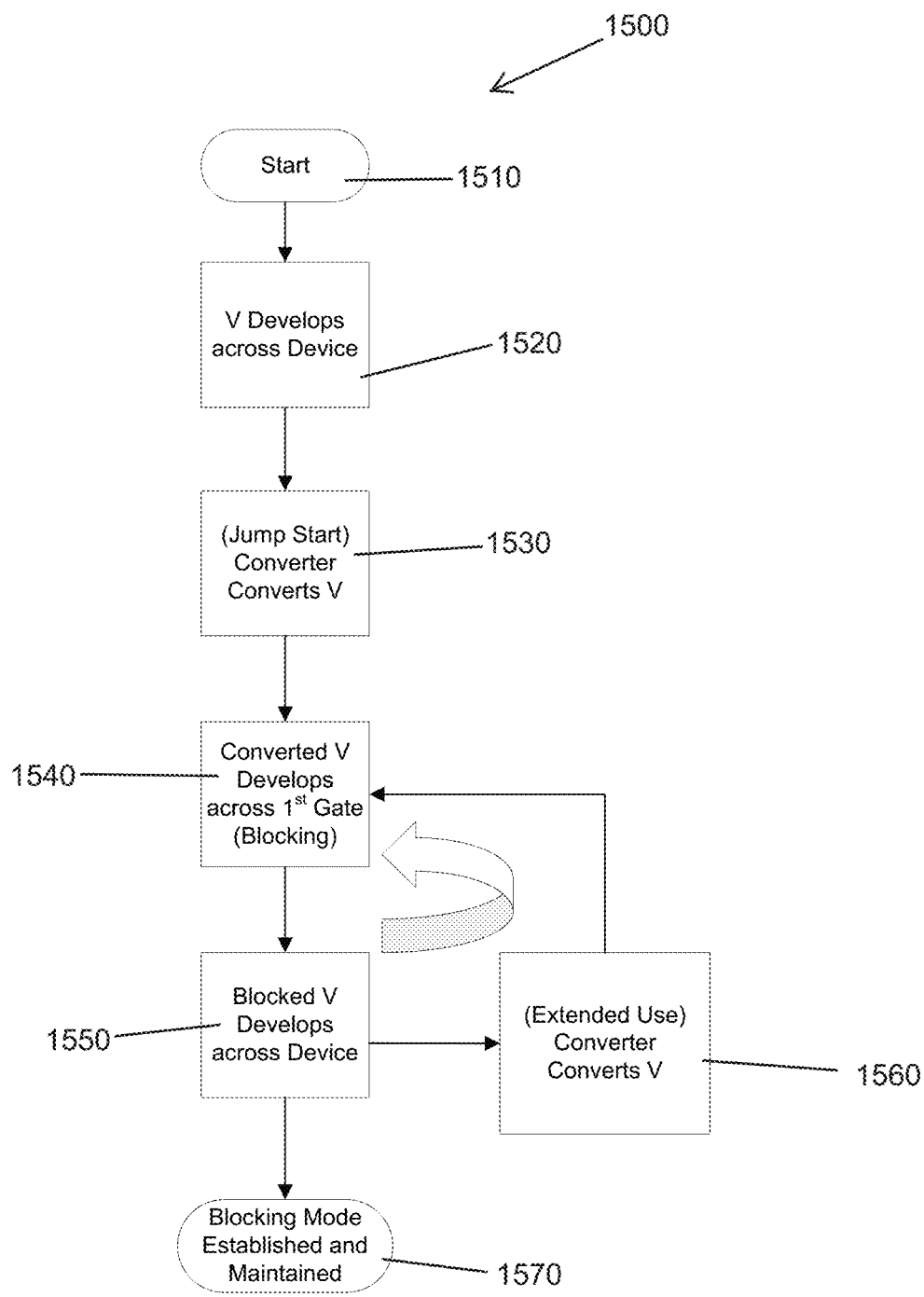
FIG. 15 depicts in flow chart form an inventive method 1500 for protecting a circuit from a sustained overcurrent condition.

FIG. 15 depicts in flow chart form an inventive method for protecting a circuit from a sustained overcurrent condition. Any suitable device can be used to practice the method 1500 of FIG. 15, such as, for example, one that includes the jumpstart voltage converter 541 and voltage converter 543 of any one of FIGS. 5-7 within the voltage converter circuitry 140 shown in FIG. 1. To begin 1510, a voltage develops 1520 across the device which can be converted 1530 into a releasably-stored voltage, optionally by a jumpstart voltage converter. The converted or releasably-stored voltage is developed 1540 across the first gate of the first transistor of the device, driving the first transistor into blocking depletion mode. Optionally, the device comprises a plurality of transistors in parallel with each other, and the converted voltage is applied to the gates of each transistor in the plurality, driving each transistor into blocking depletion mode. Since the first transistor or transistors are not passing current, a voltage develops 1550 across the device. That blocked voltage can be harvested and converted 1560 by a voltage converter, optionally an extended use voltage converter, which then applies 1540 that converted voltage across the first gate to maintain the first transistor or transistors in blocking depletion mode. Steps 1540, 1550, and 1560 optionally repeat, and the device is established and maintained 1570 in blocking mode.

Figure 16:
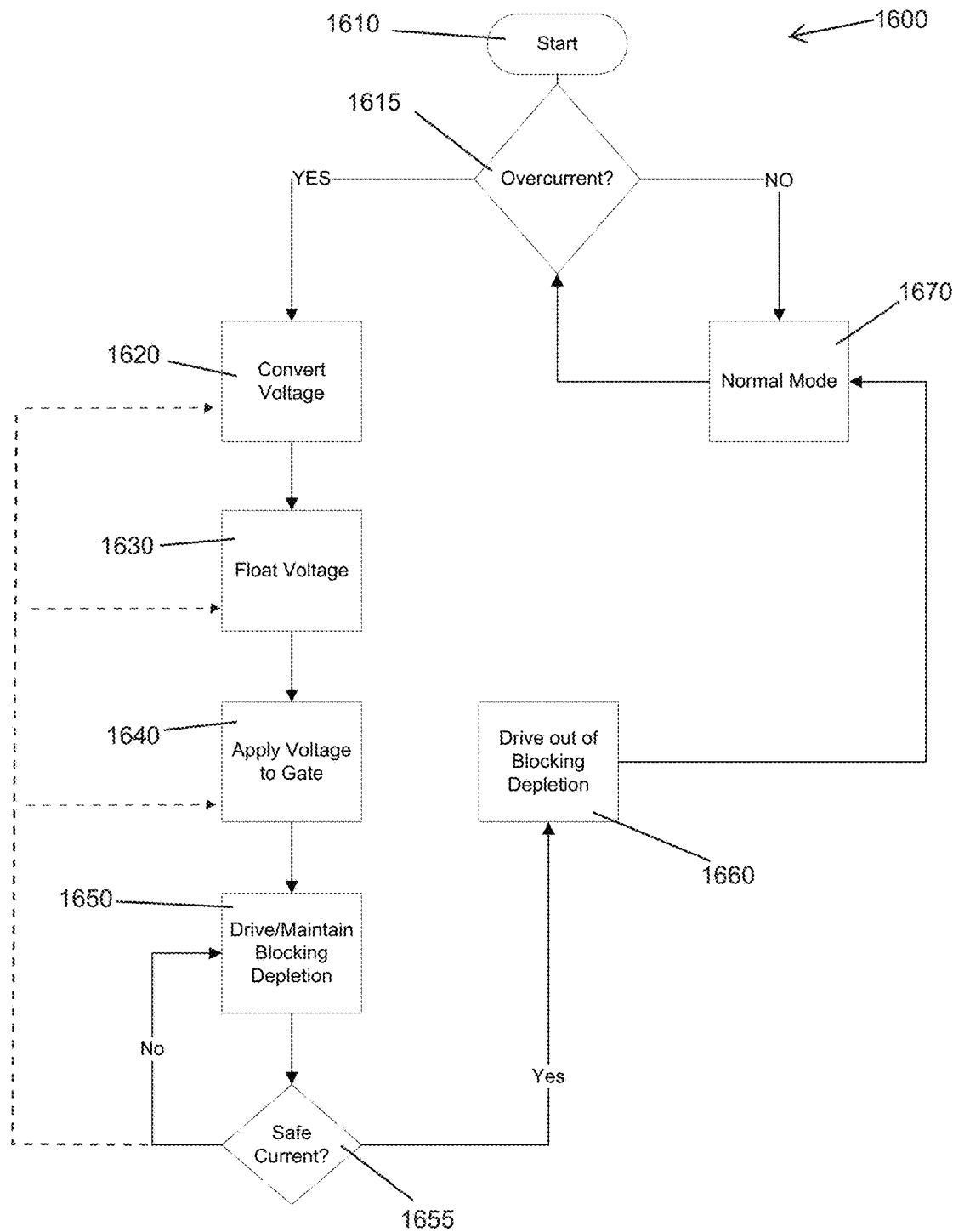
FIG. 16 depicts in flow chart form another inventive method 1600 for protecting a circuit from a sustained overcurrent condition.

FIG. 16 depicts in flow chart form another inventive method for protecting a circuit from a sustained overcurrent condition. Any suitable device can practice the method 1600 of FIG. 16. To begin 1610, it is determined whether an overcurrent condition exists 1615. If so, the device can convert a voltage 1620, such as, for example, the voltage across the device or a voltage derived therefrom, to obtain a converted voltage or a releasably-stored voltage. That voltage is then floated 1630 and applied 1640 as a gate voltage to the gate of the first transistor, or optionally to the gates of a plurality of transistors arranged in parallel. The gate voltage drives 1650 the first transistor or transistors into blocking depletion mode. The device monitors 1655 whether a safe current condition has replaced the overcurrent condition, and if not, the blocking depletion mode is maintained 1650. Blocking depletion can be maintained by any suitable process, such as one or more of converting 1620, floating 1630, and applying 1640. Once the safe current condition replaces the overcurrent condition, the first transistor or plurality of transistors is driven 1660 out of blocking depletion mode and into normal mode 1670. That can be accomplished in any suitable manner. In some cases, the same or different circuitry will convert a safe voltage to obtain a safe releasably-stored voltage, optionally float the safe releasably-stored voltage, and apply the safe releasably-stored voltage or the safe floated voltage to the gate of the first transistor or plurality of transistors to drive them out of blocking depletion. In normal mode, current is allowed to pass between a first terminal and a second terminal, and the first transistor or plurality of transistors are not in blocking depletion mode: they can be partially on, or they can be fully in enhancement. The device then continues to monitor for overcurrent conditions 1615.

Figure 17:
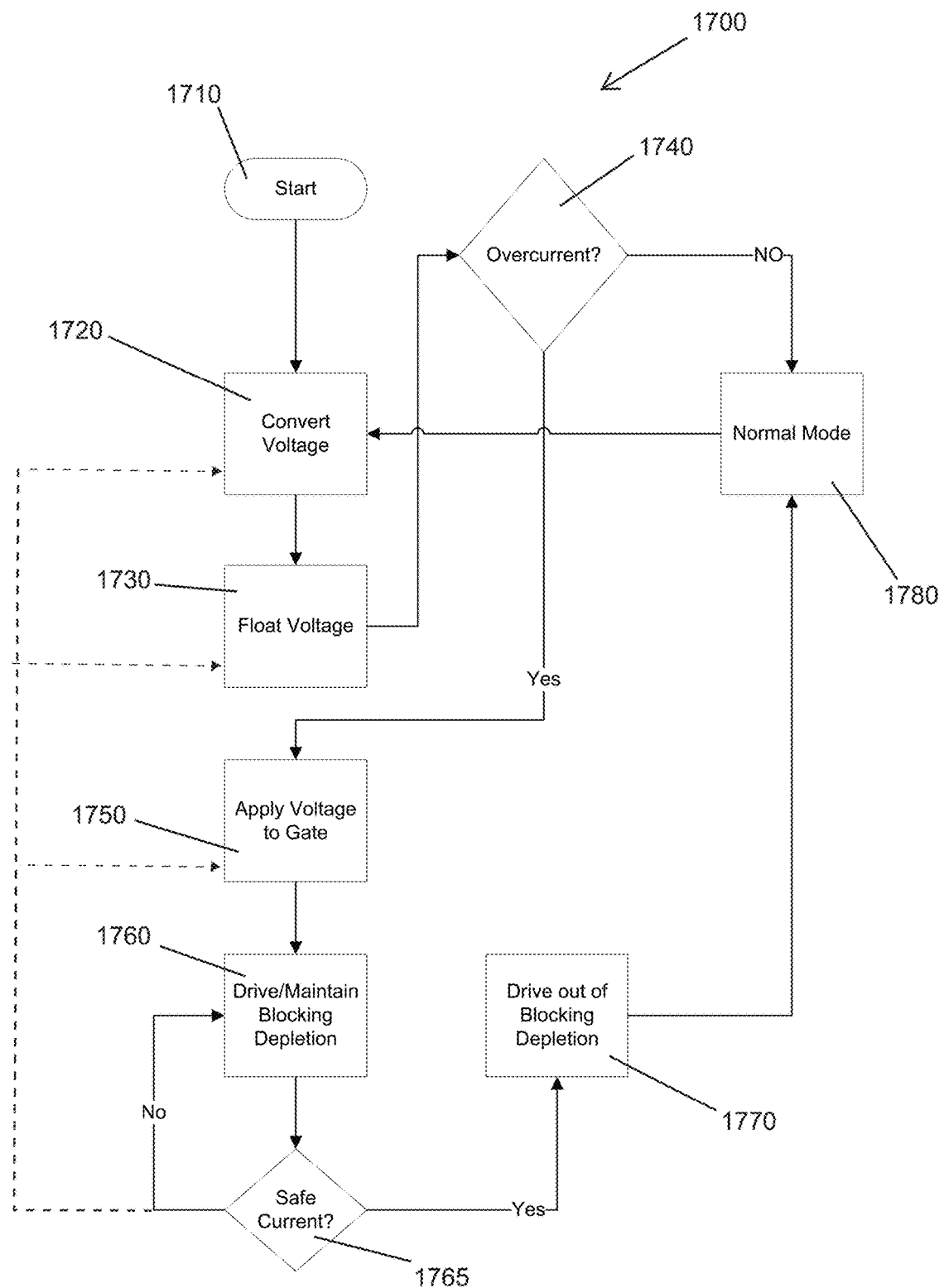
FIG. 17 depicts in flow chart form an inventive method 1700 for protecting a circuit from a sustained overcurrent condition.

FIG. 17 depicts in flow chart form an inventive method for protecting a circuit from a sustained overcurrent condition. Method 1700 differs from method 1600 in that voltages may be converted 1720 and floated 1730 even in the absence of an overcurrent condition. Any suitable device can be used to practice method 1700. To begin 1710, a voltage such as the voltage across the device or a derivative thereof, is converted 1720 to yield a converted voltage or a releasably-stored voltage, which is then floated 1730 to provide a floated voltage. The device monitors the current flowing through the device for overcurrent condition 1740 and if there is no overcurrent condition, the device remains in normal mode 1780. Once an overcurrent condition is detected 1740, the floated voltage is applied 1750 to the gate of the first transistor or to the gates of the plurality of transistors, driving them into blocking depletion mode 1760. The current that would pass through the device is monitored 1765 for safe current conditions. If the overcurrent condition persists, the device is maintained 1760 in blocking depletion mode. Blocking depletion can be maintained by any suitable process, such as one or more of converting 1720, floating 1730, and applying 1750. When a safe current exists 1765, the transistor or transistors are driven out of blocking depletion mode 1770, and the device returns to normal mode 1780.

Figure 18:
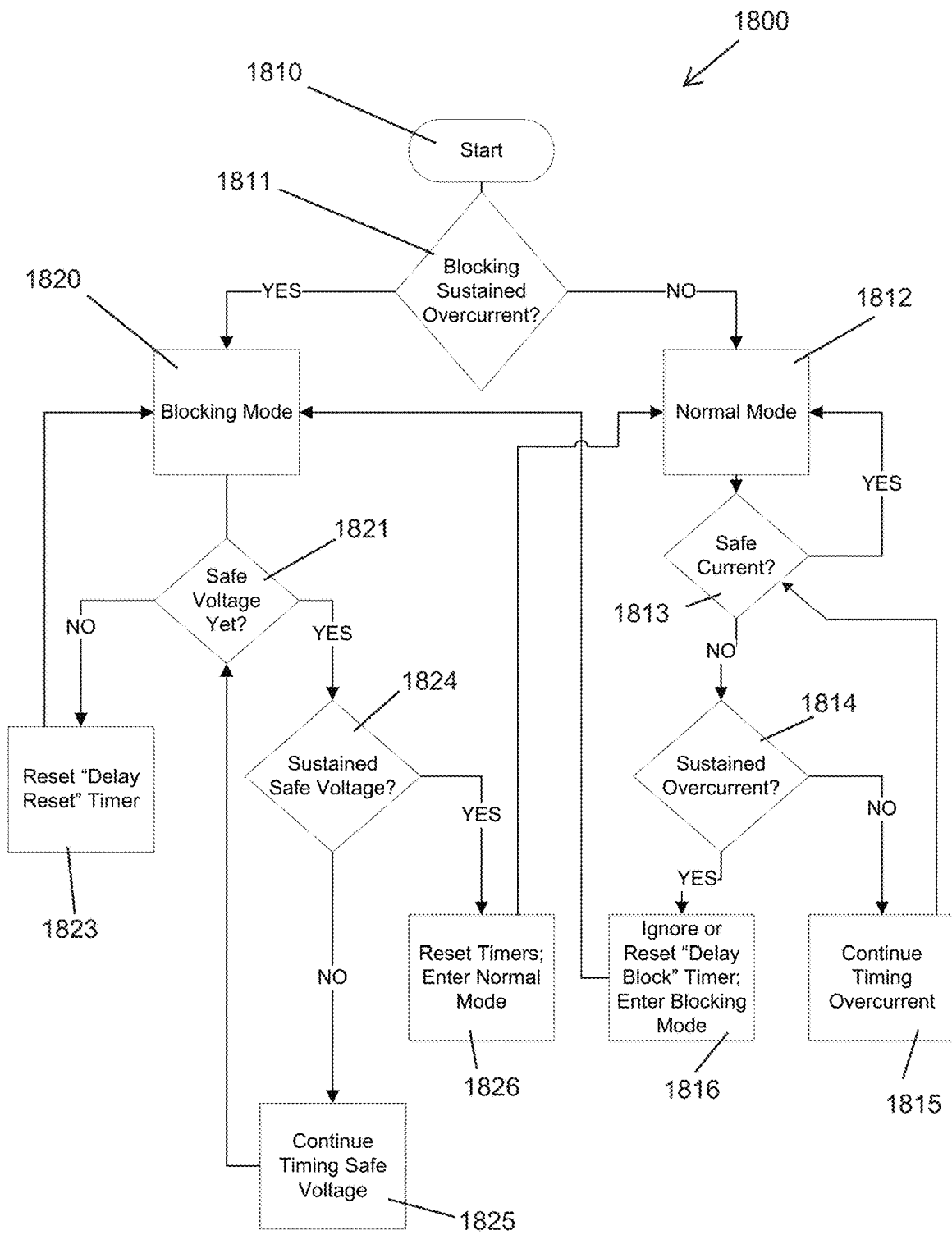
FIG. 18 depicts in flow chart form an inventive method 1800 for protecting a circuit from a sustained overcurrent condition.

FIG. 18 depicts in flow chart form an inventive method for protecting a circuit from a sustained overcurrent condition. Employing a device with suitable components such as device 1000 depicted in FIG. 10, the method 1800 depicted in FIG. 18 can be performed. To start 1810, it is determined 1811 whether the device 1000 is blocking a sustained overcurrent. If not, the device is configured for normal mode 1812, and first transistor 150 allows current to pass between first terminal 110 and second terminal 120. The current passing through the device 1000 is monitored by current monitoring circuitry 1075, and it is determined whether the current persists at a safe level 1813. If so, normal mode 1812 continues. If not, the duration of the overcurrent condition is monitored 1814 by timer circuitry 1085. If the overcurrent condition has not persisted for a predetermined duration, the unsafe current 1813 and its duration 1814 continue to be monitored. Once the predetermined duration has been achieved 1816, the timer circuitry 1085 is ignored or reset, and the device 1000 enters blocking mode 1820 by having driver circuitry 1030 drive first transistor 150 into blocking depletion mode, as described for FIG. 10. The overcurrent condition is monitored 1821 by measuring the voltage between first terminal 110 and second terminal 120 by current monitoring circuitry 1075, and if the voltage remains above a predetermined threshold, the device remains in blocking mode 1820, such as by oscillator 1095 prompting voltage converter circuitry 1040 and/or voltage floating circuitry 1080 to continuously convert and float a voltage so the driver circuitry 1030 can maintain first transistor 150 in blocking depletion mode via closed gate 160. However, if the voltage across device 1000 returns to a safe level 1821, then the duration of the safe voltage is monitored 1824, by timer circuitry 1085. If the safe voltage or normal current condition does not persist for a sufficient duration 1825, the device continues to time the safe current condition 1825 using timer circuitry 1085. Once the safe current condition (as measured by current monitoring circuitry 1075 determining whether the voltage is a safe voltage) has persisted for a suitable duration 1826, the device 1000 enters normal mode 1812, timer circuitry 1085 is reset, and current once again may pass between first terminal 110 and second terminal 120 via first transistor 150.

Figure 19:
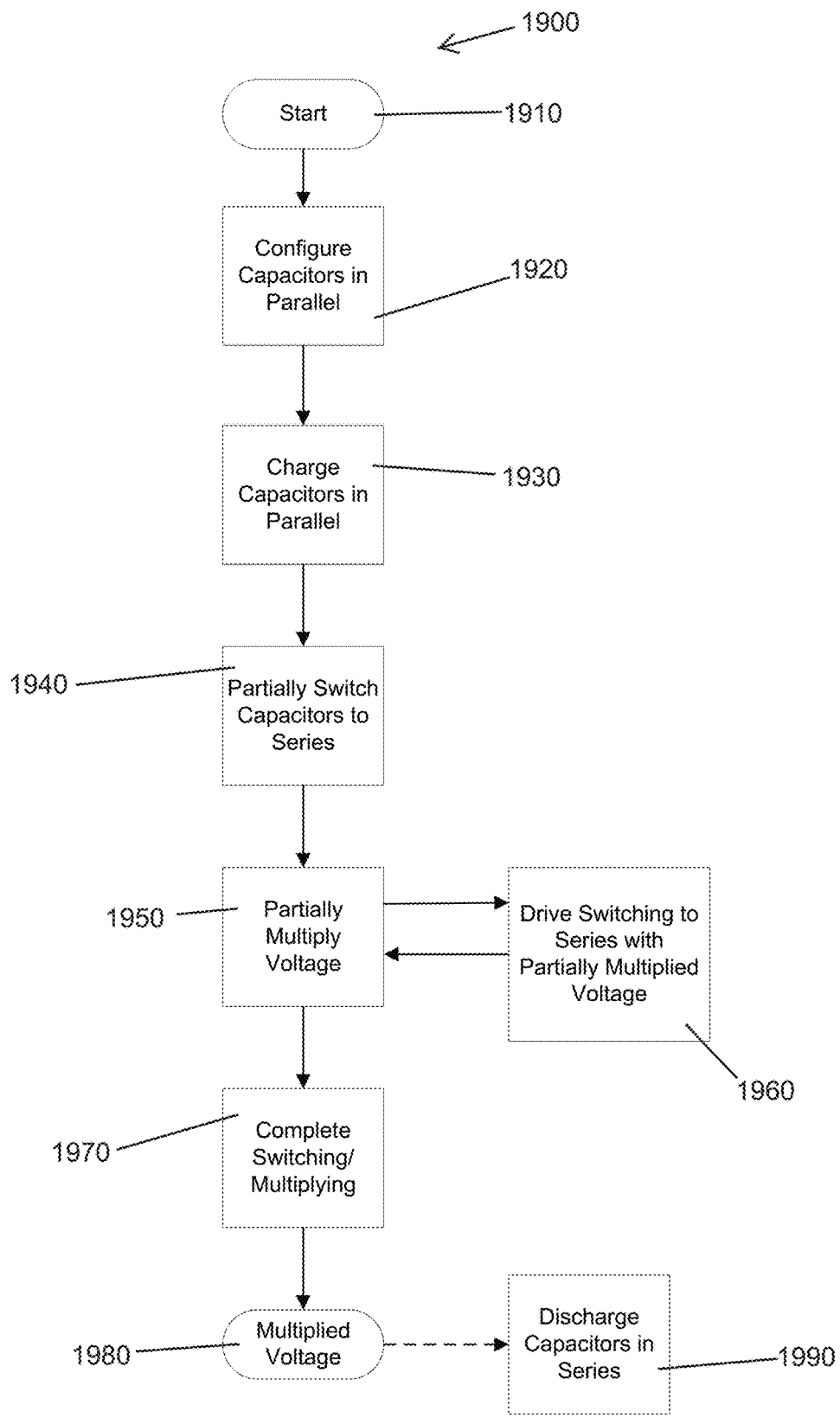
FIG. 19 depicts in flow chart form an inventive method 1900 for autocatalytically converting a voltage using a parallel-to-series switched capacitor network.

FIG. 19 depicts in flow chart form an inventive method for autocatalytically converting a voltage using a parallel-to-series switched capacitor network. Any suitable parallel-to-series switched capacitor network, such as those described and exemplified herein, can be used to practice the method 1900 shown in FIG. 19. To begin 1910, a plurality of capacitors are configured 1920 in parallel, such as by allowing switches that can be transistors, diodes, or a combination thereof, to place those capacitors in parallel with each other and subject to a voltage. The capacitors are charged 1930 in parallel, either partially or fully, as measured by the charging voltage. Then, the capacitors are partially switched 1940 from parallel to series. Partially switched means that the capacitors are no longer fully in parallel. For example, two of the capacitors in the network can be switched into series, while at least one capacitor remains in parallel. For another example, two or more, or even all, of the capacitors in the network can be switched "a little bit" toward a series arrangement, such as by transistors that transition from blocking mode to partially on. The result of a partial switch is that the stored voltage is partially multiplied 1950 to a voltage that is less than the voltage that would result if all of the capacitors were fully configured in series. The partially multiplied voltage is then fed into the network to drive 1960 the further switching of the capacitors into series. Partially multiplying the voltage 1950 and driving the switching with the partially multiplied voltage 1960 amplify each other, driving the network to complete the switching of the capacitors and multiplying the stored voltage 1970. Once complete, a multiplied voltage is available 1980. Optionally, the multiplied voltage can be applied in any suitable manner, such as by discharging the capacitors in series 1990. In some cases, an autocatalytically converted voltage can drive the gate of a transistor. In other cases, the autocatalytically converted voltage can drive the gate of a first transistor into blocking depletion mode, out of blocking depletion mode, or into enhancement mode. In still further cases, the autocatalytically converted voltage can drive a first gate of a first transistor into blocking depletion mode, thereby protecting a circuit from an overcurrent condition.

Figure 20:
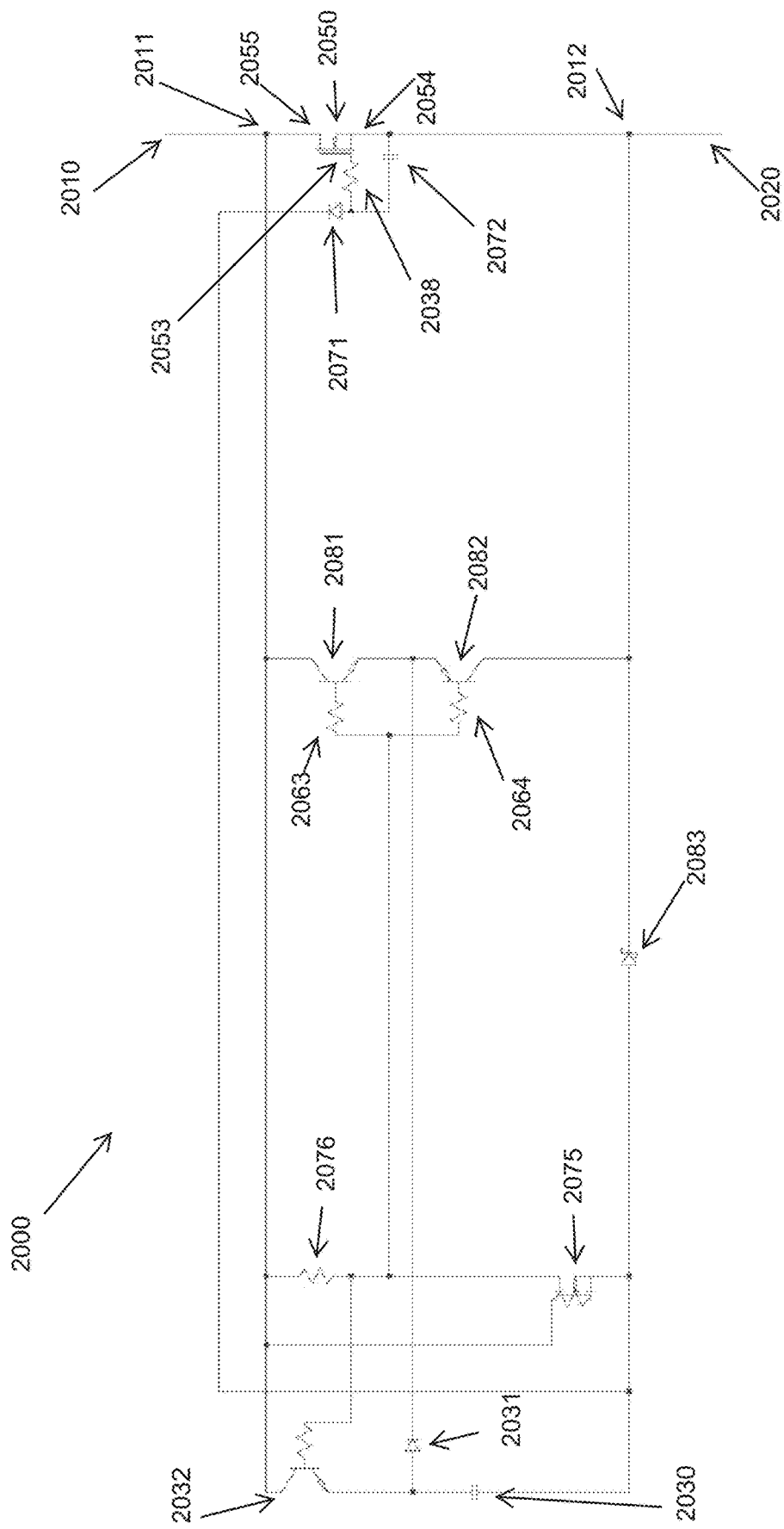
FIG. 20 provides a wiring diagram for a device 2000 configured to cause first transistor 2050 to block current between first terminal 2010 and second terminal 2020 during an overcurrent condition.

FIG. 20 provides a wiring diagram for a device 2000 configured to cause first transistor 2050 to block current between first terminal 2010 and second terminal 2020 during an overcurrent condition. First transistor 2050 is an n-channel, depletion mode, normally-on transistor in series electrical communication with first terminal 2010 via connection 2011, and second terminal 2020 via connection 2012. The first drain 2055 is connected to connection 2011, while the first source 2054 is connected to connection 2012. A primary current path appears between first terminal 2010 and second terminal 2020 through first transistor 2050 via connections 2011, 2012. First gate 2053 has gate-protection circuitry, namely resistor 2038. Charge retention circuitry consists of capacitor 2072 and diode 2071 connected about the first gate 2053. The negative end of the capacitor is electrically connected to the anode of the diode, and the first gate and the first source are in parallel electrical communication with the capacitor. Voltage converting circuitry, comprising capacitor 2030, diode 2031, and bipolar junction transistor 2032 convert the voltage across the device via connections 2011, 2012 and store it as a releasably-stored voltage at capacitor 2030. Capacitor 2030 charges through transistor 2032 until transistor 2075 turns on which brings the base of transistor 2032 low and causes it to turn off thereby cutting the charging current. Voltage floating circuitry comprising bipolar transistors 2081, 2082 in a push-pull configuration, which is also a totem pole configuration. Thus, certain embodiments of the present invention provide voltage floating circuitry comprises a pair of transistors in a push-pull configuration, or a totem pole configuration. As shown here, bipolar junction transistors can be used; or any suitable transistors such as a pair of MOSFETs. Resistors 2063, 2064 provide gate protection for transistors 2081, 2082, respectively. Schottky diode 2083 also participates in the voltage floating circuitry, because the releasably-stored voltage at capacitor 2030 is placed in parallel with Schottky diode 2083 to shift it at the appropriate moment. During normal current conditions, the current monitoring MOSFET transistor 2075 is off, which causes current to flow through the base of npn bipolar junction transistor 2081 so that is turned on, and transistor 2082 is turned off. When an overcurrent condition occurs, the current monitoring transistor 2075 turns on, thus driving the base of transistor 2081 low and turning it off. Also happening at approximately the same time, the base of pnp bipolar junction transistor 2082 is being driven low since it is connected to the base of transistor 2081. Capacitor 2030 drives pnp bipolar junction transistor 2082 turning it on. Current flows out of capacitor 2030, through the emitter and base of pnp bipolar junction transistor 2082 and then through transistor 2075 and back to the negative terminal of capacitor 2030 so that transistor 2082 is turned on. The turn off of transistor 2081 and turn on of transistor 2082 places capacitor 2030 in parallel with diode 2083. Current monitoring circuitry is provided by transistor 2075 and resistor 2076.

Figure 21:
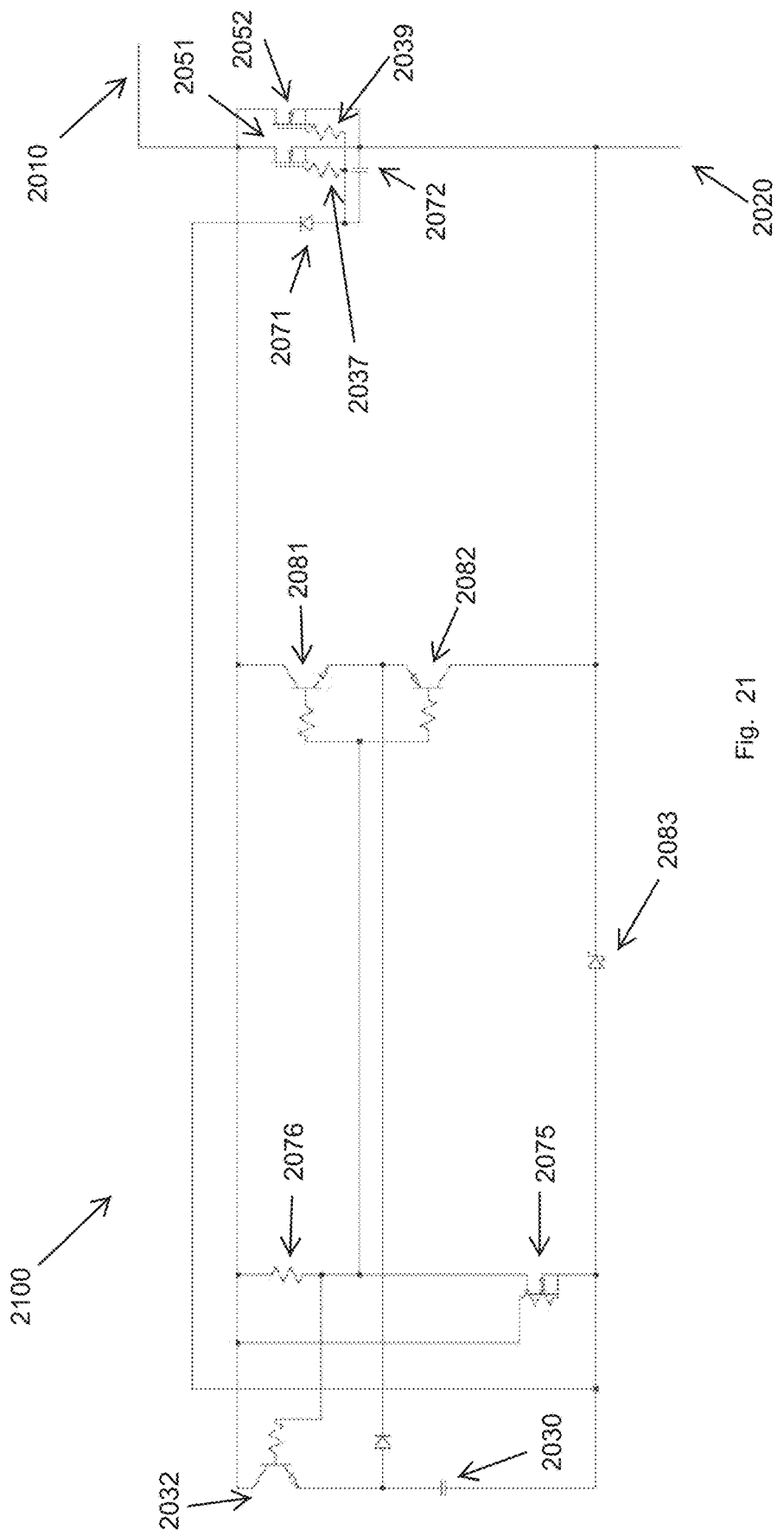
FIG. 21 provides a wiring diagram for device 2100 that is similar to device 2000, but has two transistors 2051, 2052 arranged in parallel with each other and configured to block current between first terminal 2010 and second terminal 2020 during an overcurrent condition.

FIG. 21 provides a wiring diagram for device 2100 that is similar to device 2000, but has two transistors 2051, 2052 arranged in parallel with each other and configured to block current between first terminal 2010 and second terminal 2020 during an overcurrent condition. Transistors 2051, 2052 are n-channel, depletion mode, normally-on transistors, and have gate protection circuitry in the form of resistors 2037, 2039, respectively. As can be seen from FIG. 21, the drains of transistors 2051, 2052 are electrically connected to each other and would be at the same potential. Similarly, the sources of transistors 2051, 2052 are electrically connected to each other and would be at the same potential. The other components, some of which are labelled, are as described for FIG. 20.

Figure 22:
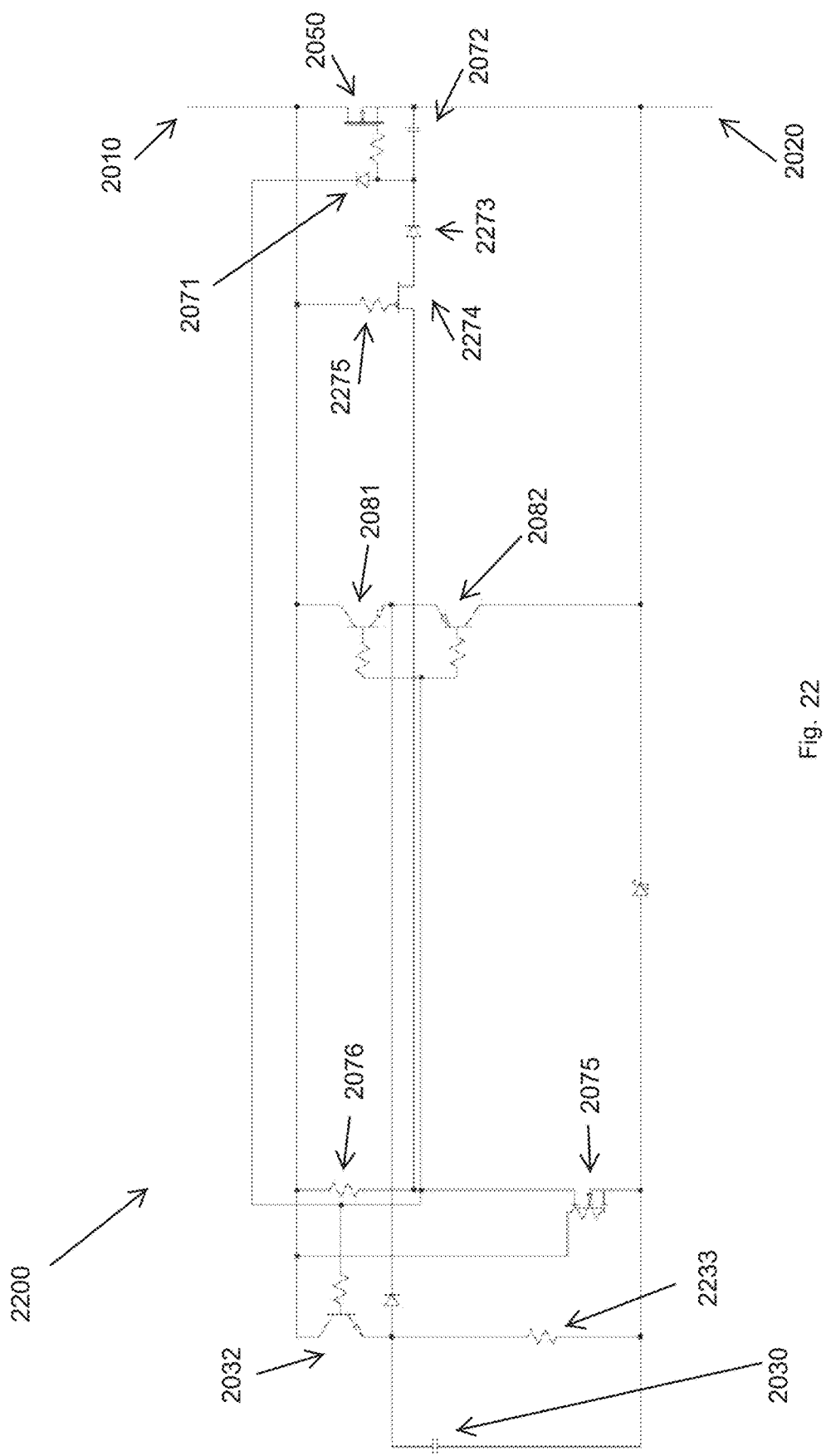
FIG. 22 provides a wiring diagram for device 2200 that is similar to device 2000 that adds additional charge retention circuitry.

FIG. 22 provides a wiring diagram for device 2200 that is similar to device 2000 but adds additional charge retention circuitry. Moreover, first transistor 2050 is configured to operate in enhancement mode during normal current conditions. In addition to diode 2071 and capacitor 2072, diode 2273 and transistor 2274 further assist with the charge retention function at the first gate of first transistor 2050. The source of the p-channel normally-on transistor 2274 is connected between current monitoring resistor 2076 and current monitoring transistor 2075. During normal conditions, capacitor 2072 is charged through resistor 2076 and transistor 2274 and diode 2273 so that the positive terminal of capacitor 2072 is at the cathode of diode 2273, and the negative terminal of capacitor 2072 is at the first source of first transistor 2050 so that capacitor 2072 drives first transistor 2050 into enhancement mode. When an overcurrent occurs, transistor 2075 is switched on and capacitor 2072 is charged to the opposite polarity through diode 2071 so that the positive terminal of capacitor 2072 is now at the first source of first transistor 2050, and the negative terminal of capacitor 2072 is now at the cathode of diode 2273. The turning on of current monitoring transistor 2075 also pulls the source of transistor 2274 low, and this causes the gate of transistor 2274 to be at a relatively higher potential than its source, thus turning off transistor 2274 so that it is in blocking depletion. This prevents positive charge from entering through transistor 2274 and diode 2273 which would discharge capacitor 2072 and possibly drive first transistor 2050 out of blocking depletion prematurely. Diode 2071 also prevents positive charge from prematurely driving the first transistor 2050 out of blocking depletion. In this way, diode 2071 and transistor 2274 assist the charge retention function by holding a depletion charge on capacitor 2072, and diode 2273 assists the charge retention function by holding an enhancement charge on the capacitor 2072. Resistor 2275 provides gate protection for transistor 2274. Here, resistor 2233 also assists capacitor 2030 with the voltage conversion process.

Figure 23:
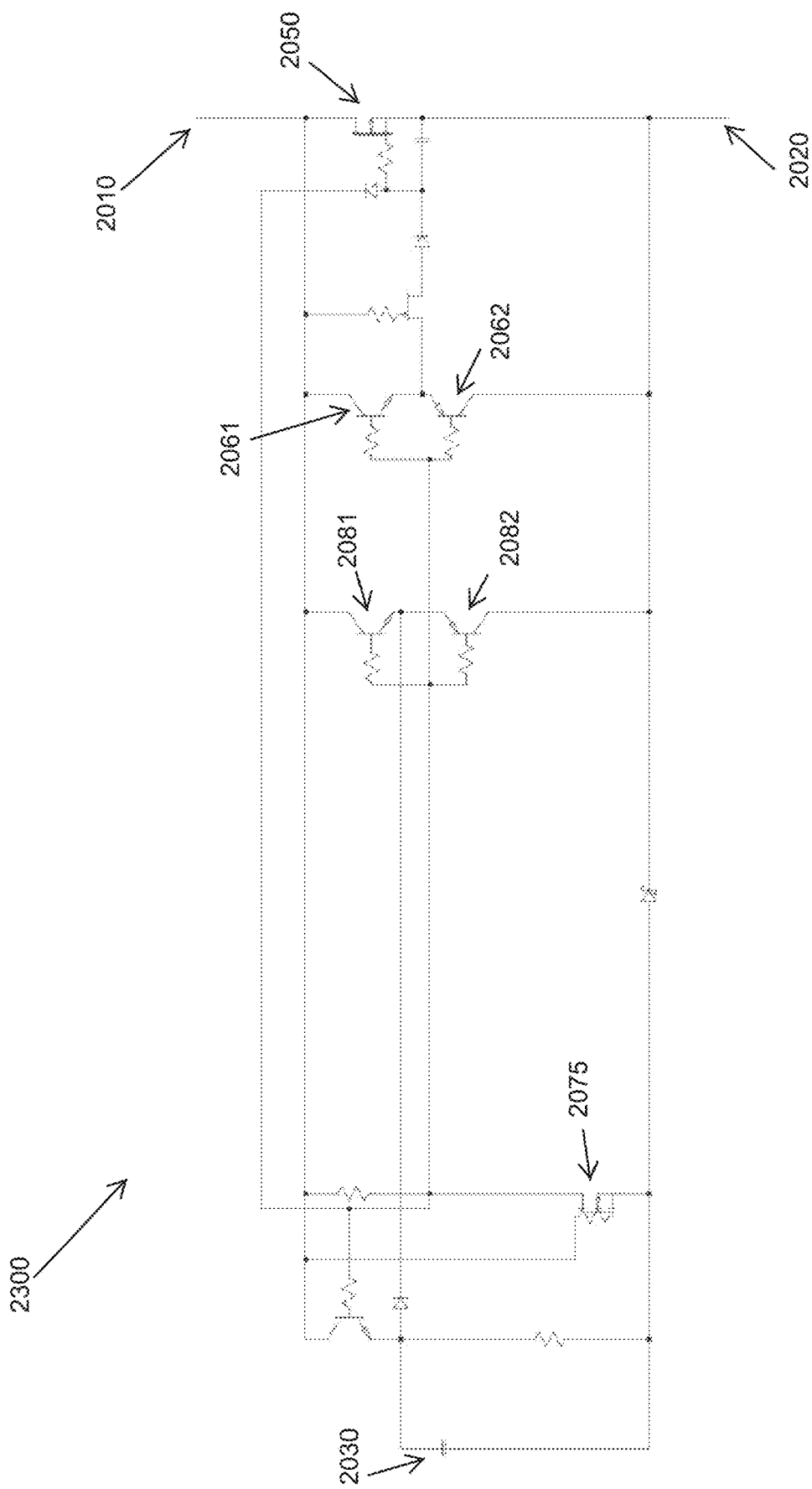
FIG. 23 provides a wiring diagram for device 2300 that is similar to device 2200 that adds switch transistors 2061, 2062.

FIG. 23 provides a wiring diagram for device 2300 that is similar to device 2200 that adds switch transistors 2061, 2062. Here, driver circuitry comprises switch transistors 2061, 2062 configured to apply a gate voltage both during normal current conditions and when driving or maintaining the first transistor 2015 blocking depletion mode. Bipolar junction transistors 2061, 2062 are arranged in a push-pull configuration, and a totem pole configuration. During normal mode, if the voltage across the two terminals is high enough, the base of transistor 2061 is driven to turn on transistor 2061. The result is that capacitor 2072 is normally charged through transistor 2061 so that capacitor 2072 holds an enhancement charge as was the case in FIG. 21. When an overcurrent condition arises, transistors 2061 and 2062 are oppositely switched so that transistor 2061 is off (blocking) and transistor 2062 is on (conducting), thus preventing any positive charge from entering through transistor 2061.

Figure 24:
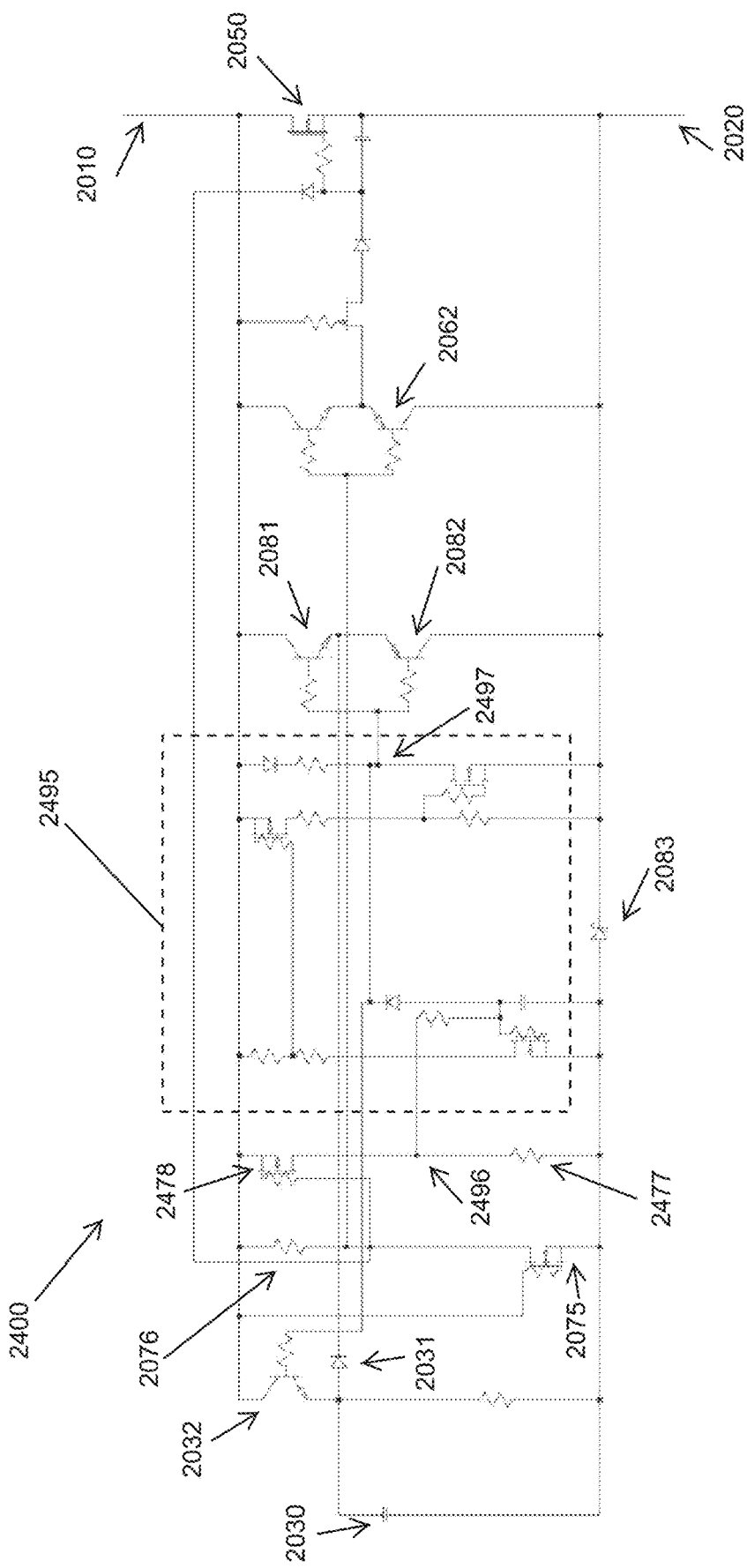
FIG. 24 provides a wiring diagram for device 2400 that is similar to device 2300, but adds oscillator 2495.

FIG. 24 provides a wiring diagram for device 2400 that is similar to device 2300, but adds oscillator 2495. Oscillator 2495 interacts with both the voltage converter circuitry at the gate of transistor 2032, and the voltage floating circuitry at the gates of transistors 2081, 2082. Resistor 2477 and transistor 2478 assist transistor 2075 and resistor 2076 in the current monitoring circuitry function. When transistor 2075 turns on, this causes transistor 2478 to turn on also. An input of the oscillator 2495 is connected between transistor 2478 and resistor 2477 at connection 2496 so that the oscillations will not start until current monitoring transistor 2075 is turned on. The voltage floating bjt totem pole structure comprising transistors 2081 and 2082 has its base connected to an output of the oscillator 2495 at connection 2497 so that when the oscillator output is high, so is the output of the totem pole, and vice versa. The base of converter transistor 2032 is also connected to the oscillator output so that transistors 2081 and 2032 are on at the same times, and off at the same times. When the oscillator output is high, transistor 2032 is on and capacitor 2030 charges through it. When the oscillator output is low, 2032 is turned off, 2081 is turned off, and 2082 is turned on. By turning transistor 2082 on, capacitor 2030 is placed in parallel with diode 2083 so that the releasably-stored voltage at capacitor 2030 is floated. It is necessary for transistor 2032 to be off when transistor 2082 is on to prevent a short circuit path through transistor 2032, through diode 2031, through transistor 2082, and out through second terminal 2020.

Figure 25:
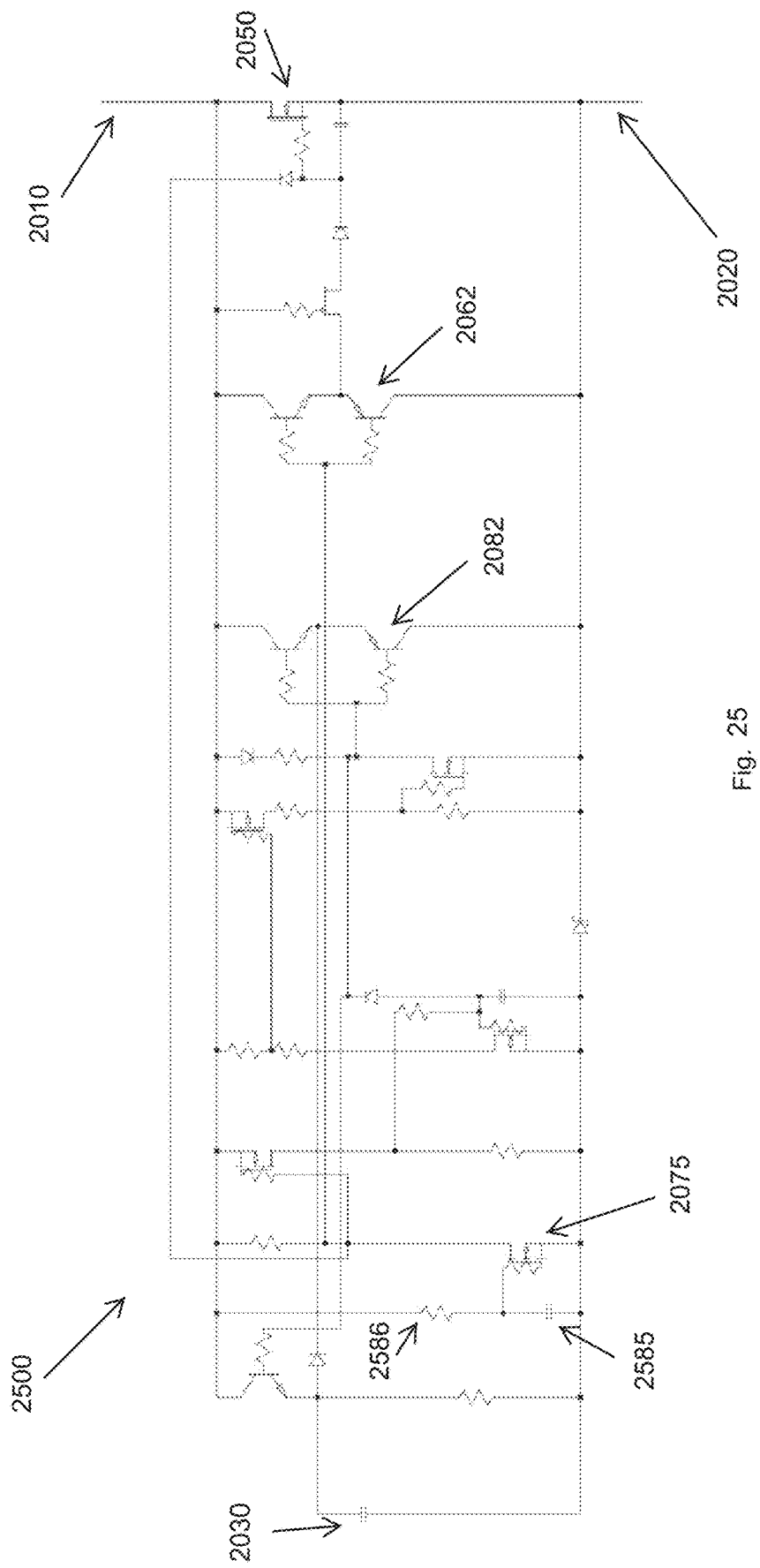
FIG. 25 provides a wiring diagram for device 2500 that is similar to device 2400, but adds delay block timer circuitry comprising capacitor 2585 and resistor 2586.

FIG. 25 provides a wiring diagram for device 2500 that is similar to device 2400, but adds delay block timer circuitry comprising capacitor 2585 and resistor 2586 at the gate of current monitoring transistor 2075.

Figure 26:
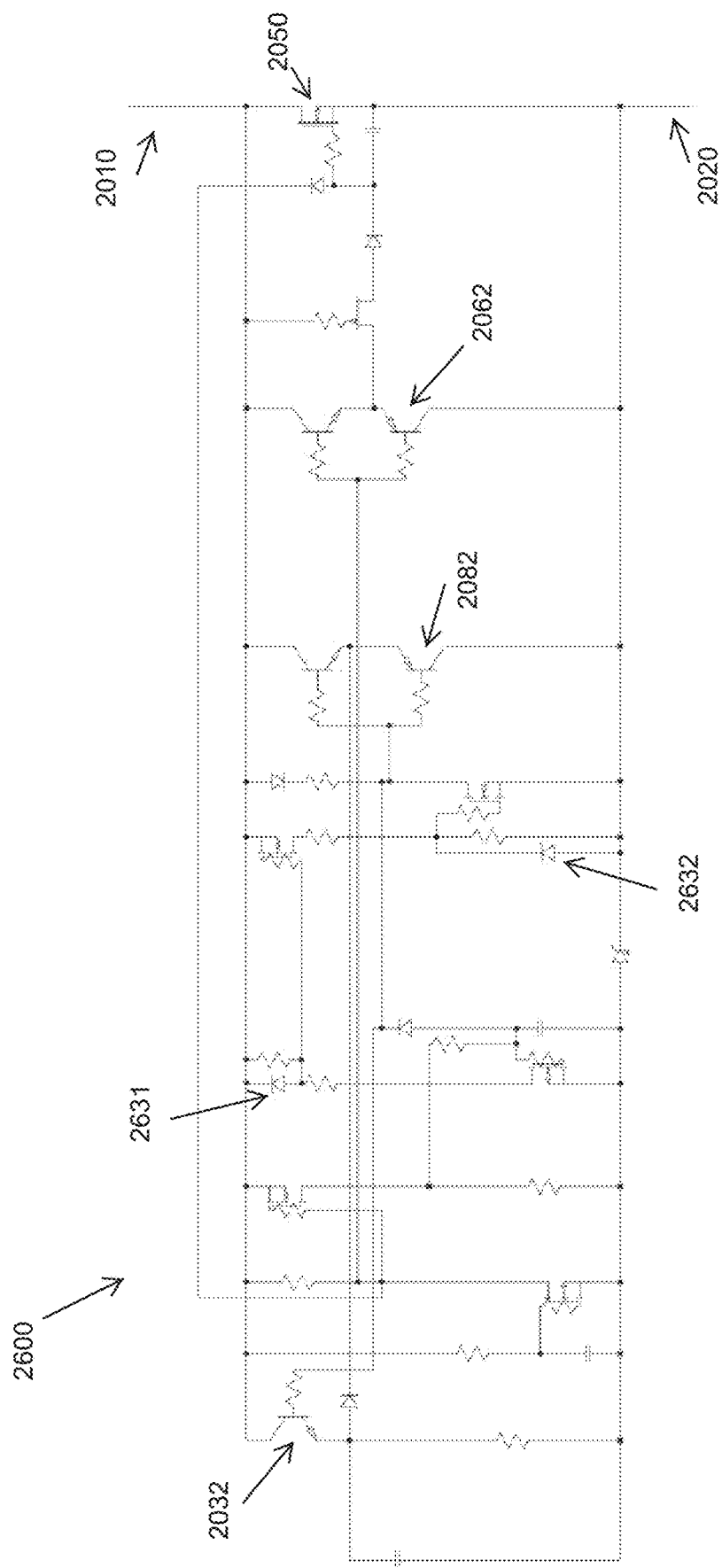
FIG. 26 provides a wiring diagram for device 2600 that is similar to device 2500, but adds gate protection circuitry in the form of Zener diodes 2631, 2632.

FIG. 26 provides a wiring diagram for device 2600 that is similar to device 2500, but adds gate protection circuitry in the form of Zener diodes 2631, 2632.

Figure 27:
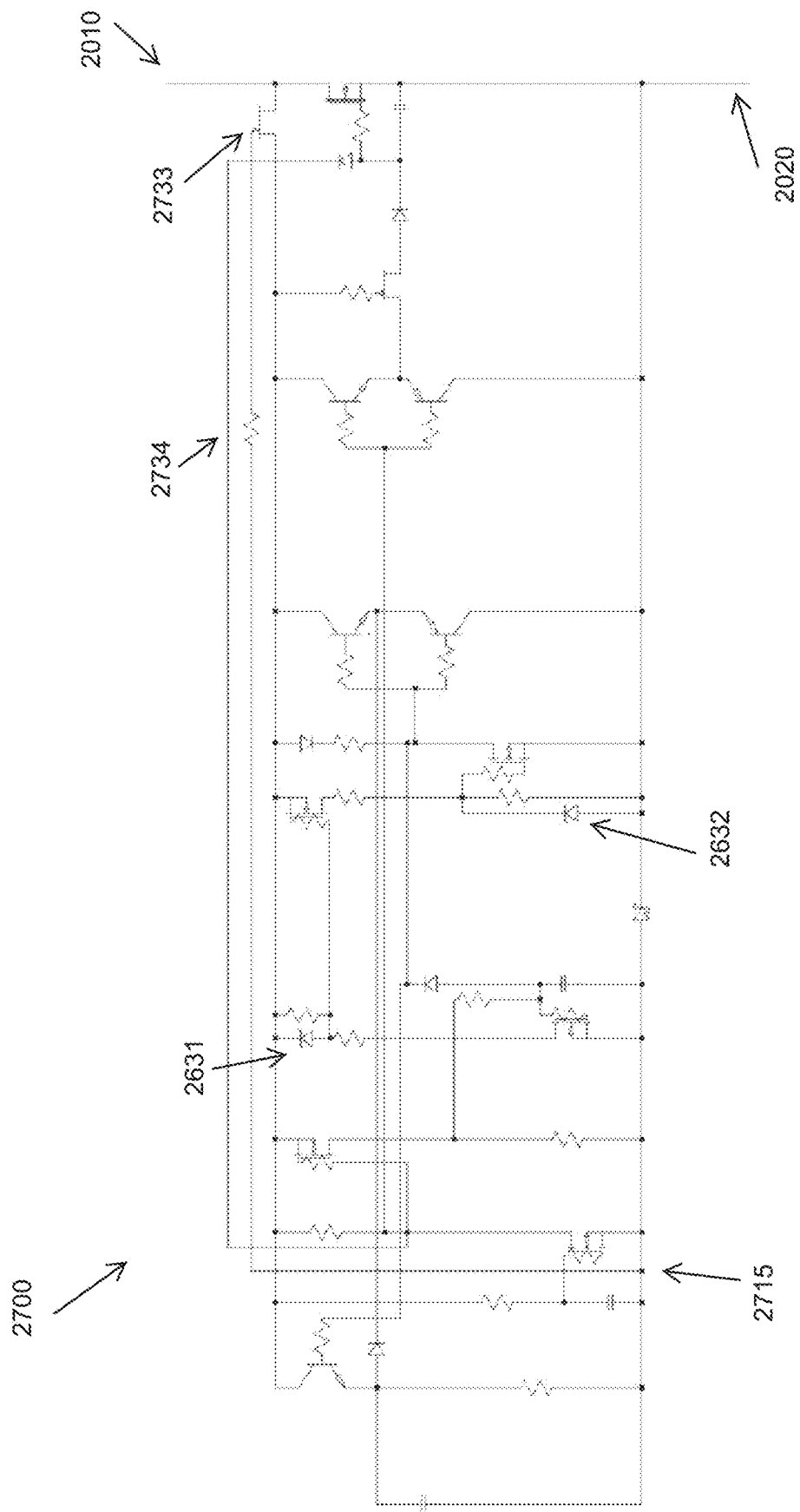
FIG. 27 provides a wiring diagram for device 2700 that is similar to device 2600, but adds further gate protection circuitry in the form of transistor 2733 and resistor 2734.

FIG. 27 provides a wiring diagram for device 2700 that is similar to device 2600, but adds further gate protection circuitry in the form of transistor 2733 and resistor 2734. The gate of transistor 2733 is in electrical communication with the second terminal 2020 via connection 2715. If a significant negative voltage develops between the gate and the source of the n-channel, depletion mode, normally on transistor 2733, transistor 2733 could be driven into blocking depletion mode thereby protecting the gates of the transistors in electrical communication with its source. Usually though, transistor 2733 will limit the voltage developed between its source and gate to a value less than its pinch off voltage by blocking any additional voltage across its drain and source.

Figure 28:
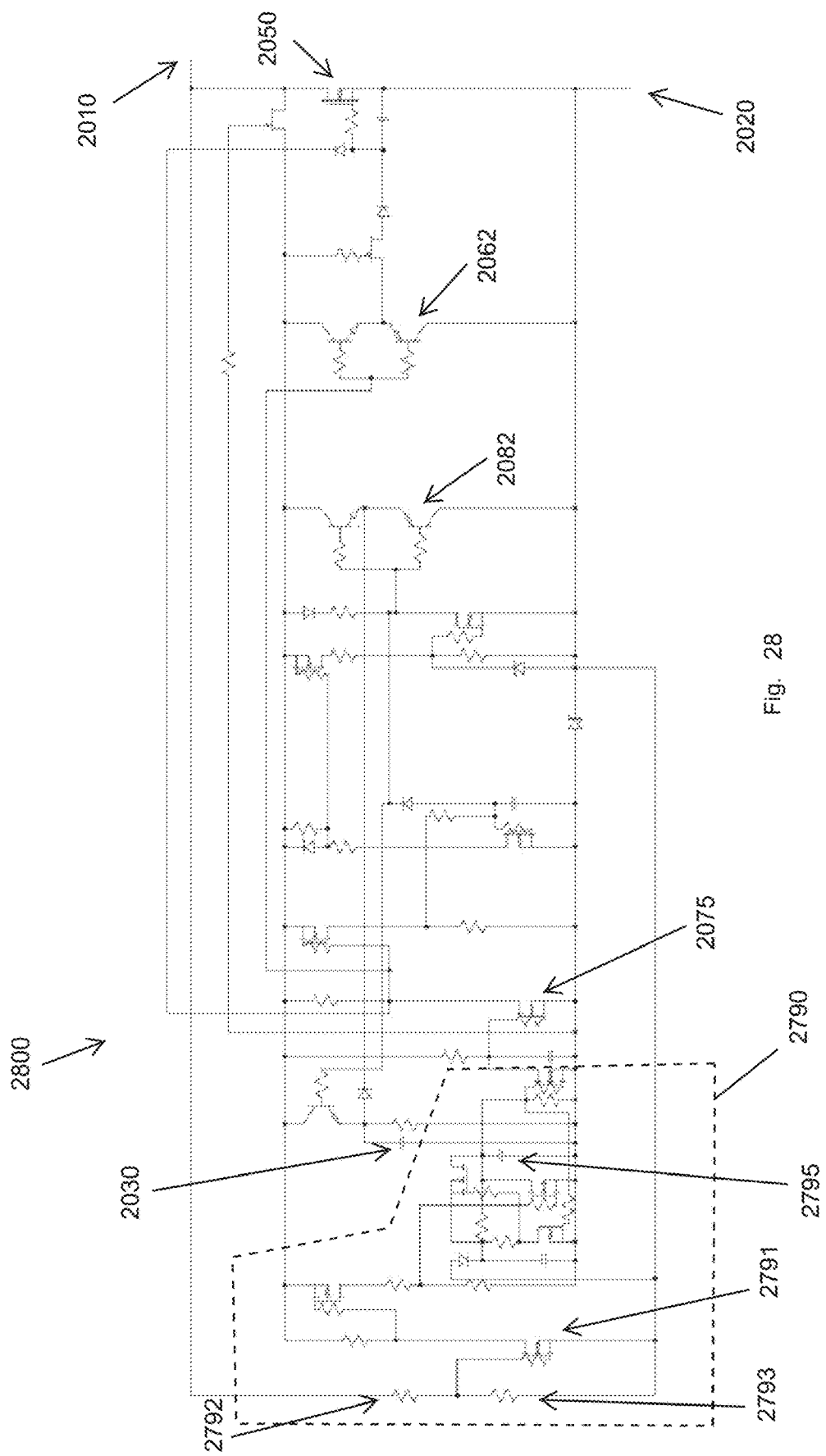
FIG. 28 provides a wiring diagram for device 2800 that is similar to device 2700, but adds a voltage level reset circuitry 2790 that allows device 2800 to reset once an overcurrent condition has subsided.

FIG. 28 provides a wiring diagram for device 2800 that is similar to device 2700, but adds a voltage level reset circuitry 2790 with delay reset timer circuitry that allows device 2800 to reset once an overcurrent condition has subsided for a specified duration. That is, device 2800 will reset when a safe current condition is determined to be a sustained safe current condition. When the voltage between first terminal 2010 and second terminal 2020 drops below a specified voltage for specified length of time, the voltage level reset circuitry 2790 resets the current monitoring circuitry comprising transistor 2075 thereby driving the first transistor 2050 into enhancement mode. Capacitor 2795 assists with determining the specified length of time; that is, capacitor 2795 functions as part of a delay reset timer circuitry in device 2800. In device 2800, the voltage divider comprising resistors 2792 and 2793, together with the threshold voltage of the transistor 2791, determine the voltage at which the device will reset, and allow current to flow between first terminal 2010 and second terminal 2020. When the voltage divider detects a safe voltage, the delay reset timer circuitry begins timing by charging capacitor 2795. When capacitor 2795 is charged to an appropriate level, current monitoring transistor 2075 switches off, and first transistor 2050 is driven out of blocking depletion. Accordingly, in some embodiments, a delay reset timer circuitry comprises a capacitor that begins charging when a safe voltage or safe current condition arises, and causes driver circuitry to drive the first transistor out of blocking depletion after a predetermined duration of the safe voltage or safe current condition.

FIG. 29 provides wiring diagrams depicting one embodiment of a parallel-to-series switched capacitor network 2900 charging in parallel (left side) and discharging in series (right side). Network 2900 comprises a plurality of capacitors 11, 12, 13 flexibly configured to be charged in parallel by an input voltage appearing across terminals 51, 52. Switches 21, 22, 23, 41, 42, and 43 are closed in the diagram on the left side of FIG. 29, while switches 31, 32, and 33 are open. Any suitable switches can be used, such as, for example, transistors, diodes, electromechanical switches, and combinations thereof. In the right side of FIG. 29, switches 21, 22, and 23, 41, 42, 43, are now open, while switches 31, 32, and 33 have closed, thereby flexibly configuring capacitors 11, 12, and 13 in series. The voltage used to charge those capacitors is thereby multiplied and made available as a releasably-stored voltage. It can be seen that network 2900 is made up of a plurality of building blocks 10, each building block comprising at least one capacitor and a plurality of switches configured to charge the at least one capacitor in parallel with other capacitors, and discharge the at least one capacitor in series with other capacitors.

FIG. 30 provides wiring diagrams depicting one embodiment of a parallel-to-series switched capacitor network 3000 charging in parallel (left side) and discharging in series (right side). Network 3000 adds a switch 53 to network 2900 that is closed during charging and opened during discharge.

FIG. 31 provides wiring diagrams depicting one embodiment of a parallel-to-series switched capacitor network 3100 charging in parallel (left side) and discharging in series (right side). Network 3100 differs from network 3000 by removing switches 21, 22, and 23, and replacing them with switches 61, 62, and 63. Switches 61, 62, and 63 are closed during charging, and are open during discharge.

FIG. 32 provides wiring diagrams depicting one embodiment of a parallel-to-series switched capacitor network 3200 charging in parallel (left side) and discharging in series (right side). Network 3200 differs from network 3000 by removing switches 41, 42, and 42 and replacing them with switches 71, 72, and 73. Switches 71, 72, and 73 are closed during charging, and are open during discharge. The advantage of network 3200 over, for example, network 3000, is that capacitors 11, 12, and 13 charge through fewer switches in network 3200. Capacitor 11 in network 3000 charges through switches 53, 21, 41, 42, and 43. If those switches represent diodes, and each diode requires a voltage of 0.5-0.8 V to drive current through, charging capacitor 11 in network 3000 requires a voltage difference of 2.5-4.0 V across terminals 51, 52. In network 3200, in contrast, capacitor 11 charges through switches 53, 21, and 71. That configuration reduces the necessary voltage difference across terminals 51, 52 to 1.5-2.4 V in this example. Network 3200 could operate in lower-voltage settings.

Figure 33:
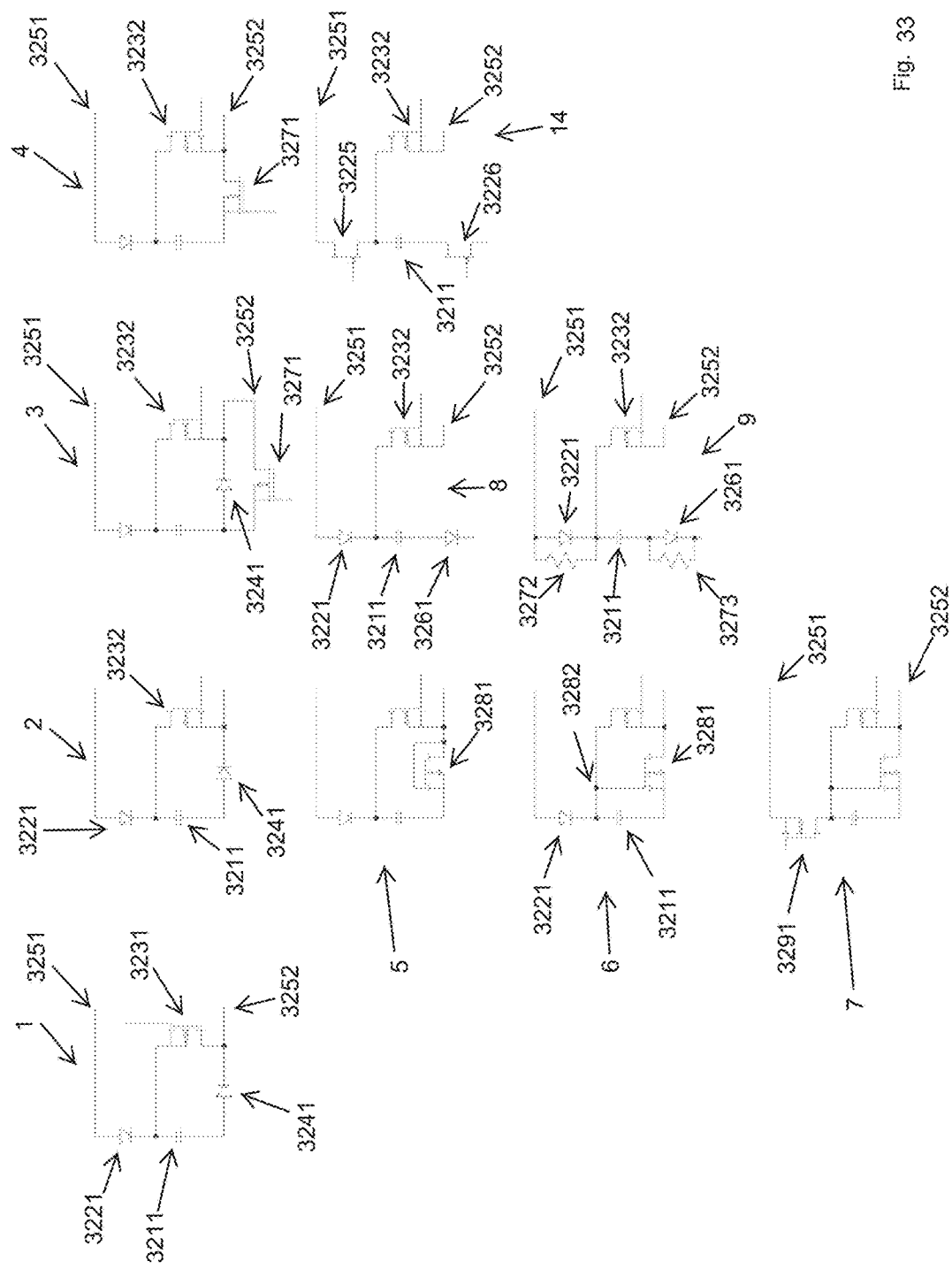
FIG. 33 provides wiring diagrams of embodiments of building blocks 1-9 and 14 useful for constructing parallel-to-series switched capacitor networks.

FIG. 33 provides wiring diagrams of building blocks 1-9 and 14 useful for constructing parallel-to-series switched capacitor networks. Building block 1 comprises, between terminals 3251 and 3252, diode 3221, capacitor 3211, p-type enhancement mode normally off transistor 3231, and diode 3241. Diodes 3221, 3241 would be closed or forward-biased and transistor 3231 would be open or off during charging; during multiplication and discharge, diodes 3221, 3241 would be open or reverse-biased and transistor 3231 would be closed or on.

Building block 2 differs from building block 1 in that transistor 3232 has replaced transistor 3231. Transistor 3232 is an n-channel, enhancement mode, normally off transistor.

Building block 3 differs from building block 2 in the addition of n-channel, depletion mode, normally on transistor 3271 in parallel with diode 3241.

Building block 4 differs from building block 3 in that diode 3241 has been removed.

Building block 5 differs from building block 2 in that diode 3241 has been replaced by an n-channel, enhancement mode, normally off transistor 3281 having its gate electrically connected to its drain.

Building block 6 differs from building block 5 in that transistor 3281 has its gate connected to the positive end of capacitor 3211 at connection 3282. After transistor 3232 is switched on, the gate of transistor 3281 is mostly at its drain so that transistor 3281 becomes connected analogously to building block 5.

Building block 7 differs from building block 6 in that diode 3221 has been replaced by an n-channel, enhancement mode, normally off transistor 3291. Optionally, transistor 3291 can be "diode connected" and also have its orientation in the circuit reversed so that the drain of transistor 3291 is connected to point 3251, and the source of transistor 3291 is connected to the positive terminal of capacitor 3211.

Building block 8 differs from building block 5 in that transistor 3281 has been replaced by diode 3261, and the cathode of diode 3261 is not connected to the source of transistor 3252. Building block 8 could be used in network 3200, for example, where diode 3221 corresponds to switch 21; capacitor 3211 corresponds to capacitor 11, diode 3261 corresponds to switch 71; and transistor 3232 corresponds to switch 31.

Building block 9 differs from building block 8 by adding resistor 3272 in parallel with diode 3221, and resistor 3273 in parallel with diode 3261. This configuration allows charging of capacitor 3211 through resistors 3272, 3273 when the voltage across terminals 3251, 3252 is too low to drive current through diodes 3221, 3261. When the voltage picks up sufficiently to forward-bias diodes 3221, 3261, capacitor 3211 is charged through those diodes 3221, 3261. This configuration allows charging of capacitor 3211 in building block 9 in low-voltage settings. Building block 9 also could be used in network 3200.

Building block 14 differs from building block 8 by replacing diode 3221 with n-channel JFET 3225, and diode 3261 with p-channel JFET 3226. Building block 14 also can be used in network 3200. Depletion mode JFETs enhance operability in low voltage settings even further, since fewer or no diodes could appear in the charging path of each capacitor.

Figure 34:
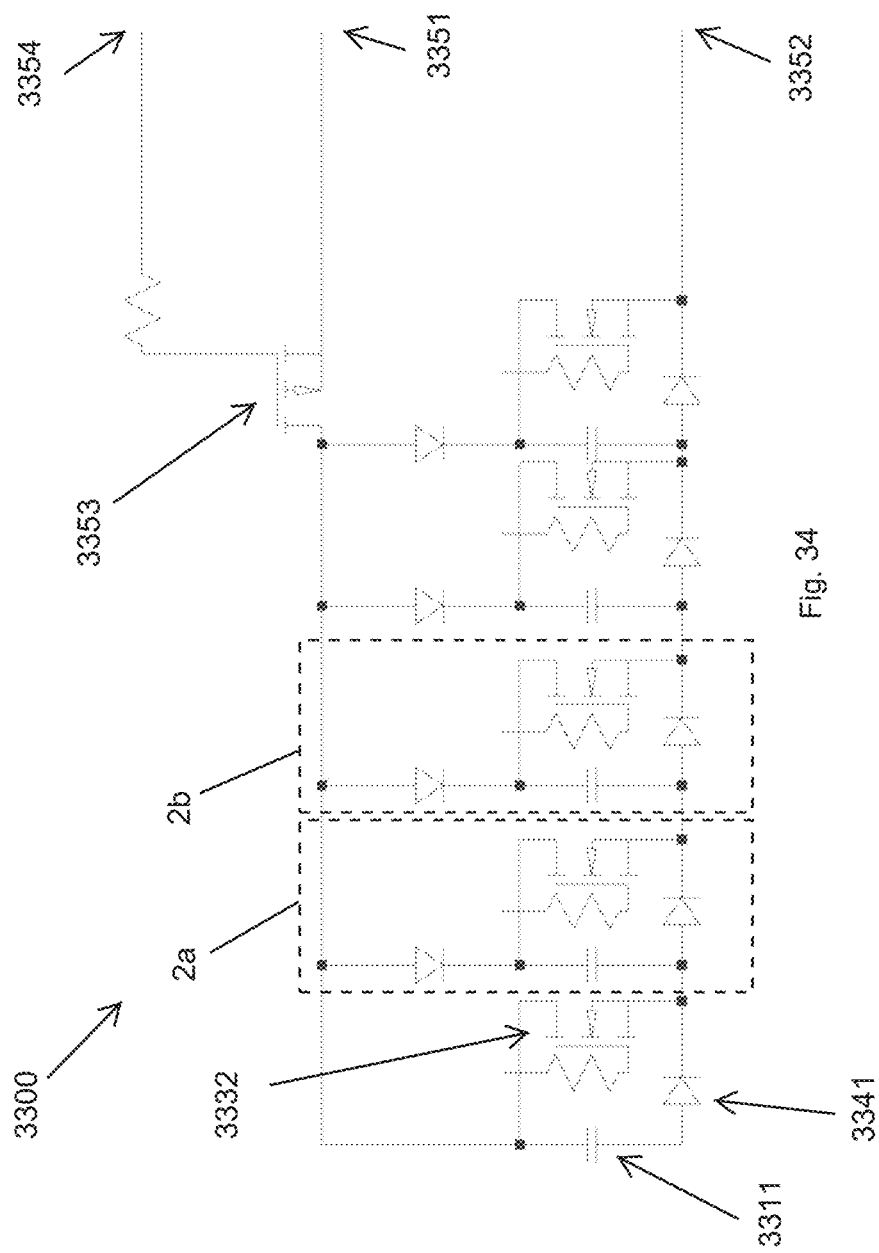
FIG. 34 provides a wiring diagram of an embodiment of a parallel-to-series switched capacitor network 3300 configured to convert an input voltage into a releasably-stored voltage.

FIG. 34 provides a wiring diagram of a parallel-to-series switched capacitor network 3300 configured to convert an input voltage into a releasably-stored voltage. It can be seen that building blocks 2a, 2b are analogous to building block 2 in FIG. 33. In operation, an input voltage appears across terminals 3351, 3352, and the capacitors such as capacitor 3311 are charged in parallel with each other. Transistor 3332 would be off and blocking, while diode 3341 would be forward-biased. Transistor 3353 would be on and conducting due to an appropriate voltage at terminal 3354. For voltage multiplication and discharge, transistor 3353 would turn off, while transistor 3332 would turn on and diode 3341 would be reverse-biased.

Figure 35:
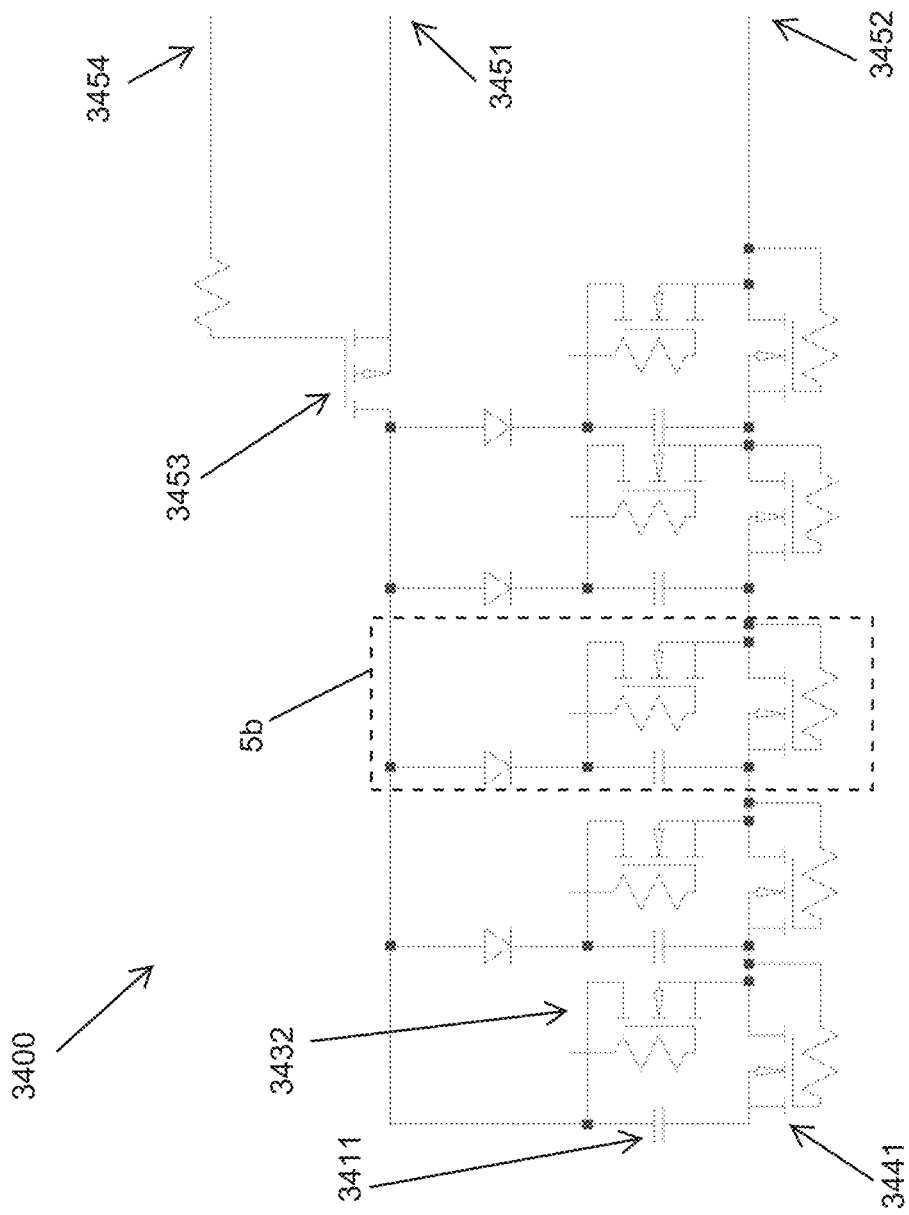
FIG. 35 provides a wiring diagram of a further embodiment of a parallel-to-series switched capacitor network 3400 configured to convert an input voltage into a releasably-stored voltage.

FIG. 35 provides a wiring diagram of a parallel-to-series switched capacitor network 3400 configured to convert an input voltage into a releasably-stored voltage. Building block 5b is analogous to building block 5 in FIG. 33. In operation, an input voltage appears across terminals 3451, 3452, and the capacitors such as capacitor 3411 are charged in parallel with each other. Transistor 3432 would be off and blocking, while transistor 3441 would be on and conducting. Transistor 3453 would be on and conducting due to an appropriate voltage at terminal 3454. For voltage multiplication and discharge, transistor 3453 would turn off, while, since transistor 3441 is "diode connected," transistor 3441 would regulate the voltage on capacitor 3411 to be close to the threshold voltage of transistor 3441. By regulating the voltage of each series connected capacitor, the multiplied voltage can be made more accurate, and precise, and also be kept to a safe level.

Figure 36:
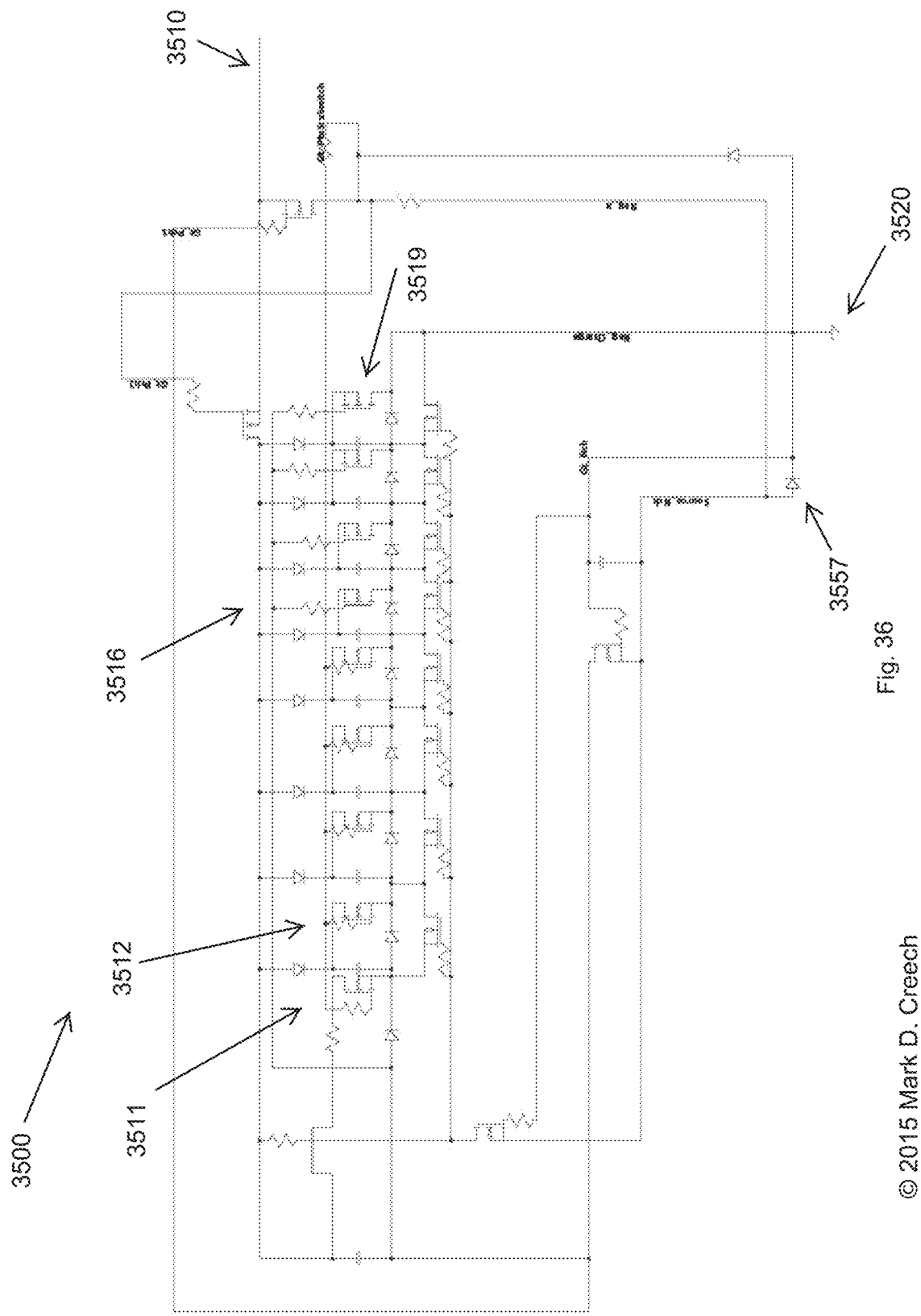
FIG. 36 provides a wiring diagram of one embodiment of an autocatalytic parallel-to-series switched capacitor device 3500 used to generate the data of FIG. 37.
Figure 37:
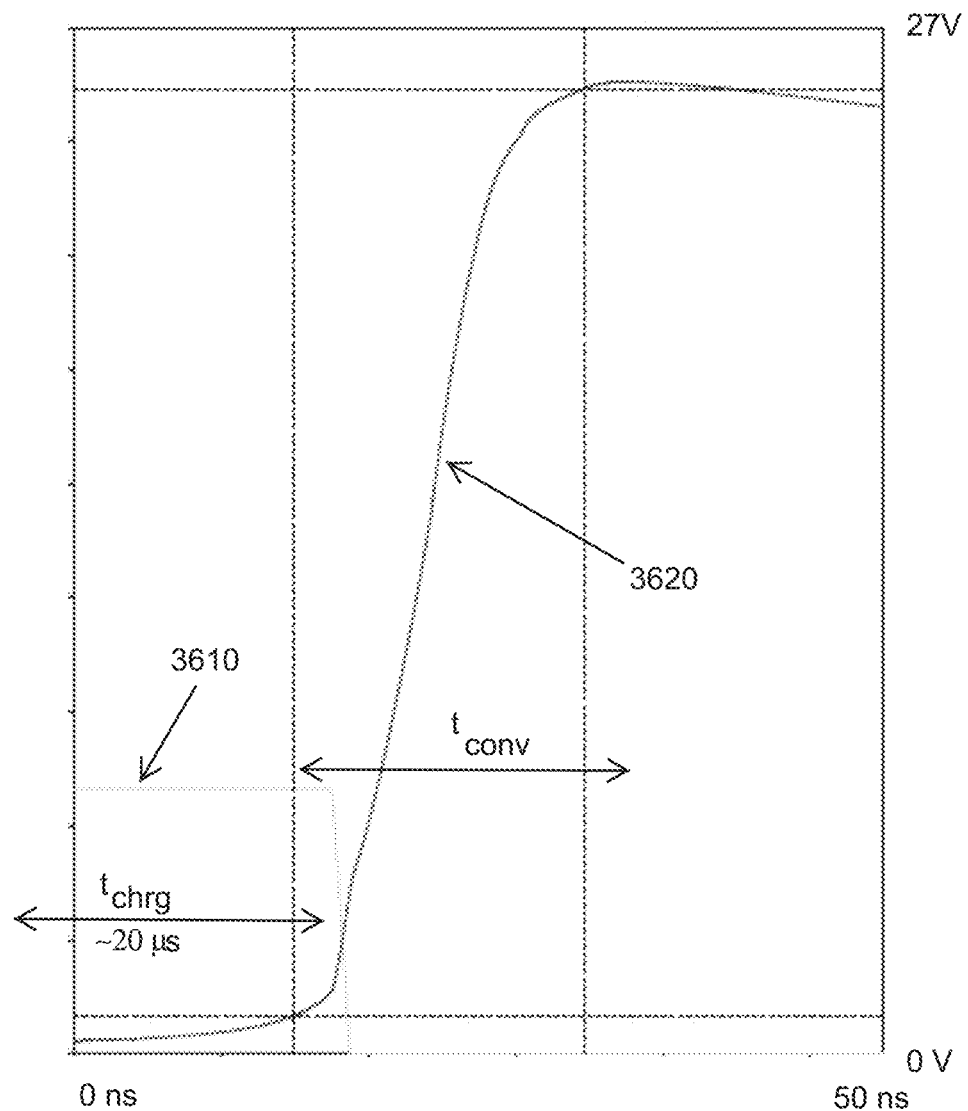
FIG. 37 illustrates autocatalytic voltage conversion using device 3500.

FIG. 36 provides a wiring diagram of one embodiment of a device 3500 comprising an autocatalytic parallel-to-series switched capacitor network used to generate the data of FIG. 37. First lead 3510 and second lead 3520 afford device 3500 all of the energy device 3500 uses. The switched capacitor network comprises a number of building blocks such as 3511, 3512, 3516, 3519. Not all building blocks are labeled, for ease of viewing the components of the device 3500. Some of the building blocks e.g., 3511, 3512 employ an n-channel transistor, while other building blocks e.g., 3516, 3519 employ a p-channel transistor. The characteristic of the transistor in each building block is chosen to account for the voltage drop between the gate and the source of each such transistor, considering the building block's position in the switched capacitor network. As the switching process proceeds from left to right in FIG. 36, the gate voltage of n-channel transistors will decrease as the voltage stored on the capacitors is partially multiplied. In a large network, or for large multiplications, it will become increasingly difficult to switch n-channel transistors. Similarly, if only p-channel transistors are used, initial multiplication and switching may be difficult due to the gate voltages on the p-channel transistors. Accordingly, in some embodiments, a parallel-to-series switched capacitor network comprises a combination of (a) building blocks comprising at least one n-channel transistor and a capacitor, with (b) building blocks comprising at least one p-channel transistor and a capacitor, wherein the at least one n-channel transistor and the at least one p-channel transistor are configured to flexibly configure the capacitors in parallel and flexibly configure the capacitors in series for discharge.

The parallel-to-series switched capacitor networks and portions thereof depicted in FIGS. 29-40 will convert an input voltage into a releasably-stored voltage. Often, the final releasably-stored voltage will be much greater than the input voltage or any voltage otherwise available in the device. Whether that conversion happens autocatalytically depends on a few simple design choices. In an autocatalytic conversion, an input voltage is initially partially converted such as by partially multiplying, and then the partially-converted or partially-multiplied voltage itself begins to drive its further conversion or multiplication to a releasably-stored voltage. Looking at FIG. 34, for example, when transistor 3332 begins to turn on and diode 3341 begins to be reversed-biased, whether the voltage conversion becomes autocatalytic depends on whether the voltage stored on capacitor 3311 and the other capacitors gets applied at the gates of transistor 3332 and the transistors in building blocks 2a, 2b, for example, and that applying the voltage begins to drive those gates to advance the conversion. If the partially-converted voltage is applied to those gates, then the switching becomes driven by the conversion, and the conversion drives the switching. The switching and the conversion mutually drive each other at the moment the conversion becomes autocatalytic. That provides one example of autocatalytic voltage conversion. In FIG. 36, the capacitors connect to the gates of the transistors in the networks, illustrating an example of an autocatalytic voltage converter. In FIGS. 34-35, the gates of the transistors have been left unconnected to illustrate parallel-to-series switched capacitor networks for voltage conversion that could be autocatalytic or non-autocatalytic. If gate drive circuitry unconnected to the voltage stored on the capacitors drives the transistors in FIGS. 34-35, those networks will not provide autocatalytic voltage conversion. Some embodiments of the present invention include such non-autocatalytic voltage converters. If, on the other hand, the gates of the transistors in FIGS. 34-35 are driven by the voltage stored on the capacitors, then the conversion can be autocatalytic. Such autocatalytic voltage converters represent other embodiments of the present invention.

Device 3500 was tested in simulation by applying an input voltage across first lead 3510 and second lead 3520 of about 7 V for about 20 µs. The input voltage was abruptly removed before the conversion had completed. An output voltage was measured across diode 3557. The results appear in FIG. 37.

FIG. 37 illustrates simulated autocatalytic voltage conversion using device 3500. Curve 3610 represents the input voltage, and curve 3620 represents the output voltage. A pulse of 7 V was applied across first lead 3510 and second lead 3520 for about 20 µs, the last 15 ns of which appear in FIG. 37. That pulse represents the time it took to charge device 3500, $t_{chrg}$. Then, device 3500 autocatalytically converted the stored voltage to about 25V in about 15 ns, which represents the time it took for device 3500 to convert the voltage, $t_{conv}$. It is during the positively sloped region of curve 3620 where the autocatalytic voltage multiplication occurred. In this region, the partially-multiplied voltage was fed back to the gates of the switching transistors of device 3500 so that the partially-multiplied voltage drove its own multiplication. The voltage multiplication continues until the switches are turned fully on and the capacitors are fully in series, which occurs near the peak of curve 3620. It is estimated that the autocatalytic conversion began when the capacitors had stored about 2.5 V each, because the transistors had been partially switched on, triggering the autocatalytic conversion. The conversion therefore was a ten-fold multiplication, from 2.5 V to 25 V.

Figure 38:
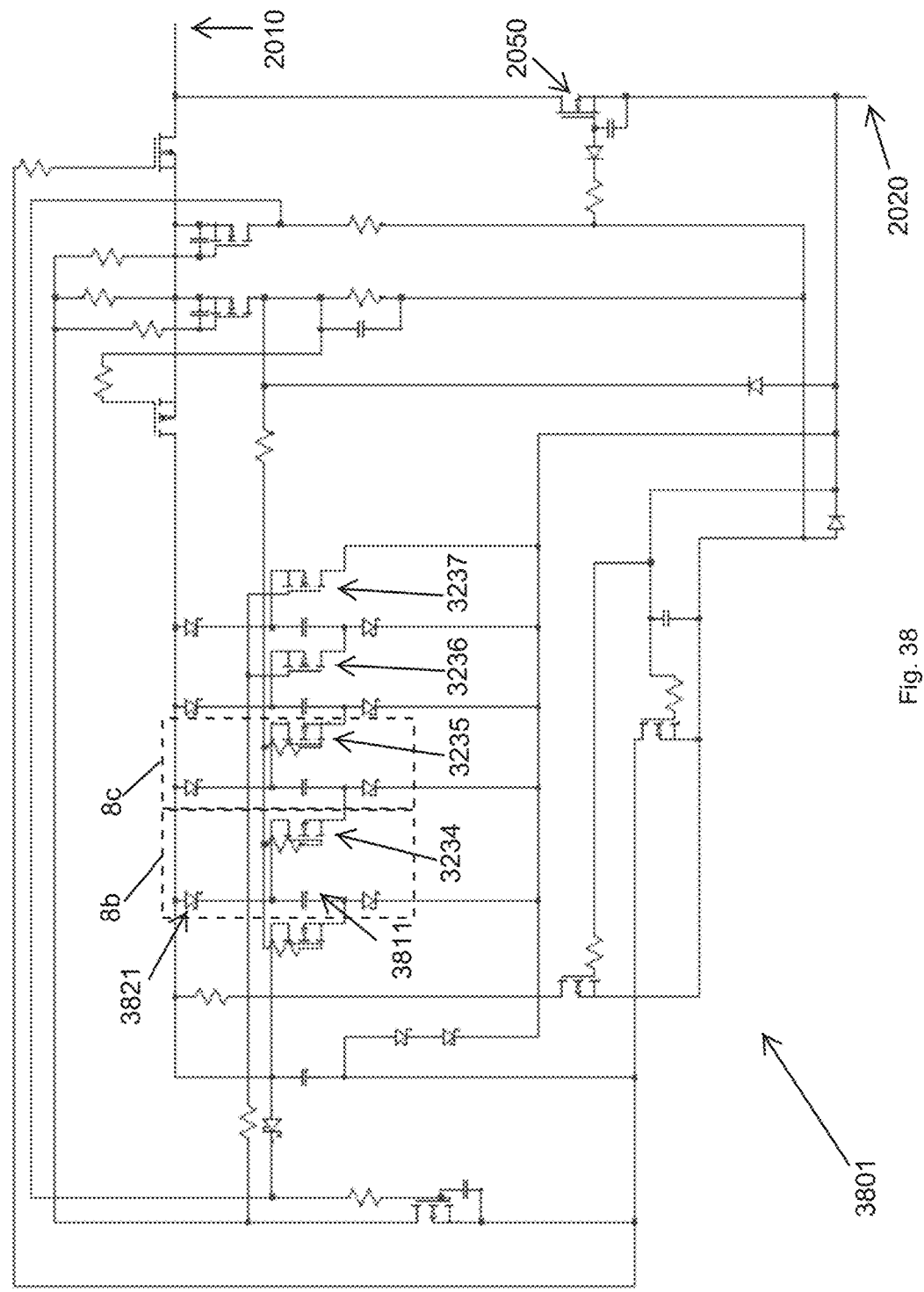
FIG. 38 provides a wiring diagram of one embodiment of an autocatalytic parallel-to-series switched capacitor device 3801 used to generate the data of FIG. 39.
Figure 39:
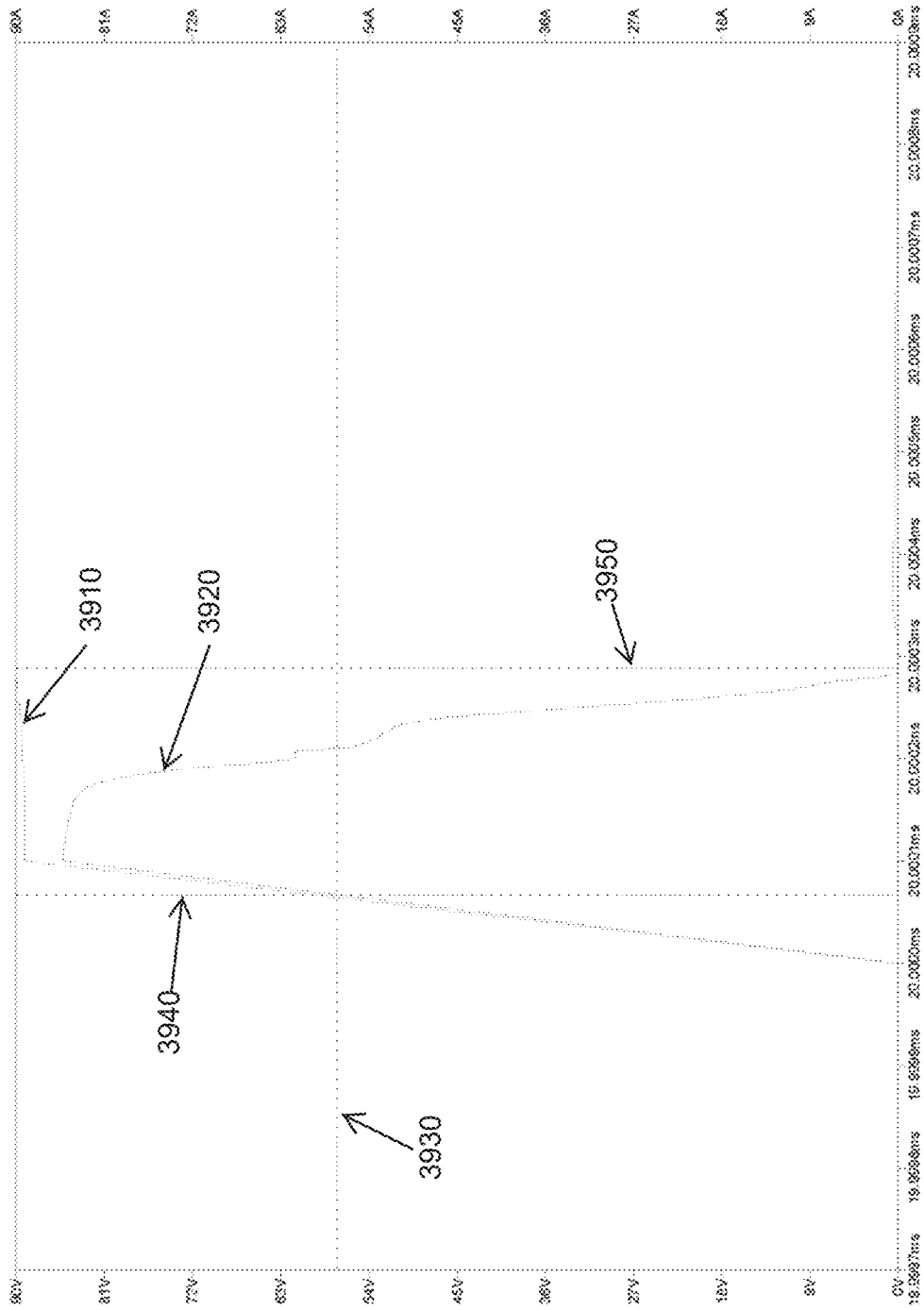
FIG. 39 illustrates autocatalytic voltage conversion using device 3801.

FIG. 38 provides a wiring diagram of one embodiment of an autocatalytic parallel-to-series switched capacitor device 3801 used to generate the data of FIG. 39. Device 3801 includes a parallel-to-series switched capacitor network configured to convert an input voltage into a releasably-stored voltage. Device 3801 in FIG. 38 uses a topology similar to network 3200 in FIG. 32, and thereby reduces the size of the voltage drop across first transistor 2050 necessary for operation since more of the voltage reaches the internal components such as the parallel to series switched capacitors such as capacitor 3811 in building block 8b. It can be seen that building blocks 8b, 8c are analogous to building block 8 in FIG. 33. MOSFET transistors 3234, 3235 are n-channel enhancement mode transistors, while MOSFET transistors 3236, 3237 are p-channel enhancement mode transistors. This is another embodiment of a parallel-to-series switched capacitor network comprising a combination of (a) building blocks comprising at least one n-channel transistor and a capacitor, with (b) building blocks comprising at least one p-channel transistor and a capacitor, wherein the at least one n-channel transistor and the at least one p-channel transistor are configured to flexibly configure the capacitors in parallel and flexibly configure the capacitors in series for discharge.

FIG. 39 illustrates autocatalytic voltage conversion using device 3801. A simulated voltage 3910 was applied across the series combination of device 3801 and a resistive load, and was caused to spike to 90 V, simulating a sustained overcurrent condition. The corresponding current 3920 that would flow through device 3801 was recorded. When the current 3920 reached a threshold current 3930 of about 58 A at time 3940, device 3801 continued charging its capacitors such as capacitor 3811 until device 3801 began autocatalytically converting the voltage across terminals 2010, 2020 into a releasably-stored voltage that could drive first transistor 2050 into blocking mode. The current that would pass through device 3801 reached 5 mA by time 3950, which was 221 ns after time 3940.

Figure 40:
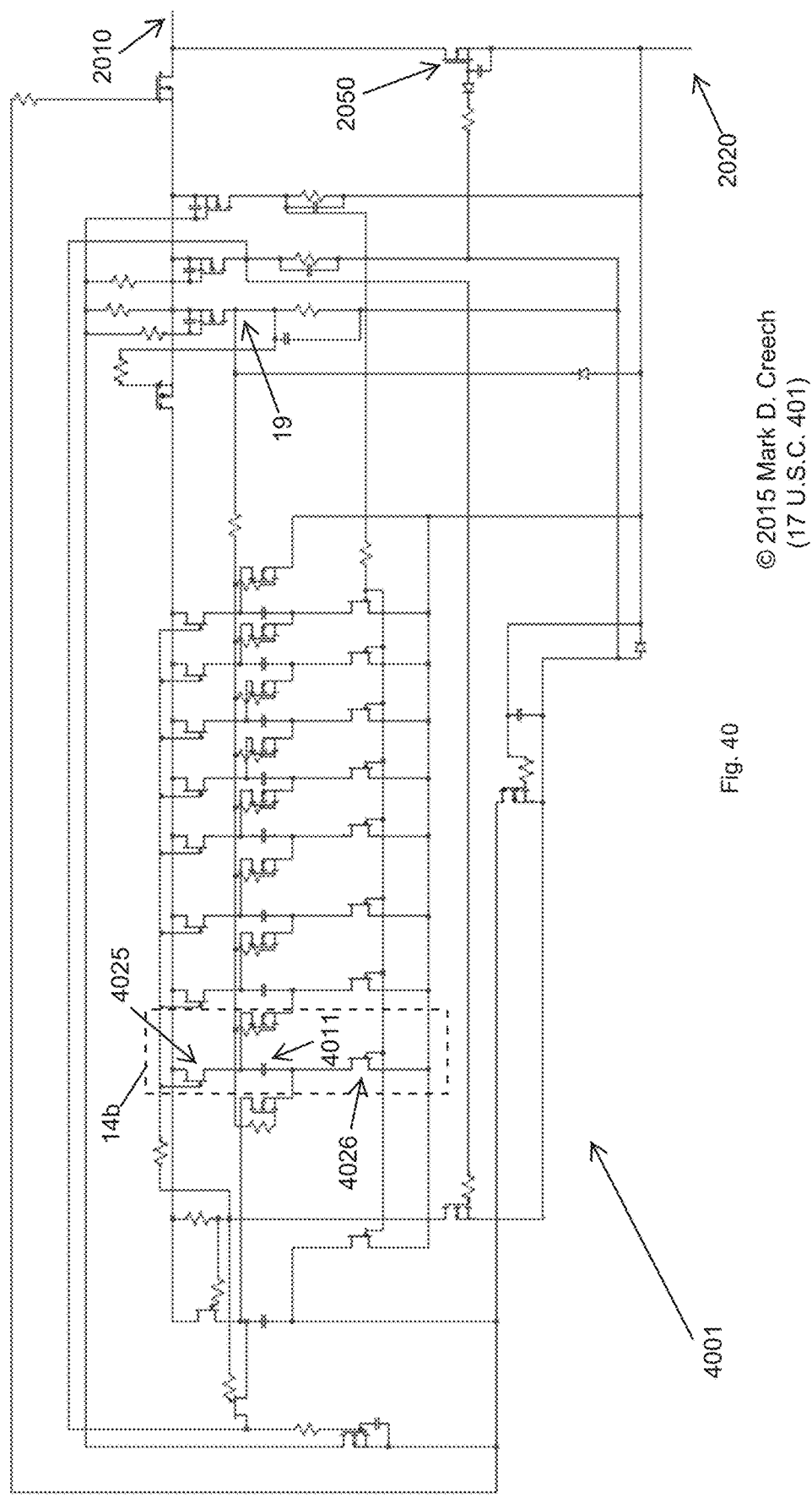
FIG. 40 provides a wiring diagram of one embodiment of an autocatalytic parallel-to-series switched capacitor device 4001.

FIG. 40 provides a wiring diagram of one embodiment of an autocatalytic parallel-to-series switched capacitor device 4001. Device 4001 includes a parallel-to-series switched capacitor network configured to convert an input voltage into a releasably-stored voltage that could drive first transistor 2050 into blocking mode if an overcurrent condition arose across terminals 2010, 2020. It can be seen that building block 14b is analogous to building block 14 in FIG. 33. Building block 14b employs n-channel JFET 4025 and p-channel JFET 4026 to charge capacitor 4011 even in low voltage environments. Like device 3801 in FIG. 38, device 4001 in FIG. 40 also uses a topology similar to network 3200 in FIG. 32, and is also able to operate from lower voltages. However, by replacing diodes (e.g., diode 3821) with depletion mode transistors (e.g., JFET 4025), device 4001 may, in some instances, operate from even lower input voltages than device 3801. By reducing or eliminating the number of diodes in the charging path of, for example, capacitor 4011, the voltage needed to charge capacitor 4011 decreases. If even lower voltage operation is desired, device 4001 may be configured to operate in the sub-threshold regime, where the voltages involved are not sufficient to fully turn on enhancement mode transistors. Such transistors just below their threshold voltages still conduct some small amount of current, which property can be used to provide useable signals. For example, a transistor in series with a high impedance may produce usable signals at the node between them when the transistor's gate voltage is in the sub-threshold regime. Node 19 in FIG. 40 represents such a node. It should be noted, however, that such sub-threshold operation is not limited to device 4001 in FIG. 40. Indeed, any device described or depicted herein can be configured for, and optionally optimized for, operation in any suitable voltage range, including the sub-threshold regime. Devices comprising parallel-to-series switched networks of capacitors, in some instances, can autocatalytically convert small voltages to drive first transistor 2050 into blocking mode. Converting voltages in the sub-threshold regime can be performed intermittently or persistently in certain embodiments of the present invention. That is, a converted voltage can then drive operation of the network out of the sub-threshold regime, in some cases, while in other cases, the network remains persistently in the sub-threshold regime. Device 4001 can be used, among other applications, in circumstances where overcurrent conditions supply only a very small usable voltage drop across first transistor 2050, but nonetheless threaten delicate circuits with overcurrent conditions. That may be the case, for example, if first transistor 2050 or a combination of transistors in parallel (e.g., transistors 2051, 2052 in FIG. 21) offer a very low on-state resistance. In other cases, the on-state resistance may be relatively large, but the overcurrent may be so small as to provide only a small usable voltage drop across first transistor 2050. Thus, some embodiments of the present invention provide a parallel-to-series switched capacitor network comprising no diodes in the charging path of the capacitors in that network.

Figure 41:
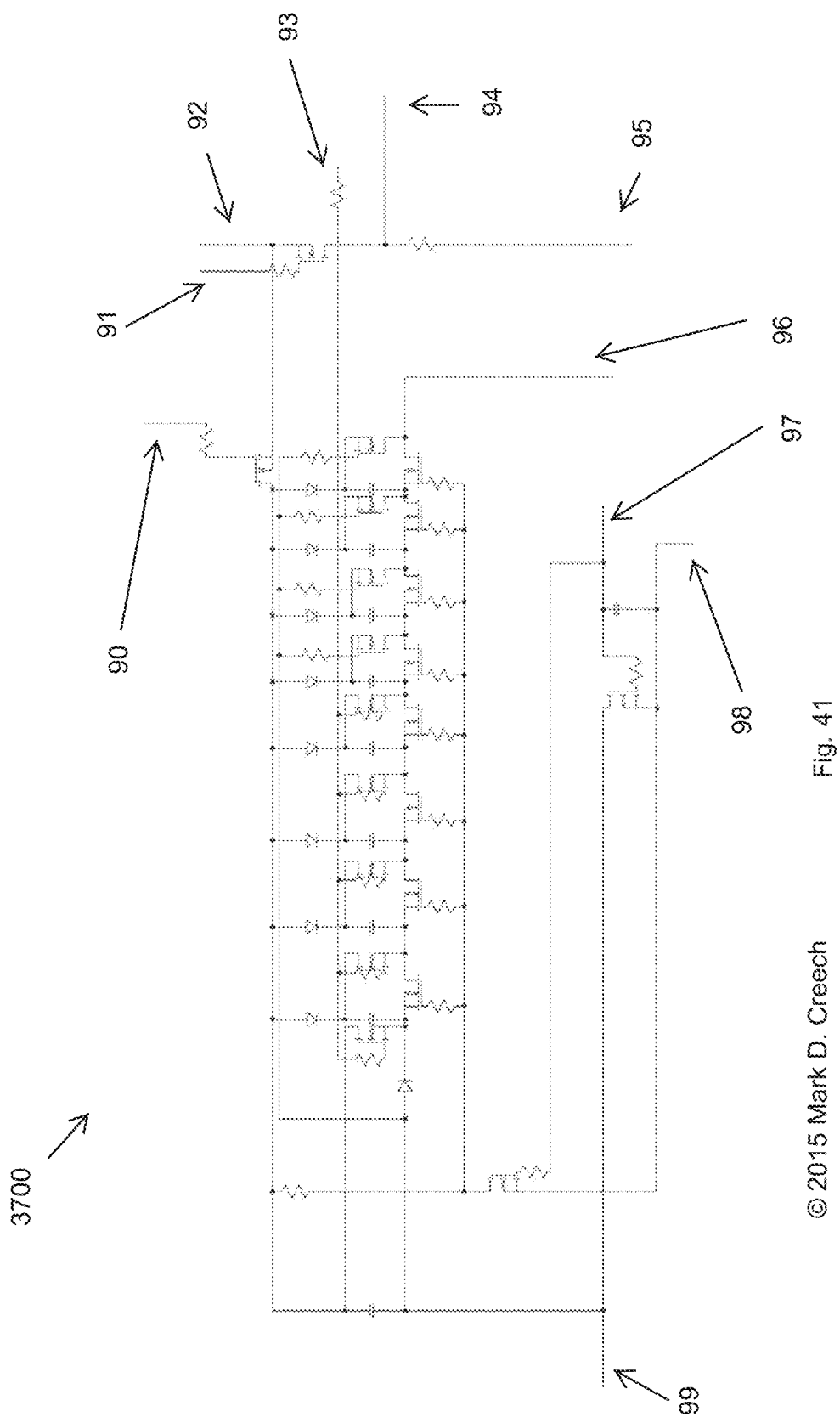
FIG. 41 provides a wiring diagram of one embodiment of a parallel-to-series switched capacitor network 3700.

FIG. 41 provides a wiring diagram of one embodiment of a parallel-to-series switched capacitor network 3700. Network 3700 is similar to the network appearing in device 3500. For simplicity in later figures, several pins or connections 90-99 are shown for network 3700.

Figure 42:
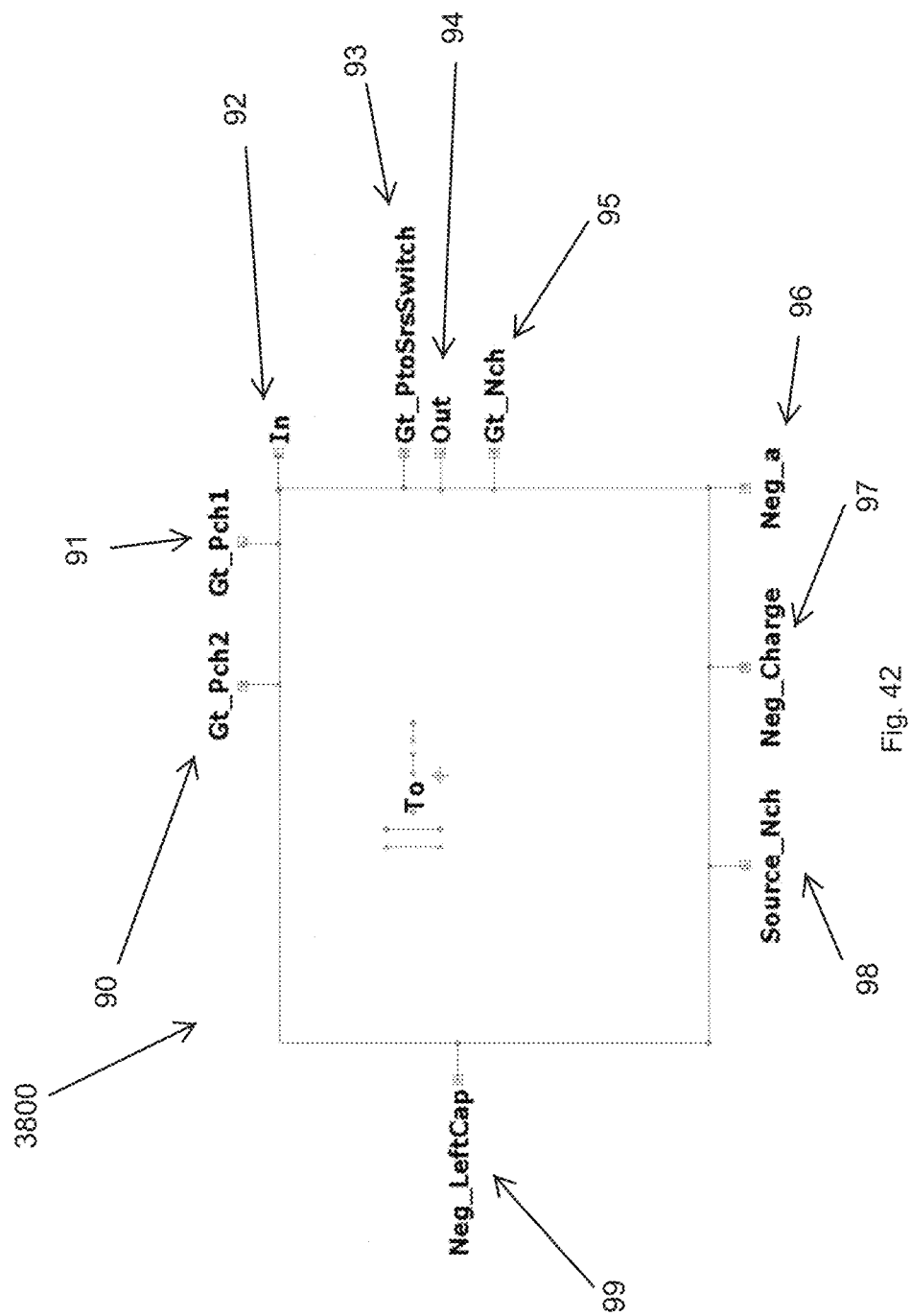
FIG. 42 provides a schematic 3800 representing the parallel-to-series switched capacitor network 3700.

FIG. 42 provides a schematic 3800 representing the parallel-to-series switched capacitor network 3700. Connections 90-99 for schematic 3800 are the same as those shown in FIG. 41 for network 3700.

Figure 43:
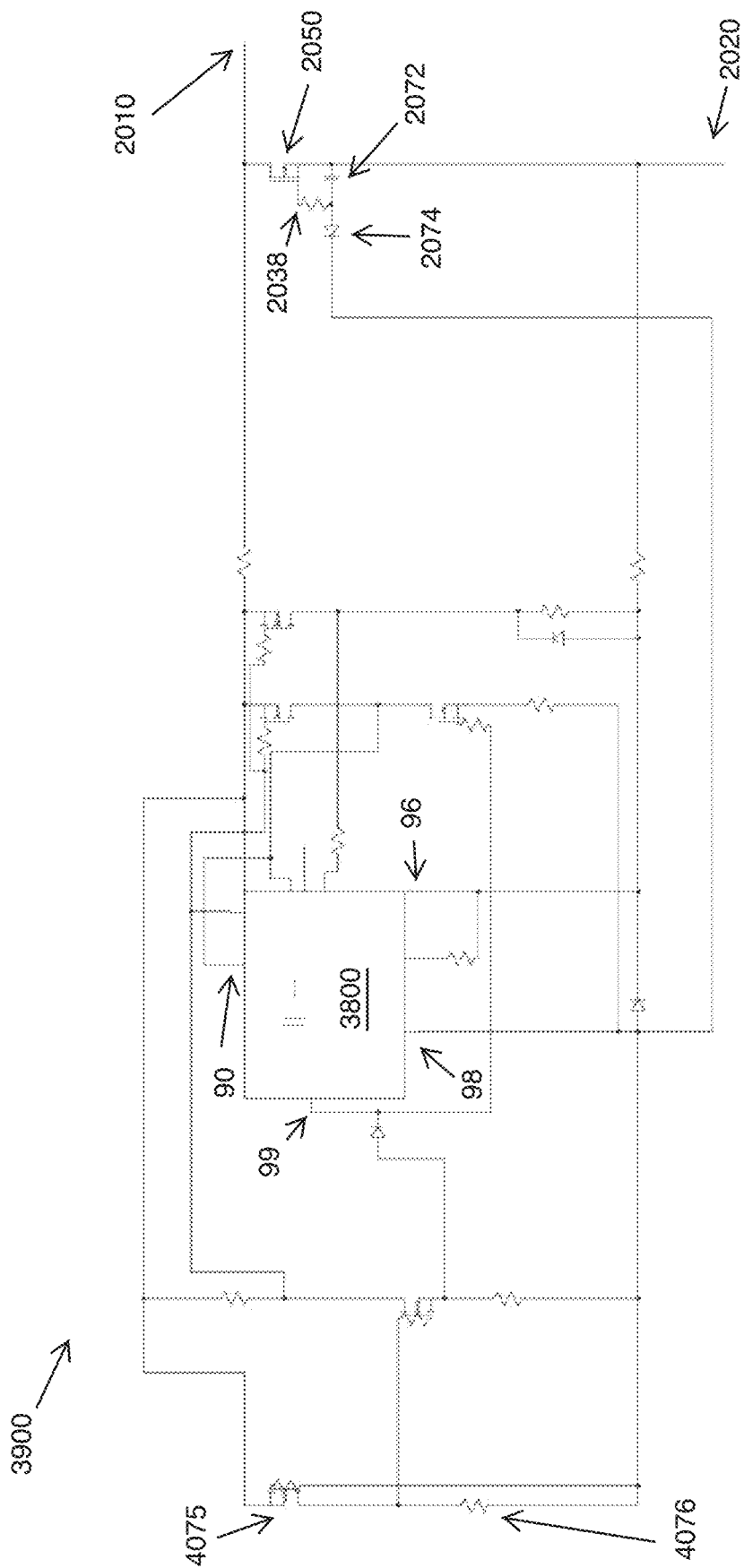
FIG. 43 provides a wiring diagram of one embodiment, device 3900 that uses schematic 3800.

FIG. 43 provides a wiring diagram of one embodiment, device 3900, which uses schematic 3800. First transistor 2050 is in series electrical communication in the primary current path between first terminal 2010 in second terminal 2020 in device 3900. In this device, schematic 3800 functions as part of an autocatalytic one-shot jumpstart voltage converter and a voltage floater, configured to drive transistor 2050 into blocking depletion when an overcurrent condition arises. The charge retention circuitry, in the form of capacitor 2072 and diode 2074, maintain first transistor 2050 in depletion mode for a time. The voltage conversion is "one-shot," and it is also a rapidly-acting jumpstart conversion designed to quickly place the first transistor 150 into blocking depletion. Current monitoring circuitry, in the form of transistor 4075 and resistor 4076, monitors the current that flows between first terminal 2010 and second terminal 2020, and controls the voltage converter and voltage floater ultimately through pin 99.

Figure 44:
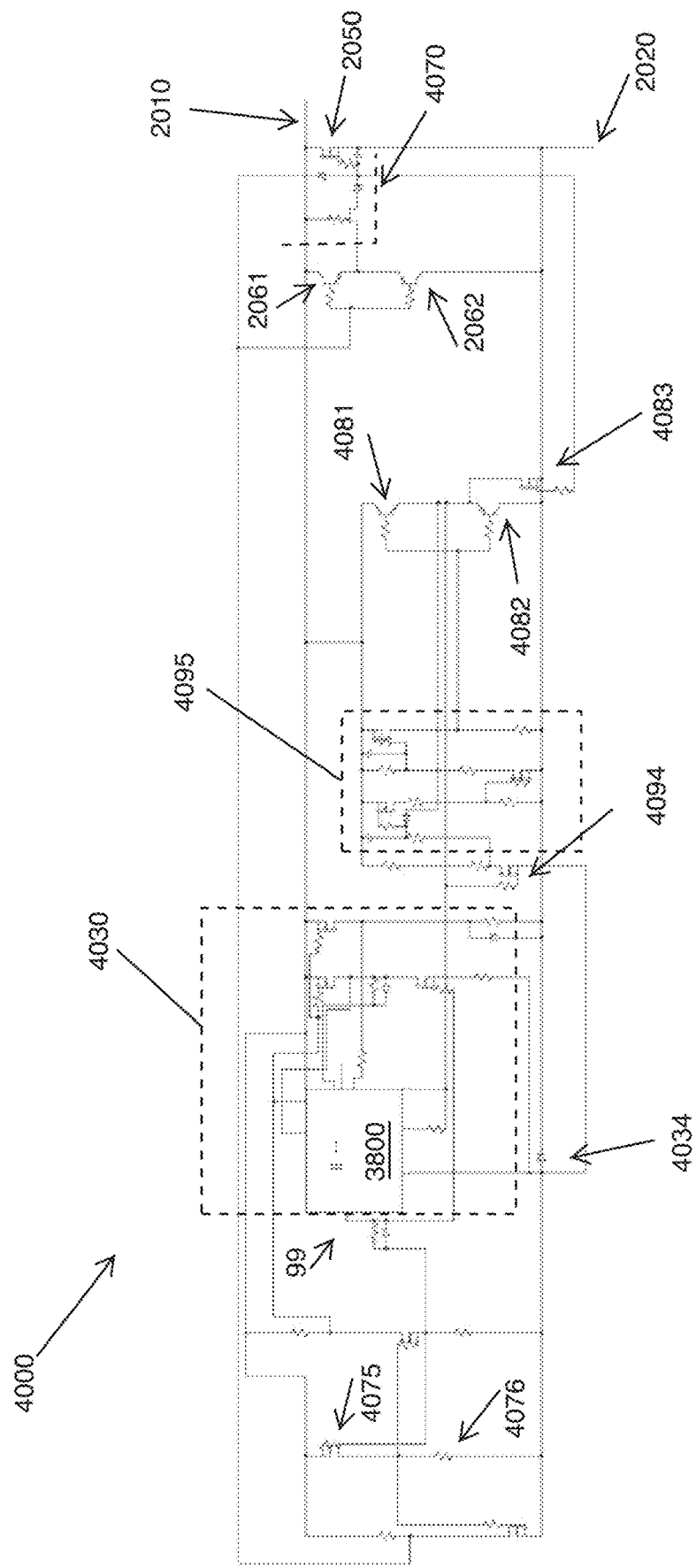
FIG. 44 provides a wiring diagram of a further embodiment, device 4000, also employing schematic 3800.

FIG. 44 provides a wiring diagram of a further embodiment, device 4000, also employing schematic 3800. The parallel-to-series switched capacitor network inside of schematic 3800 provides an autocatalytic, one-shot, jumpstart voltage conversion, which then locks the network in a series arrangement for non-autocatalytic extended use voltage conversion. The resulting releasably-stored voltage (from the autocatalytic one-shot conversion, and is greater in magnitude than the input voltage) drives first transistor 2050 into blocking depletion, thereby blocking the overcurrent from flowing between first terminal 2010 and second terminal 2020. Transistor 4083 is also driven and latched into blocking depletion until the device 4000 is reset. The releasably-stored voltage also opens transistor 4094, which enables oscillator 4095 with an oscillator-triggering voltage. Oscillator 4095 modulates voltage converter 4030 and the network inside schematic 3800 to perform a non-autocatalytic extended use voltage conversion with the assistance of the bipolar junction transistors 4081, 4082, which are also driven by oscillator 4095. The extended use voltage conversion here is an operation of identity. Due to unavoidable losses, the releasably-stored voltage from the extended-use voltage conversion is slightly less than the input voltage. Transistors 4081, 4082 also play a role in floating the releasably-stored voltage. Charge retention circuitry 4070 also appears at the gate of first transistor 2050, to maintain the gate voltage while the oscillator 4095 operates voltage converter 4030. Diode 4034 plays a role in the floating operation, in that the floated voltage is placed in parallel with diode 4034.

Figure 45:
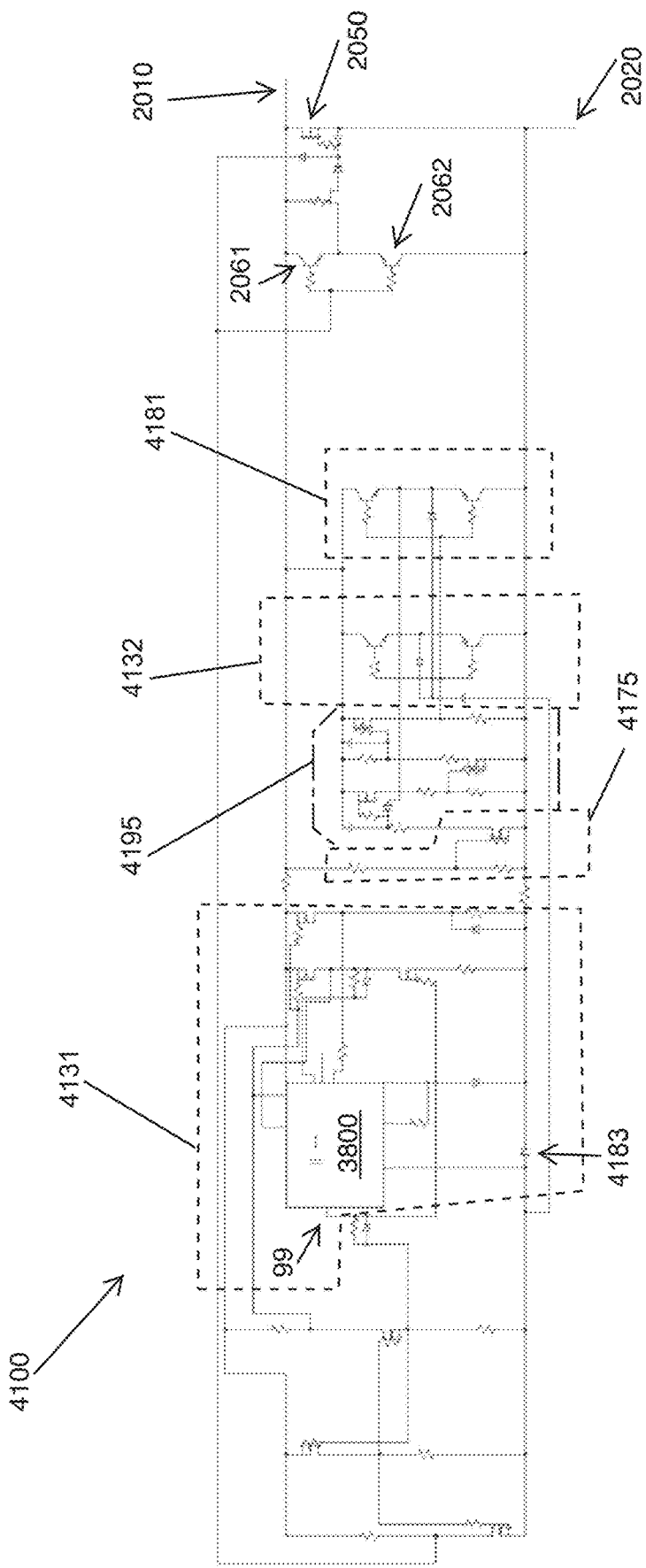
FIG. 45 provides a wiring diagram of another embodiment, device 4100, employing schematic 3800.

FIG. 45 provides a wiring diagram of another embodiment, device 4100, employing schematic 3800. Device 4100 is similar to device 4000, although not identical. Autocatalytic jumpstart voltage converter and floater 4131 comprises schematic 3800, and provides a one-shot voltage conversion and one-shot floating that drives first transistor 2050 into blocking depletion when an overcurrent condition arises. Oscillator enabling circuitry 4175 appears, providing a voltage divider that turns on its transistor to enable the oscillator 4195 only when a certain voltage develops across first terminal 2010 and second terminal 2020. It can be said that the autocatalytic jumpstart voltage converter and floater 4131 provides the oscillator enabling circuitry with an oscillator-triggering voltage when the converter and floater 4131 turns on the transistor of the oscillator enabling circuitry 4175. Optionally, that means the oscillator 4195 will not turn on until first transistor 2050 is in blocking depletion. Extended use voltage converter 4132 comprises a pair of bipolar junction transistors in a push pull, totem pole arrangement, powered by oscillator 4195 to continuously convert and store a releasably-stored voltage on its own capacitor, so long as an overcurrent condition persists. Extended use floating circuitry 4181 is also modulated by oscillator 4195 in phase with the extended use voltage converter 4132, once the device 4100 is in blocking mode. Diode 4183 assists with both the one-shot floating operation by jump-start converter and floater 4131, and the extended use floating circuitry 4181: the floated voltages are placed in parallel with diode 4183. Switch transistors 2061, 2062 operate to apply the floated voltages as gate voltages at the first transistor 2050. FIG. 45 is analogous to the arrangement shown in FIG. 7, and can be used to practice at least the method depicted in FIG. 15.

Figure 46:
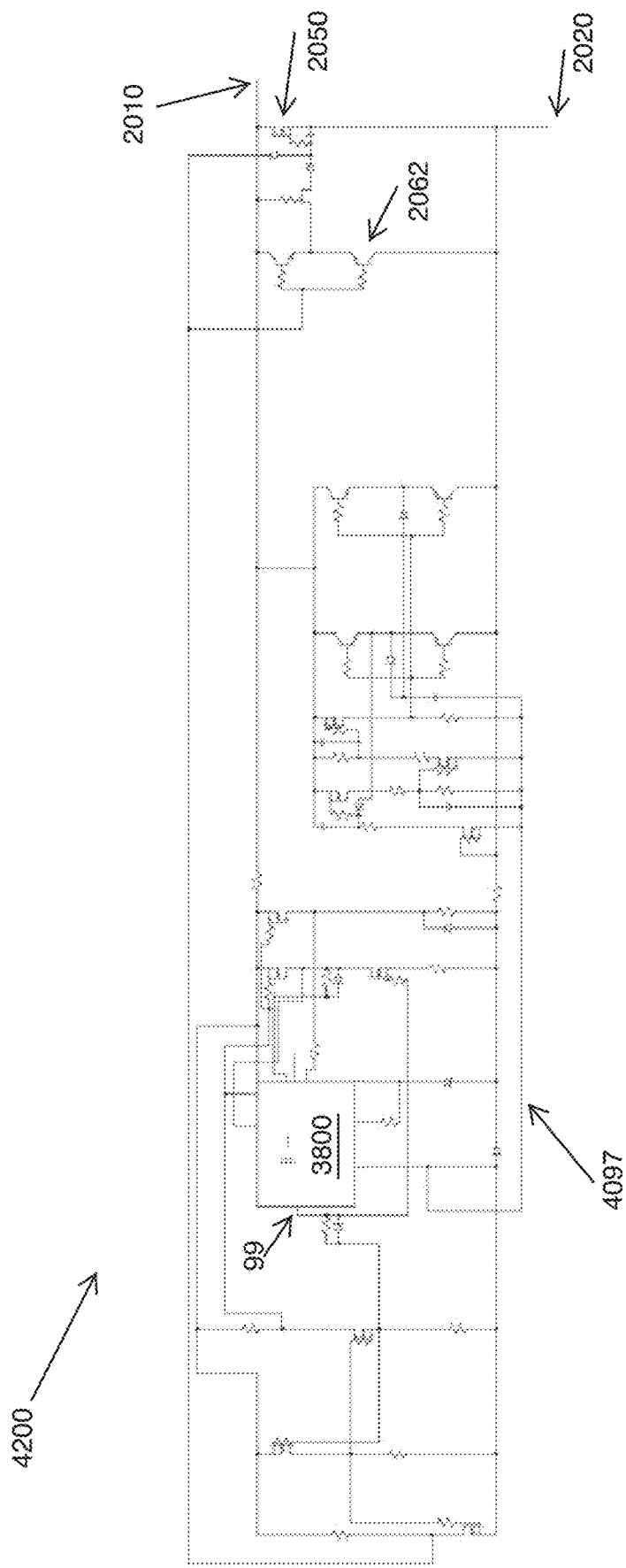
FIG. 46 provides a wiring diagram of an additional embodiment, device 4200, employing schematic 3800.

FIG. 46 provides a wiring diagram of an additional embodiment, device 4200, employing schematic 3800. Device 4200 is similar, although not identical, to device 4100. Wire 4097 and its connections allow the autocatalytic jumpstart voltage converter comprising schematic 3800 (4131 in FIG. 45) to power the oscillator (4195 in FIG. 45) earlier in an overcurrent condition, as first transistor 2050 is being driven into blocking depletion by the autocatalytic jumpstart voltage converter and floater (4131 in FIG. 45). The device 4200 is in some ways analogous to the arrangement shown in FIG. 5, and wire 4097 is analogous to the dotted line in FIG. 5.

FIG. 47 provides wiring diagram of an additional embodiment, device 4300, employing a parallel-to-series switched capacitor network 4310. Device 4300 illustrates autocatalytic voltage conversion to jumpstart blocking mode, and autocatalytic voltage conversion to maintain blocking depletion, at first transistor 2050. In operation, an arising overcurrent condition will power the capacitors of network 4310, flexibly configured in parallel, to charge up at least to the threshold voltage of transistor 4331. When capacitor 4335 reaches that threshold voltage, transistor 4331 turns on, triggering the autocatalytic voltage conversion in network 4310 by flexibly configuring the capacitors in series, and first transistor 2050 is driven into blocking depletion. Transistor 4332 is turning off as transistors 4331, 4333, 4334, and 4362 turn on. The transistor 4361 is driven into blocking depletion, blocking the electrical current to the rest of the device, and the releasably-stored voltage decays. Transistors 4362 and 4331 begin to turn off. Once transistor 4331 is off, network 4310 switches back to a parallel arrangement. Transistor 4332 leaves blocking depletion, the capacitors of network 4310 recharge, and the process repeats: network 4310 autocatalytically converts the voltage and maintains first transistor 2050 in blocking depletion.

Figure 48:
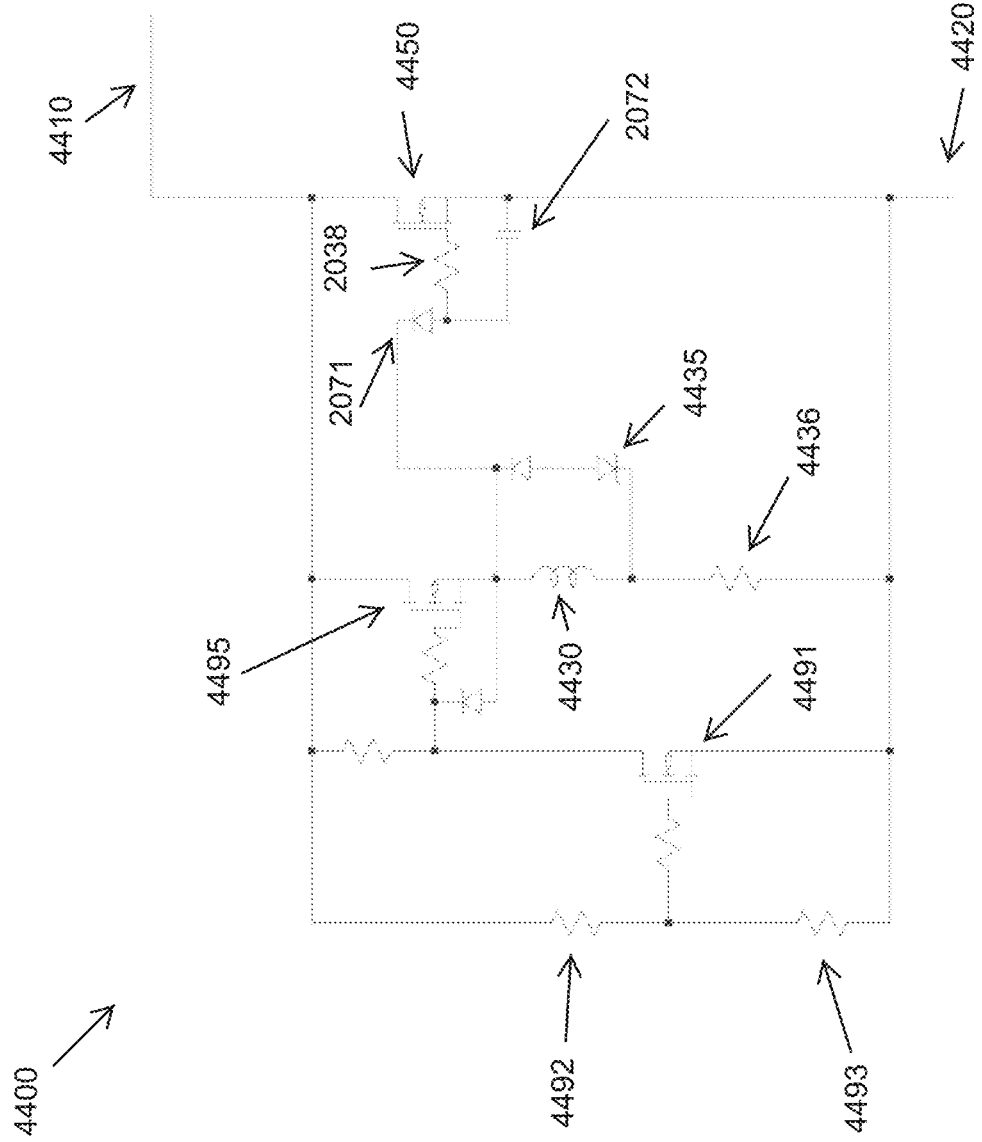
FIG. 48 provides a wiring diagram of an embodiment, device 4400 that employs inductor 4430.

FIG. 48 provides a wiring diagram of an embodiment, device 4400, which employs inductor 4430. First transistor 4450 is positioned in a primary current path in series electrical communication between first terminal 4410 and second terminal 4420. A voltage divider provided by resistors 4492, 4493, together with the threshold voltage of transistor 4491, determine the voltage across device 4400 at which an overcurrent will send the device into blocking mode. As the voltage across first terminal 4410 and second terminal 4420 increases close to the threshold voltage of transistor 4495, the current through inductor 4430 increases. As the voltage across first terminal 4410 and second terminal 4420 further increases transistor 4491 turns on. The gate of transistor 4495 is connected to the drain of transistor 4491 so that turn on of transistor 4491 abruptly turns off transistor 4495 which quickly cuts off current to inductor 4430. The abrupt cut off of current to inductor 4430 flips the polarity across the inductor 4430 and produces a flyback voltage which charges capacitor 2072 through diode 2071 thereby driving the first transistor 4450 into blocking depletion. The flyback voltage produced by inductor 4430 is floated by transistor 4495 when it turns off. Charge retention circuitry, in the form of capacitor 2072 and diode 2071 assist in holding first transistor 4450 in blocking depletion mode.

FIG. 49 provides a wiring diagram for two transistors 4551, 4552, which are both n-channel, depletion mode, normally-on transistors, that can be configured to block overcurrent in an alternating current environment. With their sources connected, transistors 4551 and 4552 have their blocking ends pointing away from each other. Capacitor 4572 provides a measure of charge retention circuitry, and resistors 4537, 4538 protect the gates of transistors 4551, 4552.

FIG. 50 provides a wiring diagram for two transistors 4551, 4552 and rectifier bridge 4640 that can be configured to block overcurrent in an alternating current environment. Rectifier bridge 4640 comprises diodes 4641, 4642, 4643, 4644, and can be connected as shown to the drains of transistors 4551, 4552.

Figure 51:
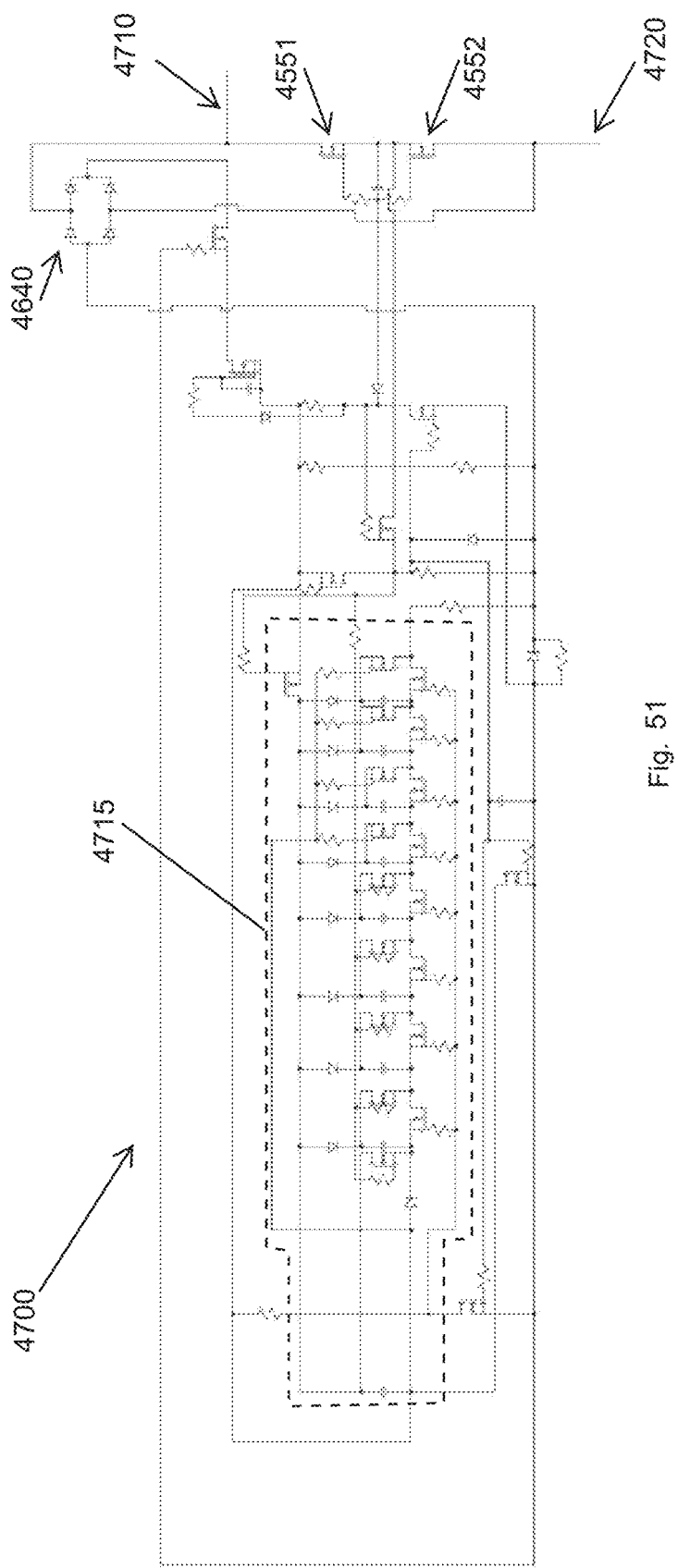
FIG. 51 provides a wiring diagram for an embodiment, device 4700 employing transistors 4551, 4552 and rectifier bridge 4640, configured to block overcurrent in an alternating current environment.

FIG. 51 provides a wiring diagram for an embodiment, device 4700 employing transistors 4551, 4552 and rectifier bridge 4640 configured to block overcurrent in an alternating current environment. Similar to device 4300, device 4700 provides for autocatalytic jumpstart voltage conversion and autocatalytic extended use voltage conversion employing parallel-to-series switched capacitor network 4715 to drive and maintain first transistors 4551, 4552 in blocking depletion, should an overcurrent condition arise across first terminal 4710 and second terminal 4720. Rectifier bridge 4640 ensures that device 4700 can protect against overcurrent no matter the polarity of the overcurrent. In device 4700, transistors 4551, 4552 and optionally rectifier bridge 4640 can be replaced by a single bi-directional transistor suited to blocking current having either polarity.

Certain GaN depletion mode, normally-on transistors configured for bi-directional functionality may be mentioned, for example.

Figure 52:
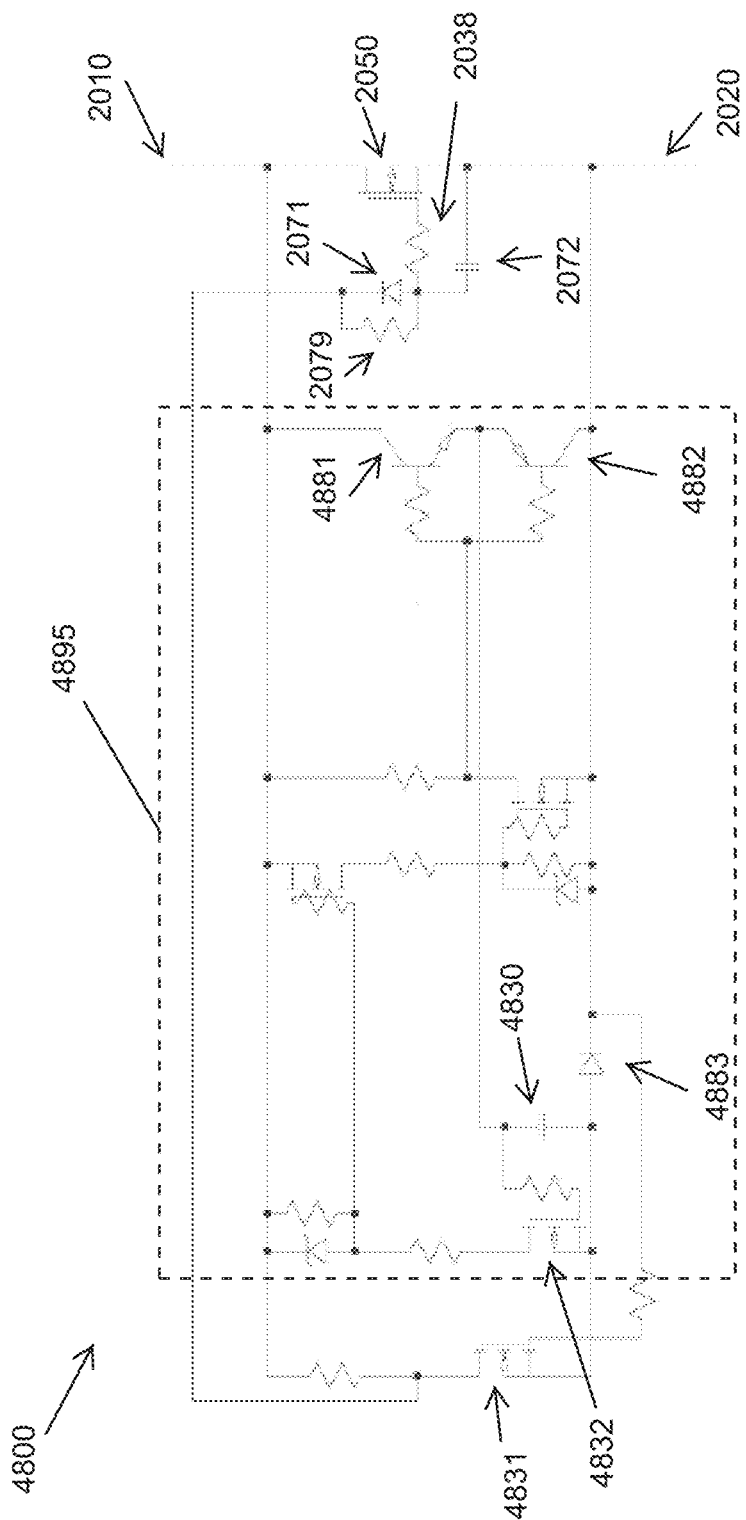
FIG. 52 provides a wiring diagram for a further embodiment, device 4800, configured to block overcurrent current wherein at least some of the components perform more than one of the functions described herein.

FIG. 52 provides a wiring diagram for a further embodiment, device 4800, configured to block overcurrent current wherein at least some of the components perform more than one of the functions described herein. First terminal 2010 and second terminal 2020 define a primary current path through device 4800 through the drain and source of first transistor 2050. Charge retention circuitry comprising diode 2071, capacitor 2072, and resistor 2079 maintain a gate voltage on the first gate of first transistor 2050 via gate protecting resistor 2038. Bipolar junction transistors 4881, 4882, arranged in a push-pull, totem pole arrangement provide both a voltage conversion and voltage floating function, placing the releasably-stored voltage on capacitor 4830 in parallel with diode 4883 as needed to drive first transistor 2050 into blocking depletion. The circuitry 4895 represents voltage converter, voltage floater, oscillator, current monitor, and delay block timer circuitry. In some ways, circuitry 4895 is analogous to driver circuitry 1030 in FIG. 10. Under normal current conditions, transistor 4881 is on, transistor 4882 is off, and capacitor 4830 charges to provide a releasably stored voltage. Transistor 4832 acts as a current monitor, turning on when a sustained overcurrent condition arises. Capacitor 4830 further acts as a delay block timing circuitry timing element, momentarily delaying transistor 4832 from turning on and the onset of blocking depletion mode while capacitor 4830 further charges under the higher voltage of an overcurrent condition. Transistor 4881 turns off, transistor 4882 turns on, and the releasably-stored voltage at capacitor 4830 is floated across diode 4883. That floated voltage now charges capacitor 2072 and drives first transistor 2050 into blocking depletion, cutting off current between first terminal 2010 and second terminal 2020. The transistors inside circuitry 4895 oscillate, alternatively charging and floating the voltage at capacitor 4830 to sustain first transistor 2050 in blocking depletion mode. Capacitor 4830 acts as a timing element in the oscillation. Transistor 4831 is normally off, which allows capacitor 2072 to charge, which normally holds first transistor 2050 in enhancement mode. When transistor 4882 turns on and floats the releasably-stored voltage at capacitor 4830, transistor 4831 turns on and first transistor 2050 is driven into blocking depletion. In some ways, transistor 4831 is analogous to switch 160 in FIG. 10. Device 4800 resets by powering down for a time sufficient to discharge capacitor 2072. Any suitable reset circuitry can be added to device 4800, such as, for example, voltage level reset circuitry described herein. Accordingly, some embodiments provide a device for protecting a circuit having a primary current path from a overcurrent condition, comprising a first terminal and a second terminal configured to route the primary current path through the device; a first transistor comprising a first gate, a first drain, and a first source; wherein the first transistor is a depletion mode, normally-on transistor; wherein the first transistor is arranged in series in the primary current path between the first terminal and the second terminal; a driver circuitry comprising an oscillating voltage converter and floater circuitry configured to convert an input voltage derived solely from a voltage between the first terminal and the second terminal into a releasably-stored voltage, float the releasably stored voltage to obtain a floated voltage, apply the releasably-stored voltage or a derivative voltage thereof as a gate voltage at the first gate relative to the first source upon occurrence of an overcurrent condition, and oscillate to repeatedly convert, float, and apply a blocked voltage for at least the duration of the overcurrent condition, to drive and maintain the first transistor in blocking depletion mode, thereby protecting the circuit from the overcurrent condition.

Figure 53:
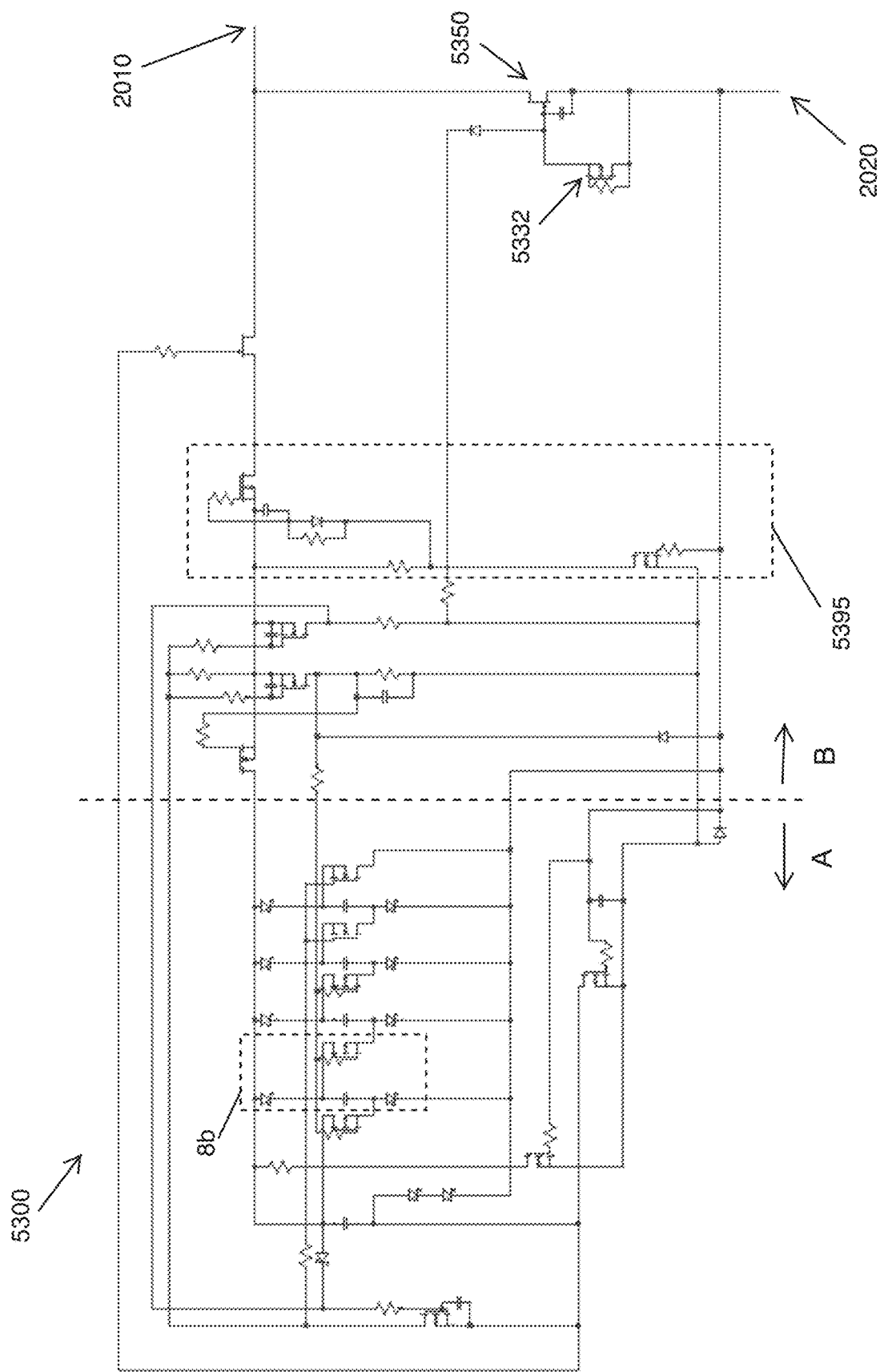
FIGS. 53 and 68-69 provide wiring diagrams for another embodiment, device 5300, configured to limit current when an overcurrent condition arises.
Figure 68:
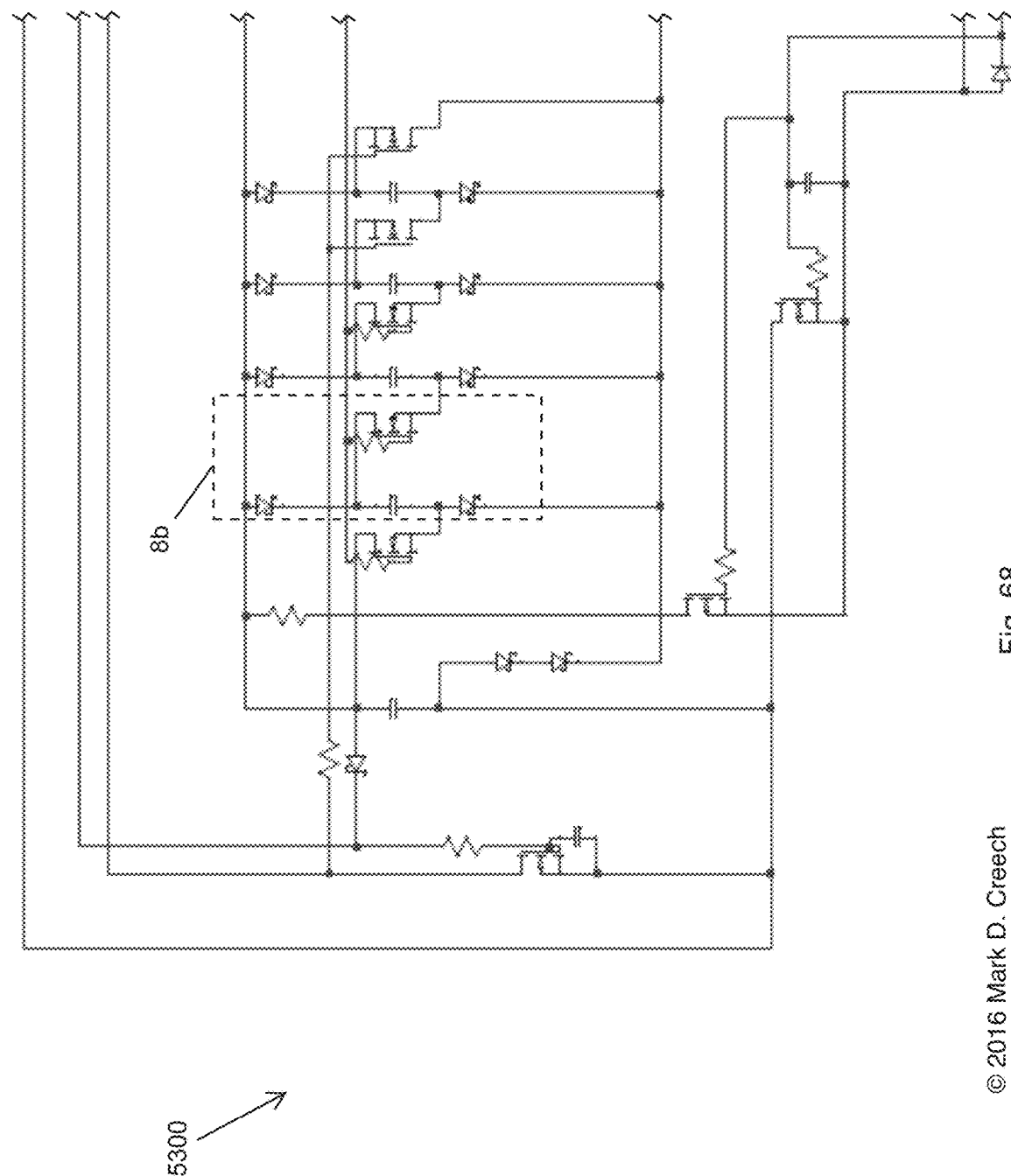
Figure 69:
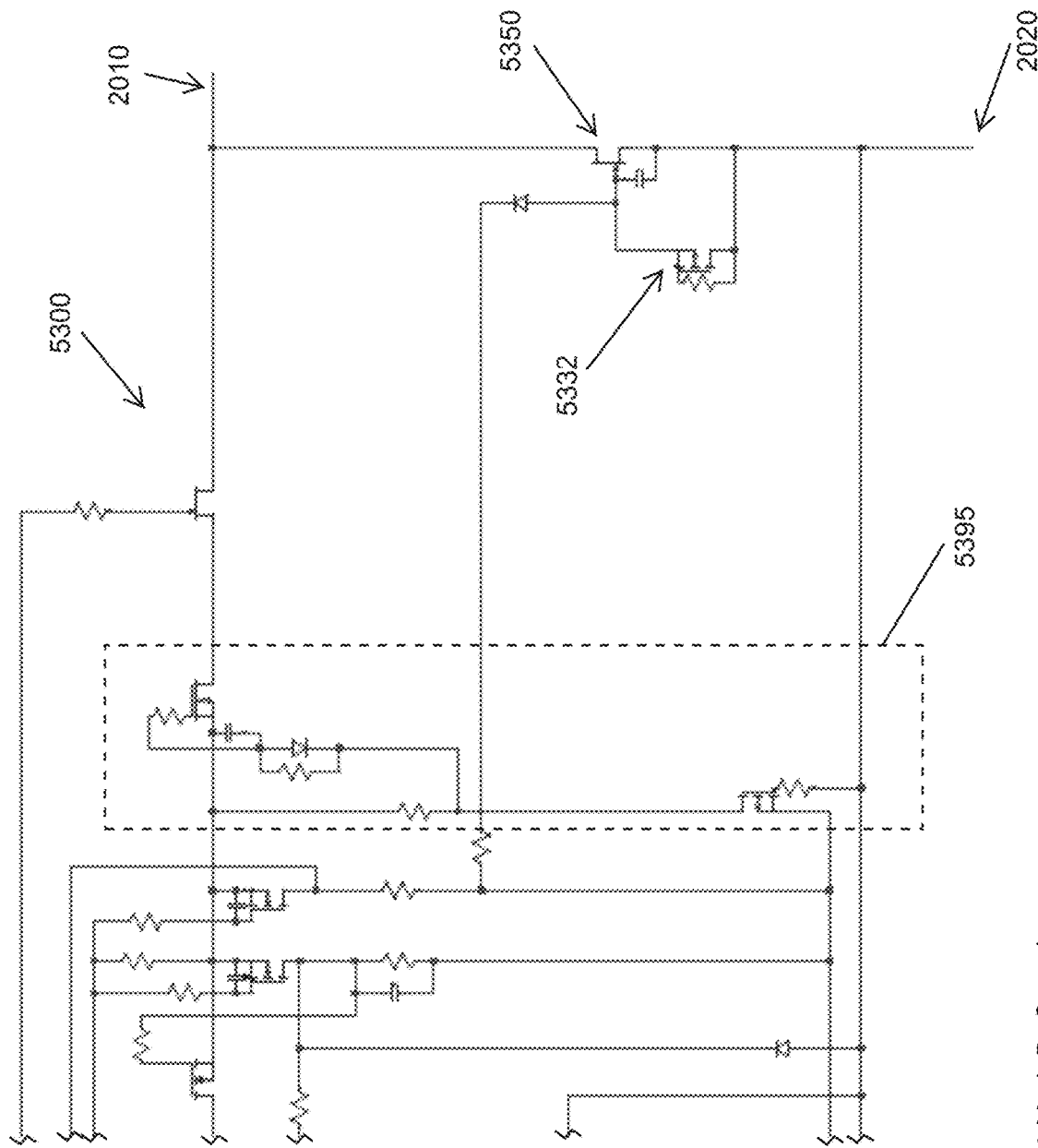

FIG. 53 provides a wiring diagram for another embodiment, device 5300, configured to limit current when an overcurrent condition arises. FIG. 68 shows section A of device 5300 from FIG. 53; FIG. 69 shows section B. In device 5300, first transistor 5350 is an n-channel, depletion mode JFET. First terminal 2010 and second terminal 2020 would be placed in series in the primary current path of the circuit to be protected. Limiting transistor 5332 is an n-channel enhancement-mode MOSFET that controls whether first transistor 5350 enters blocking depletion mode, and instead places first transistor 5350 into current limiting mode when an overcurrent condition arises. In some configurations, device 5300 can only limit current, and cannot block current. Oscillator circuitry 5395 begins oscillating when current limiting mode is initiated, and maintains a suitable gate voltage for first transistor 5350 to maintain current limiting mode.

Device 5300 is otherwise similar to device 3801. For example, device 5300 includes an autocatalytic parallel-to-series switched capacitor network configured to convert an input voltage into a releasably-stored voltage. Device 5300 in FIG. 53 uses a topology similar to network 3200 in FIG. 32, and thereby reduces the size of the voltage drop across first transistor 5350 necessary for operation since more of the voltage reaches the internal components such as those in building block 8b. It can be seen that building block 8b is analogous to building block 8 in FIG. 33. This is another embodiment of a parallel-to-series switched capacitor network comprising a combination of (a) building blocks comprising at least one n-channel transistor and a capacitor, with (b) building blocks comprising at least one p-channel transistor and a capacitor, wherein the at least one n-channel transistor and the at least one p-channel transistor are configured to flexibly configure the capacitors in parallel and flexibly configure the capacitors in series for discharge. Here, that parallel-to-series switched capacitor network is employed by device 5300 to limit current during an overcurrent condition.

Figure 54:
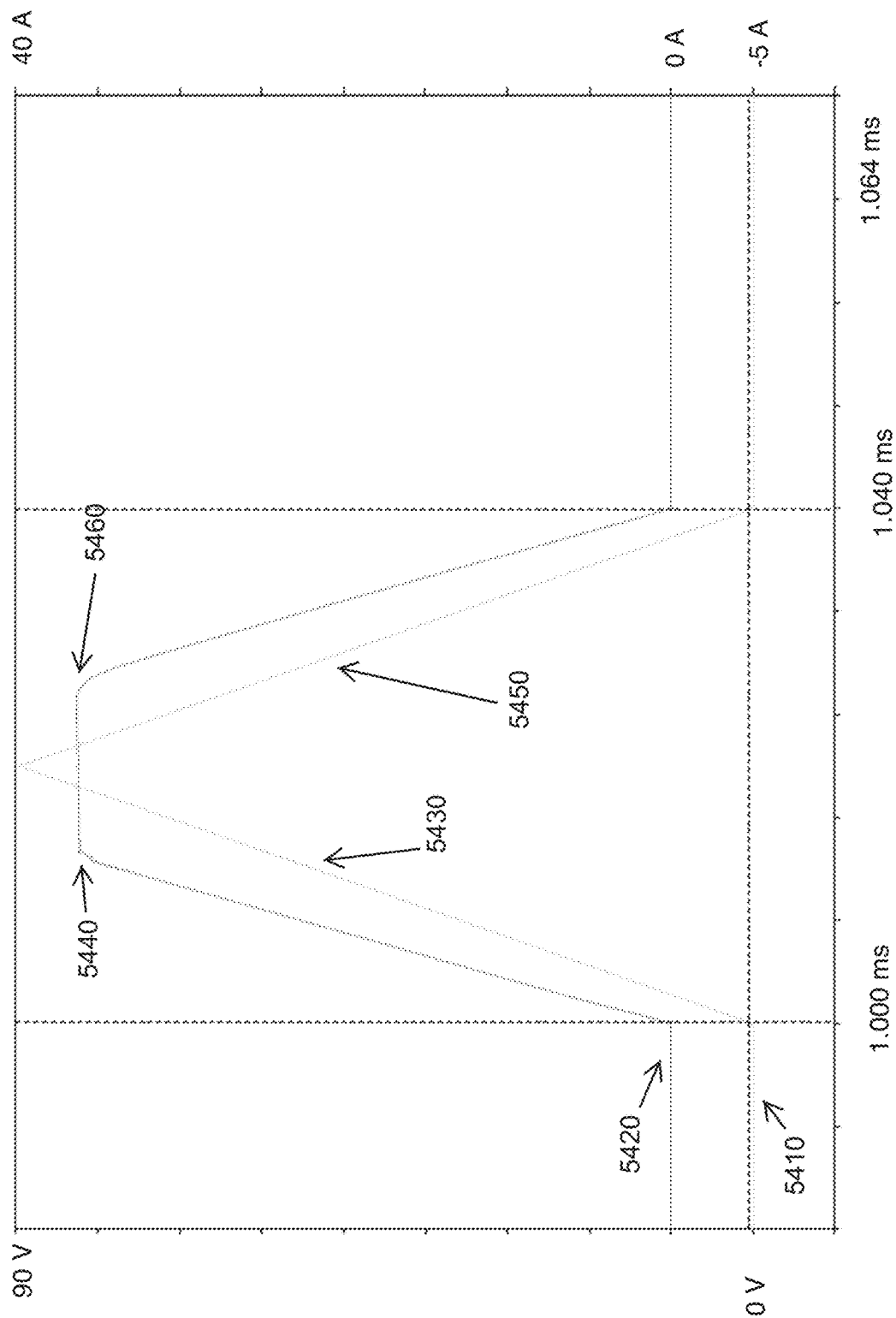
FIG. 54 illustrates current limiting behavior of device 5300 during a simulated overcurrent condition.

FIG. 54 illustrates current limiting behavior of device 5300 during a simulated overcurrent condition. A resistive load simulating a protected circuit was connected in series from second terminal 2020 to ground, and the voltage was monitored from first terminal 2010 to ground. A simulated voltage 5410 was applied at first terminal 2010, and the current 5420 that would pass through device 5300 was recorded. When the voltage reached a critical voltage 5430, device 5300 acted to limit current 5440 to about 35 A, by entering current limiting mode. When the voltage dropped below a certain voltage 5450, device 5300 passed current 5460 correspondingly.

Figure 55:
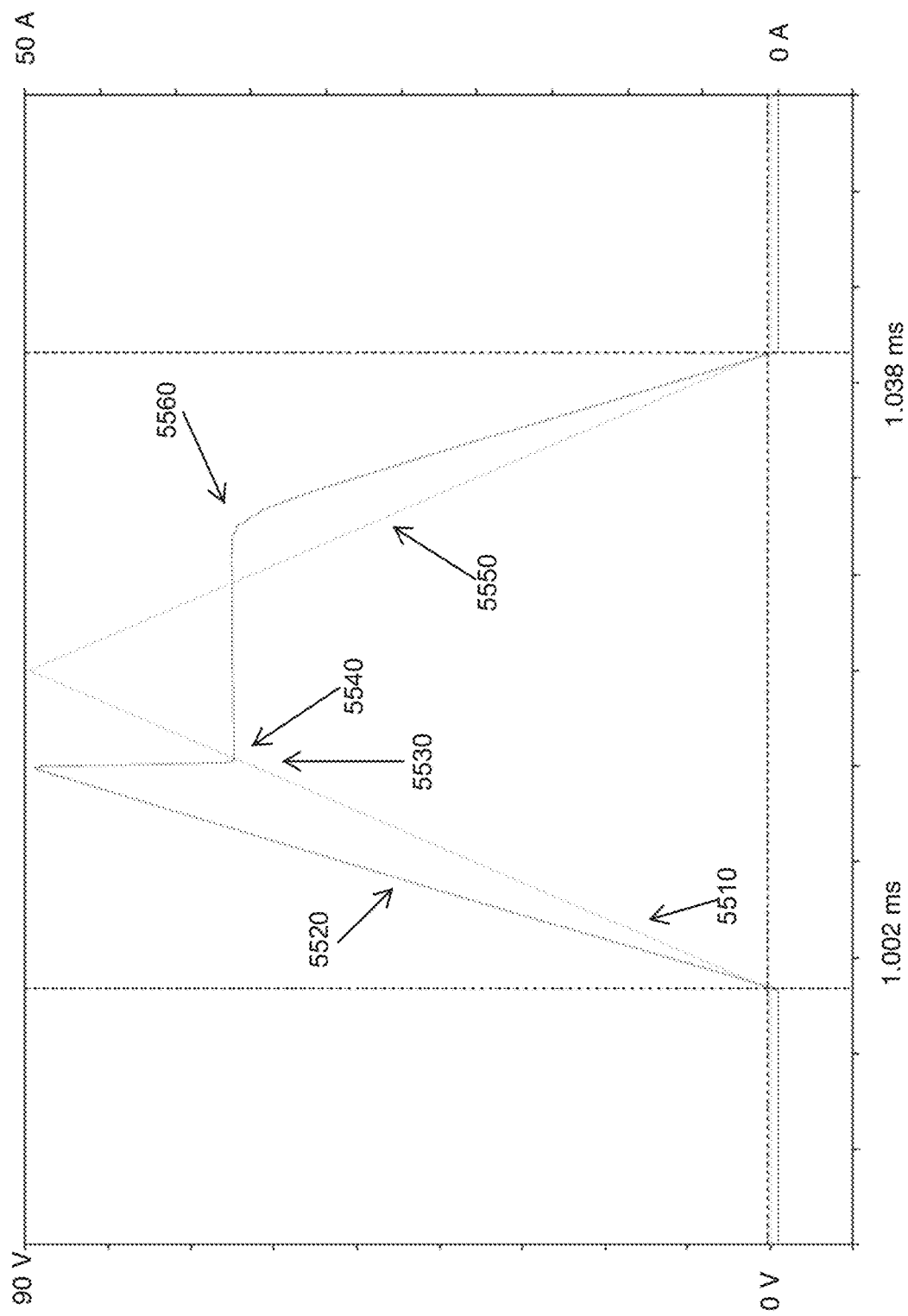
FIG. 55 illustrates current limiting behavior of device 5300 wherein the current at which the device begins limiting current is greater than the limited current.

FIG. 55 illustrates current limiting behavior of device 5300 wherein the current at which the device begins limiting current, almost 50 A, is greater than the limited current, about 35 A. Using the same simulated testing conditions as those for FIG. 54, the simulated voltage 5510 exhibited the same overcurrent condition. This time, however, device 5300 was configured slightly differently. Initially, device 5300 passed current 5520. When current limiting mode was triggered by voltage 5530, the device 5300 limited to a slightly lower current 5540 than had been allowed at the onset of the overcurrent condition. This shows that the embodiments of the present invention can be configured as desired, in this case to avoid limiting currents due to brief, less-dangerous nuisance spikes in voltage; but if the overcurrent condition persists, the device can enter current limiting mode. In this case, when the voltage returned below a certain voltage 5550, device 5300 passed current 5560 correspondingly.

It is important to note that device 5300 did not "reset," or exit current limiting mode, in either of FIGS. 54 and 55. After points 5460 and 5560, device 5300 still would limit current; however, the simulated voltage simply was not great enough to supply more than the limited current through device 5300. Accordingly, some embodiments of the present invention do not provide reset circuitry, but they still work to protect a circuit.

Figure 56:
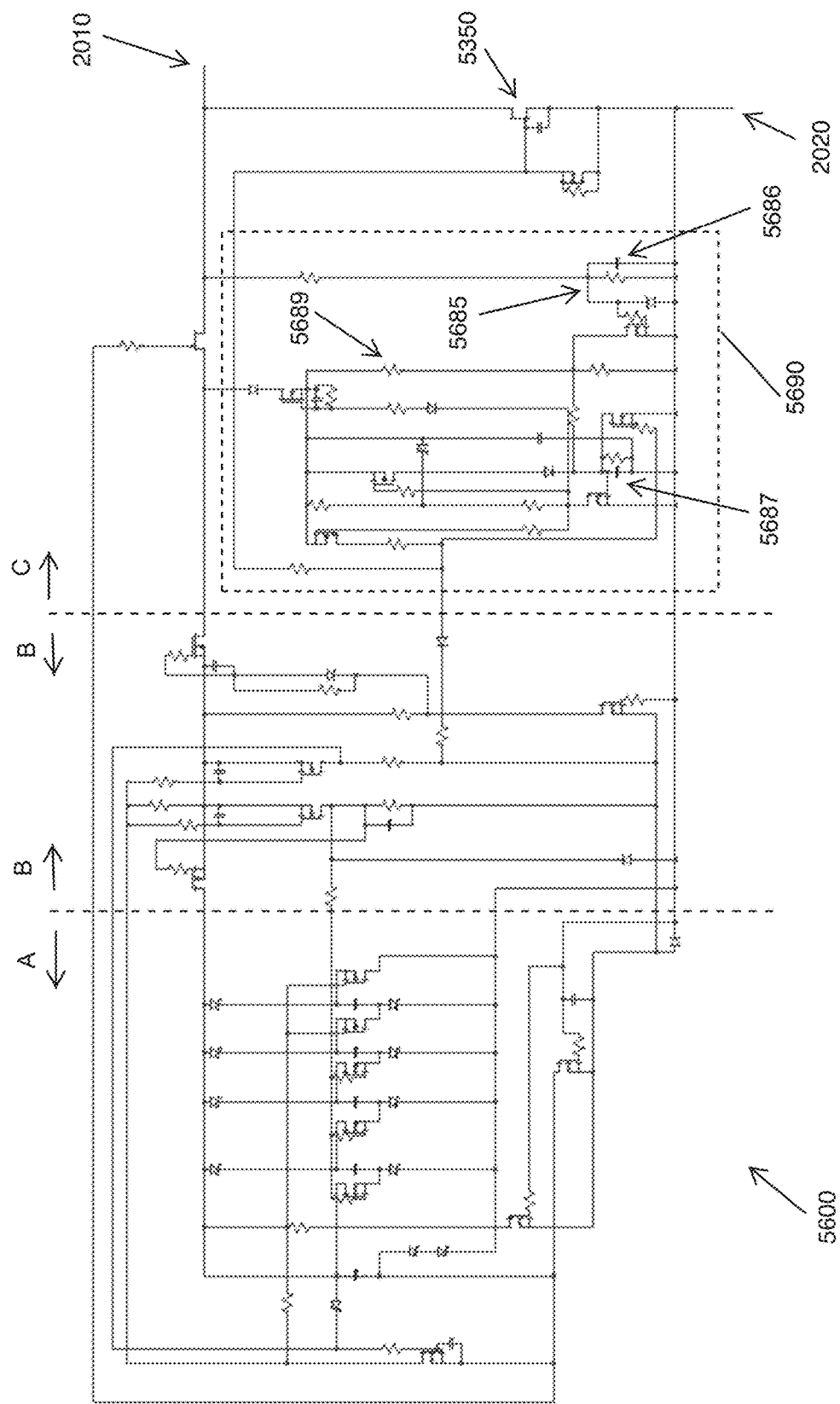
FIGS. 56 and 70-72 provide wiring diagrams for yet another embodiment, device 5600, that includes conduction reset circuitry 5690.
Figure 70:
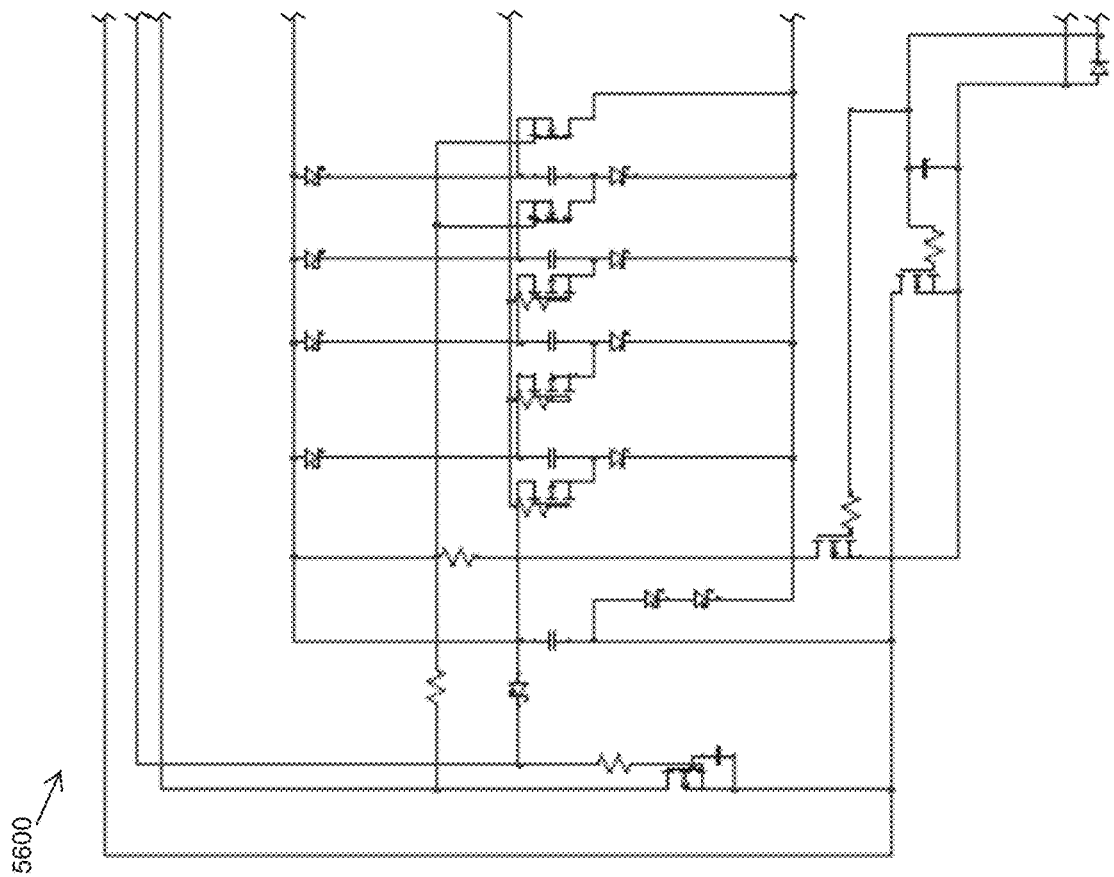
Figure 71:
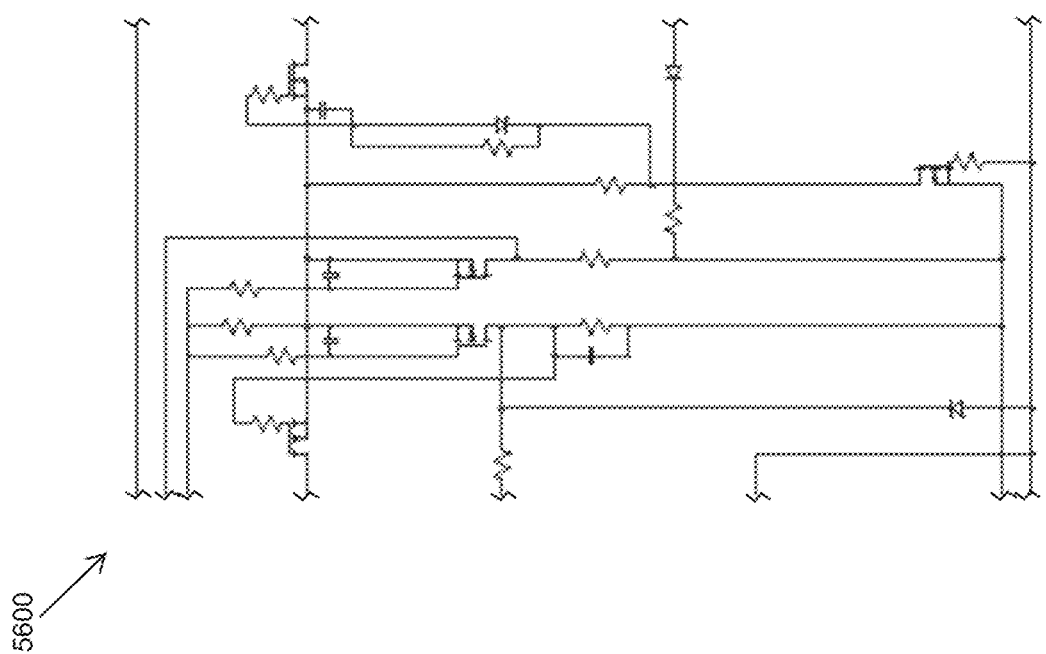
Figure 72:
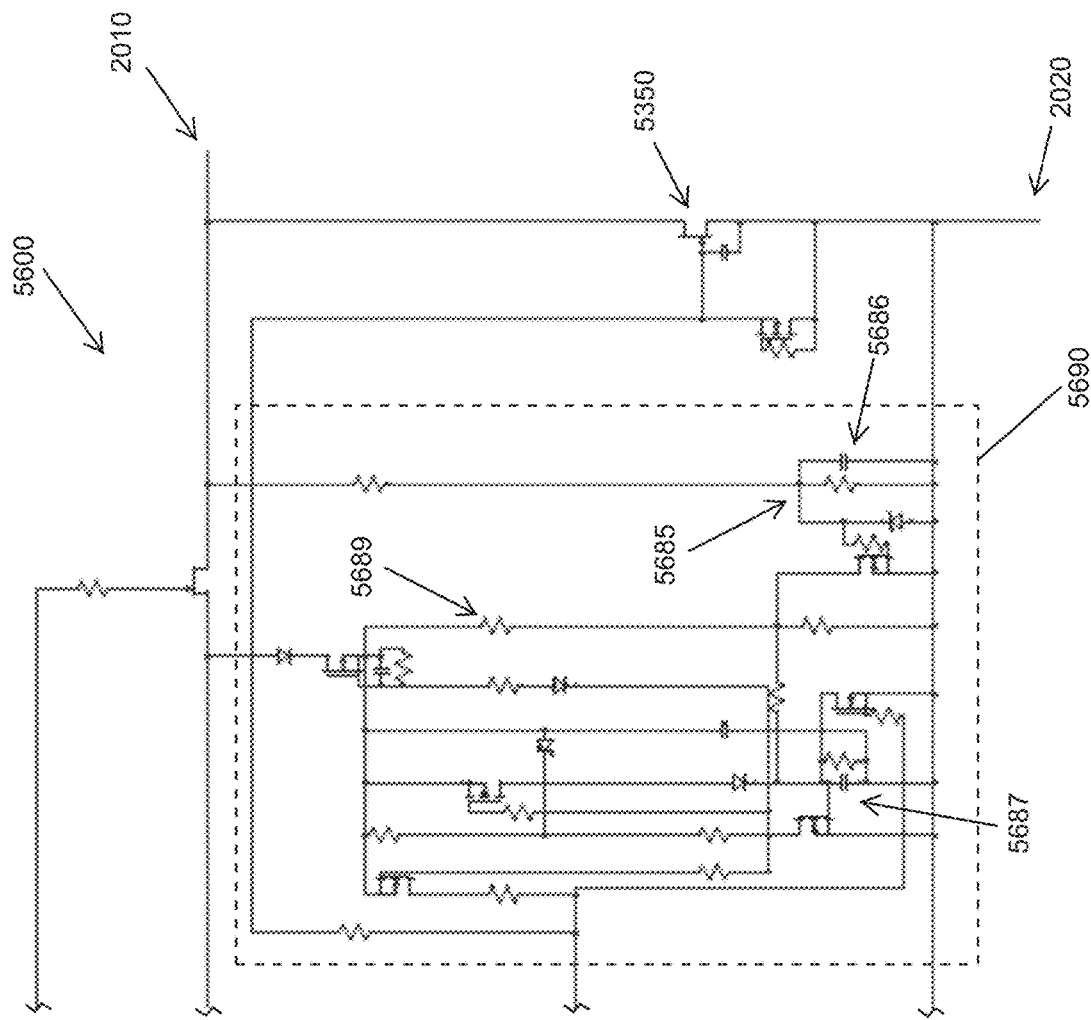

FIG. 56 provides a wiring diagram for yet another embodiment, device 5600, that includes conduction reset circuitry 5690. Otherwise, device 5600 is similar to device 5300. FIG. 70 shows section A of device 5600 from FIG. 56; FIG. 71 shows section B; and FIG. 72 shows section C. Capacitor 5686, capacitor 5687, resistor 5685, and other resistors such as resistor 5689 provide reset timer circuitry configurable to allow device 5600 to return to full conduction mode after an overcurrent condition has subsided.

Figure 57:
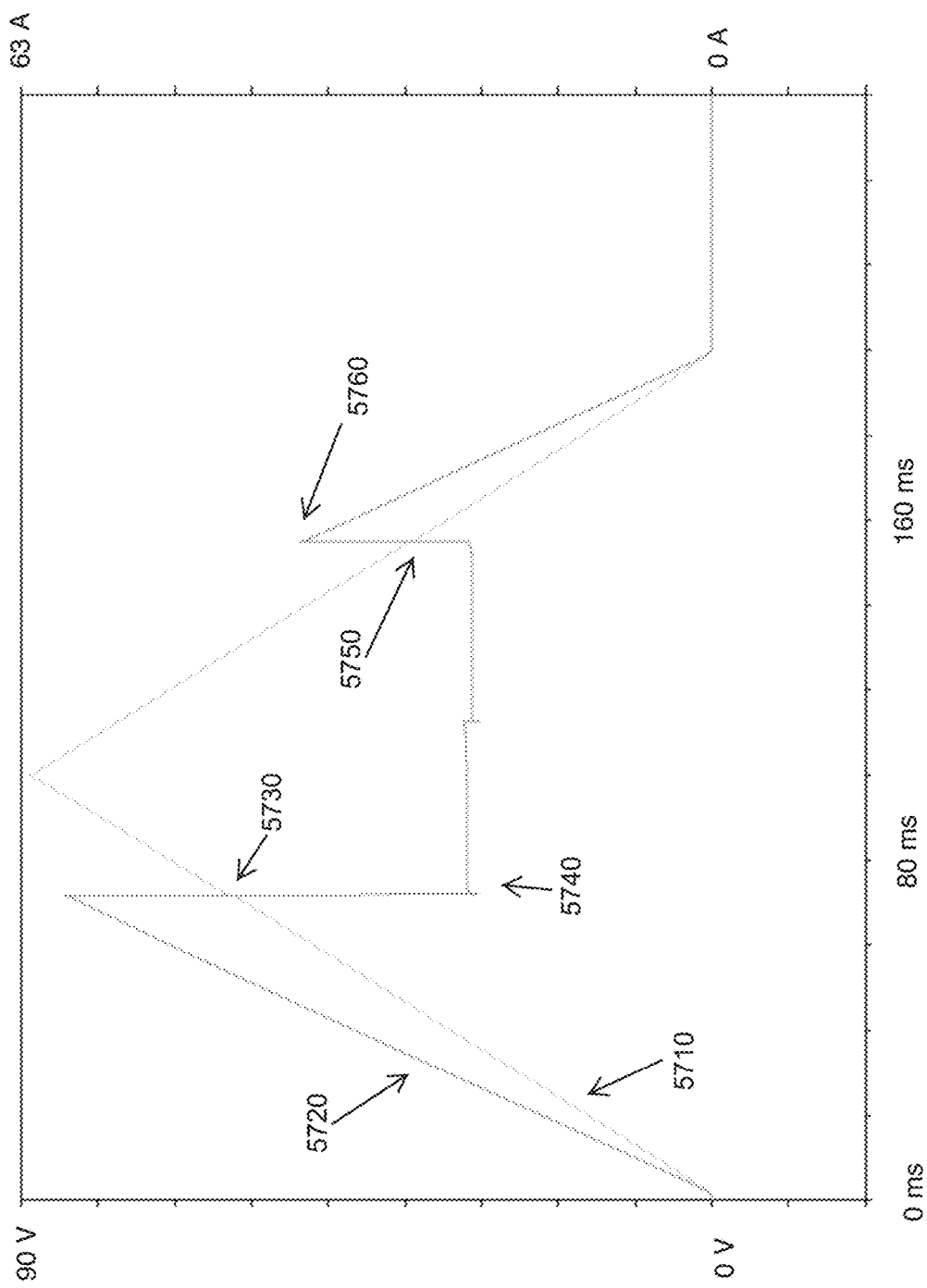
FIG. 57 illustrates current limiting behavior of device 5600 during a simulated overcurrent condition.

FIG. 57 illustrates current limiting behavior of device 5600 during a simulated overcurrent condition. Using the same testing configuration as for FIG. 54, a simulated voltage 5710 was applied and current 5720 passing through device 5600 was recorded. When voltage 5730 represented an overcurrent condition, device 5600 acted to limit current 5740 by entering current limiting mode. When the voltage dropped below safe voltage 5750, device 5600 reset to full conduction mode, and allowed current 5760 to flow at a level greater than the limited current 5740.

Figure 58:
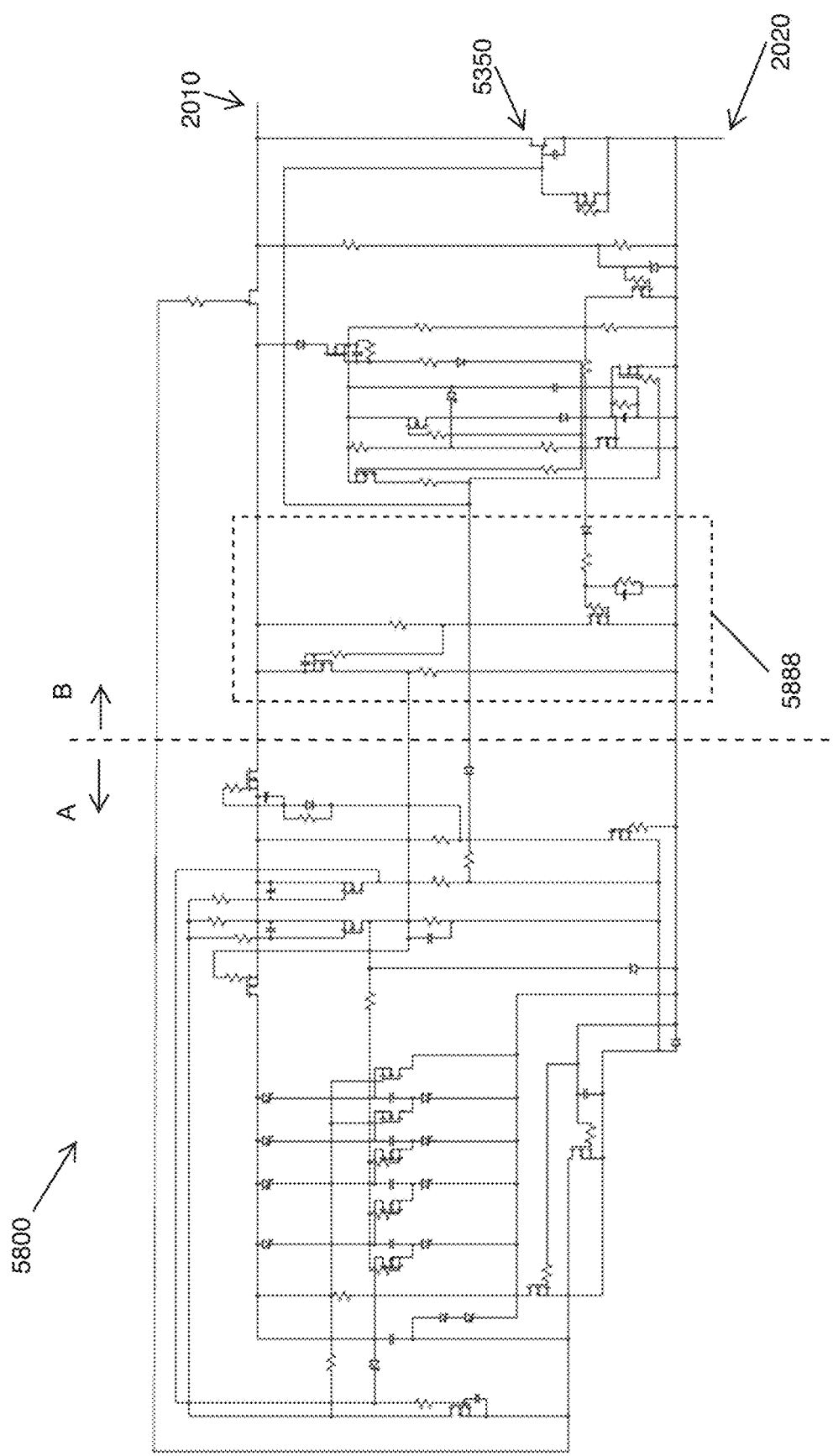
FIGS. 58 and 73-74 provide wiring diagrams for another embodiment, device 5800, that includes retry and latch circuitry 5888.
Figure 73:
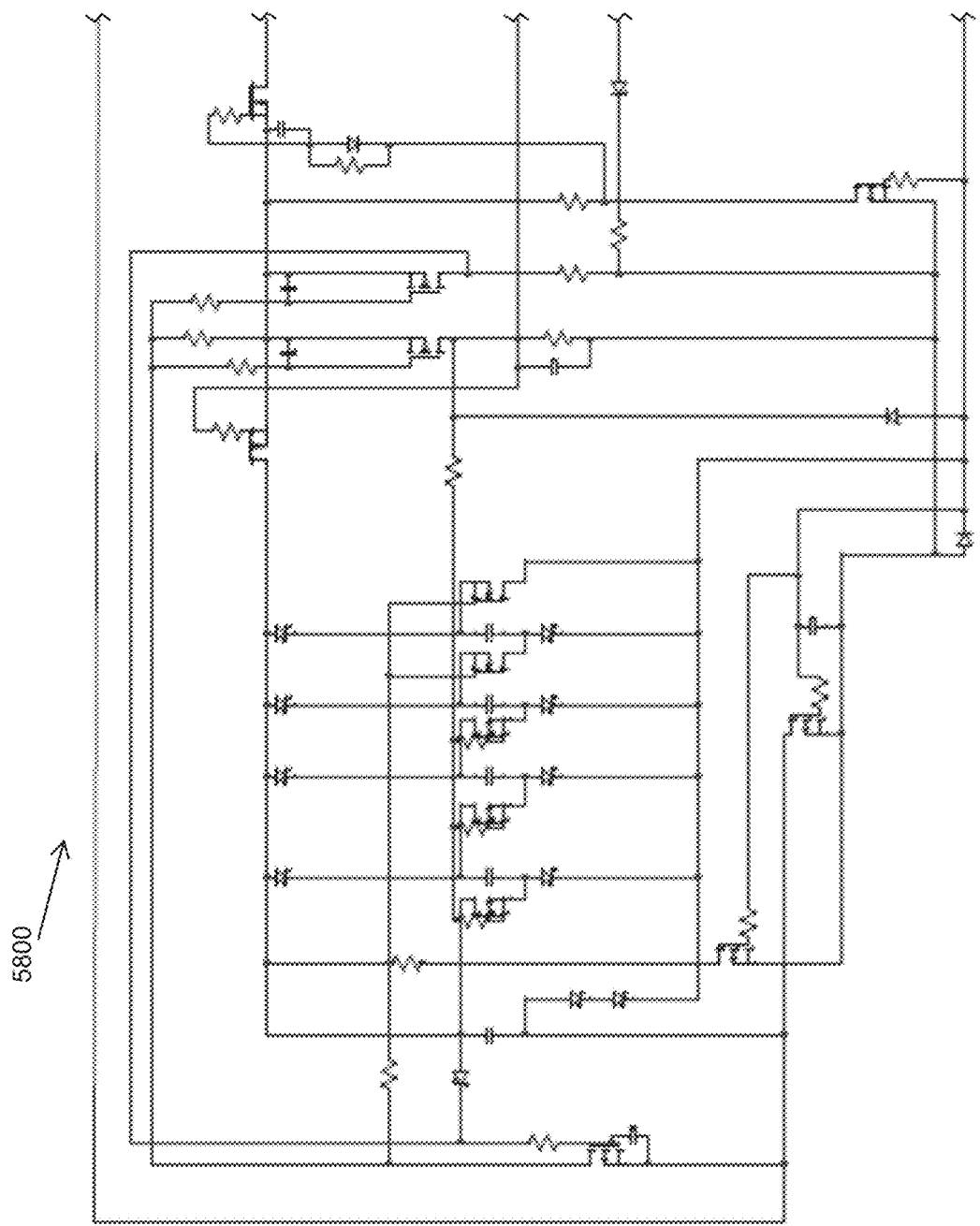
Figure 74:
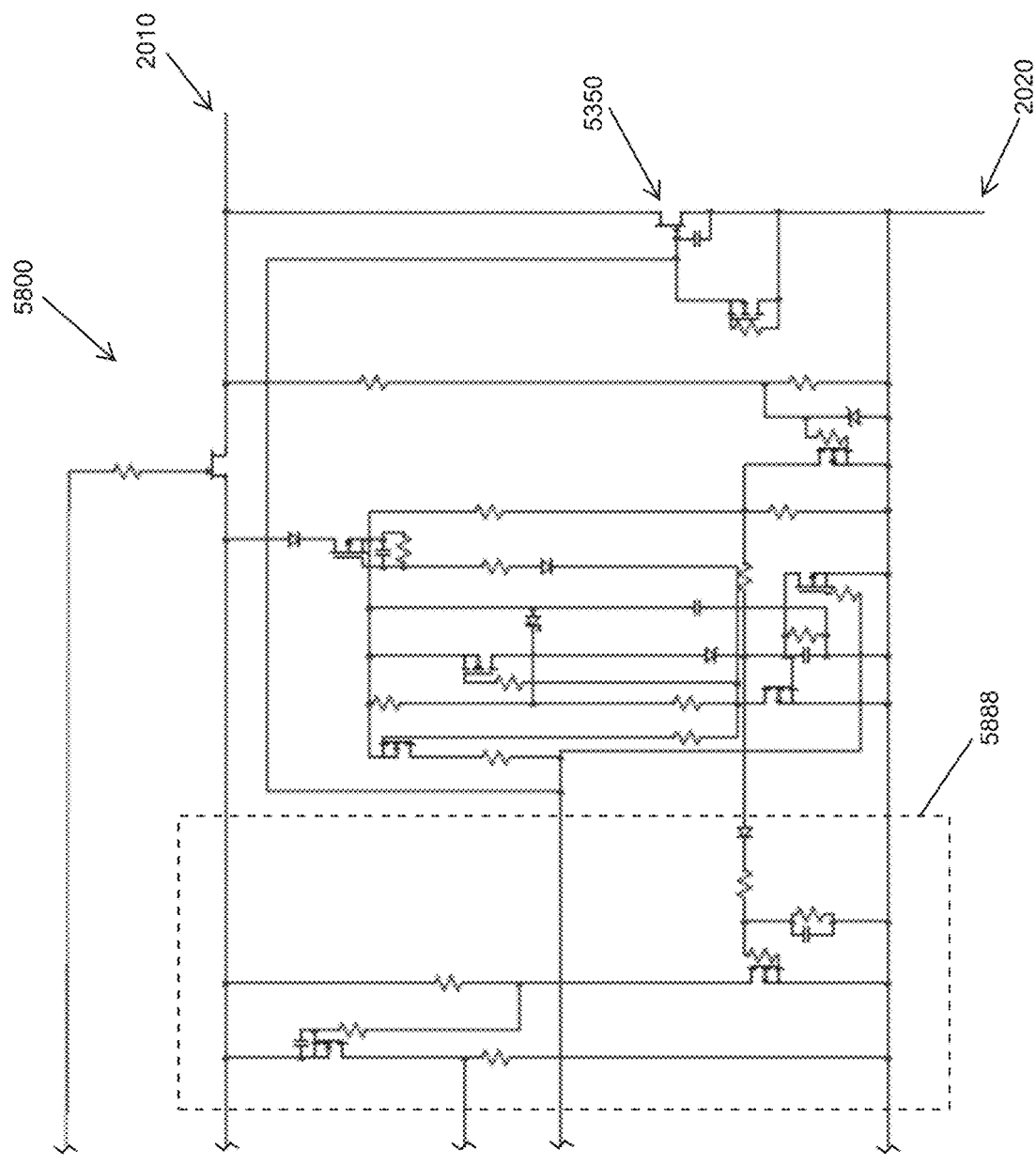

FIG. 58 provides a wiring diagram for another embodiment, device 5800, that includes retry and latch circuitry 5888. FIG. 73 shows section A of device 5800 from FIG. 58; FIG. 74 shows section B. Device 5800 is similar to device 5600, but retry and latch circuitry 5888 allows device 5800 to count the number of overcurrent events, and if that number exceeds a preselected limit, device 5800 latches into full conduction mode. Such a device is useful, for example, if device 5800 is placed in series with a mechanical switch or fuse. During certain overcurrent conditions, device 5800 will act to limit current. However, if the overcurrent conditions become too many, device 5800 latches into full conduction mode, which allows the switch to open or fuse to blow. Thus, some embodiments of the present invention are configured to count the number of overcurrent events, reset after a predetermined number of overcurrent events, and then latch into full conduction mode if the number of overcurrent events exceeds the predetermined number.

Figure 59:
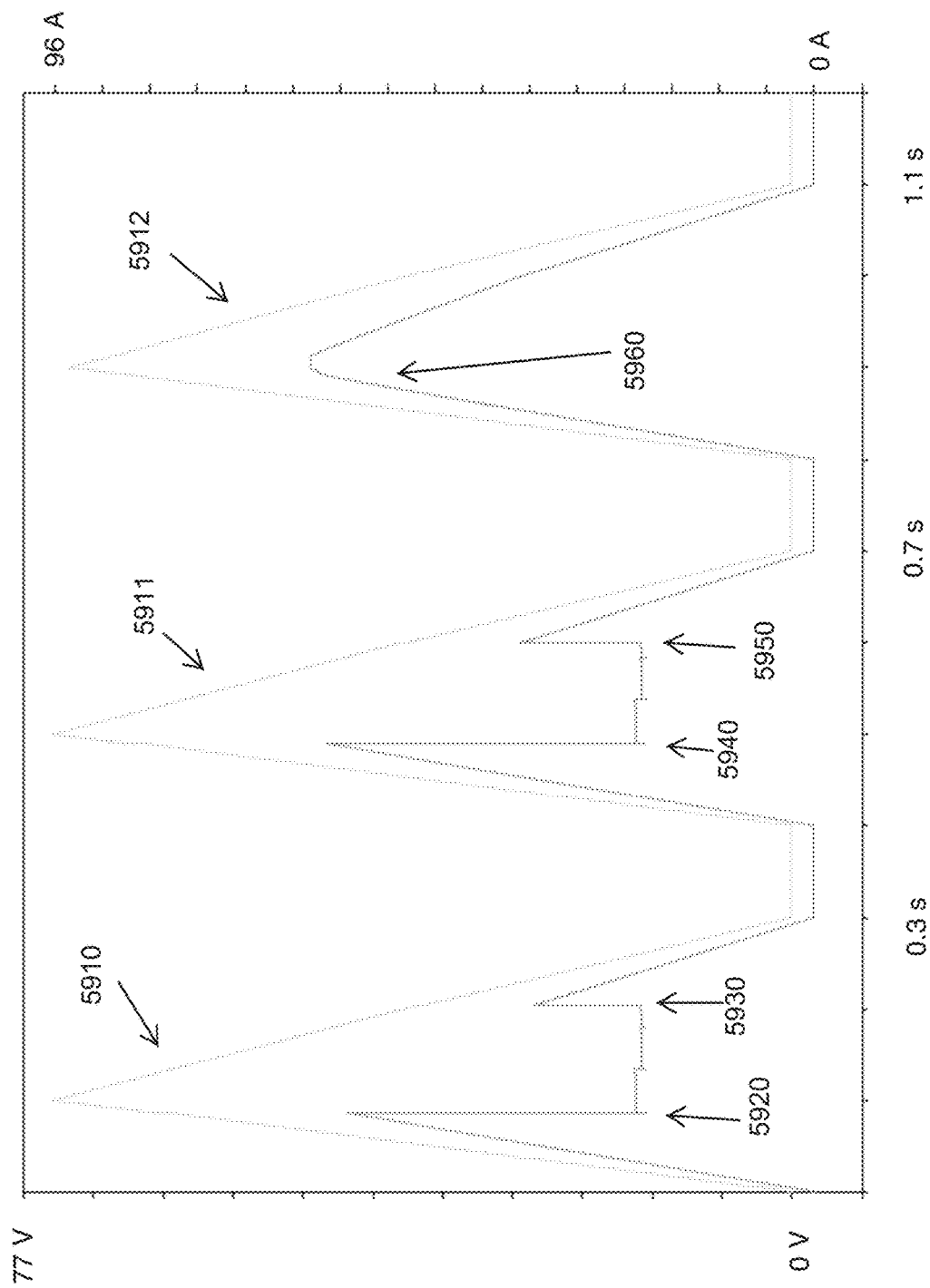
FIG. 59 illustrates current limiting behavior of device 5800 subjected to a series of simulated overcurrent conditions, which causes device 5800 to latch into full conduction mode.

FIG. 59 illustrates current limiting behavior of device 5800 subjected to a series of simulated overcurrent conditions, which causes device 5800 to latch into full conduction mode. Using the same configuration as for FIG. 54, three overcurrent events 5910, 5911, and 5912 were simulated. During the first overcurrent event 5910, device 5800 entered current limiting mode allowing current 5920, and reset to full conduction mode 5930. During the second overcurrent event 5911, device 5800 entered current limiting mode allowing current 5940, and reset to full conduction mode 5950. The preselected number of overcurrent events that device 5800 would endure was two, so upon occurrence of the third overcurrent event 5912, device 5800 had been latched into full conduction mode, and current 5960 was not limited or blocked.

Figure 60:
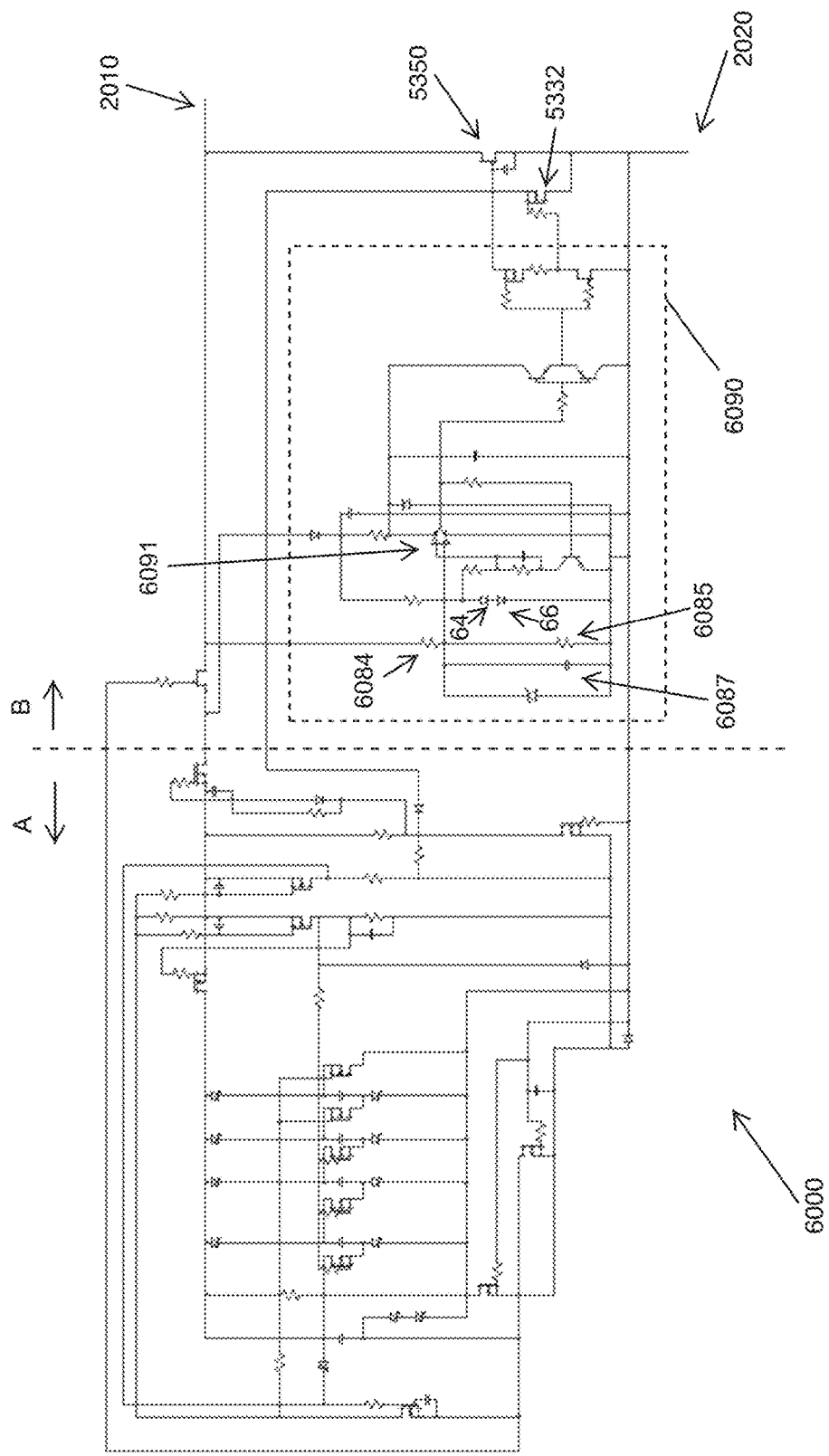
FIGS. 60 and 75-76 provide wiring diagrams for an additional embodiment, device 6000, configured to reset into a current limiting mode from a blocking depletion mode as an overcurrent condition subsides.
Figure 75:
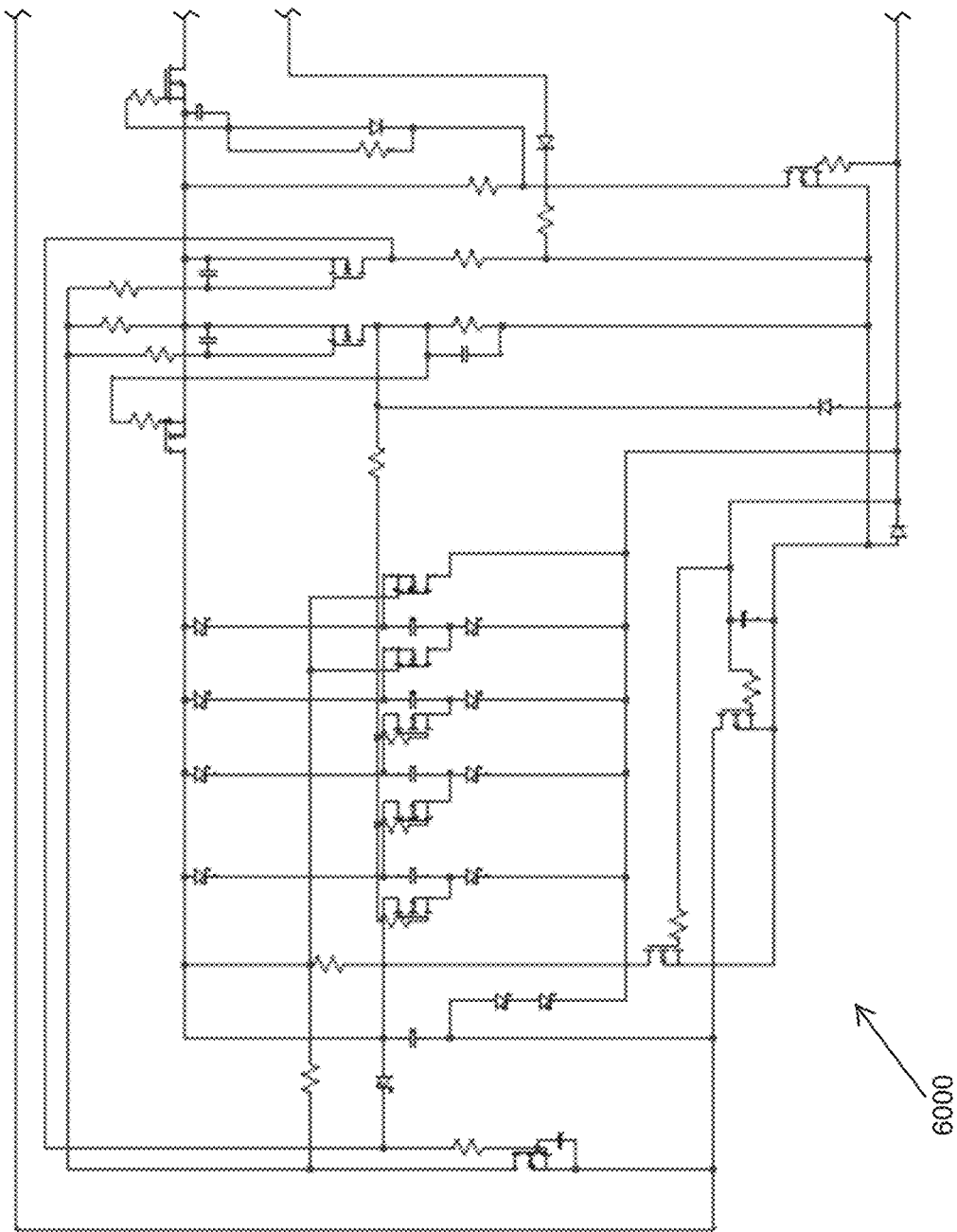
Figure 76:
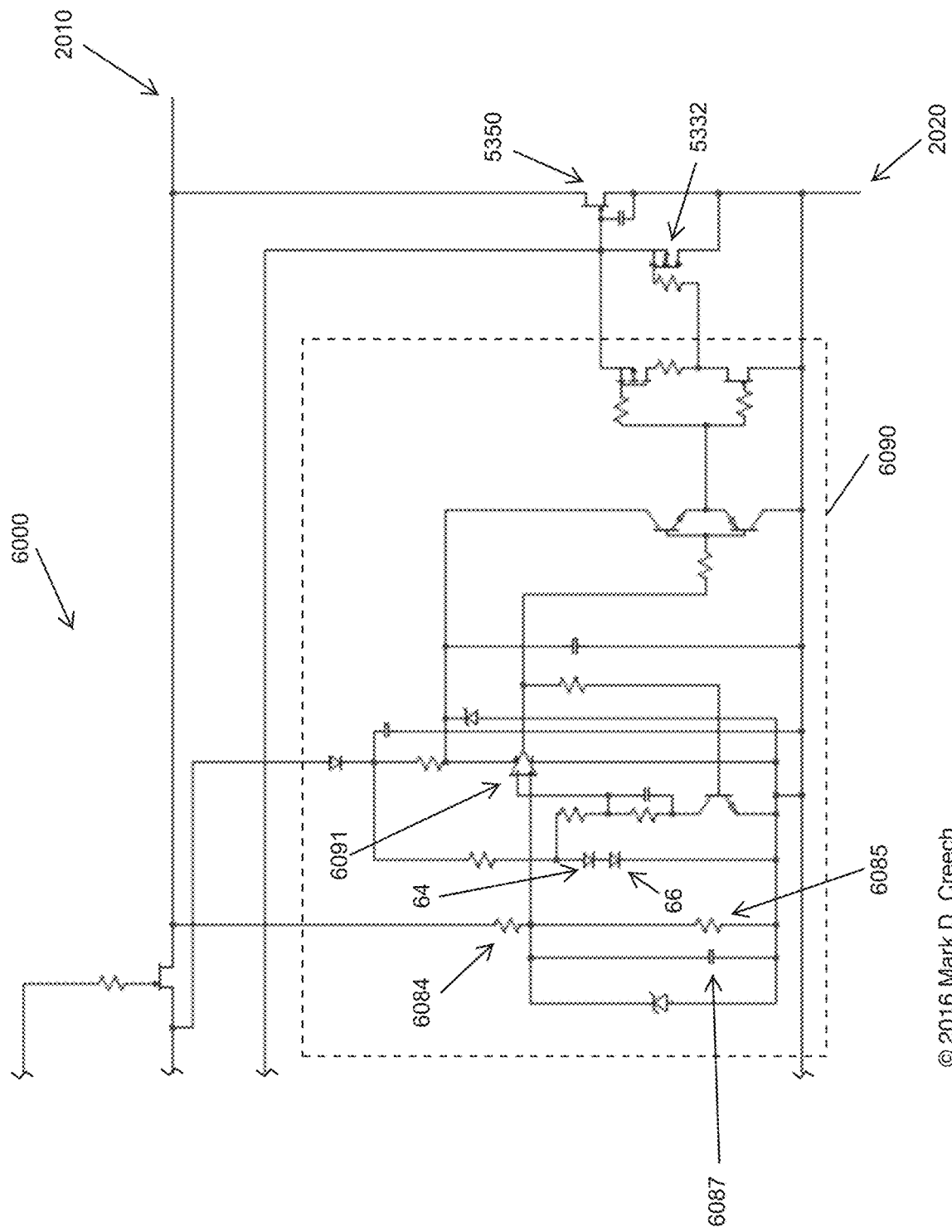

FIG. 60 provides a wiring diagram for an additional embodiment, device 6000, configured to reset into a current limiting mode from a blocking depletion mode as an overcurrent condition subsides. FIG. 75 shows section A of device 6000 from FIG. 60; FIG. 76 shows section B. Device 6000 is similar to device 5300, but adds limiting reset circuitry 6090, and is configured to block current as well as limit current. Here, limiting transistor 5332 is configured to allow first transistor 5350 to enter blocking depletion mode, and assists limiting reset circuitry 6090 in transitioning device 6000 into current limiting mode. Comparator 6091 together with resistors such as resistors 6084, 6085 configured as voltage dividers determine the voltages at which transitions between various modes occur. Diodes 64, 66 set a reference voltage at the inverting input of comparator 6091. When the difference between the non-inverting ("+") and inverting ("−") inputs of the comparator 6091 become great enough, the output of the comparator goes high. The "high" output of the comparator 6091 corresponds to the blocking depletion mode. Additionally, capacitors such as capacitor 6087 and resistors such as resistors 6084, 6085 measure the durations of voltages at certain levels, and delay the transitions from one mode to another. For example, capacitor 6087 and resistor 6084 delay entering blocking depletion mode. Resistor 6085 helps delay the exit out of blocking depletion mode and reentry back into current limiting mode by slowing the discharge of capacitor 6087. Accordingly, device 6000 can both limit and block current during various overcurrent conditions, and resets from blocking depletion mode into current limiting mode. As in many embodiments disclosed herein, various components serve more than one function. Limiting reset circuitry 6090, for example, also participates in entering device 6000 into blocking depletion mode.

Figure 61:
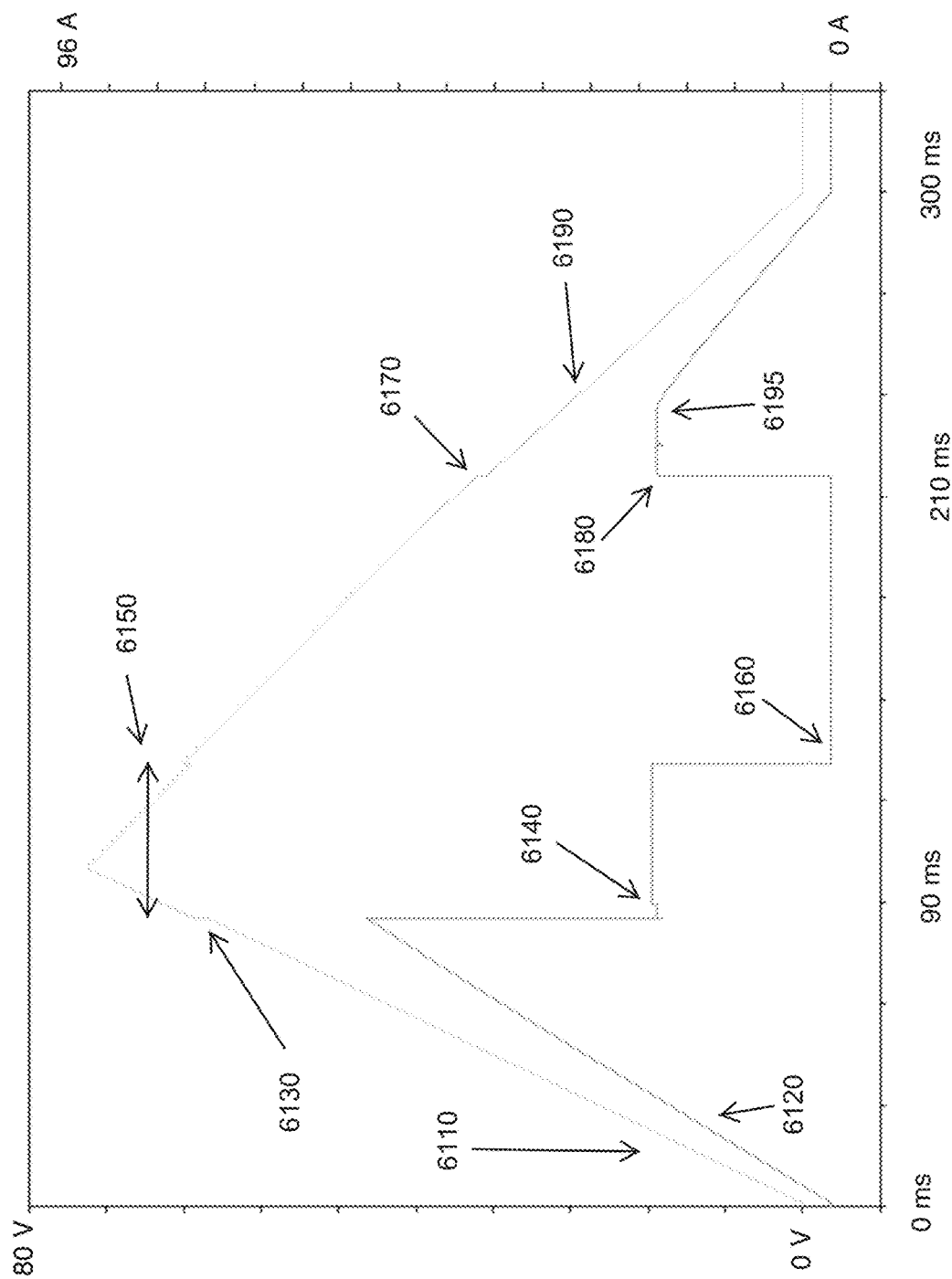
FIG. 61 illustrates current limiting, current blocking, and resetting into current limiting behavior of device 6000 during a simulated overcurrent condition.

FIG. 61 illustrates current limiting, current blocking, and resetting into current limiting behavior of device 6000 during a simulated overcurrent condition. Voltage 6110 climbs to an overcurrent condition 6130. Device 6000 passes current 6120 in full conduction mode, and enters current limiting mode and limits current 6140. Because the overcurrent condition presents a voltage higher than a predetermined level, and persists for longer than a predetermined time 6150, device 6000 enters blocking mode 6160 and no current passes. Since the current is roughly constant while in current limiting mode, this operation sometimes can be described in terms of the power dissipated so that when the power dissipated (I*V) surpasses a preselected level for a time, device 6000 enters blocking depletion mode. This approach provides a method of measuring, or approximating, the dissipated power and can be useful as such. When the voltage reaches and maintains a safe voltage 6170 for a time, device 6000 resets to limit current 6180. Still in current limiting mode, device 6000 passes current 6195 commensurate with lower voltage 6190. Note that device 6000 is not reset into full conduction mode.

Figure 62:
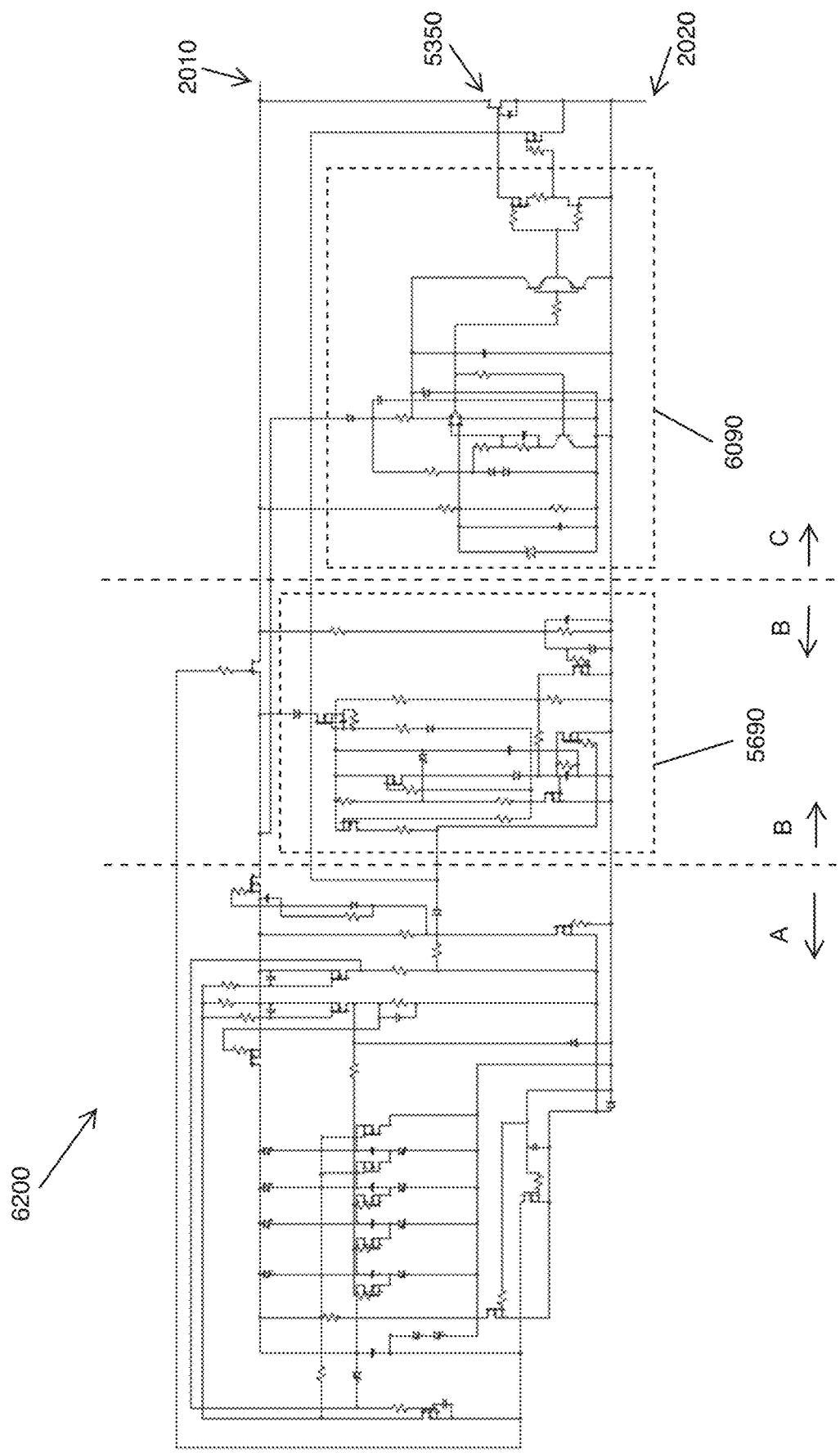
FIGS. 62 and 77-79 provide wiring diagrams for yet an additional embodiment, device 6200, which can be configured to limit current, block current, reset into full conduction mode from blocking depletion mode, or reset into current limiting mode from blocking depletion mode, as desired.
Figure 77:
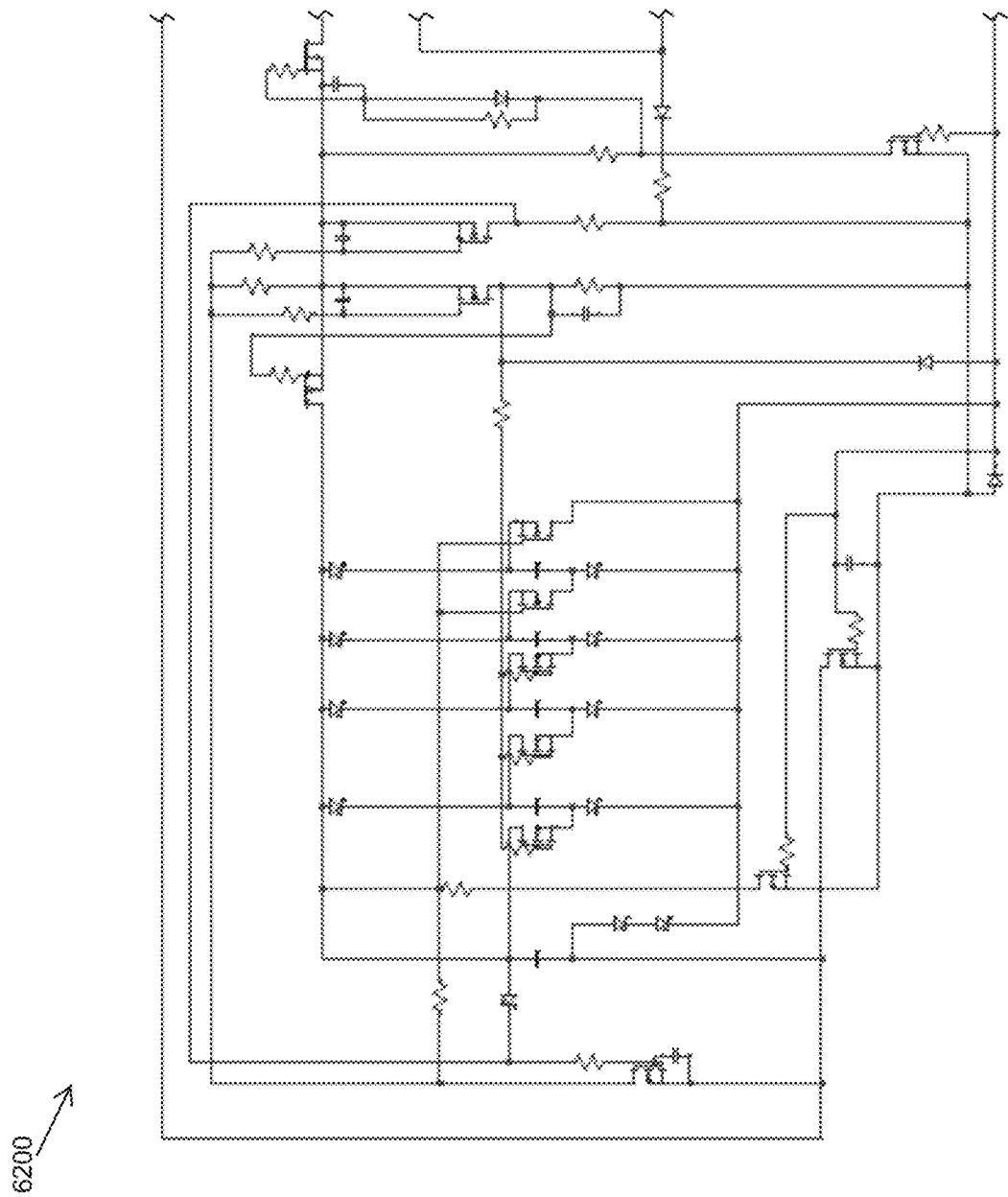
Figure 78:
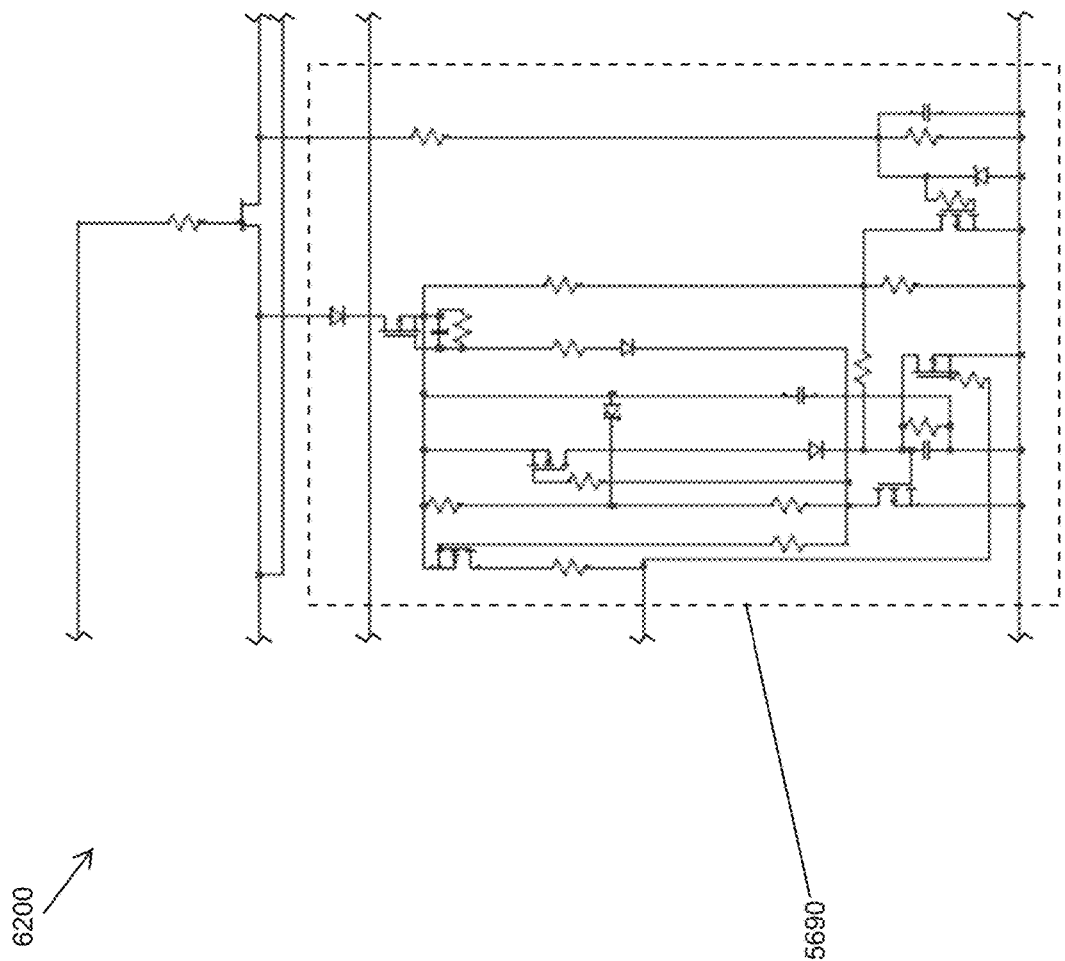
Figure 79:
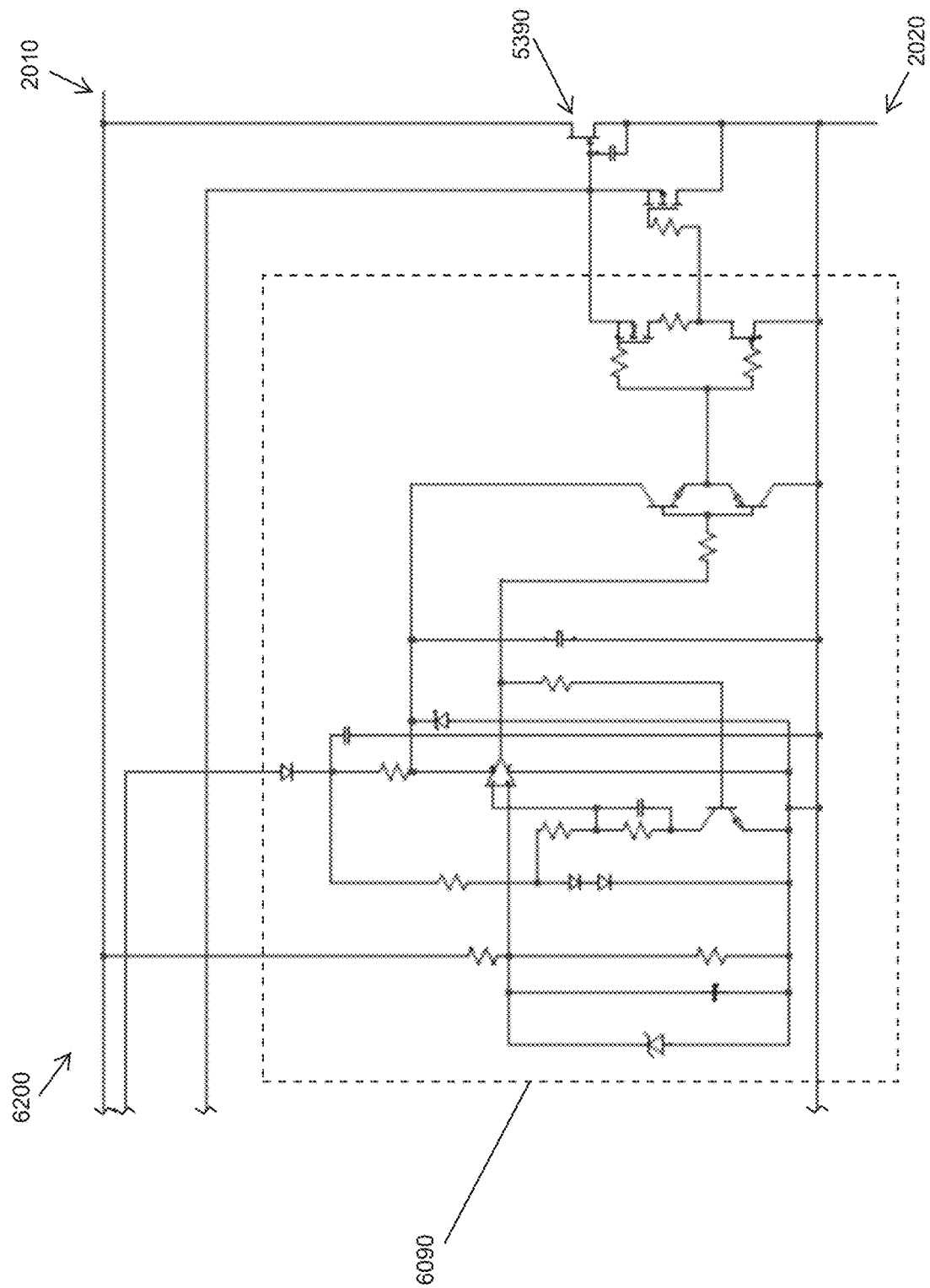

FIG. 62 provides a wiring diagram for yet an additional embodiment, device 6200, which can be configured to limit current, block current, reset into full conduction mode from blocking depletion mode, or reset into current limiting mode from blocking depletion mode, as desired. FIG. 77 shows section A of device 6200 from FIG. 62; FIG. 78 shows section B; and FIG. 79 shows section C. Device 6200 includes conduction reset circuitry 5690 and limiting reset circuitry 6090. Accordingly, device 6200 has similarities with device 5600 and device 6000. Device 6200 can reset into current limiting mode from blocking depletion mode using limiting reset circuitry 6090, and can reset into full conduction using conduction reset circuitry 5690.

Figure 63:
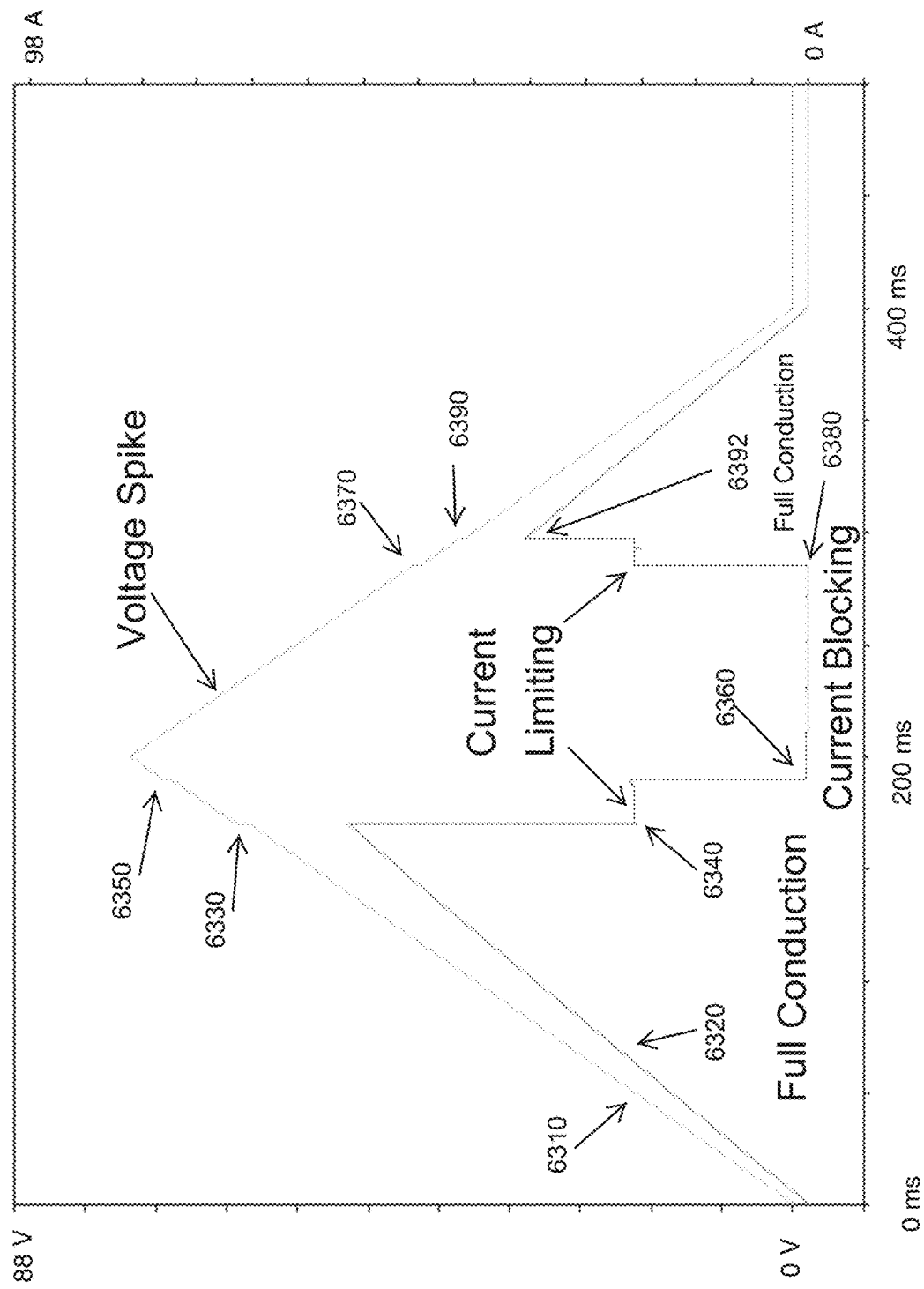
FIG. 63 illustrates current limiting, current blocking, and resetting behavior of device 6200 during a simulated overcurrent condition.

FIG. 63 illustrates current limiting, current blocking, and resetting behavior of device 6200 during a simulated overcurrent condition. Employing the same test configuration as for FIG. 54, device 6200 was subjected to voltage 6310, and the current 6320 that would pass through device 6200 was recorded. When the voltage reached an unsafe voltage 6330 representing a slight overcurrent condition, device 6200 went into current limiting mode passing limited current 6340. When the voltage increased further to voltage 6350, device 6200 entered blocking depletion mode passing no current 6360. As the voltage returned to a safer voltage 6370 representing a less severe or slight overcurrent condition, device 6200 reset into current limiting mode from blocked current 6380. As the voltage fell to safe voltage 6390, device 6200 reset into full conduction mode passing current 6392 corresponding to the voltage across the circuit. Accordingly, some embodiments of the present invention are configured to pass current during a normal current condition, limit current during a slight overcurrent condition, block current during a severe overcurrent condition, reset to limit current following a severe overcurrent condition, and reset to pass current during a normal current condition following a slight overcurrent condition.

Figure 64:
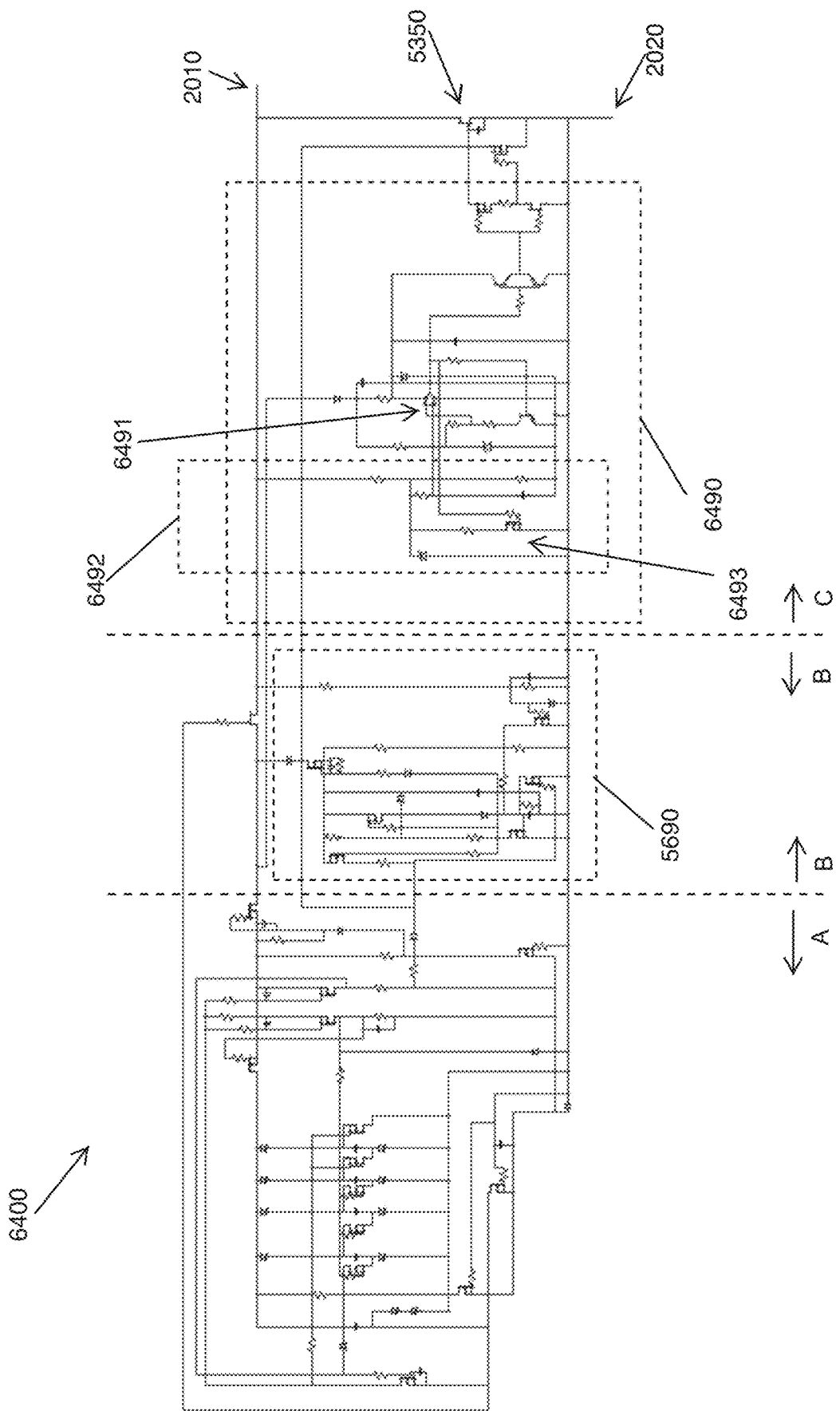
FIGS. 64 and 80-82 provide wiring diagrams for another embodiment, device 6400, configured to reset to limited current mode even when the voltage across the device is greater than the voltage that triggered the limiting and blocking modes.
Figure 80:
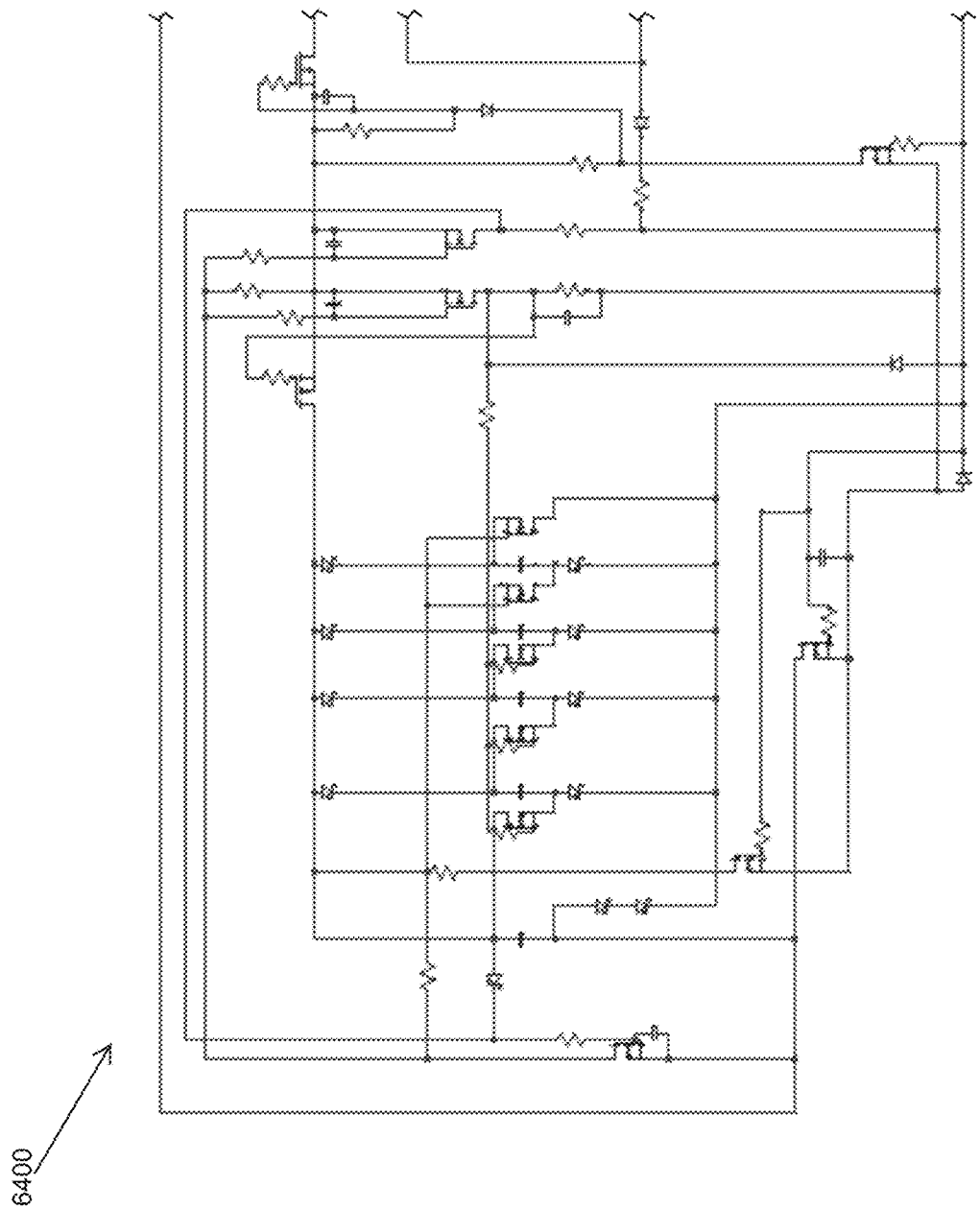
Figure 81:
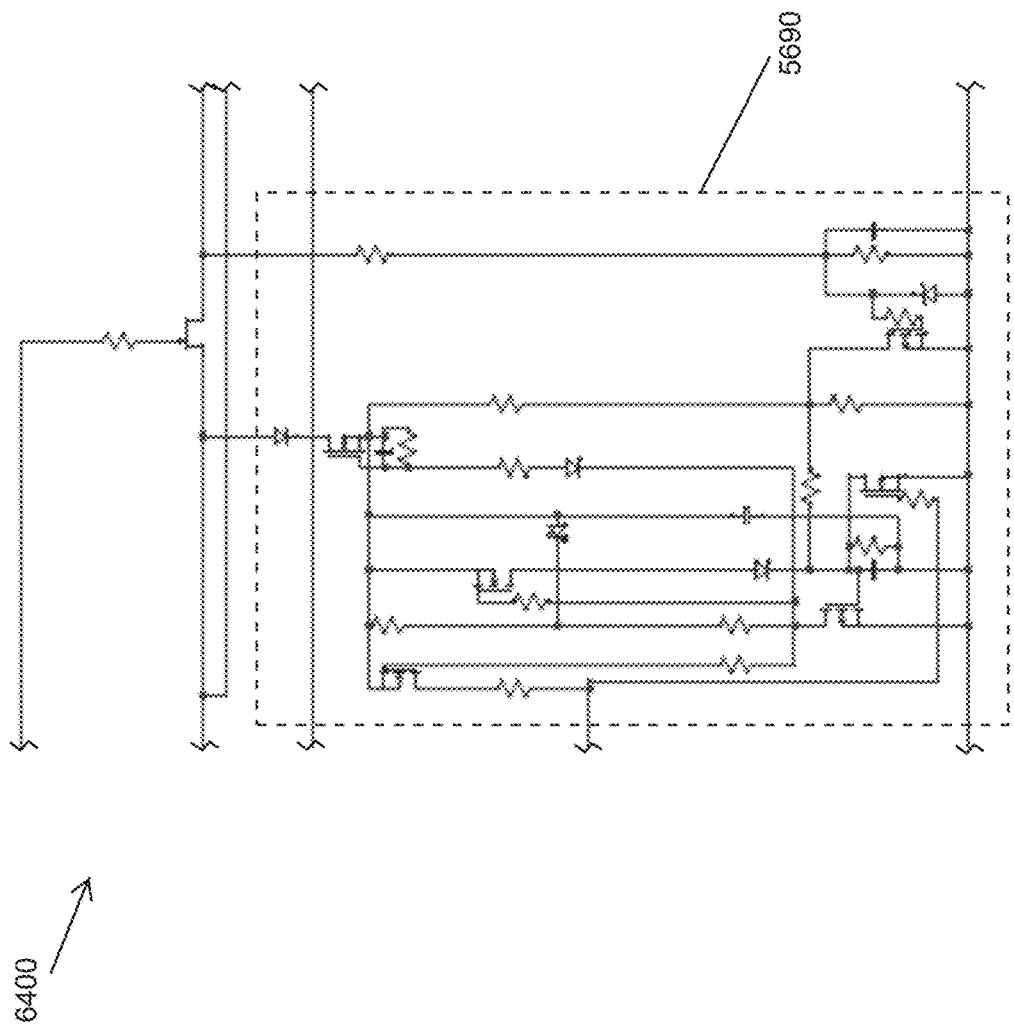
Figure 82:
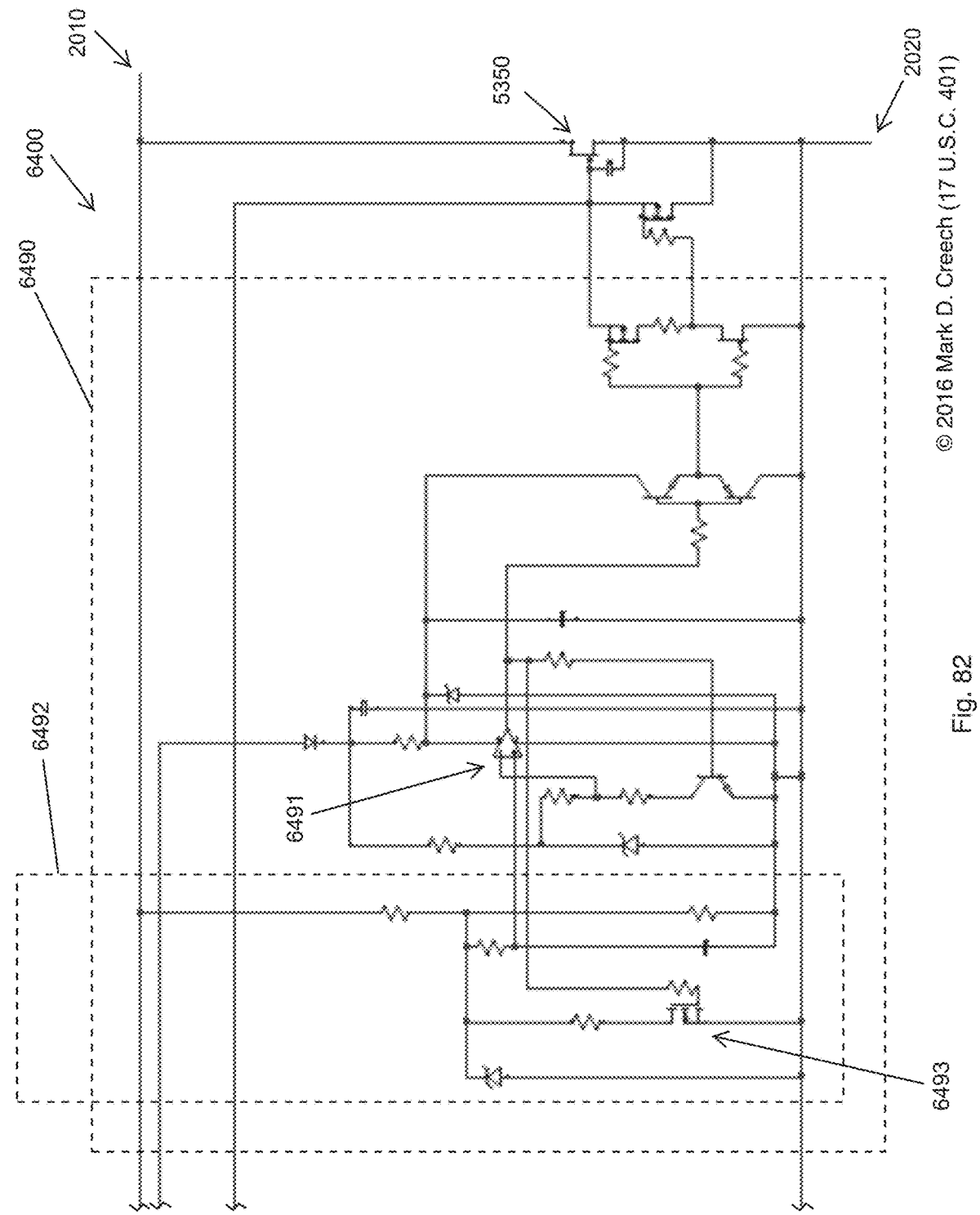

FIG. 64 provides a wiring diagram for another embodiment, device 6400, configured to reset to limited current mode even when the voltage across the device is greater than the voltage that triggered the limiting and blocking modes. FIG. 80 shows section A of device 6400 from FIG. 64; FIG. 81 shows section B; and FIG. 82 shows section C. One difficulty that arises when a device such as certain embodiments of the present invention block current due to an overcurrent condition is that the voltage across the device increases during blocking depletion mode. That is simply the result of Ohm's law: in full conduction mode, the device should have a low resistance, and experience a small voltage drop across it; however, in blocking depletion mode or even current limiting mode, a device will have a higher resistance, and therefore see a larger voltage drop across it. It could happen, therefore, that a device will have to respond to an overcurrent condition when the device experiences a smaller voltage drop than when the device ought to reset. The voltage at which the device begins limiting or blocking could be, in some embodiments, lower than the voltage at which the device resets. One way to make this possible, shown in device 6400, employs timer reset circuitry 6492 in combination with negative feedback to the non-inverting input of comparator 6491 (the "+" input of the comparator 6491) within limiting reset circuitry 6490. When the comparator output goes high, MOSFET 6493 turns on and effectively lowers the resistance seen between the non-inverting input of the comparator and its negative supply thereby requiring a higher voltage in order for the comparator 6491 to maintain a "high" output. The "high" output of the comparator 6491 corresponds to the blocking depletion mode. Accordingly, limiting reset circuitry 6490 also participates in entering blocking depletion mode. Also used in device 6400 is conduction reset circuitry 5690. Thus, device 6400 can reset from blocking depletion mode into current limiting mode, and from current limiting mode into full conduction mode. The conditions at which those resets occur are independently chosen from the conditions that trigger the limiting and blocking modes, and may in some ways be more severe.

Figure 65:
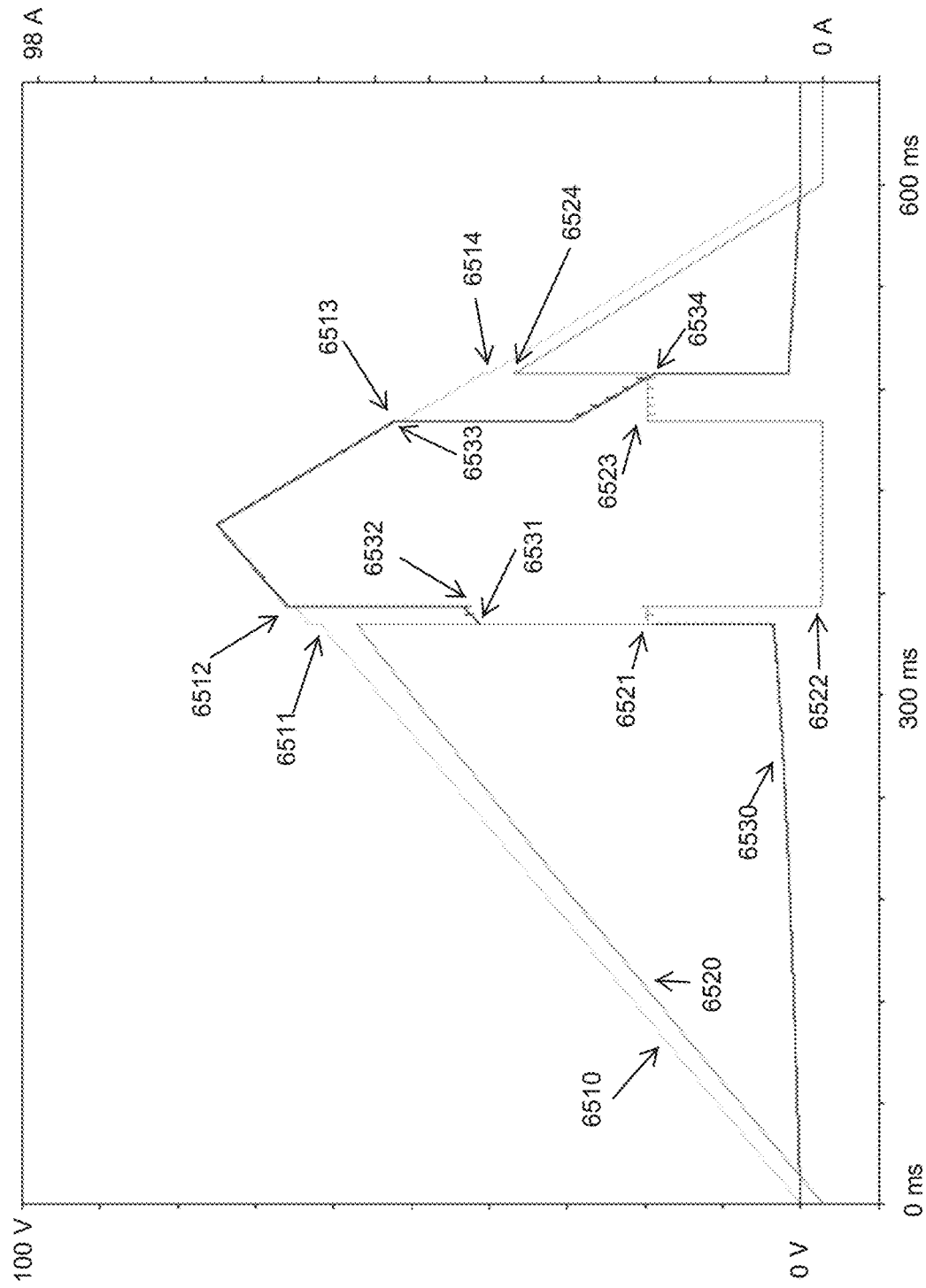
FIG. 65 illustrates current limiting, current blocking, and resetting behavior of device 6400 during a simulated overcurrent condition.

FIG. 65 illustrates current limiting, current blocking, and resetting behavior of device 6400 during a simulated overcurrent condition. Employing the same configuration as for FIG. 54, a voltage 6510 is applied to device 6400 and the current 6520 passing through device 6400 is recorded. Also recorded is the voltage drop 6530 from the drain to the source of first transistor 5350 of device 6400, $V_{DS}$. Under normal current conditions, the current 6520 increases with voltage 6510, and $V_{DS}$ 6530 is near zero. As an overcurrent condition develops due to the voltage 6511 reaching an unsafe level, device 6400 enters current limiting mode, as shown by the limited current 6521. Device 6400 is also configured to respond to unsafe current levels. This means, for example, that both an overvoltage or short circuit in the protected circuit might cause limiting or blocking. $V_{DS}$ jumps from near 0 to voltage 6531, which is about 40 V. The device 6400 sees an increasing voltage 6512, which causes device 6400 to enter blocking depletion mode and current 6522 is nearly 0 A. $V_{DS}$ jumps from voltage 6532 to approximately the voltage 6512 across the entire circuit, around 65 V. When the overcurrent condition begins subsiding, as indicated by voltage 6513 (which is higher than the voltage that caused the device to enter into blocking mode), device 6400 resets from blocking depletion mode to current limiting mode, and passes limited current 6523. $V_{DS}$ drops from voltage 6533, which is approximately 50 V. As the voltage 6514 drops further, device 6400 resets to full conduction mode, passing current 6524, and $V_{DS}$ drops from voltage 6534 to near 0 V. Thus, device 6400 enters blocking depletion mode when $V_{DS}$ is around 40 V, and resets from blocking depletion mode when $V_{DS}$ is around 50 V.

Figure 66:
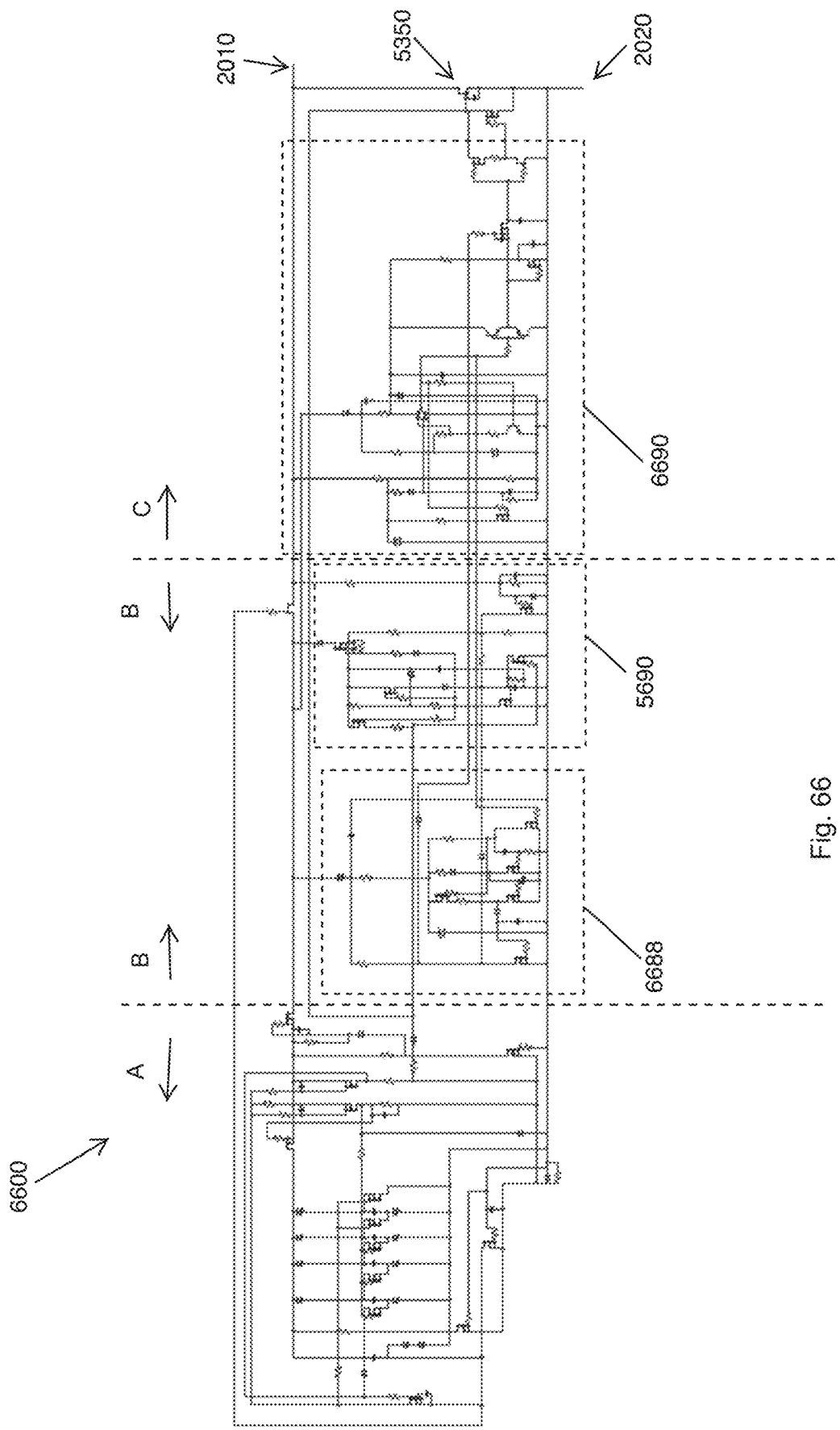
FIGS. 66 and 83-85 provide wiring diagrams for a further embodiment, device 6600, that includes retry and latch circuitry 6688.
Figure 83:
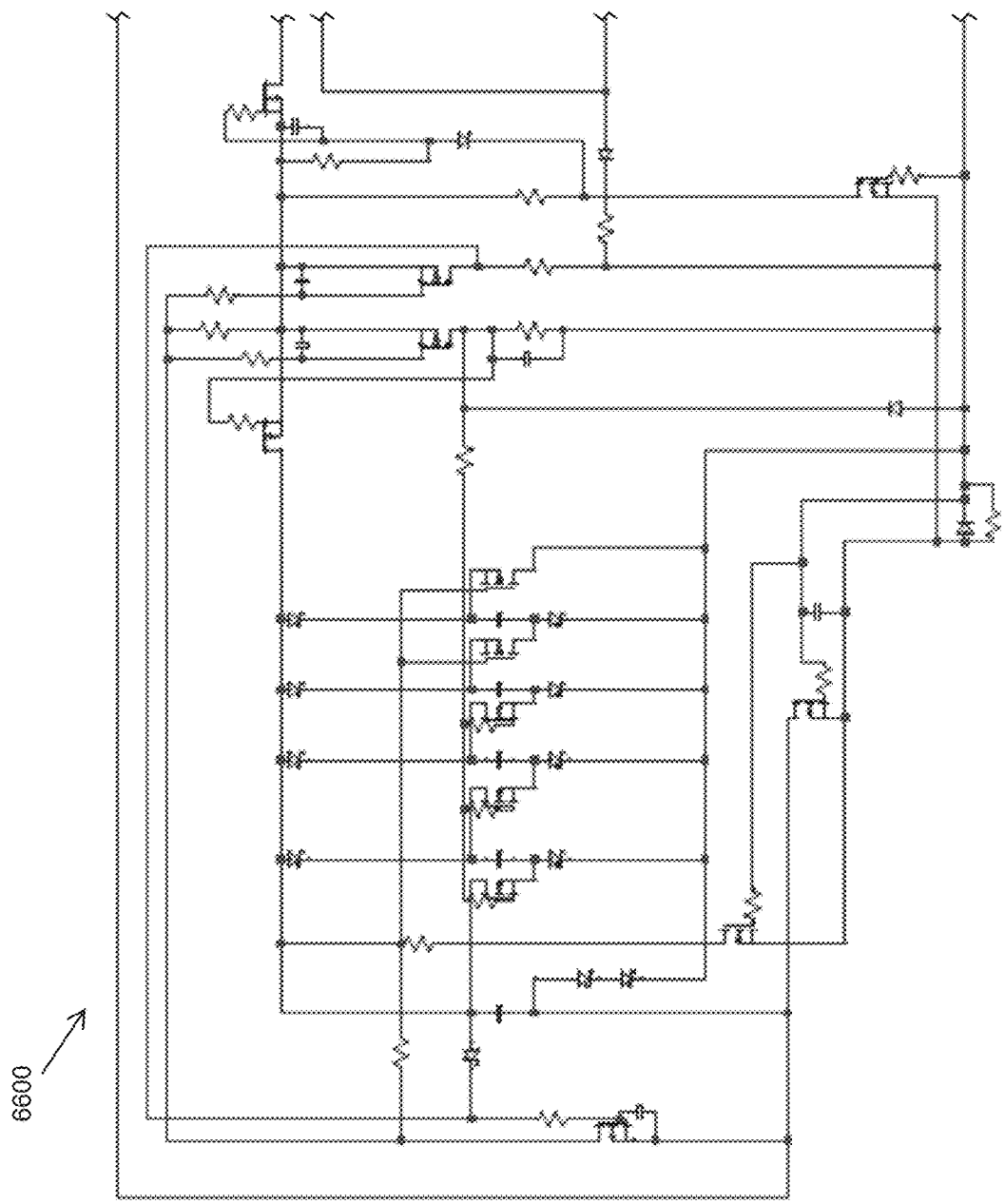
Figure 84:
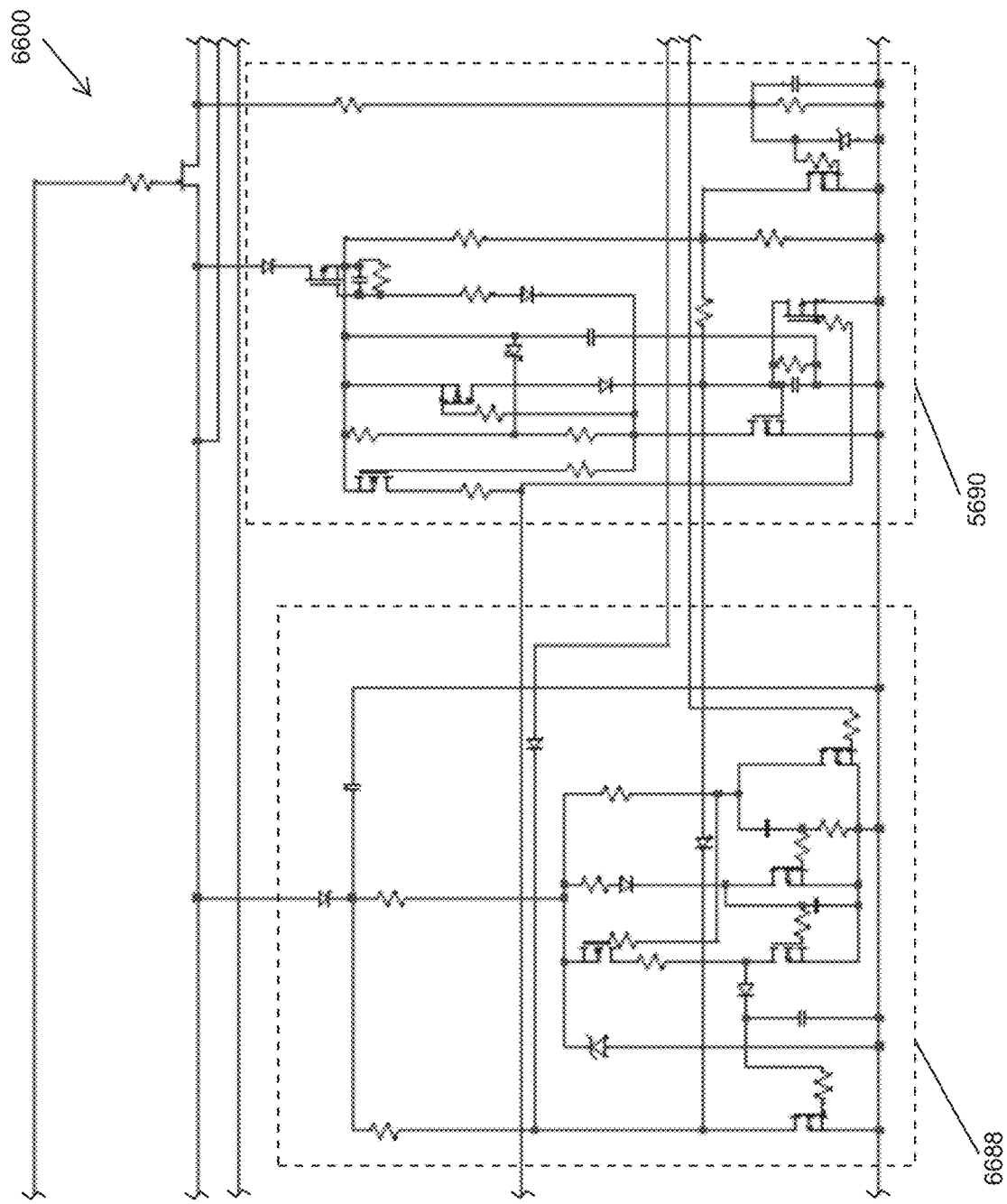
Figure 85:
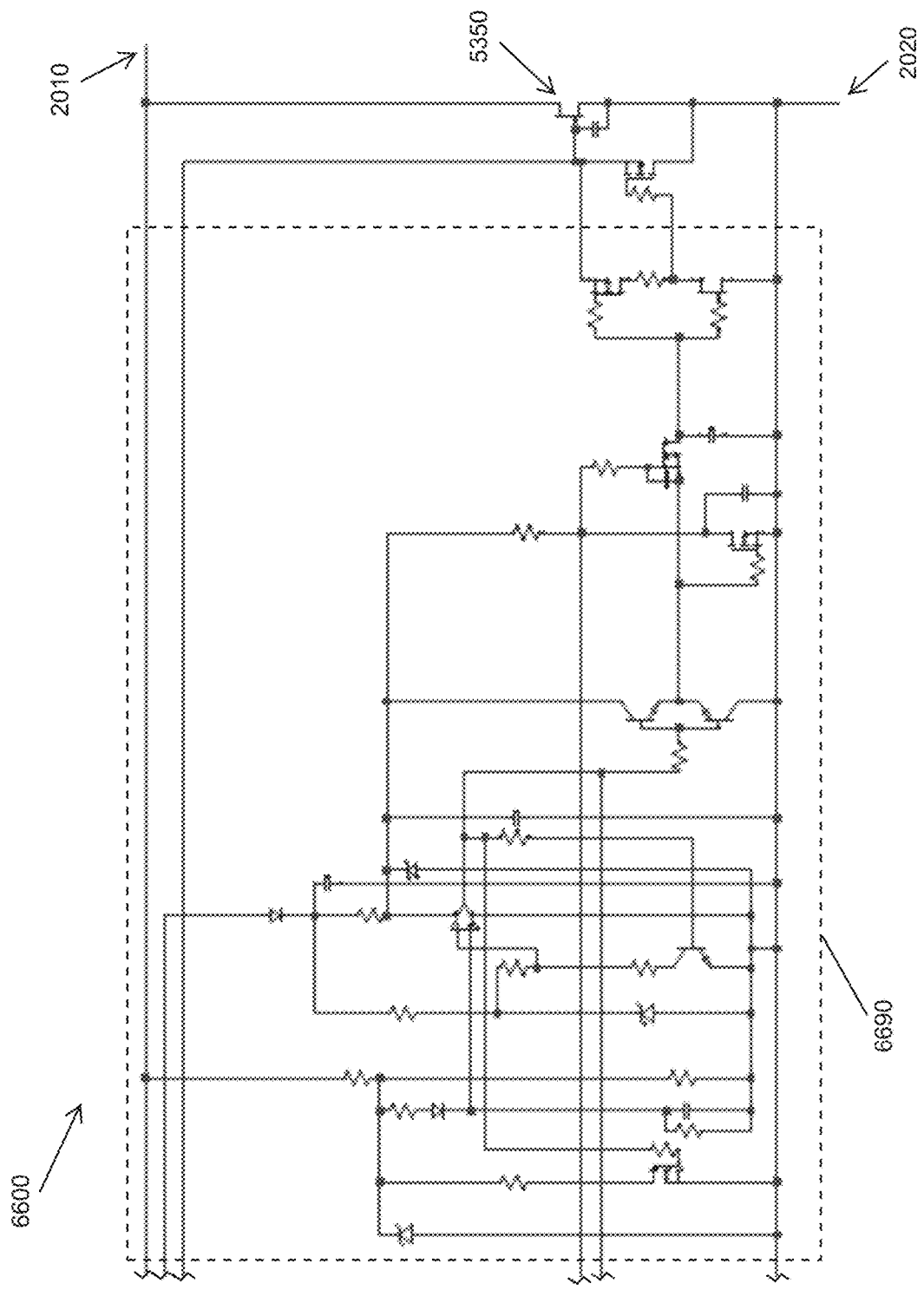

FIG. 66 provides a wiring diagram for a further embodiment, device 6600, that includes retry and latch circuitry 6688. FIG. 83 shows section A of device 6600 from FIG. 66; FIG. 84 shows section B; and FIG. 85 shows section C. Device 6600 is similar to device 5600, but retry and latch circuitry 6688 allows device 6600 to count the number of resets out of blocking mode occurring within a certain time interval, and if that number exceeds a preset limit, device 6600 latches into blocking depletion mode. For a number of resets from blocking mode are fewer than that preset limit, limiting reset circuitry 6690 resets device 6600 from blocking depletion mode to current limiting mode. And when the number of resets are fewer than that preset limit, conduction reset circuitry 5690 operates to return device 6600 to full conduction mode.

Figure 67:
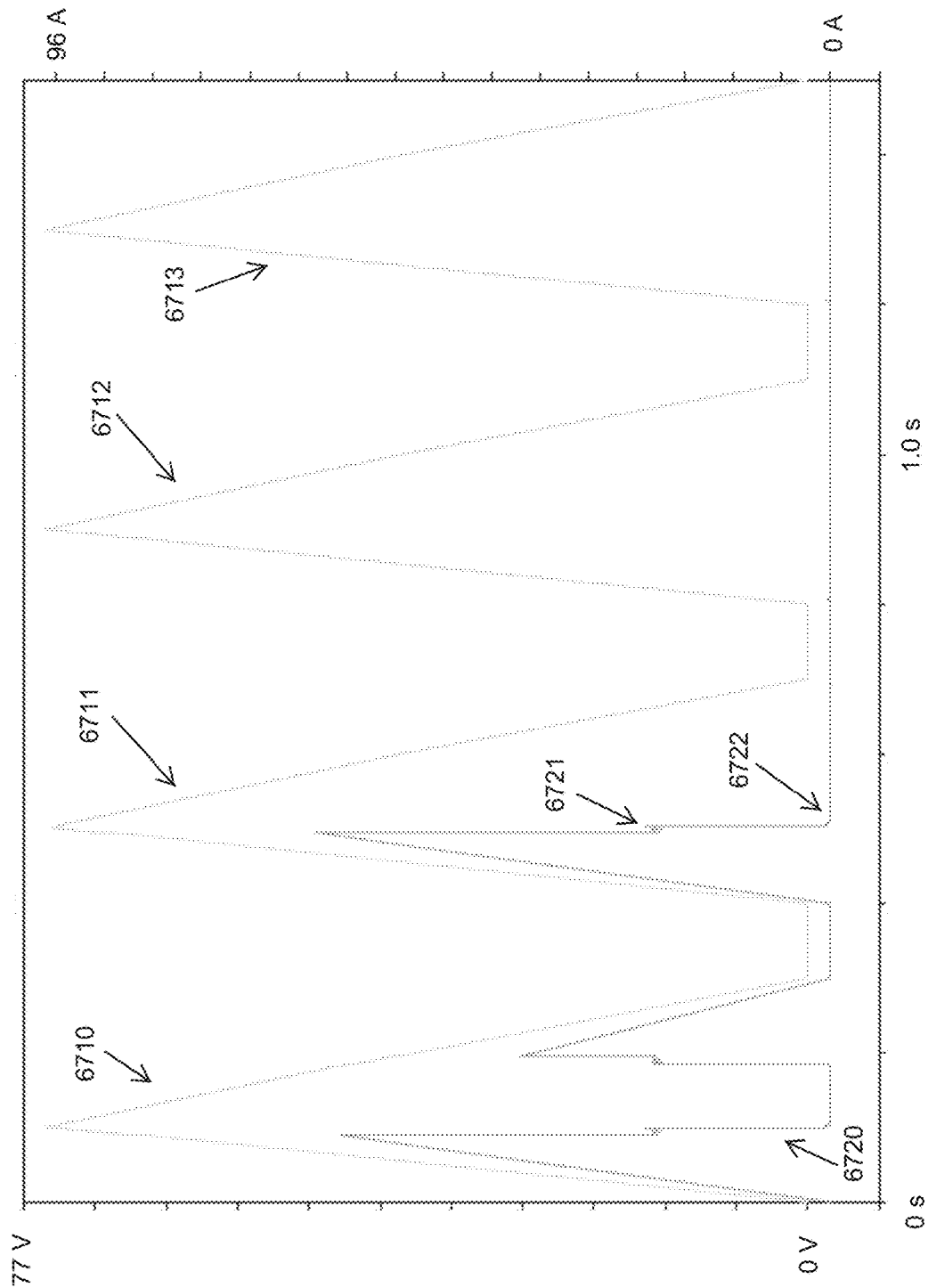
FIG. 67 illustrates current limiting, current blocking, and resetting behavior of device 6600 subjected to a series of simulated overcurrent conditions, which causes device 6600 to latch into blocking depletion mode.

FIG. 67 illustrates current limiting, current blocking, and resetting behavior of device 6600 subjected to a series of simulated overcurrent conditions, which causes device 6600 to latch into blocking depletion mode. Using the same test configuration as that for FIG. 65, four overcurrent events 6710, 6711, 6712, and 6713 were presented to device 6600. As the voltage increased in the first overcurrent event 6710, device 6600 transitions from full conduction mode, to current limiting mode, to blocking depletion mode. As the overcurrent event 6710 subsided, device 6600 reset to current limiting mode and then to full conduction mode. Upon reset out of blocking depletion mode to current limiting mode, the reset count increased by one, in this case, to "one." When the second overcurrent event 6711 began, device 6600 transitioned from full conduction mode to current limiting mode 6721. As the overcurrent condition became more severe, device 6600 transitioned to blocking depletion mode 6722. The preset limit here was two, so that when device 6600 would have reset out of blocking depletion mode 6722 the second time, the device 6600 latched into blocking depletion mode without implementing the reset. This is achieved by implementing a slight delay between the counting and the reset, allowing the count to occur first, and then latching before the reset has time to occur. Even though the second overcurrent event 6711 subsided, device 6600 did not reset out of blocking depletion mode, and remained in blocking depletion mode during overcurrent events 6712 and 6713. Such a device is useful to protect a circuit from a limited number of overcurrent events, limiting current or blocking current only as needed 6720. However, if the number of overcurrent events becomes unacceptably high, device 6600 will protect the circuit by latching "permanently" into blocking depletion mode.

Figure 86:
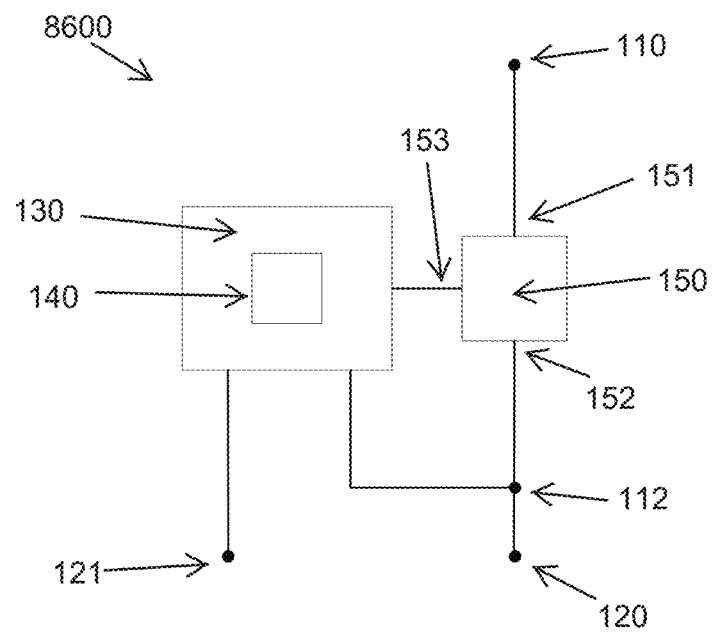
FIG. 86 conceptually depicts another embodiment, namely device 8600 similar to device 100 further comprising third terminal 121.

FIG. 86 conceptually depicts another embodiment, namely device 8600 similar to device 100, further comprising third terminal 121. Device 8600 comprises first terminal 110 connecting to pin 151 of first transistor 150, which connects via pin 152 to second terminal through connection 112. Gate 153 connects driver circuitry 130 having voltage converter circuitry 140. Here, voltage converter circuitry 140 is configured to receive an input voltage such as the voltage between second terminal 120 and third terminal 121, convert that input voltage to a converted voltage or a releasably-stored voltage, and allow driver circuitry 130 to apply it as a gate voltage at first gate 153. During overcurrent conditions, driver circuitry 130 is configured to apply a gate voltage that drives first transistor 150 into current limiting mode or blocking depletion mode. During normal current conditions, or safe current conditions following an overcurrent condition, driver circuitry 130 is configured to drive first transistor 150 out of blocking depletion mode, out of current limiting mode, and optionally into enhancement mode.

The first transistor 150 can be any suitable transistor. For example, first transistor 150 can be an n-channel depletion mode transistor, or any negative gate threshold characteristic, normally-on transistor. That would make pin 151 the first drain and pin 152 the first source of first transistor 150. In an alternative example, first transistor 150 can be a p-channel, depletion mode transistor, or any positive gate threshold characteristic, normally-on transistor. Pin 151 would be the first source, and pin 152 would be the first drain of first transistor 150. Any suitable driver circuitry 130 and voltage converter circuitry 140, such as those described and exemplified herein, can be used.

First terminal 110 and second terminal 120 define the primary current path through device 8600. Third terminal 121 can be used to sense a current or voltage that is not in the primary current path, yet provides important information about the current and voltage being experienced by a protect circuit or load (not shown) connected to second terminal 120. Optionally, a voltage between second terminal 120 and third terminal 121 can be autocatalytically multiplied as disclosed herein.

Figure 87:
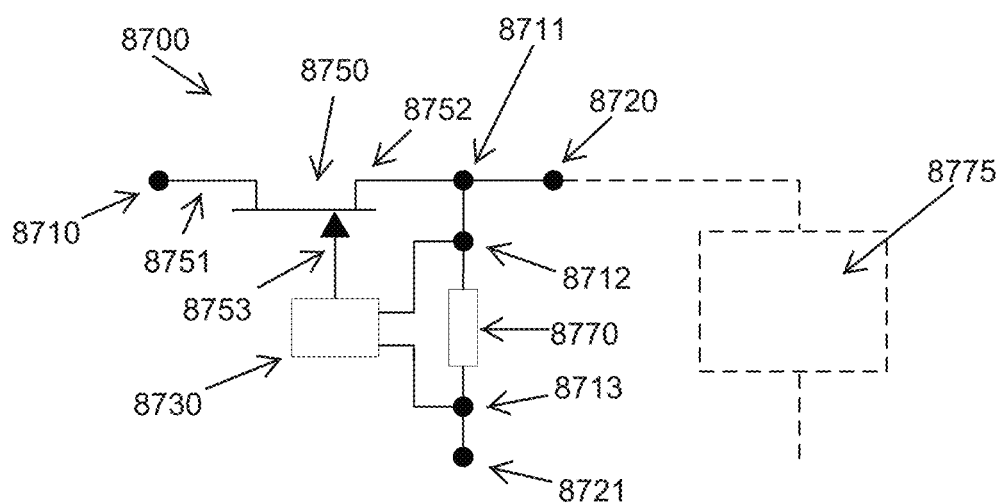
FIG. 87 schematically depicts a device 8700 having first terminal 8710, second terminal 8720, and third terminal 8721 protecting load 8775.

FIG. 87 schematically depicts a device 8700 having first terminal 8710, second terminal 8720, and third terminal 8721 protecting load 8775. First terminal 8710 is connected to the first drain 8751 of first transistor 8750 having a first gate 8753 and a first source 8752. First transistor 8750 is an n-channel, normally-on, depletion mode transistor. First source 8752 connects to second terminal 8720 via connection 8711. Driver circuitry 8730 is in electrical communication with second terminal 8720 via connections 8712 and 8711, and in electrical communication with third terminal 8721 via connection 8713. Those connections allow driver circuitry 8730 to monitor a voltage drop across resistor 8770, while device 8700 is protecting load 8775. Resistor 8770 is positioned between second terminal 8720 and third terminal 8721 to allow bifurcated monitoring of the primary current path. When first terminal 8710 and second terminal 8720 are placed in series with load 8775, which is then powered positively at first terminal 8710 and connected to ground below load 8775, a primary current path is provided through first transistor 8750 between first terminal 8710 and second terminal 8720. Third terminal 8721 is in bifurcated electrical communication with second terminal 8720. Resistor 8770 can be any suitable resistor, such as, for example 1 mΩ, 10 mΩ, 100 mΩ, 1 Ω, 10 Ω, 100 Ω, 1000Ω, or 10,000Ω. Resistor 8770 can be replaced by any suitable component that provides information about the primary current path. The path from connection 8711 to third terminal 8721, which is not in the primary current path, can be said to be a bifurcated path, or in bifurcated electrical communication with the "primary current path."

This bifurcated path might be, for example, a normally non-conducting path as in the case of an overvoltage surge protective device such as a metal oxide varistor, a transient voltage suppression diode, a gas discharge tube, a thyristor, or combinations thereof. In one example, an n-channel, normally-on first transistor 150 can be used advantageously with an overvoltage surge protective device, attached in series from third terminal 8721. One or more advantages of such an arrangement may include an increased lifetime for the overvoltage surge protective device, reduced let-through voltages without the problem of deterioration of the overvoltage surge protective device, reduced let-through energy, and reduction or prevention of thermal runaway. In this example, the bifurcated current path from connection 8711 through resistor 8770 and third terminal 8721 through a overvoltage surge protective device (then to ground) runs parallel to the primary current path out of second terminal 8720 through load 8775 (to ground). During normal current conditions and in the absence of an overvoltage event, the bifurcated path passes little or no current and the first transistor 8750 allows current to flow to load 8775. When an overvoltage event begins, driver circuitry 8730 will detect the increased voltage drop across resistor 8770 and will cause first transistor 8750 to enter current limiting mode or blocking depletion mode. In so doing, the device 8700 protects both the load 8775 and the overvoltage surge protective device (not shown).

By employing the bifurcated path, certain complications may be avoided such as those caused by the on-resistance of the first transistor 8750. If latching behavior is desired, the voltage drop from the first drain 8751 to the first source 8752 (Vds) can be utilized after the initial trigger, as demonstrated in previous figures and text, to maintain the first transistor 8750 in current limiting mode or blocking depletion mode. It can be useful to switch to Vds after the initial trigger because the voltage drop across resistor 8770 may become too small to be useful. Autocatalytic voltage conversion, whether using the voltage across resistor 8770, Vds, or both, can be advantageous in some cases. For example, certain transient waveforms such as those induced by lightning, can behave erratically and within short time frames.

Further advantages to using a bifurcated path for monitoring the current and voltage conditions may include: lower power consumption by device 8700, because resistor 8770 does not contribute to the normal power losses of the circuit and does not cause a voltage drop at load 8775. Furthermore, because resistor 8770 is in a bifurcated path, the on-resistance of the first transistor 8750 may be selected to be arbitrarily small without compromising the performance of device 8700. Additionally, monitoring the current and voltage in a bifurcated path could reveal the location of the transient. For example, if the only trigger comes from the resistor 8770, then it can be known that the transient arises in the location of resistor 8770. Accordingly, in a more-complicated circuit employing one or more devices of the present invention that monitor a plurality of bifurcated paths, transients can be controlled with a minimum degree of disruption to the entire circuit. Yet another advantage that may be enjoyed in some cases is that resistor 8770 can have any desired resistance for a desired effect. For example, resistor 8770 can have a relatively small resistance, and therefore lower the voltage drops that cumulatively add to the let-through voltage. That reduces the likelihood of overvoltage damage to the first gate 8753 and also to load 8775 by enabling lower let-through voltage. If even lower let-through voltages are desired, multiplying the voltage across resistor 8770 in driver circuitry 8730 can assist.

Figure 88:
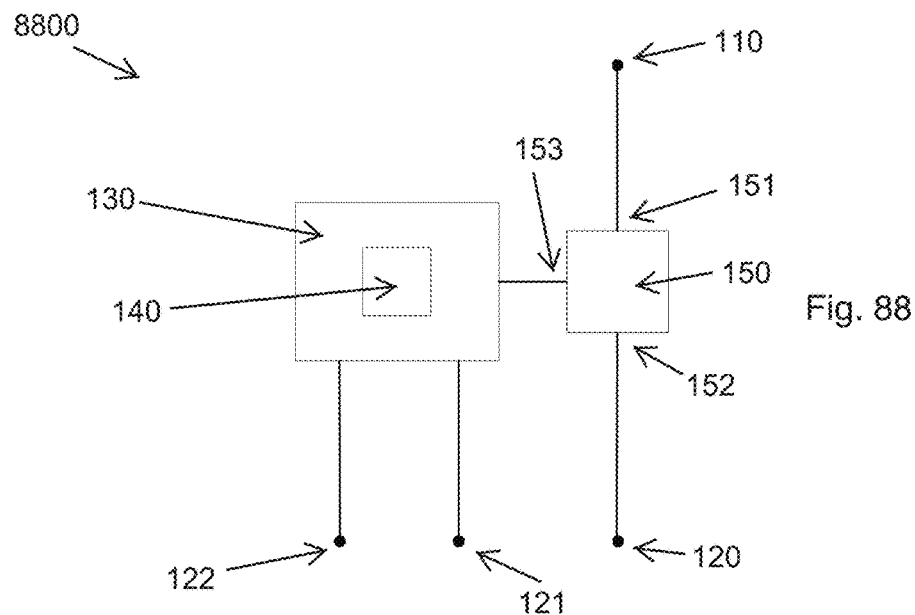
FIG. 88 conceptually depicts another embodiment, namely device 8800 similar to device 8600 further comprising fourth terminal 122.

FIG. 88 conceptually depicts another embodiment, namely device 8800 similar to device 8600 further comprising fourth terminal 122. Driver circuitry 130 in device 8800 does not connect to second terminal 120, but rather derives an input voltage from third terminal 121 and fourth terminal 122. It can be said that third terminal 121 and fourth terminal 122 are adapted to be placed in bifurcated electrical communication with the primary current path to monitor for overcurrent conditions. Here, voltage converter circuitry 140 is configured to receive an input voltage such as the voltage between third terminal 121 and fourth terminal 122, convert that input voltage to a converted voltage or a releasably-stored voltage, and allow the driver circuitry 130 to apply it as a gate voltage at first gate 153. During overcurrent conditions, as determined across third terminal 121 and fourth terminal 122, driver circuitry 130 is configured to apply a gate voltage that drives first transistor 150 into current limiting mode or blocking depletion mode. During normal current conditions, or safe current conditions following an overcurrent condition, as determined across third terminal 121 and fourth terminal 122 in this device 8800, driver circuitry 130 is configured to drive first transistor 150 out of blocking depletion mode, out of current limiting mode, and optionally into enhancement mode.

Significantly, third terminal 121 and fourth terminal 122 can be placed anywhere useful for detecting overcurrent conditions threatening the circuit to be protected. For example, rechargeable batteries such as lithium-ion batteries frequently employ circuitry known as battery management units or BMUs. Device 8800 can be deployed such that the electric current powering a circuit can be routed primarily through first terminal 110, first transistor 150, and second terminal 120, and then to the circuit powered by the battery and protected by device 8800. Third terminal 121 and fourth terminal 122 can be placed across a resistance inside the BMU to monitor the voltage coming off the battery, and thereby be placed in bifurcated electrical communication with the primary current path. Any sudden increase in the voltage across that resistance can be converted by the voltage converter circuitry 140, optionally autocatalytically, and applied by driver circuitry 130 at first gate 153 to drive first transistor 150 into current limiting mode, blocking depletion mode, or both sequentially, thereby protecting the circuit powered by the battery. This example can be illustrated further by reference to FIG. 89.

Figure 89:
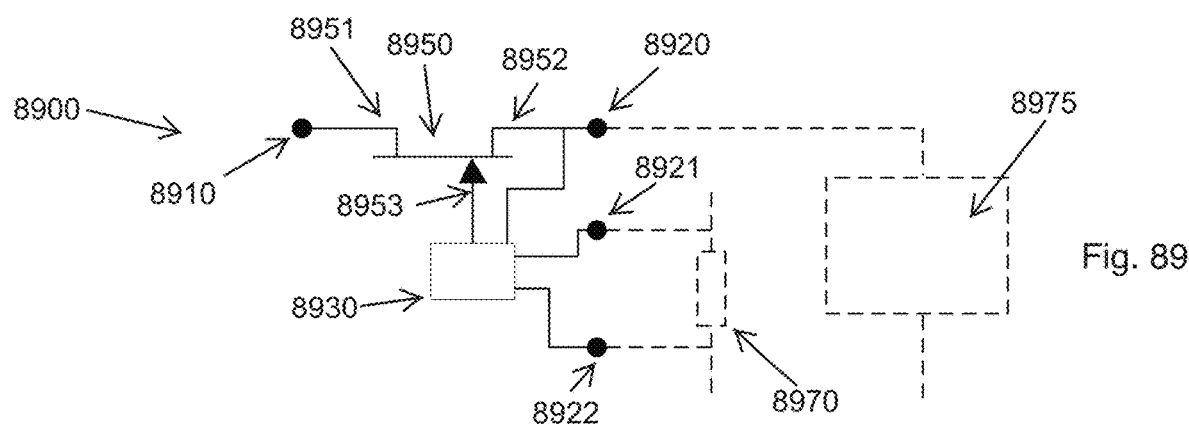
FIG. 89 schematically depicts a device 8900 having first terminal 8910, second terminal 8920, third terminal 8921, and fourth terminal 8922 protecting load 8975.

FIG. 89 schematically depicts a device 8900 having first terminal 8910, second terminal 8920, third terminal 8921, and fourth terminal 8922 protecting load 8975. First terminal 8910 connects to first drain 8951 of first transistor 8950 having first source 8952 connecting to second terminal 8920, which defines the primary current path through device 8900. First transistor 8950 is an n-channel, normally-on, depletion mode device. Driver circuitry 8930 connects to first source 8952 as shown, and also provides a gate voltage at first gate 8953. That gate voltage is derived from a voltage detected across third terminal 8921 and fourth terminal 8922, by measuring the voltage drop across resistor 8970. Second terminal 8920 continues the primary current path to load 8975. Resistor 8970 can be any useful resistance or voltage drop relevant to the protection of load 8975. When device 8900 receives a positive voltage at first terminal 8910 and load 8975 is connected to ground, third terminal 8921 and fourth terminal 8922 have been placed in bifurcated electrical communication with the primary current path. In the example set forth in the previous paragraph, resistor 8970 can represent a voltage drop somewhere within a BMU that would reveal the onset of an overcurrent condition such as an overvoltage spike from a rechargeable lithium-ion battery.

Figure 90:
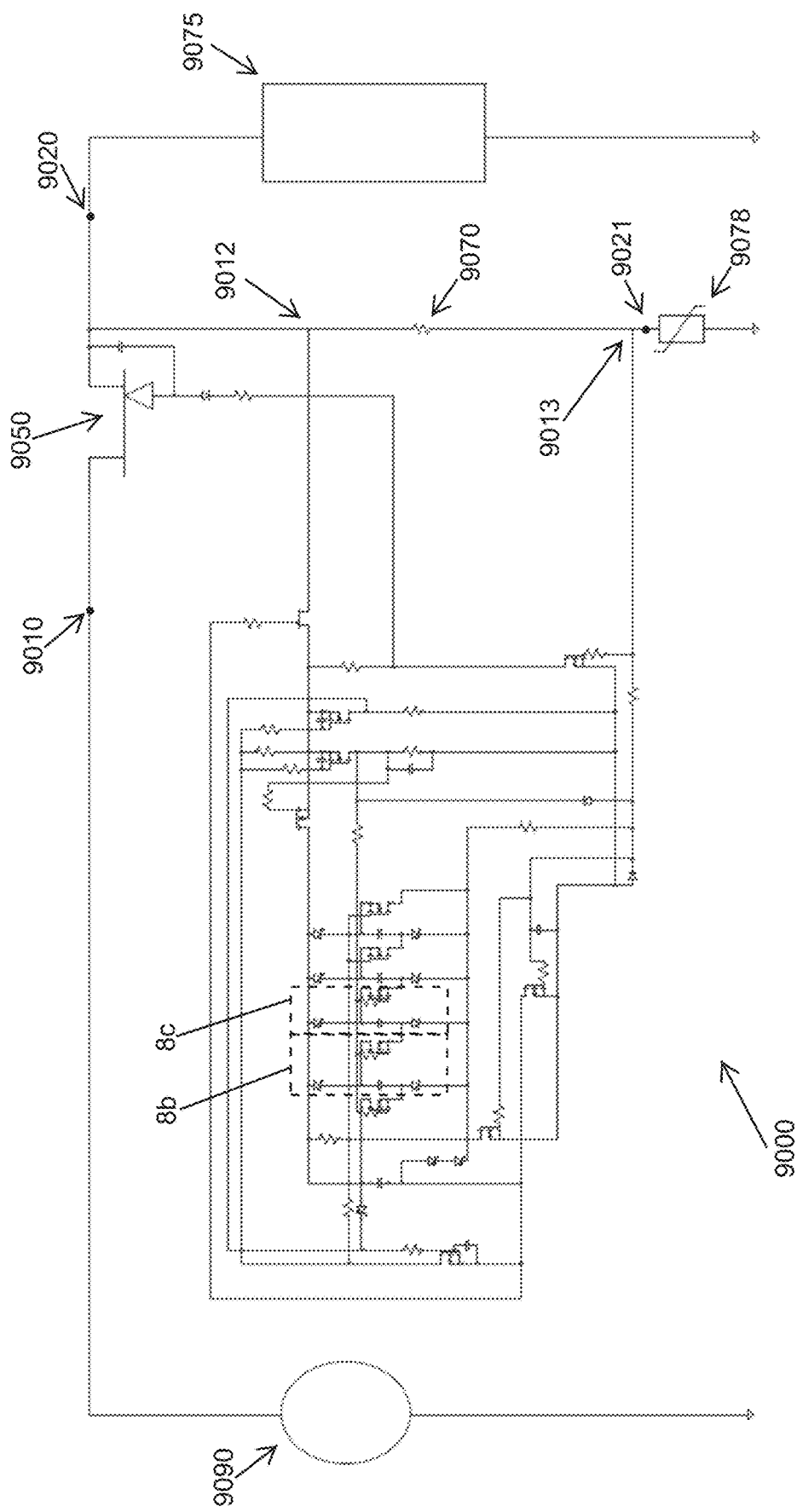
FIG. 90 provides a wiring diagram for yet another embodiment, device 9000 having first terminal 9010, second terminal 9020, and third terminal 9021 protecting load 9075.

FIG. 90 provides a wiring diagram for yet another embodiment, device 9000 having first terminal 9010, second terminal 9020, and third terminal 9021 protecting load 9075. In this wiring diagram, power supply 9090, load 9075, and metal oxide varistor 9078 are also shown. Building blocks 8*b*, 8*c*, analogous to building block 8 in FIG. 33, form part of a parallel to series switched capacitor network suitable for autocatalytically converting a voltage detected between second terminal 9020 and third terminal 9021, or more specifically between connections 9012, 9013 across resistor 9070. Resistor 9070 has been added for illustration purposes; any suitable component can appear between second terminal 9020 and third terminal 9021, in various embodiments. That voltage across resistor 9070 is autocatalytically converted and applied to drive first transistor 9050 into blocking depletion mode when necessary to protect load 9075. Metal oxide varistor 9078 is an overvoltage surge protective device that has a limited lifetime determined by the number of overvoltage events it faces. In some circumstances, sending first transistor 9050 into blocking depletion mode protects metal oxide varistor 9078 and load 9075, lengthening the service life of metal oxide varistor 9078.

Figure 91:
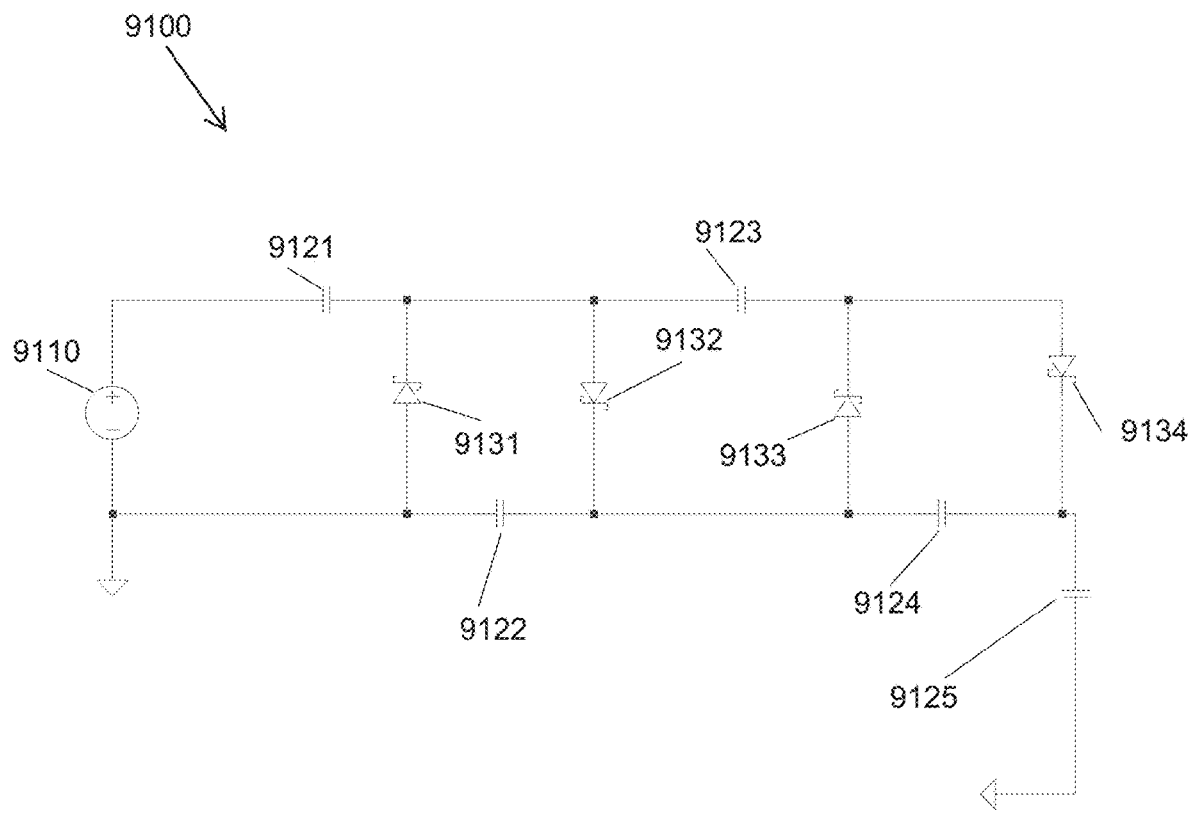
FIG. 91 provides a wiring diagram for an embodiment of a voltage converter circuitry comprising a switched capacitor network in the form of a Cockraft-Walton multiplier.

FIG. 91 provides a wiring diagram for an embodiment of a voltage converter circuitry comprising a switched capacitor network in the form of a Cockraft-Walton multiplier. Device 9100 is adapted to receive an oscillating input voltage from voltage source 9110. Input capacitors 9121, 9122, 9123, and 9124 are configured to be charged in stages as schottky diodes 9131, 9132, 9133, and 9134 switch on and off due to the relative voltages of those capacitors. Input capacitors 9121, 9122, 9123, 9124, and output capacitor 9125 can have any suitable capacitances. In some cases, input capacitors can have a combined input capacitance such that the ratio of combined input capacitance to output capacitance of capacitor 9125 is greater than 1. For example, input capacitor 9121 can have a capacitance of 100 nF; input capacitor 9122 can have a capacitance of 50 nF; input capacitor 9123 can have a capacitance of 25 nF; and input capacitor 9124 can have a capacitance of 15 nF. Output capacitor 9125 can have, for example, a capacitance of 10 nF. In that example, device 9100 depicts a switched capacitor network configured to convert an input voltage from power source 9110 to a converted voltage available at output capacitor 9125, wherein the input voltage charges a plurality of input capacitors 9121, 9122, 9123, and 9124 having a combined input capacitance, and the converted voltage is adapted to charge an output capacitance 9125; wherein the ratio of the combined input capacitance to the output capacitance is greater than 1.

EMBODIMENTS

Embodiment 1. A device for protecting a circuit having a primary current path from a overcurrent condition, comprising:

a first terminal and a second terminal configured to route the primary current path through the device;
a first transistor comprising a first gate, a first drain, and a first source;
  wherein the first transistor is a depletion mode, normally-on transistor;
  wherein the first transistor is arranged in series in the primary current path between the first terminal and the second terminal;
a driver circuitry;
  the driver circuitry comprising a voltage converter circuitry adapted to receive an input voltage derived solely from a voltage between the first terminal and the second terminal, and convert the input voltage to a releasably-stored voltage,
  wherein the driver circuitry is configured to apply the releasably-stored voltage or a derivative voltage thereof as a gate voltage at the first gate relative to the first source;
wherein, when a first positive voltage and a normal current condition exist from the first terminal to the second terminal,
  the first transistor is configured to pass current between the first terminal and the second terminal; and
wherein, when a second positive voltage and an overcurrent condition exist from the first terminal to the second terminal,
  the driver circuitry is configured to drive the first transistor into blocking depletion mode by applying the releasably-stored voltage or the derivative voltage thereof as the gate voltage; and
wherein the device is configured to pass current during normal current conditions, and to substantially block current during overcurrent conditions.

Embodiment 2. The device of embodiment 1, wherein the device comprises no terminals other than the first terminal and the second terminal.

Embodiment 3. A device for protecting a circuit having a primary current path from a overcurrent condition, comprising:
a first terminal and a second terminal configured to route the primary current path through the device;
a third terminal adapted to be placed in bifurcated electrical communication with the second terminal;
a first transistor comprising a first gate, a first drain, and a first source;
  wherein the first transistor is a depletion mode, normally-on transistor;
  wherein the first transistor is arranged in series in the primary current path between the first terminal and the second terminal;
a driver circuitry;
  the driver circuitry comprising a voltage converter circuitry adapted to receive an input voltage derived from a voltage between the second terminal and the third terminal, and convert the input voltage to a releasably-stored voltage, wherein the driver circuitry is configured to apply the releasably-stored voltage or a derivative voltage thereof as a gate voltage at the first gate relative to the first source;
wherein, when a first positive voltage exists between the second terminal and the third terminal indicating a normal current condition from the first terminal to the second terminal,
  the first transistor is configured to pass current between the first terminal and the second terminal; and
wherein, when a second positive voltage exists between the second terminal and the third terminal indicating an overcurrent condition from the first terminal to the second terminal,
  the driver circuitry is configured to drive the first transistor into blocking depletion mode by applying the releasably-stored voltage or the derivative voltage thereof as the gate voltage; and
wherein the device is configured to pass current during normal current conditions, and to substantially block current during overcurrent conditions.

Embodiment 4. A device for protecting a circuit having a primary current path from a overcurrent condition, comprising:
a first terminal and a second terminal configured to route the primary current path through the device;
a third terminal and a fourth terminal adapted to be placed in bifurcated electrical communication with the primary current path;
a first transistor comprising a first gate, a first drain, and a first source;
  wherein the first transistor is a depletion mode, normally-on transistor;
  wherein the first transistor is arranged in series in the primary current path between the first terminal and the second terminal;
a driver circuitry;
  the driver circuitry comprising a voltage converter circuitry adapted to receive an input voltage derived from a voltage between the third terminal and the fourth terminal, and convert the input voltage to a releasably-stored voltage, wherein the driver circuitry is configured to apply the releasably-stored voltage or a derivative voltage thereof as a gate voltage at the first gate relative to the first source;
wherein, when a first positive voltage exists between the third terminal and the fourth terminal indicating a normal current condition from the first terminal to the second terminal,
  the first transistor is configured to pass current between the first terminal and the second terminal; and
wherein, when a second positive voltage exists between the third terminal and the fourth terminal indicating an overcurrent condition from the first terminal to the second terminal,
  the driver circuitry is configured to drive the first transistor into blocking depletion mode by applying the releasably-stored voltage or the derivative voltage thereof as the gate voltage; and
wherein the device is configured to pass current during normal current conditions, and to substantially block current during overcurrent conditions.

Embodiment 5. A device for protecting a circuit having a primary current path from a overcurrent condition, comprising:
a first terminal and a second terminal configured to route the primary current path through the device;
a first transistor comprising a first gate, a first drain, and a first source;
  wherein the first transistor is a depletion mode, normally-on transistor;
  wherein the first transistor is arranged in series in the primary current path between the first terminal and the second terminal;
a driver circuitry;
  the driver circuitry comprising a voltage converter circuitry adapted to receive an input voltage derived solely from a voltage between the first terminal and the second terminal, and convert the input voltage to a releasably-stored voltage, wherein the driver circuitry is configured to apply the releasably-stored voltage or a derivative voltage thereof as a gate voltage at the first gate relative to the first source;

wherein, when a first positive voltage and a normal current condition exist from the first terminal to the second terminal, the first transistor is configured to pass current between the first terminal and the second terminal; and wherein, when a second positive voltage and an overcurrent condition exist from the first terminal to the second terminal, the driver circuitry is configured to drive the first transistor into blocking depletion mode by applying the releasably-stored voltage or the derivative voltage thereof as the gate voltage; and wherein the device is configured to pass current during normal current conditions, and to substantially block current during overcurrent conditions;

wherein the voltage converter circuitry converts the input voltage to the releasably-stored voltage by multiplying and inverting the input voltage; and wherein the voltage converter circuitry comprises a switched capacitor network and converts the input voltage to the releasably-stored voltage within 100 μs.

Embodiment 6. The device of any one of embodiments 1-5, wherein the device is configured to operate without any auxiliary power supply.

Embodiment 7. The device of any one of embodiments 1-6, wherein the device does not comprise an inductor.

Embodiment 8. The device of any one of embodiments 1-7, wherein the device does not comprise a transformer.

Embodiment 9. The device of any one of embodiments 1-8, wherein, when the first positive voltage and the normal current condition exist from the first terminal to the second terminal, the first transistor is configured to operate in enhancement mode.

Embodiment 10. The device of any one of embodiments 1-9, wherein the overcurrent conditions are sustained overcurrent conditions.

Embodiment 11. The device of any one of embodiments 1-10, wherein the driver circuitry further comprises at least one switch transistor configured to allow the driver circuitry to apply the gate voltage only during the overcurrent conditions.

Embodiment 12. The device of any one of embodiments 1-11, wherein the driver circuitry further comprises at least one switch transistor configured to allow the driver circuitry to apply the gate voltage only when driving or maintaining the first transistor in blocking depletion mode.

Embodiment 13. The device of embodiment 12, wherein the at least one switch transistor comprises a transistor in series with a resistor.

Embodiment 14. The device of any one of embodiments 11-13, wherein the at least one switch transistor comprises a pair of transistors in a push-pull configuration.

Embodiment 15. The device of embodiment 14, wherein the pair of transistors comprises a pair of bipolar junction transistors in a totem pole configuration.

Embodiment 16. The device of embodiment 14, wherein the pair of transistors comprises a pair of MOSFETs in a totem pole configuration.

Embodiment 17. The device of any one of embodiments 1-16, wherein the driver circuitry comprises a charge retention circuitry configured to apply a retained charge as the gate voltage.

Embodiment 18. The device of embodiment 17, wherein the charge retention circuitry comprises a diode and a capacitor in series electrical communication, with the negative end of the capacitor electrically connected to the anode of the diode, so the capacitor charges through the diode but the diode substantially blocks the capacitor from discharging; and the first gate is connected between the diode and the capacitor.

Embodiment 19. The device of embodiment 17, wherein the charge retention circuitry comprises a diode in series with a capacitor configured to retain blocking charge on the capacitor.

Embodiment 20. The device of embodiment 19, further comprising a second diode configured to retain an enhancement charge on the capacitor.

Embodiment 21. The device of any one of embodiments 19-20, further comprising a transistor configured to retain a depletion charge or an enhancement charge on the capacitor.

Embodiment 22. The device of embodiment 21, wherein the transistor is configured to retain the depletion charge on the capacitor.

Embodiment 23. The device of embodiment 18, further comprising a transistor configured to direct charge on the capacitor to the first gate.

Embodiment 24. The device of embodiment 17, wherein the charge retention circuitry comprises at least one diode and a capacitor configured to be charged in series electrical communication, switched to a parallel electrical communication for discharge so that the first gate and first source are in parallel electrical communication with the capacitor and at least one diode.

Embodiment 25. The device of embodiment 24, wherein the at least one diode comprises a plurality of diodes in series electrical communication.

Embodiment 26. The device of any one of embodiments 17-25, wherein the charge retention circuitry comprises a charge retention transistor connected to the first gate.

Embodiment 27. The device of embodiment 26, wherein the charge retention transistor is in series electrical communication with the first gate.

Embodiment 28. The device of any one of embodiments 1-27, wherein the voltage converter circuitry comprises a one-shot voltage converter.

Embodiment 29. The device of any one of embodiments 1-28, wherein the voltage converter circuitry comprises an extended-use voltage converter.

Embodiment 30. The device of embodiment 29, wherein the extended-use voltage converter is coupled to an oscillator.

Embodiment 31. The device of embodiment 30, wherein the oscillator is configured to cause the extended-use voltage converter to provide the releasably-stored voltage only after the oscillator receives an oscillator-triggering voltage.

Embodiment 32. The device of any one of embodiments 1-31, wherein the voltage converter circuitry comprises a jump-start voltage converter.

Embodiment 33. The device of any one of embodiments 1-32, wherein the voltage converter circuitry is adapted to multiply, reduce, invert, identify, or a combination of two or more thereof, the input voltage.

Embodiment 34. The device of any one of embodiments 1-33, wherein the voltage converter circuitry is adapted to convert the input voltage autocatalytically.

Embodiment 35. The device of any one of embodiments 1-34, wherein the voltage converter circuitry comprises a parallel-to-series switched capacitor network configured to convert the input voltage to the releasably-stored voltage.

Embodiment 36. The device of embodiment 35, wherein the parallel-to-series switched capacitor network is configured to convert the input voltage to the releasably-stored voltage by multiplying the input voltage.

Embodiment 37. The device of any one of embodiments 35-36 wherein the parallel-to-series switched capacitor network is configured to convert the input voltage to the releasably-stored voltage autocatalytically.

Embodiment 38. The device of any one of embodiments 35-37, wherein the parallel-to-series switched capacitor network comprises:
a plurality of capacitors that are configured to be charged by the input voltage and discharge to provide the releasably-stored voltage;
a plurality of transistors that, when in the "off" state configure the plurality of capacitors in parallel electrical communication, and when in the "on" state configure the plurality of capacitors in series electrical communication.

Embodiment 39. The device of any one of embodiments 35-37, wherein the parallel-to-series switched capacitor network comprises:
a plurality of capacitors that are configured to be charged by the input voltage and discharge to provide the releasably-stored voltage;
a plurality of diodes that, when forward biased, configure the plurality of capacitors in parallel electrical communication, and when reverse biased, configure the plurality of capacitors in series electrical communication.

Embodiment 40. The device of any one of embodiments 1-34, wherein the voltage converter circuitry comprises a switched capacitor network configured to convert the input voltage to the releasably-stored voltage.

Embodiment 41. The device of embodiment 39, wherein the switched capacitor network is chosen from Cockraft-Walton multipliers and Dickson charge pumps, and combinations thereof.

Embodiment 42. The device of any one of embodiments 1-41, wherein the voltage converter circuitry is configured to convert the input voltage to the releasably-stored voltage within an overcurrent damage-limiting time.

Embodiment 43. The device of any one of embodiments 1-42, wherein the voltage converter circuitry is configured to convert the input voltage to the releasably-stored voltage within 100 μs.

Embodiment 44. The device of any one of embodiments 1-43, wherein the voltage converter circuitry is configured to convert the input voltage to the releasably-stored voltage within 10 μs.

Embodiment 45. The device of any one of embodiments 1-44, wherein the voltage converter circuitry is configured to convert the input voltage to the releasably-stored voltage within 1 μs.

Embodiment 46. The device of any one of embodiments 1-45, wherein the voltage converter circuitry is configured to convert the input voltage to the releasably-stored voltage within 100 ns.

Embodiment 47. The device of any one of embodiments 1-46, wherein the voltage converter circuitry is configured to convert the input voltage to the releasably-stored voltage within 20 ns.

Embodiment 48. The device of any one of embodiments 1-6 and 8-47, wherein the voltage converter circuitry comprises an inductor.

Embodiment 49. The device of any one of embodiments 1-48, wherein the voltage converter circuitry comprises a capacitor.

Embodiment 50. The device of any one of embodiments 1-49, wherein the driver circuitry further comprises a voltage floating circuitry configured to float the releasably-stored voltage to obtain a floated voltage;
wherein the driver circuitry is configured to apply the floated voltage or a derivative of the floated voltage as the gate voltage.

Embodiment 51. The device of embodiment 50, wherein the voltage floating circuitry comprises a capacitor and at least one transistor.

Embodiment 52. The device of any one of embodiments 50-51, wherein the voltage floating circuitry comprises a pair of transistors arranged in a push-pull configuration.

Embodiment 53. The device of any one of embodiments 50-52, wherein the voltage floating circuitry comprises a capacitor and a diode, wherein the capacitor's positive terminal is connected to the cathode of the diode, and the capacitor's negative terminal is connected to the anode of the diode.

Embodiment 54. The device of any one of embodiments 50-52,
wherein the voltage floating circuitry comprises a capacitor and a diode, wherein the capacitor's negative terminal is connected to the anode of the diode;
further comprising a floater switch transistor configured to selectively connect the capacitor's positive terminal to the cathode of the diode, thereby selectively placing the capacitor in parallel with the diode.

Embodiment 55. The device of any one of embodiments 50-52,
wherein the voltage floating circuitry comprises a capacitor and a diode, wherein the capacitor's positive terminal is connected to the cathode of the diode;
further comprising a floater switch transistor configured to selectively connect the capacitor's negative terminal to the anode of the diode, thereby selectively placing the capacitor in parallel with the diode.

Embodiment 56. The device of any one of embodiments 53-55, wherein the cathode of the diode is further connected to the first source.

Embodiment 57. The device of any one of embodiments 53-55, wherein the anode of the diode is further connected to the first source.

Embodiment 58. The device of any one of embodiments 50-52,
wherein the voltage floating circuitry comprises a capacitor and a floater charging transistor, wherein the capacitor is connected in series to a first end of the floater charging transistor;
further comprising a floater switch transistor configured to selectively connect the capacitor with a second end of the floater charging transistor, flexibly placing the capacitor in parallel with the floater charging transistor.

Embodiment 59. The device of any one of embodiments 50-58, wherein the voltage floating circuitry is configured to float the releasably-stored voltage only during the overcurrent conditions.

Embodiment 60. The device of any one of embodiments 50-59, wherein the voltage floating circuitry is configured to float the releasably-stored voltage only when the driver circuitry is driving or maintaining the first transistor in blocking depletion mode.

Embodiment 61. The device of any one of embodiments 50-60, wherein the voltage floating circuitry comprises a one-shot voltage floater, and the driver circuitry is configured to apply the floated voltage or the derivative of the floated voltage as the gate voltage only at the beginning of the overcurrent condition.

Embodiment 62. The device of any one of embodiments 50-61, wherein the voltage floating circuitry comprises an extended-use voltage floater.

Embodiment 63. The device of embodiment 62, wherein the extended-use voltage floater is coupled to an oscillator.

Embodiment 64. The device of embodiment 63, wherein the oscillator is configured to cause the extended-use voltage floater to float a releasably-stored voltage by modulating a pair of transistors in a push-pull configuration.

Embodiment 65. The device of any one of embodiments 1-64, further comprising:
a current monitoring circuitry configured to
monitor a current that would pass between the first terminal and the second terminal; and
configure the driver circuitry to drive the first transistor into blocking depletion mode when the current represents overcurrent conditions.

Embodiment 66. The device of embodiment 65, wherein the current monitoring circuitry monitors the current by measuring the voltage between the first terminal and the second terminal.

Embodiment 67. The device of any one of embodiments 1-66, further comprising a delay block timer circuitry configured to delay the driver circuitry from driving the first transistor into blocking depletion mode until the overcurrent condition is a sustained overcurrent condition.

Embodiment 68. The device of embodiment 67, wherein the delay block timer circuitry comprises a resistor and a capacitor in parallel with the first terminal and the second terminal.

Embodiment 69. The device of embodiment 67, wherein the delay block timer circuitry comprises a delay block transistor and a capacitor in parallel with the first terminal and the second terminal.

Embodiment 70. The device of embodiment 69, wherein the delay block transistor is chosen from bipolar junction transistors, enhancement-mode MOSFETs, depletion-mode MOSFETs, zero-threshold transistors, and depletion-mode JFETs.

Embodiment 71. The device of any one of embodiments 1-70, further comprising a gate protection circuitry configured to reduce a gate voltage at a transistor in the device.

Embodiment 72. The device of embodiment 71, wherein the gate protection circuitry comprises a Zener diode.

Embodiment 73. The device of embodiment 71, wherein the gate protection circuitry comprises a gate-protecting transistor in parallel with the first transistor, and a gate resistor in series electrical communication between the gate of the gate-protecting transistor and the second terminal.

Embodiment 74. The device of any one of embodiments 1-73, further comprising a reset circuitry configured to configure the driver circuitry to drive the first transistor out of blocking depletion mode when the overcurrent conditions no longer exist.

Embodiment 75. The device of embodiment 74, further comprising a delay reset timer circuitry configured to delay the reset circuitry from configuring the driver circuitry until a safe current condition is a sustained safe current condition.

Embodiment 76. The device of any one of embodiments 1-75, further comprising a sense resistor arranged in series in the primary current path with the first transistor and between the first terminal and the second terminal.

Embodiment 77. The device of embodiment 76, wherein the sense resistor is arranged in series between the first transistor and the second terminal.

Embodiment 78. The device of any one of embodiments 1-77, further comprising a temperature responsive element arranged in series in the primary current path with the first transistor and between the first terminal and the second terminal.

Embodiment 79. The device of embodiment 78, wherein the temperature responsive element comprises a polymeric positive temperature coefficient device configured to block current above a predetermined temperature threshold.

Embodiment 80. The device of any one of embodiments 1-79, further comprising one or more transistors, each transistor of the one or more transistors having a drain in direct parallel electrical communication with the first drain, a source in direct parallel electrical communication with the first source, and a gate in parallel electrical communication with the first gate.

Embodiment 81. The device of any one of embodiments 1-80, further comprising a second transistor having a second gate, a second drain, and a second source,
wherein the second transistor is arranged in series in the primary current path with the first transistor and between the first terminal and the second terminal;
wherein the second transistor exhibits a lower gate capacitance than the first transistor, and
the second transistor is configured so that a voltage drop across the second drain and the second source is applied to the first gate.

Embodiment 82. The device of any one of embodiments 1-81, wherein the driver circuitry comprising the voltage converter circuitry comprises:
an oscillating voltage converter and floater circuitry configured to convert an input voltage derived solely from a voltage between the first terminal and the second terminal into a releasably-stored voltage, float the releasably stored voltage to obtain a floated voltage, apply the releasably-stored voltage or a derivative voltage thereof as a gate voltage at the first gate relative to the first source upon occurrence of an overcurrent condition, and oscillate to repeatedly convert, float, and apply a blocked voltage for at least the duration of the overcurrent condition, to drive and maintain the first transistor in blocking depletion mode,
thereby protecting the circuit from the overcurrent condition.

Embodiment 83. The device of any one of embodiments 1-82, wherein the first transistor comprises:
a GaN depletion mode normally-on transistor.

Embodiment 84. The device of embodiment 83, wherein the GaN depletion mode normally-on transistor is a field effect transistor.

Embodiment 85. The device of embodiment 83, wherein the GaN depletion mode normally-on transistor is a bidirectional transistor.

Embodiment 86. The device of any one of embodiments 1-85, wherein when the first positive voltage and the normal current condition exist from the first terminal to the second terminal,
the driver circuitry comprising the voltage converter circuitry is configured to drive the first transistor into enhancement mode by applying the releasably-stored voltage or the derivative voltage thereof as the gate voltage.

Embodiment 87. The device of embodiment 86, wherein the voltage converter circuitry is configured to convert the first positive voltage or a derivative voltage thereof to obtain the releasably-stored voltage.

Embodiment 88. The device of any one of embodiments 86-87, wherein the voltage converter circuitry is configured to autocatalytically convert the first positive voltage or a derivative voltage thereof to obtain the releasably-stored voltage.

Embodiment 89. The device of any one of embodiments 1-88, wherein when the second positive voltage and the overcurrent condition are replaced by a safe voltage and a safe current condition from the first terminal to the second terminal, the driver circuitry comprising the voltage converter circuitry is configured to convert the safe voltage or a derivative voltage thereof to obtain a safe releasably-stored voltage; and drive the first transistor into enhancement mode by applying the safe releasably-stored voltage or a safe derivative voltage thereof as the gate voltage.

Embodiment 90. The device of embodiment 89, wherein the voltage converter circuitry is configured to autocatalytically convert the safe voltage or a derivative voltage thereof to obtain the safe releasably-stored voltage.

Embodiment 91. The device of any one of embodiments 89-90, wherein the safe derivative voltage thereof is a safe floated voltage.

Embodiment 92. A method of forming the device of any one of embodiments 1-91, comprising:
arranging the first transistor in series in the primary current path between the first terminal and the second terminal.

Embodiment 93. A method for protecting a circuit having a primary current path from an overcurrent condition, comprising:
placing in the primary current path the device of any one of embodiments 1-91, so that all current flowing in the circuit flows through or is blocked by the device.

Embodiment 94. A method for protecting a circuit against an overcurrent condition, comprising:
providing a device of any one of embodiments 1-91;
placing the first terminal and the second terminal in series electrical communication in the circuit so that all current flowing in the circuit flows through or is blocked by the device;
when a non-zero voltage exists between the first terminal and the second terminal, converting the non-zero voltage to obtain a releasably-stored voltage;
floating the releasably-stored voltage to obtain a floated voltage;
when an overcurrent condition exists between the first terminal and the second terminal,
applying the floated voltage to the first gate to drive the first transistor into blocking depletion mode,
thereby blocking substantially all current between the first terminal and the second terminal;
thereby protecting the circuit from the overcurrent condition.

Embodiment 95. A method for protecting a circuit against an overcurrent condition, comprising:
providing a device of any one of embodiments 1-91;
placing the first terminal and the second terminal in series electrical communication in the circuit so that all current flowing in the circuit flows through or is blocked by the device;
when a non-zero voltage and an overcurrent condition exist between the first terminal and the second terminal,
converting the non-zero voltage to obtain a releasably-stored voltage;
floating the releasably-stored voltage to obtain a floated voltage;
applying the floated voltage to the first gate to drive the first transistor into blocking depletion mode,
thereby blocking substantially all current between the first terminal and the second terminal;
thereby protecting the circuit from the overcurrent condition.

Embodiment 96. The method of any one of embodiments 94-95 wherein converting the non-zero voltage comprises autocatalytically converting the non-zero voltage.

Embodiment 97. A method for protecting a circuit against an overcurrent condition, comprising:
providing a device of any one of embodiments 1-91;
placing the first terminal and the second terminal in series electrical communication in the circuit so that all current flowing in the circuit flows through or is blocked by the device;
when a non-zero voltage and an overcurrent condition exist between the first terminal and the second terminal,
autocatalytically converting the non-zero voltage to obtain a releasably-stored voltage;
floating the releasably-stored voltage to obtain a floated voltage;
applying the floated voltage to the first gate to drive the first transistor into blocking depletion mode,
thereby blocking substantially all current between the first terminal and the second terminal;
thereby protecting the circuit from the overcurrent condition.

Embodiment 98. A method for protecting a circuit against an overcurrent condition, comprising:
providing a device having
a first terminal and a second terminal, and
a first transistor comprising a first gate, a first drain, and a first source;
wherein the first transistor is a depletion mode, normally-on transistor;
wherein the first transistor is arranged in series in a primary current path between
the first terminal and the second terminal;
wherein the device is configured to receive no auxiliary power;
placing the first terminal and the second terminal in series electrical communication in the circuit so that all current flowing in the circuit flows through or is blocked by the device;
when a non-zero voltage exists between the first terminal and the second terminal, converting the non-zero voltage to obtain a releasably-stored voltage;
floating the releasably-stored voltage to obtain a floated voltage;
when an overcurrent condition exists between the first terminal and the second terminal,
applying the floated voltage to the first gate to drive the first transistor into blocking depletion mode,
thereby blocking substantially all current between the first terminal and the second terminal;

thereby protecting the circuit from the overcurrent condition.

Embodiment 99. A method for protecting a circuit against an overcurrent condition, comprising:
providing a device having
  a first terminal and a second terminal, and
  a first transistor comprising a first gate, a first drain, and a first source;
  wherein the first transistor is a depletion mode, normally-on transistor;
  wherein the first transistor is arranged in series in a primary current path between
  the first terminal and the second terminal;
  wherein the device is configured to receive no auxiliary power;
placing the first terminal and the second terminal in series electrical communication in the circuit so that all current flowing in the circuit flows through or is blocked by the device;
when a non-zero voltage and an overcurrent condition exist between the first terminal and the second terminal,
  converting the non-zero voltage to obtain a releasably-stored voltage;
  floating the releasably-stored voltage to obtain a floated voltage;
  applying the floated voltage to the first gate to drive the first transistor into blocking depletion mode,
  thereby blocking substantially all current between the first terminal and the second terminal;
thereby protecting the circuit from the overcurrent condition.

Embodiment 100. The method of any one of embodiments 98-99, wherein obtaining the releasably-stored voltage comprises autocatalytically converting the non-zero voltage.

Embodiment 101. A method for protecting a circuit against an overcurrent condition, comprising:
providing a device having
  a first terminal and a second terminal,
  and a first transistor comprising a first gate, a first drain, and a first source;
  wherein the first transistor is a depletion mode, normally-on transistor;
  wherein the first transistor is arranged in series in a primary current path between
  the first terminal and the second terminal;
placing the first terminal and the second terminal in series electrical communication in the circuit so that all current flowing in the circuit flows through or is blocked by the device;
when an overcurrent condition exists between the first terminal and the second terminal,
  autocatalytically converting a non-zero voltage to obtain a releasably-stored voltage;
  applying the releasably-stored voltage to the first gate to drive the first transistor into blocking depletion mode,
  thereby blocking substantially all current between the first terminal and the second terminal;
thereby protecting the circuit from the overcurrent condition.

Embodiment 102. The method of embodiment 101, wherein the non-zero voltage is or is derived from a voltage between the first terminal and the second terminal.

Embodiment 103. The method of embodiment 101. wherein the non-zero voltage is derived from an auxiliary power supplied to the device.

Embodiment 104. The method of embodiment 103, wherein the auxiliary power is chosen from a battery, a thermal energy converter, a radio frequency converter, a light-to-electricity converter, an independent mains supply, or a combination thereof.

Embodiment 105. The method of any one of embodiments 101-102, wherein the device is configured to receive no auxiliary power.

Embodiment 106. A method for protecting a circuit against an overcurrent condition, comprising:
providing a device having
  a first terminal and a second terminal,
  and a first transistor comprising a first gate, a first drain, and a first source;
  wherein the first transistor is a depletion mode, normally-on transistor;
  wherein the first transistor is arranged in series in a primary current path between the first terminal and the second terminal;
placing the first terminal and the second terminal in series electrical communication in the circuit so that all current flowing in the circuit flows through or is blocked by the device;
when an overcurrent condition exists between the first terminal and the second terminal,
  autocatalytically converting a non-zero voltage to obtain a releasably-stored voltage;
  floating the releasably-stored voltage to obtain a floated voltage;
  applying the floated voltage to the first gate to drive the first transistor into blocking depletion mode,
  thereby blocking substantially all current between the first terminal and the second terminal;
thereby protecting the circuit from the overcurrent condition.

Embodiment 107. The method of any one of embodiments 92-106 wherein the primary current path between the first terminal and the second terminal defines a low resistance path, and only the first transistor, or optionally one or more transistors in parallel with the first transistor, are arranged in series in the low resistance path.

Embodiment 108. The method of any one of embodiments 94-107, wherein obtaining the releasably-stored voltage employs a voltage converter circuitry comprising a parallel-to-series switched capacitor network configured to convert the non-zero voltage to the releasably-stored voltage.

Embodiment 109. The method of embodiment 108, wherein obtaining the releasably-stored voltage comprises multiplying the non-zero voltage.

Embodiment 110. The method of any one of embodiments 93-109, wherein the overcurrent condition is a sustained overcurrent condition.

Embodiment 111. The method of any one of embodiments 94-110, wherein the converting does not occur until the overcurrent condition exists.

Embodiment 112. The method of any one of embodiments 94-111, wherein the floating does not occur until the overcurrent condition exists.

Embodiment 113. The method of any one of embodiments 94-112, wherein the converting comprises one or more of multiplying, reducing, inverting, and identifying.

Embodiment 114. The method of any one of embodiments 93-113, wherein the device does not comprise an inductor.

Embodiment 115. The method of any one of embodiments 93-113, wherein the device does not comprise a transformer.

Embodiment 116. The method of any one of embodiments 94-100 and 106-115, wherein the floating the releasably-stored voltage comprises switching the releasably-stored voltage.

Embodiment 117. The method of embodiment 116, wherein the switching employs a floating switch transistor.

Embodiment 118. The method of embodiment 116, wherein the switching employs a floating switch diode.

Embodiment 119. The method of any one of embodiments 116-118, wherein the switching comprises placing the releasably-stored voltage in parallel with a diode, wherein the positive end of the releasably-stored voltage is connected to the cathode of the diode, and the negative end of the releasably-stored voltage is connected to the anode of the diode.

Embodiment 120. The method of any one of embodiments 116-118, wherein the switching comprises placing the releasably-stored voltage in parallel with a floater charging transistor, wherein a first lead of the releasably-stored voltage is connected to a first end of the floater charging transistor, and a second lead of the releasably-stored voltage is adapted to be flexibly configured in parallel with the floater charging transistor.

Embodiment 121. The method of any one of embodiments 101-105, 107-111, and 113-115, wherein the applying the releasably-stored voltage to the first gate to drive the first transistor into blocking depletion comprises placing the releasably-stored voltage in parallel with the first gate and the first source.

Embodiment 122. The method of any one of embodiments 94-100, and 106-120, wherein the applying the floated voltage to the first gate to drive the first transistor into blocking depletion comprises placing the floated voltage in parallel with the first gate and the first source.

Embodiment 123. The method of any one of embodiments 93-121, wherein the first transistor is not in enhancement mode in an absence of the overcurrent condition.

Embodiment 124. The method of any one of embodiments 93-123, wherein the device does not multiply or invert voltages in an absence of the overcurrent condition.

Embodiment 125. The method of any one of embodiments 94-124, further comprising:
detecting that the overcurrent condition no longer exists by
 determining a safe voltage between the first terminal and the second terminal;
converting the safe voltage to obtain a safe releasably-stored voltage;
applying the safe releasably-stored voltage to the first gate to drive the first transistor out of blocking depletion mode, thereby allowing current to flow between the first terminal and the second terminal.

Embodiment 126. The method of embodiment 125, wherein the applying the safe releasably-stored voltage to the first gate comprises driving the first transistor into enhancement mode.

Embodiment 127. The method of any one of embodiments 94-124, further comprising:
detecting that the overcurrent condition no longer exists by
 determining a safe voltage between the first terminal and the second terminal;
converting the safe voltage to obtain a safe releasably-stored voltage;
floating the safe releasably-stored voltage to obtain a safe floated voltage;
applying the safe floated voltage to the first gate to drive the first transistor out of blocking depletion mode, thereby allowing current to flow between the first terminal and the second terminal.

Embodiment 128. The method of embodiment 127, wherein the applying the safe floated voltage to the first gate comprises driving the first transistor into enhancement mode.

Embodiment 129. The method of any one of embodiments 125-128, wherein the converting the safe voltage comprises one or more of multiplying, reducing, inverting, and identifying.

Embodiment 130: The method of any one of embodiments 94-96, 98-100, and 107-129, wherein the converting the non-zero voltage comprises:
charging two or more capacitors from the non-zero voltage,
 where the two or more capacitors are electrically connected by a switching arrangement configuring the two or more capacitors in parallel, thereby providing a stored voltage;
multiplying the stored voltage by switching the switching
 arrangement to configure the two or more capacitors in series, thereby providing the releasably-stored voltage;
wherein the releasably-stored voltage powers the multiplying by driving the switching.

Embodiment 131: The method of any one of embodiments 97 and 101-129, wherein the autocatalytic converting comprises:
charging two or more capacitors from the non-zero voltage,
 where the two or more capacitors are electrically connected by a switching arrangement configuring the two or more capacitors in parallel, thereby providing a stored voltage;
multiplying the stored voltage by switching the switching
 arrangement to configure the two or more capacitors in series, thereby providing the releasably-stored voltage;
wherein the releasably-stored voltage powers the multiplying by driving the switching.

Embodiment 132. The method of any one of embodiments 97 and 101-129, wherein the autocatalytic converting comprises:
providing a plurality of capacitors flexibly configured into
 parallel electrical communication by a switching arrangement;
charging the plurality of capacitors in parallel with the
 non-zero voltage to obtain a stored voltage;
multiplying the stored voltage by switching the switching
 arrangement so that the plurality of capacitors becomes at least partially electrically connected in series to produce a multiplied voltage;
increasing the multiplied voltage by driving the switching
 with the multiplied voltage so that the plurality of capacitors becomes fully electrically connected in series, thereby autocatalytically converting the non-zero voltage to obtain the releasably-stored voltage.

Embodiment 133. The method of any one of embodiments 97 and 101-129, wherein the autocatalytic converting comprises:
providing a plurality of capacitors flexibly configured into
 parallel electrical communication by a switching arrangement;
charging the plurality of capacitors in parallel with the input
 voltage;
partially switching the switching arrangement so that a
 portion of the plurality of capacitors becomes flexibly configured into series electrical communication to provide a partially-multiplied voltage;
driving at least some of the partially switching using the
 partially-multiplied voltage;

repeating partially switching and driving until the plurality of capacitors is entirely in series electrical communication, thereby autocatalytically converting the input voltage to obtain the releasably stored voltage.

Embodiment 134. The method of any one of embodiments 130-133, wherein:
the switching arrangement comprises a plurality of transistors configured to flexibly connect the plurality of capacitors in a parallel or a series configuration.

Embodiment 135. The method of embodiment 134, wherein the plurality of capacitors is configured to drive at least a portion of the gates of the transistors in the plurality of transistors.

Embodiment 136. A method for protecting a circuit against an overcurrent condition, comprising:
providing a device of any one of embodiments 3-4 and 6-91;
placing the first terminal and the second terminal in series electrical communication in the circuit so that all current flowing in the circuit flows through or is blocked by the device;
placing the third terminal in bifurcated electrical communication with the second terminal; or, if the fourth terminal of embodiment 4 is present, placing the third terminal and the fourth terminal in bifurcated electrical communication with the primary current path;
when a non-zero voltage exists between the second terminal and the third terminal, or, if the fourth terminal of embodiment 4 is present, when a non-zero voltage exists between the third terminal and the fourth terminal,
converting the non-zero voltage to obtain a releasably-stored voltage;
floating the releasably-stored voltage to obtain a floated voltage;
when an overcurrent condition exists between the first terminal and the second terminal,
applying the floated voltage to the first gate to drive the first transistor into blocking depletion mode,
thereby blocking substantially all current between the first terminal and the second terminal;
thereby protecting the circuit from the overcurrent condition.

Embodiment 137. A method for protecting a circuit against an overcurrent condition, comprising:
providing a device of any one of embodiments 3-4 and 6-91;
placing the first terminal and the second terminal in series electrical communication in the circuit so that all current flowing in the circuit flows through or is blocked by the device;
placing the third terminal in bifurcated electrical communication with the second terminal; or, if the fourth terminal of embodiment 4 is present, placing the third terminal and the fourth terminal in bifurcated electrical communication with the primary current path;
when a non-zero voltage exists between the second terminal and the third terminal, or when the fourth terminal is present, between the third terminal and the fourth terminal, and such non-zero voltage indicates an overcurrent condition exists between the first terminal and the second terminal,
converting the non-zero voltage to obtain a releasably-stored voltage;
floating the releasably-stored voltage to obtain a floated voltage;
applying the floated voltage to the first gate to drive the first transistor into blocking depletion mode,
thereby blocking substantially all current between the first terminal and the second terminal;
thereby protecting the circuit from the overcurrent condition.

Embodiment 138. The method of any one of embodiments 136-137 wherein converting the non-zero voltage comprises autocatalytically converting the non-zero voltage.

Embodiment 139. A method for protecting a circuit against an overcurrent condition, comprising:
providing a device of any one of embodiments 3-4 and 6-91;
placing the first terminal and the second terminal in series electrical communication in the circuit so that all current flowing in the circuit flows through or is blocked by the device;
placing the third terminal in bifurcated electrical communication with the second terminal; or, if the fourth terminal of embodiment 4 is present, placing the third terminal and the fourth terminal in bifurcated electrical communication with the primary current path;
when a non-zero voltage exists between the second terminal and the third terminal, or when the fourth terminal is present, between the third terminal and the fourth terminal, and such non-zero voltage indicates an overcurrent condition exists between the first terminal and the second terminal,
autocatalytically converting the non-zero voltage to obtain a releasably-stored voltage;
floating the releasably-stored voltage to obtain a floated voltage;
applying the floated voltage to the first gate to drive the first transistor into blocking depletion mode,
thereby blocking substantially all current between the first terminal and the second terminal;
thereby protecting the circuit from the overcurrent condition.

Embodiment 140. A method for protecting a circuit against an overcurrent condition, comprising:
providing a device having
a first terminal and a second terminal, and
a first transistor comprising a first gate, a first drain, and a first source;
wherein the first transistor is a depletion mode, normally-on transistor;
wherein the first transistor is arranged in series in a primary current path between the first terminal and the second terminal;
a third terminal adapted to be placed in bifurcated electrical communication with the second terminal, or a third terminal and a fourth terminal adapted to be placed in bifurcated electrical communication with the primary current path;
wherein the device is configured to receive no auxiliary power;
placing the first terminal and the second terminal in series electrical communication in the circuit so that all current flowing in the circuit flows through or is blocked by the device;
placing the third terminal in bifurcated electrical communication with the second terminal, or when the fourth terminal is present, placing the third terminal and the fourth terminal in bifurcated electrical communication with the primary current path;
when a non-zero voltage exists between the second terminal and the third terminal, or when the fourth terminal is present, between the third terminal and the fourth terminal,
converting the non-zero voltage to obtain a releasably-stored voltage;

floating the releasably-stored voltage to obtain a floated voltage;
when an overcurrent condition exists between the first terminal and the second terminal,
applying the floated voltage to the first gate to drive the first transistor into blocking depletion mode,
thereby blocking substantially all current between the first terminal and the second terminal;
thereby protecting the circuit from the overcurrent condition.

Embodiment 141. A method for protecting a circuit against an overcurrent condition, comprising:
providing a device having
a first terminal and a second terminal, and
a first transistor comprising a first gate, a first drain, and a first source;
wherein the first transistor is a depletion mode, normally-on transistor;
wherein the first transistor is arranged in series in a primary current path between the first terminal and the second terminal;
a third terminal adapted to be placed in bifurcated electrical communication with the second terminal, or a third terminal and a fourth terminal adapted to be placed in bifurcated electrical communication with the primary current path;
wherein the device is configured to receive no auxiliary power;
placing the first terminal and the second terminal in series electrical communication in the circuit so that all current flowing in the circuit flows through or is blocked by the device;
placing the third terminal in bifurcated electrical communication with second terminal, or when the fourth terminal is present, placing the third terminal and the fourth terminal in bifurcated electrical communication with the primary current path;
when a non-zero voltage exists between the second terminal and the third terminal, or when the fourth terminal is present, between the third terminal and the fourth terminal, and the non-zero voltage indicates an overcurrent condition exists between the first terminal and the second terminal,
converting the non-zero voltage to obtain a releasably-stored voltage;
floating the releasably-stored voltage to obtain a floated voltage;
applying the floated voltage to the first gate to drive the first transistor into blocking depletion mode,
thereby blocking substantially all current between the first terminal and the second terminal;
thereby protecting the circuit from the overcurrent condition.

Embodiment 142. The method of any one of embodiments 140-141, wherein obtaining the releasably-stored voltage comprises autocatalytically converting the non-zero voltage.

Embodiment 143. A method for protecting a circuit against an overcurrent condition, comprising:
providing a device having
a first terminal and a second terminal,
and a first transistor comprising a first gate, a first drain, and a first source;
wherein the first transistor is a depletion mode, normally-on transistor;
wherein the first transistor is arranged in series in a primary current path between the first terminal and the second terminal;
a third terminal adapted to be placed in bifurcated electrical communication with the second terminal, or a third terminal and a fourth terminal adapted to be placed in bifurcated electrical communication with the primary current path;
placing the first terminal and the second terminal in series electrical communication in the circuit so that all current flowing in the circuit flows through or is blocked by the device;
placing the third terminal in bifurcated electrical communication with the second terminal, or when the fourth terminal is present, placing the third terminal and the fourth terminal in bifurcated electrical communication with the primary current path;
when an overcurrent condition exists between the first terminal and the second terminal, autocatalytically converting a non-zero voltage to obtain a releasably-stored voltage;
applying the releasably-stored voltage to the first gate to drive the first transistor into blocking depletion mode,
thereby blocking substantially all current between the first terminal and the second terminal;
thereby protecting the circuit from the overcurrent condition.

Embodiment 144. The method of embodiment 143, wherein the non-zero voltage is or is derived from a voltage between the second terminal and the third terminal.

Embodiment 145. The method of embodiment 144, wherein the non-zero voltage is or is derived from a voltage between the third terminal and the fourth terminal.

Embodiment 146. The method of embodiment 144, wherein the non-zero voltage is derived from an auxiliary power supplied to the device.

Embodiment 147. The method of embodiment 146, wherein the auxiliary power is chosen from a battery, a thermal energy converter, a radio frequency converter, a light-to-electricity converter, an independent mains supply, or a combination thereof.

Embodiment 148. The method of any one of embodiments 143-145, wherein the device is configured to receive no auxiliary power.

Embodiment 149. A method for protecting a circuit against an overcurrent condition, comprising:
providing a device having
a first terminal and a second terminal,
and a first transistor comprising a first gate, a first drain, and a first source;
wherein the first transistor is a depletion mode, normally-on transistor;
wherein the first transistor is arranged in series in a primary current path between the first terminal and the second terminal;
a third terminal adapted to be placed in bifurcated electrical communication with the second terminal, or a third terminal and a fourth terminal adapted to be placed in bifurcated electrical communication with the primary current path;
placing the first terminal and the second terminal in series electrical communication in the circuit so that all current flowing in the circuit flows through or is blocked by the device;
placing the third terminal in bifurcated electrical communication with the second terminal, or when the fourth terminal is present, placing the third terminal and the fourth terminal in bifurcated electrical communication with the primary current path;

when an overcurrent condition exists between the first terminal and the second terminal, autocatalytically converting a non-zero voltage to obtain a releasably-stored voltage;

floating the releasably-stored voltage to obtain a floated voltage;

applying the floated voltage to the first gate to drive the first transistor into blocking depletion mode, thereby blocking substantially all current between the first terminal and the second terminal;

thereby protecting the circuit from the overcurrent condition.

Embodiment 150. The method of any one of embodiments 136-149 wherein the primary current path between the first terminal and the second terminal defines a low resistance path, and only the first transistor, or optionally one or more transistors in parallel with the first transistor, are arranged in series in the low resistance path.

Embodiment 151. The method of any one of embodiments 136-150, wherein obtaining the releasably-stored voltage employs a voltage converter circuitry comprising a parallel-to-series switched capacitor network configured to convert the non-zero voltage to the releasably-stored voltage.

Embodiment 152. The method of embodiment 151, wherein obtaining the releasably-stored voltage comprises multiplying the non-zero voltage.

Embodiment 153. The method of any one of embodiments 136-152, wherein the overcurrent condition is a sustained overcurrent condition.

Embodiment 154. The method of any one of embodiments 136-153, wherein the converting does not occur until the overcurrent condition exists.

Embodiment 155. The method of any one of embodiments 136-154, wherein the floating does not occur until the overcurrent condition exists.

Embodiment 156. The method of any one of embodiments 136-155, wherein the converting comprises one or more of multiplying, reducing, inverting, and identifying.

Embodiment 157. The method of any one of embodiments 136-156, wherein the device does not comprise an inductor.

Embodiment 158. The method of any one of embodiments 136-157, wherein the device does not comprise a transformer.

Embodiment 159. The method of any one of embodiments 136-142 and 149-158, wherein the floating the releasably-stored voltage comprises switching the releasably-stored voltage.

Embodiment 160. The method of embodiment 159, wherein the switching employs a floating switch transistor.

Embodiment 161. The method of embodiment 159, wherein the switching employs a floating switch diode.

Embodiment 162. The method of any one of embodiments 159-161, wherein the switching comprises placing the releasably-stored voltage in parallel with a diode, wherein the positive end of the releasably-stored voltage is connected to the cathode of the diode, and the negative end of the releasably-stored voltage is connected to the anode of the diode.

Embodiment 163. The method of any one of embodiments 159-161, wherein the switching comprises placing the releasably-stored voltage in parallel with a floater charging transistor, wherein a first lead of the releasably-stored voltage is connected to a first end of the floater charging transistor, and a second lead of the releasably-stored voltage is adapted to be flexibly configured in parallel with the floater charging transistor.

Embodiment 164. The method of any one of embodiments 143-148, 150-154, and 156-158, wherein the applying the releasably-stored voltage to the first gate to drive the first transistor into blocking depletion mode comprises placing the releasably-stored voltage in parallel with the first gate and the first source.

Embodiment 165. The method of any one of embodiments 136-142, and 149-163, wherein the applying the floated voltage to the first gate to drive the first transistor into blocking depletion mode comprises placing the floated voltage in parallel with the first gate and the first source.

Embodiment 166. The method of any one of embodiments 136-165, wherein the first transistor is not in enhancement mode in an absence of the overcurrent condition.

Embodiment 167. The method of any one of embodiments 136-166, wherein the device does not multiply or invert voltages in an absence of the overcurrent condition.

Embodiment 168. The method of any one of embodiments 136-167, further comprising:

detecting that the overcurrent condition no longer exists by determining a safe voltage between the first terminal and one or more of the second terminal, the third terminal, and where present, the fourth terminal;

converting the safe voltage to obtain a safe releasably-stored voltage;

applying the safe releasably-stored voltage to the first gate to drive the first transistor out of blocking depletion mode, thereby allowing current to flow between the first terminal and the second terminal.

Embodiment 169. The method of embodiment 168, wherein the applying the safe releasably-stored voltage to the first gate comprises driving the first transistor into enhancement mode.

Embodiment 170. The method of any one of embodiments 136-167, further comprising:

detecting that the overcurrent condition no longer exists by determining a safe voltage between the first terminal and one or more of the second terminal, the third terminal, and where present the fourth terminal;

converting the safe voltage to obtain a safe releasably-stored voltage;

floating the safe releasably-stored voltage to obtain a safe floated voltage;

applying the safe floated voltage to the first gate to drive the first transistor out of blocking depletion mode, thereby allowing current to flow between the first terminal and the second terminal.

Embodiment 171. The method of embodiment 170, wherein the applying the safe floated voltage to the first gate comprises driving the first transistor into enhancement mode.

Embodiment 172. The method of any one of embodiments 168-171, wherein the converting the safe voltage comprises one or more of multiplying, reducing, inverting, and identifying.

Embodiment 173: The method of any one of embodiments 136-138, 140-142, and 150-172, wherein the converting the non-zero voltage comprises:

charging two or more capacitors from the non-zero voltage, where the two or more capacitors are electrically connected by a switching arrangement configuring the two or more capacitors in parallel, thereby providing a stored voltage;

multiplying the stored voltage by switching the switching arrangement to configure the two or more capacitors in series, thereby providing the releasably-stored voltage;

wherein the releasably-stored voltage powers the multiplying by driving the switching.

Embodiment 174: The method of any one of embodiments 139 and 143-172, wherein the autocatalytic converting comprises:

charging two or more capacitors from the non-zero voltage, where the two or more capacitors are electrically connected by a switching arrangement configuring the two or more capacitors in parallel, thereby providing a stored voltage;

multiplying the stored voltage by switching the switching arrangement to configure the two or more capacitors in series, thereby providing the releasably-stored voltage;

wherein the releasably-stored voltage powers the multiplying by driving the switching.

Embodiment 175. The method of any one of embodiments 139 and 143-172, wherein the autocatalytic converting comprises:

providing a plurality of capacitors flexibly configured into parallel electrical communication by a switching arrangement;

charging the plurality of capacitors in parallel with the non-zero voltage to obtain a stored voltage;

multiplying the stored voltage by switching the switching arrangement so that the plurality of capacitors becomes at least partially electrically connected in series to produce a multiplied voltage;

increasing the multiplied voltage by driving the switching with the multiplied voltage so that the plurality of capacitors becomes fully electrically connected in series, thereby autocatalytically converting the non-zero voltage to obtain the releasably-stored voltage.

Embodiment 176. The method of any one of embodiments 139 and 143-172, wherein the autocatalytic converting comprises:

providing a plurality of capacitors flexibly configured into parallel electrical communication by a switching arrangement;

charging the plurality of capacitors in parallel with the input voltage;

partially switching the switching arrangement so that a portion of the plurality of capacitors becomes flexibly configured into series electrical communication to provide a partially-multiplied voltage;

driving at least some of the partially switching using the partially-multiplied voltage;

repeating partially switching and driving until the plurality of capacitors is entirely in series electrical communication, thereby autocatalytically converting the input voltage to obtain the releasably stored voltage.

Embodiment 177. The method of any one of embodiments 173-176, wherein:

the switching arrangement comprises a plurality of transistors configured to flexibly connect the plurality of capacitors in a parallel or a series configuration.

Embodiment 178. The method of embodiment 177, wherein the plurality of capacitors is configured to drive at least a portion of the gates of the transistors in the plurality of transistors.

Embodiment 179. A voltage converter circuitry, comprising:

a first input lead and a second input lead configured to receive an input voltage;

at least one output lead configured to deliver a converted voltage; and a switched capacitor network configured to convert the input voltage to the converted voltage;

wherein the switched capacitor network is configured to convert the input voltage to the converted voltage autocatalytically.

Embodiment 180. A voltage converter circuitry, comprising:

a first lead and a second lead configured to receive an input voltage and to deliver a converted voltage; and a parallel-to-series switched capacitor network configured to convert the input voltage to the converted voltage;

wherein the parallel-to-series switched capacitor network is configured to convert the input voltage to the converted voltage autocatalytically.

Embodiment 181. A voltage converter circuitry, comprising:

a parallel-to-series switched capacitor network configured to convert an input voltage to a converted voltage;

wherein the parallel-to-series switched capacitor network is configured to convert the input voltage to the converted voltage autocatalytically.

Embodiment 182. The voltage converter circuitry of any one of embodiments 180-181, wherein the parallel-to-series switched capacitor network is configured to convert the input voltage to the converted voltage by multiplying the input voltage.

Embodiment 183. The voltage converter circuitry of embodiment 179, wherein the second input lead and the first output lead are configured to deliver the converted voltage.

Embodiment 184. The voltage converter circuitry of embodiment 179, further comprising a second output lead, wherein the first output lead and the second output lead are configured to deliver the converted voltage.

Embodiment 185. The voltage converter circuitry of any one of embodiments 179-184, wherein the switched capacitor network or the parallel-to-series switched capacitor network comprises:

a plurality of capacitors that are configured to be charged by the input voltage and discharge to provide the converted voltage;

a plurality of transistors that, when in the "off" state configure the plurality of capacitors in parallel electrical communication, and when in the "on" state configure the plurality of capacitors in series electrical communication.

Embodiment 186. The voltage converter circuitry of any one of embodiments 179-184, wherein the switched capacitor network or the parallel-to-series switched capacitor network comprises:

a plurality of capacitors that are configured to be charged by the input voltage and discharge to provide the converted voltage;

a plurality of diodes that, when forward biased, configure the plurality of capacitors in parallel electrical communication, and when reverse biased, configure the plurality of capacitors in series electrical communication.

Embodiment 187. A voltage converter circuitry comprising:

a first input lead and a second input lead configured to receive an input voltage;

at least one output lead configured to deliver a converted voltage;

wherein the voltage converter circuitry is configured to convert the input voltage to the converted voltage autocatalytically.

Embodiment 188. The voltage converter circuitry of embodiment 187, comprising a parallel-to-series switched capacitor network comprising a plurality of capacitors that are configured to be charged by the input voltage and discharge to provide the converted voltage;

a plurality of transistors that, when in the "off" state configure the plurality of capacitors in parallel electrical communication, and when in the "on" state configure the plurality of capacitors in series electrical communication;

wherein at least a portion of the plurality of transistors are further configured to receive the converted voltage or a portion thereof to drive the plurality of transistors to the "on" state.

Embodiment 189. A method of driving a transistor having a gate, the method comprising:

autocatalytically converting an input voltage to obtain a releasably stored voltage;

applying the releasably stored voltage to the gate, thereby driving the transistor.

Embodiment 190. A method of autocatalytically converting an input voltage into a converted voltage, comprising:

charging a plurality of capacitors flexibly configured in parallel electrical communication with the input voltage;

switching in the solid state the plurality of capacitors so the plurality of capacitors is flexibly configured in series electrical communication to provide the converted voltage;

wherein the converted voltage or a portion thereof drives at least some of the switching, thereby autocatalytically converting the input voltage to the converted voltage.

Embodiment 191: The method of embodiment 190, wherein the switching in the solid state is provided by a plurality of transistors flexibly configuring the plurality of capacitors.

Embodiment 192: The method of embodiment 190, wherein the switching in the solid state is provided by a plurality of diodes flexibly configuring the plurality of capacitors.

Embodiment 193: The method of embodiment 190, wherein the switching in the solid state is provided by a plurality of transistors and diodes flexibly configuring the plurality of capacitors.

Embodiment 194: The device of any one of embodiments 1-91, wherein the device is further configured to limit current during a slight overcurrent condition, and to substantially block current during a severe overcurrent condition.

Embodiment 195: The device of embodiment 194, further comprising a limiting transistor configured to drive the first transistor into current limiting mode during the slight overcurrent condition, and to drive the first transistor into blocking depletion mode during the severe overcurrent condition.

Embodiment 196: A device for protecting a circuit having a primary current path from an overcurrent condition, comprising:

a first terminal and a second terminal configured to route the primary current path through the device;

a first transistor comprising a first gate, a first drain, and a first source;

wherein the first transistor is a depletion mode, normally-on transistor;

wherein the first transistor is arranged in series in the primary current path between the first terminal and the second terminal;

a driver circuitry;

the driver circuitry comprising a voltage converter circuitry adapted to receive an input voltage derived solely from a voltage between the first terminal and the second terminal, and convert the input voltage to a releasably-stored voltage, wherein the driver circuitry is configured to apply the releasably-stored voltage or a derivative voltage thereof as a gate voltage at the first gate relative to the first source;

wherein, when a first positive voltage and a normal current condition exist from the first terminal to the second terminal, the first transistor is configured to pass current between the first terminal and the second terminal; and wherein, when a second positive voltage and a slight overcurrent condition exist from the first terminal to the second terminal, the driver circuitry is configured to drive the first transistor into current-limiting mode by applying the releasably-stored voltage or the derivative voltage thereof as the gate voltage; and wherein, when a third positive voltage and a severe overcurrent condition exist from the first terminal to the second terminal, the driver circuitry is configured to drive the first transistor into blocking depletion mode by applying the releasably-stored voltage or the derivative voltage thereof as the gate voltage; and wherein the device is configured to pass current during normal current conditions, to limit current during slight overcurrent conditions, and to substantially block current during severe overcurrent conditions.

Embodiment 197: A device for protecting a circuit having a primary current path from an overcurrent condition, comprising:

a first terminal and a second terminal configured to route the primary current path through the device;

a third terminal adapted to be placed in bifurcated electrical communication with the second terminal, or a third terminal and a fourth terminal adapted to be placed in bifurcated electrical communication with the primary current path;

a first transistor comprising a first gate, a first drain, and a first source;

wherein the first transistor is a depletion mode, normally-on transistor;

wherein the first transistor is arranged in series in the primary current path between the first terminal and the second terminal;

a driver circuitry;

the driver circuitry comprising a voltage converter circuitry adapted to receive an input voltage derived from a voltage between the second terminal and the third terminal, or if the fourth terminal is present, between the third terminal and the fourth terminal, and convert the input voltage to a releasably-stored voltage, wherein the driver circuitry is configured to apply the releasably-stored voltage or a derivative voltage thereof as a gate voltage at the first gate relative to the first source;

wherein, when a normal current condition exists from the first terminal to the second terminal, the first transistor is configured to pass current between the first terminal and the second terminal; and wherein, when a slight overcurrent condition exists from the first terminal to the second terminal, the driver circuitry is configured to drive the first transistor into current-limiting mode by applying the releasably-stored voltage or the derivative voltage thereof as the gate voltage; and wherein, when a severe overcurrent condition exists from the first terminal to the second terminal, the driver circuitry is configured to drive the first transistor into blocking depletion mode by applying the releasably-stored voltage or the derivative voltage thereof as the gate voltage; and wherein the device is configured to pass current during normal current conditions, to limit current during slight overcurrent conditions, and to substantially block current during severe overcurrent conditions.

Embodiment 198: The device of any one of embodiments 194-197, wherein a slight overcurrent condition comprises a current that is no more than 10%, 50%, 100%, 200%, 500%, or 1000% of a maximum expected current load for the circuit.

Embodiment 199: The device of any one of embodiments 194-197, wherein a slight overcurrent condition comprises a current that is no more than 0.1 A, 0.5 A, 1 A, 5 A, 10 A, 50 A, 100 A, 1000 A, 10,000 A, or 100,000 A more than a maximum expected current load for the circuit.

Embodiment 200: The device of any one of embodiments 194-199, further comprising oscillator circuitry configured to oscillate when the first transistor enters current limiting mode, and to maintain the first transistor in current limiting mode during the slight overcurrent condition.

Embodiment 201: The device of any one of embodiments 194-200, further comprising a comparator configured to determine when a slight overcurrent condition arises.

Embodiment 202: The device of any one of embodiments 194-201, further comprising a comparator configured to determine when a severe overcurrent condition arises.

Embodiment 203: The device of any one of embodiments 194-202, comprising conduction reset circuitry configured to drive the first transistor into full conduction mode following the slight overcurrent condition or the severe overcurrent condition.

Embodiment 204: The device of any one of embodiments 194-203, further comprising limiting reset circuitry configured to drive the first transistor into current limiting mode following the severe overcurrent condition.

Embodiment 205: The device of embodiment 204, wherein the limiting reset circuitry comprises a comparator configured to determine that the severe overcurrent condition has ended.

Embodiment 206: The device of any one of embodiments 204-205, wherein the limiting reset circuitry further comprises timer reset circuitry configured to delay driving the first transistor into current limiting mode following the severe overcurrent condition.

Embodiment 207: The device of any one of embodiments 203-204, further comprising retry and latch circuitry configured to count a number of overcurrent events within a time interval, and when the number reaches a preselected limit, latch the first transistor into full conduction mode or blocking depletion mode.

Embodiment 208. A method of forming the device of any one of embodiments 194-207, comprising:
arranging the first transistor in series in the primary current path between the first terminal and the second terminal.

Embodiment 209. A method for protecting a circuit having a primary current path from an overcurrent condition, comprising:
placing in the primary current path the device of any one of embodiments 194-207 so that all current flowing in the circuit flows through, is limited by, or is blocked by the device.

Embodiment 210. A method for protecting a circuit against an overcurrent condition, comprising:
providing a device of any one of embodiments 194-207;

placing the first terminal and the second terminal in series electrical communication in the circuit so that all current flowing in the circuit flows through, is limited by, or is blocked by the device;
when a non-zero voltage exists between the first terminal and the second terminal, or when the third terminal is present, between the second terminal and third terminal, or when the fourth terminal is present, between the third terminal and the fourth terminal,
  converting the non-zero voltage to obtain a releasably-stored voltage;
  floating the releasably-stored voltage to obtain a floated voltage;
when an overcurrent condition exists between the first terminal and the second terminal,
  applying the floated voltage to the first gate to drive the first transistor into current limiting mode,
  thereby limiting the current between the first terminal and the second terminal;
thereby protecting the circuit from the overcurrent condition.

Embodiment 211. A method for protecting a circuit against an overcurrent condition, comprising:
providing a device of any one of embodiments 194-207;
placing the first terminal and the second terminal in series electrical communication in the circuit so that all current flowing in the circuit flows through, is limited by, or is blocked by the device;
when an overcurrent condition exists between the first terminal and the second terminal, and
a non-zero voltage exists between the first terminal and the second terminal, or when the third terminal is present, between the second terminal and third terminal, or when the fourth terminal is present, between the third terminal and the fourth terminal,
  converting the non-zero voltage to obtain a releasably-stored voltage;
  floating the releasably-stored voltage to obtain a floated voltage;
  applying the floated voltage to the first gate to drive the first transistor into current limiting mode,
  thereby limiting the current between the first terminal and the second terminal;
thereby protecting the circuit from the overcurrent condition.

Embodiment 212. The method of any one of embodiments 210-211 wherein converting the non-zero voltage comprises autocatalytically converting the non-zero voltage.

Embodiment 213. A method for protecting a circuit against an overcurrent condition, comprising:
providing a device of any one of embodiments 194-207;
placing the first terminal and the second terminal in series electrical communication in the circuit so that all current flowing in the circuit flows through, is limited by, or is blocked by the device;
when an overcurrent condition exist between the first terminal and the second terminal, and
a non-zero voltage exists between the first terminal and the second terminal, or when the third terminal is present, between the second terminal and third terminal, or when the fourth terminal is present, between the third terminal and the fourth terminal,
  autocatalytically converting the non-zero voltage to obtain a releasably-stored voltage;
  floating the releasably-stored voltage to obtain a floated voltage;

applying the floated voltage to the first gate to drive the first transistor into current limiting mode,
thereby limiting the current between the first terminal and the second terminal;
thereby protecting the circuit from the overcurrent condition.

Embodiment 214. A method for protecting a circuit against an overcurrent condition, comprising:
providing a device having
a first terminal and a second terminal, and
a first transistor comprising a first gate, a first drain, and a first source;
wherein the first transistor is a depletion mode, normally-on transistor;
wherein the first transistor is arranged in series in a primary current path between the first terminal and the second terminal;
wherein the device is configured to receive no auxiliary power;
placing the first terminal and the second terminal in series electrical communication in the circuit so that all current flowing in the circuit flows through, is limited by, or is blocked by the device;
when a non-zero voltage exists between the first terminal and the second terminal,
converting the non-zero voltage to obtain a releasably-stored voltage;
floating the releasably-stored voltage to obtain a floated voltage;
when an overcurrent condition exists between the first terminal and the second terminal,
applying the floated voltage to the first gate to drive the first transistor into current limiting mode,
thereby limiting current between the first terminal and the second terminal;
thereby protecting the circuit from the overcurrent condition.

Embodiment 215. A method for protecting a circuit against an overcurrent condition, comprising:
providing a device having
a first terminal and a second terminal, and
a first transistor comprising a first gate, a first drain, and a first source;
wherein the first transistor is a depletion mode, normally-on transistor;
wherein the first transistor is arranged in series in a primary current path between the first terminal and the second terminal;
wherein the device is configured to receive no auxiliary power;
placing the first terminal and the second terminal in series electrical communication in the circuit so that all current flowing in the circuit flows through, is limited by, or is blocked by the device;
when a non-zero voltage and an overcurrent condition exist between the first terminal and the second terminal,
converting the non-zero voltage to obtain a releasably-stored voltage;
floating the releasably-stored voltage to obtain a floated voltage;
applying the floated voltage to the first gate to drive the first transistor into current limiting mode,
thereby limiting the current between the first terminal and the second terminal;
thereby protecting the circuit from the overcurrent condition.

Embodiment 216. A method for protecting a circuit against an overcurrent condition, comprising:
providing a device having
a first terminal and a second terminal, and
a first transistor comprising a first gate, a first drain, and a first source;
wherein the first transistor is a depletion mode, normally-on transistor;
wherein the first transistor is arranged in series in a primary current path between the first terminal and the second terminal;
a third terminal adapted to be placed in bifurcated electrical communication with second terminal, or a third terminal and a fourth terminal adapted to be placed in bifurcated electrical communication with the primary current path;
wherein the device is configured to receive no auxiliary power;
placing the first terminal and the second terminal in series electrical communication in the circuit so that all current flowing in the circuit flows through, is limited by, or is blocked by the device;
placing the third terminal in bifurcated electrical communication with the second terminal, or when the fourth terminal is present, placing the third terminal and the fourth terminal in bifurcated electrical communication with the primary current path;
when a non-zero voltage exists between the second terminal and the third terminal, or
when the fourth terminal is present, between the third terminal and the fourth terminal,
converting the non-zero voltage to obtain a releasably-stored voltage;
floating the releasably-stored voltage to obtain a floated voltage;
when an overcurrent condition exists between the first terminal and the second terminal,
applying the floated voltage to the first gate to drive the first transistor into current limiting mode,
thereby limiting current between the first terminal and the second terminal;
thereby protecting the circuit from the overcurrent condition.

Embodiment 217. A method for protecting a circuit against an overcurrent condition, comprising:
providing a device having
a first terminal and a second terminal, and
a first transistor comprising a first gate, a first drain, and a first source;
wherein the first transistor is a depletion mode, normally-on transistor;
wherein the first transistor is arranged in series in a primary current path between the first terminal and the second terminal;
a third terminal adapted to be placed in bifurcated electrical communication with the second terminal, or a third terminal and a fourth terminal adapted to be placed in bifurcated electrical communication with the primary current path;
wherein the device is configured to receive no auxiliary power;
placing the first terminal and the second terminal in series electrical communication in the circuit so that all current flowing in the circuit flows through, is limited by, or is blocked by the device;
placing the third terminal in bifurcated electrical communication with the second terminal, or when the fourth terminal is present, placing the third terminal and the fourth terminal in bifurcated electrical communication with the primary current path;

when an overcurrent condition exists between the first terminal and the second terminal, and a non-zero voltage between the second terminal and the third terminal, or when the fourth terminal is present, between the third terminal and the fourth terminal,
    converting the non-zero voltage to obtain a releasably-stored voltage;
    floating the releasably-stored voltage to obtain a floated voltage;
    applying the floated voltage to the first gate to drive the first transistor into current limiting mode,
    thereby limiting the current between the first terminal and the second terminal;
thereby protecting the circuit from the overcurrent condition.

Embodiment 218. The method of any one of embodiments 214-217, wherein obtaining the releasably-stored voltage comprises autocatalytically converting the non-zero voltage.

Embodiment 219. A method for protecting a circuit against an overcurrent condition, comprising:
providing a device having
    a first terminal and a second terminal,
    and a first transistor comprising a first gate, a first drain, and a first source;
    wherein the first transistor is a depletion mode, normally-on transistor;
    wherein the first transistor is arranged in series in a primary current path between the first terminal and the second terminal;
    optionally, a third terminal adapted to be placed in bifurcated electrical communication with the second terminal, or a third terminal and a fourth terminal adapted to be placed in bifurcated electrical communication with the primary current path;
placing the first terminal and the second terminal in series electrical communication in the circuit so that all current flowing in the circuit flows through, is limited by, or is blocked by the device;
when an overcurrent condition exists between the first terminal and the second terminal,
    autocatalytically converting a non-zero voltage to obtain a releasably-stored voltage;
    applying the releasably-stored voltage to the first gate to drive the first transistor into current limiting mode,
    thereby limiting the current between the first terminal and the second terminal;
thereby protecting the circuit from the overcurrent condition.

Embodiment 220. The method of embodiment 219, wherein the non-zero voltage is or is derived from a voltage between the first terminal and the second terminal.

Embodiment 221. The method of embodiment 219, wherein the non-zero voltage is or is derived from a voltage between the second terminal and the third terminal.

Embodiment 222. The method of embodiment 219, wherein the non-zero voltage is or is derived from a voltage between the third terminal and the fourth terminal.

Embodiment 223. The method of embodiment 219, wherein the non-zero voltage is derived from an auxiliary power supplied to the device.

Embodiment 224. The method of embodiment 223, wherein the auxiliary power is chosen from a battery, a thermal energy converter, a radio frequency converter, a light-to-electricity converter, an independent mains supply, or a combination thereof.

Embodiment 225. The method of any one of embodiments 219-222, wherein the device is configured to receive no auxiliary power.

Embodiment 226. A method for protecting a circuit against an overcurrent condition, comprising:
providing a device of any one of embodiments 194-207;
placing the first terminal and the second terminal in series electrical communication in the circuit so that all current flowing in the circuit flows through, is limited by, or is blocked by the device;
when a slight overcurrent condition is detected by the device, causing the first transistor to enter current limiting mode.

Embodiment 227. The method of embodiment 226, further comprising:
detecting that the slight overcurrent condition has subsided; and
causing the first transistor to reset to full conduction mode.

Embodiment 228. The method of any one of embodiments 226-227, further comprising:
counting a number of reset events within a given time period;
when the number of reset events within the given time period exceeds a preselected number, latching the first transistor into full conduction mode or current blocking mode.

Embodiment 229. A method for protecting a circuit against an overcurrent condition, comprising:
providing a device of any one of embodiments 194-207;
placing the first terminal and the second terminal in series electrical communication in the circuit so that all current flowing in the circuit flows through, is limited by, or is blocked by the device;
when a severe overcurrent condition is detected by the device, causing the first transistor to enter depletion blocking mode.

Embodiment 230. The method of embodiment 229, further comprising:
detecting that the severe overcurrent condition has subsided; and
causing the first transistor to reset to current limiting mode or full conduction mode.

Embodiment 231. The method of embodiment 230, further comprising:
counting a number of reset events within a given time period;
when the number of reset events within the given time period exceeds a preselected number, latching the first transistor into full conduction mode, current limiting mode, or current blocking mode.

Embodiment 232. The device of any one of the foregoing device embodiments, wherein the first transistor is a MEMS.

Embodiment 233. The method of any one of the foregoing method embodiments, wherein the first transistor is a MEMS.

Embodiment 234. A voltage converter circuitry, comprising:
a switched capacitor network configured to convert an input voltage to a converted voltage, the switched capacitor network comprising a plurality of input capacitors,
wherein the input capacitors are in direct parallel electrical communication with each other to receive an inrush current.

Embodiment 235. The voltage converter circuitry of embodiment 234, wherein the direct parallel electrical communication is provided by one or more transistors, one or more diodes, or a combination thereof.

Embodiment 236. The voltage converter circuitry of any one of embodiments 234-235, wherein the direct parallel electrical communication is terminated after a quantity of inrush current.

Embodiment 237. The voltage converter circuitry of embodiment 236, wherein the quantity of inrush current is measured as a function of time.

Embodiment 238. The voltage converter circuitry of embodiment 236, wherein the quantity of inrush current is measured by electrical charge.

Embodiment 239. A voltage converter circuitry, comprising:
a switched capacitor network configured to convert an input voltage to a converted voltage, wherein the input voltage charges a plurality of input capacitors having a combined input capacitance, and the converted voltage is adapted to charge an output capacitance;
wherein the ratio of the combined input capacitance to the output capacitance is greater than 1.

Embodiment 240. A voltage converter circuitry, comprising:
a switched capacitor network configured to convert an input voltage to a converted voltage, wherein the input voltage charges a plurality of input capacitors, each input capacitor having an input capacitance, and the converted voltage is adapted to charge an output capacitance;
wherein the ratio of the input capacitance of at least one input capacitor in the plurality of input capacitors to the output capacitance is greater than 1.

Embodiment 241. The voltage converter circuitry of embodiment 240, wherein the plurality of input capacitors has a combined input capacitance, and the ratio of the combined input capacitance to the output capacitance is greater than 1.

Embodiment 242. A voltage converter circuitry, comprising:
a switched capacitor network configured to convert an input voltage to a converted voltage, wherein the input voltage charges at least one input capacitor having a input capacitance, and the converted voltage is adapted to charge an output capacitance;
wherein the ratio of the input capacitance to the output capacitance is greater than 1.

Embodiment 243. The voltage converter circuitry of any one of embodiments 234-242, wherein at least one of the plurality of input capacitors is configured to function as a flying capacitor.

Embodiment 244. The voltage converter circuitry of embodiment 242, wherein the at least one input capacitor is configured to function as a flying capacitor.

Embodiment 245. The voltage converter circuitry of any one of embodiments 234-244, wherein the switched capacitor network is a parallel-to-series switched capacitor network comprising a plurality of input capacitors, and the plurality of input capacitors functions as a flying capacitance.

Embodiment 246. The voltage converter circuitry of embodiment 245, wherein the ratio of the equivalent capacitance of the series-configured input capacitors to the output capacitance is greater than 1.

Embodiment 247. The voltage converter circuitry of any one of embodiments 234-244, wherein the switched capacitor network is chosen from Cockraft-Walton multipliers and Dickson charge pumps.

Embodiment 248. The voltage converter circuitry of any one of embodiments 234-247, wherein the converted voltage is applied to the gate of a transistor, and the output capacitance comprises the gate capacitance of the transistor.

Embodiment 249. The voltage converter circuitry of embodiment 248, wherein the transistor is the first transistor of any one of embodiments 1-91.

Embodiment 250. The voltage converter circuitry of any one of embodiments 234-249, wherein an input capacitor in the plurality of input capacitors has a greater capacitance than another input capacitor in the plurality.

Embodiment 251. The voltage converter circuitry of embodiment 250, wherein an input capacitor in the plurality of input capacitors has a greater capacitance than the next input capacitor in the plurality.

Embodiment 252. The voltage converter circuitry of embodiment 250, wherein an input capacitor in the plurality of input capacitors has a greater capacitance than a subsequent input capacitor in the plurality.

Embodiment 253. The voltage converter circuitry of any one of embodiments 234-252, wherein an input capacitor in the plurality of input capacitors that is closest to the output capacitance has an input capacitance greater than the output capacitance.

Embodiment 254. The voltage converter circuitry of any one of embodiments 234-253, comprising at least one flying capacitor having a flying capacitance that is greater than the output capacitance.

Embodiment 255. The voltage converter circuitry of any one of embodiments 234-254, comprising a plurality of flying capacitors each having a capacitance greater than the output capacitance.

Embodiment 256. The voltage converter circuitry of any one of embodiments 234-255, wherein the first input capacitor in the plurality of input capacitors has a capacitance of 100 nF, and the last input capacitor in the plurality of input capacitors has a capacitance of 15 nF.

Embodiment 257. The voltage converter circuitry of any one of embodiments 234-256, wherein each input capacitor in the plurality of input capacitors has a greater capacitance than the next input capacitor in the plurality of input capacitors, with the input capacitor closest to the output capacitance having the smallest capacitance in the plurality.

Embodiment 258. A method for reducing the number of clock cycles needed for a switched capacitor network to convert an input voltage to a converted voltage, comprising:
obtaining a plurality of input capacitors in the switched capacitor network between the input voltage and an output capacitance, wherein each input capacitor has a greater capacitance than the next input capacitor from the input voltage to the output capacitance;
charging a first input capacitor with the input voltage;
charging subsequent input capacitors in the plurality of input capacitors with previous input capacitors in the plurality of input capacitors; and
charging the output capacitance to obtain the converted voltage.

Embodiment 259. A voltage converter circuitry for converting an input voltage to a releasably-stored voltage comprising a switched-capacitor network, further comprising a high-frequency oscillator and a tank capacitor configured to supply current to the high-frequency oscillator or the switched-capacitor network.

Embodiment 260. A voltage converter circuitry for auto-catalytically converting an input voltage to a releasably-stored voltage, wherein the voltage converter circuitry is adapted to operate at or above about 750 kHz.

Embodiment 261. A voltage converter circuitry, comprising:
a switched capacitor network configured to convert an input voltage to a converted voltage, the switched capacitor network comprising a plurality of input capacitors; and
an inrush protection transistor in series electrical communication with the plurality of input capacitors configured to allow inrush current to the plurality, and to cut off or substantially limit current once the plurality of input capacitors has been charged.

Embodiment 262. The voltage converter circuitry of embodiment 261, wherein the inrush protection transistor is a JFET or a depletion mode transistor.

Embodiment 263. A voltage converter circuitry for converting an input voltage to a releasably-stored voltage, wherein the circuitry is adapted to receive an input voltage changing at a rate greater than 2 V/µs.

Embodiment 264. A method of converting an input voltage to a releasably-stored voltage, comprising:
supplying an input voltage that is changing at a rate greater than 2 V/µs.

Embodiment 265. A voltage converter circuitry for converting an input voltage to a releasably-stored voltage, wherein the releasably-stored voltage is at least two times greater than the input voltage, and the conversion takes less than about 100 µs.

Embodiment 266. The voltage converter circuitry of embodiment 265, wherein the releasably-stored voltage is at least three times, at least five times, at least eight times, or at least 10 times greater than the input voltage.

Embodiment 267. The voltage converter circuitry of any one of embodiments 265-266, wherein the conversion takes less than about 50 µs, less than about 20 µs, less than about 10 µs, less than about 5 µs, or less than about 1 µs.

Embodiment 268. The voltage converter circuitry of any one of embodiments 234-257, 259, and 261-262, wherein the switched capacitor network is configured to receive a current at each input capacitor that correlates with the capacitance of that input capacitor.

Embodiment 269. The voltage converter circuitry of any one of embodiments 260, 263, and 265-267 comprising a switched capacitor network comprising a plurality of input capacitors, wherein the switched capacitor network is configured to receive a current at each input capacitor that correlates with the capacitance of that input capacitor.

Embodiment 270. The method of embodiment 264, wherein the supplying an input voltage occurs at a switched capacitor network comprising a plurality of input capacitors, wherein the switched capacitor network is configured to receive a current at each input capacitor that correlates with the capacitance of that input capacitor.

Embodiment 271. A method for reducing the number of clock cycles needed for a switched capacitor network to convert an input voltage to a converted voltage, comprising:
obtaining a plurality of input capacitors in the switched capacitor network between the input voltage and an output capacitance, wherein an input capacitor has a greater capacitance than a subsequent input capacitor from the input voltage to the output capacitance;
charging a first input capacitor with the input voltage;
charging subsequent input capacitors in the plurality of input capacitors with previous input capacitors in the plurality of input capacitors; and
charging the output capacitance to obtain the converted voltage.

Embodiment 272. The method of any one of embodiments 258 and 271 wherein the switched capacitor network is configured to receive a current at each input capacitor that correlates with the capacitance of that input capacitor.

As previously stated, detailed embodiments of the present invention are disclosed herein; however, it is to be understood that the disclosed embodiments are merely exemplary of the invention that may be embodied in various forms. It will be appreciated that many modifications and other variations stand within the intended scope of this invention as claimed below. Furthermore, the foregoing description of various embodiments does not necessarily imply exclusion. For example, "some" embodiments may include all or part of "other" and "further" embodiments within the scope of this invention. In addition, "a" does not mean "one and only one;" "a" can mean "one and more than one."

I claim:

1. A device for protecting a circuit having a primary current path from an overcurrent condition, comprising:
   a first terminal and a second terminal configured to route the primary current path through the device;
   a first transistor comprising a first gate, a first drain, and a first source;
   wherein the first transistor is a depletion mode, normally-on transistor;
   wherein the first transistor is arranged in series in the primary current path between the first terminal and the second terminal;
   a driver circuitry;
   the driver circuitry comprising a first voltage converter circuitry adapted to receive a first input voltage derived solely from a voltage between the first terminal and the second terminal, and convert the first input voltage to a first releasably-stored voltage,
   the driver circuitry further comprising a jumpstart voltage converter adapted to convert a second input voltage to a second releasably-stored voltage more quickly than the first voltage converter converts the first input voltage,
   wherein the driver circuitry is configured to apply a gate voltage at the first gate relative to the first source;
   wherein, when a first positive voltage and a normal current condition exist from the first terminal to the second terminal,
   the first transistor is configured to pass current between the first terminal and the second terminal; and
   wherein, when a second positive voltage and a severe overcurrent condition exist from the first terminal to the second terminal,
   the driver circuitry is configured to drive the first transistor into blocking depletion mode by applying the first releasably stored voltage or a derivative voltage thereof, the second releasably-stored voltage or a derivative voltage thereof, or a combination thereof as the gate voltage; and
   wherein the device is configured to pass current during normal current conditions, and to substantially block current during severe overcurrent conditions.

2. The device of claim 1, wherein the jumpstart voltage converter is configured to operate as a one-shot voltage converter.

3. The device of claim 1, wherein the jumpstart voltage converter is configured to operate as an extended use voltage converter.

4. The device of claim 1, wherein the jumpstart voltage converter is configured to operate as a one-shot voltage converter and an extended use voltage converter.

5. The device of claim 1, wherein the jumpstart voltage converter is configured to provide an oscillator with an oscillator-triggering voltage.

6. The device of claim 5, wherein the oscillator-triggering voltage is configured to cause the oscillator to drive the jumpstart voltage converter to continually supply a converted voltage sufficient to maintain the first transistor in blocking depletion mode during the severe overcurrent condition.

7. The device of claim 1, wherein, when a third positive voltage and a slight overcurrent condition exists from the first terminal to the second terminal,
the driver circuitry is configured to drive the first transistor into current-limiting mode by applying the first releasably-stored voltage or the derivative voltage thereof, the second releasably-stored voltage or the derivative voltage thereof, or the combination thereof as the gate voltage; and
wherein the device is configured to limit current during slight overcurrent conditions.

8. The device of claim 7, wherein the jumpstart voltage converter is configured to provide an oscillator with an oscillator-triggering voltage.

9. The device of claim 8, wherein the oscillator-triggering voltage is configured to cause the oscillator to drive the jumpstart voltage converter to continually supply a converted voltage sufficient to maintain the first transistor in current-limiting mode during the slight overcurrent condition.

10. The device of claim 1, wherein the jumpstart voltage converter is configured to apply the second releasably-stored voltage or the derivative voltage thereof as a gate voltage at the first gate relative to the first source to drive the first transistor into blocking depletion mode.

11. The device of claim 1, wherein the jumpstart voltage converter is configured to apply the second releasably-stored voltage or the derivative thereof to the first voltage converter circuitry.

12. The device of claim 1, wherein
the jumpstart voltage converter is configured to apply the second releasably-stored voltage or the derivative voltage thereof as a gate voltage at the first gate relative to the first source to drive the first transistor into blocking depletion mode, and
the first voltage converter circuitry is configured apply the first releasably-stored voltage or the derivative thereof to maintain the first transistor in blocking depletion mode during the severe overcurrent condition.

13. The device of claim 12, wherein the first voltage converter circuitry is configured in a feedback loop with the first transistor.

14. The device of claim 1, wherein the driver circuitry comprises a voltage floater, and wherein the first releasably-stored voltage or the derivative voltage thereof, the second releasably-stored voltage or the derivative thereof, or the combination thereof is a floated voltage.

15. The device of claim 1, wherein the driver circuitry further comprises a voltage floater, and the gate voltage is a floated voltage.

16. The device of claim 1, wherein the jumpstart voltage converter comprises a switched capacitor network.

17. The device of claim 16, wherein the switched capacitor network comprises a parallel-to-series switched capacitor network.

18. The device of claim 1, wherein the jumpstart voltage converter is configured to provide autocatalytic voltage conversion.

* * * * *